US012312364B2

(12) United States Patent
Choi et al.

(10) Patent No.: US 12,312,364 B2
(45) Date of Patent: May 27, 2025

(54) ORGANOMETALLIC COMPOUND, ORGANIC LIGHT-EMITTING DEVICE INCLUDING THE SAME, AND DIAGNOSTIC COMPOSITION INCLUDING THE ORGANOMETALLIC COMPOUND

(71) Applicant: Samsung Electronics Co., Ltd., Suwon-si (KR)

(72) Inventors: Hyeonho Choi, Seoul (KR); Kyuyoung Hwang, Anyang-si (KR); Seungyeon Kwak, Suwon-si (KR); Youngmin Nam, Seoul (KR); Kum Hee Lee, Suwon-si (KR); Aram Jeon, Suwon-si (KR); Whail Choi, Seoul (KR); Kyungdoc Kim, Seoul (KR); Jiho Yoo, Hwaseong-si (KR); Younsuk Choi, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 979 days.

(21) Appl. No.: 16/555,257

(22) Filed: Aug. 29, 2019

(65) Prior Publication Data

US 2020/0083464 A1 Mar. 12, 2020

(30) Foreign Application Priority Data

Aug. 31, 2018 (KR) ........................ 10-2018-0104040
Aug. 28, 2019 (KR) ........................ 10-2019-0105899

(51) Int. Cl.

| | |
|---|---|
| ***H10K 85/30*** | (2023.01) |
| ***C07F 15/00*** | (2006.01) |
| ***C09K 11/06*** | (2006.01) |
| ***H10K 50/11*** | (2023.01) |
| ***H10K 50/15*** | (2023.01) |
| ***H10K 50/16*** | (2023.01) |
| ***H10K 50/17*** | (2023.01) |
| ***H10K 50/18*** | (2023.01) |
| ***H10K 101/10*** | (2023.01) |

(52) U.S. Cl.

CPC .......... *C07F 15/0033* (2013.01); *C09K 11/06* (2013.01); *H10K 85/342* (2023.02); *C09K 2211/1029* (2013.01); *C09K 2211/185* (2013.01); *H10K 50/11* (2023.02); *H10K 50/15* (2023.02); *H10K 50/16* (2023.02); *H10K 50/17* (2023.02); *H10K 50/171* (2023.02); *H10K 50/18* (2023.02); *H10K 2101/10* (2023.02)

(58) Field of Classification Search

CPC ... H01L 51/5016; H01L 51/0077–0089; H01L 51/0091–0092; C07F 15/0033; C07F 5/00; C07F 5/003; C07F 5/06–069; C07F 7/00; C07F 7/003; C07F 7/22–28; C07F 9/00; C07F 9/005; C07F 15/002; C09K 11/06; C09K 2211/1029; C09K 2211/182–188

See application file for complete search history.

(56) References Cited

U.S. PATENT DOCUMENTS

| | | | |
|---|---|---|---|
| 7,205,054 B2 | 4/2007 | Tsuboyama et al. | |
| 8,501,328 B2 | 8/2013 | Kim et al. | |
| 8,623,519 B2 | 1/2014 | Kim et al. | |
| 8,956,737 B2 | 2/2015 | Park et al. | |
| 2003/0054198 A1 | 3/2003 | Tsuboyama et al. | |
| 2008/0286604 A1* | 11/2008 | Inoue | C09K 11/06 428/690 |
| 2014/0027716 A1 | 1/2014 | Tsai et al. | |
| 2015/0001472 A1* | 1/2015 | Boudreault | C07F 15/0033 546/4 |
| 2016/0380216 A1 | 12/2016 | Tsai et al. | |
| 2017/0084849 A1 | 3/2017 | Tsai et al. | |
| 2018/0159051 A1 | 6/2018 | Li et al. | |

FOREIGN PATENT DOCUMENTS

| | | | | |
|---|---|---|---|---|
| CN | 103012490 A | | 4/2013 | |
| JP | 2003081989 A | | 3/2003 | |
| JP | 2006120905 A | * | 5/2006 | |
| KR | 1020070105080 A | | 10/2007 | |
| KR | 1020090032250 A | | 4/2009 | |
| TW | 201042005 A | * | 12/2010 | C09K 11/06 |
| WO | 2006098120 A1 | | 9/2006 | |
| WO | 2006103874 A1 | | 10/2006 | |

OTHER PUBLICATIONS

Machine Translation of Cheng (TW 201042005 A) from Espacenet.com (Year: 2010).*
Machine Translation of IDS reference Nishizeki (WO 2006098120 A1) from Espacenet.com (Year: 2006).*
Nishizeki et al., machine translation of JP-2006120905-A (2006) pp. 1-45. (Year: 2006).*

(Continued)

*Primary Examiner* — Dylan C Kershner

(74) *Attorney, Agent, or Firm* — CANTOR COLBURN LLP

(57) ABSTRACT

An organometallic compound represented by Formula 1:

$$M(L_1)_{n1}(L_2)_{n2} \qquad \text{Formula 1}$$

wherein, in Formula 1, M, $L_1$, $L_2$, n1 and n2 are each the same as defined in the detailed description of the specification.

11 Claims, 1 Drawing Sheet

(56) References Cited

OTHER PUBLICATIONS

Extended European search report issued by the European Patent Office on Jan. 2, 2020 in the examination of the European Patent Application No. 19194318.2, which corresponds to the U.S. Application above.
XP-002796165, Chien Hong Cheng, et al., "Iridium complex for organic light emitting diode with excellent brightness and luminous efficiency", 2 pgs.
English Abstract of WO 2006/103874.
English Translation of Office Action dated Feb. 2, 2024, issued in corresponding CN Patent Application No. 201910826608.2, 10 pp.
Office Action dated Feb. 2, 2024, issued in corresponding CN Patent Application No. 201910826608.2, 9 pp.

* cited by examiner

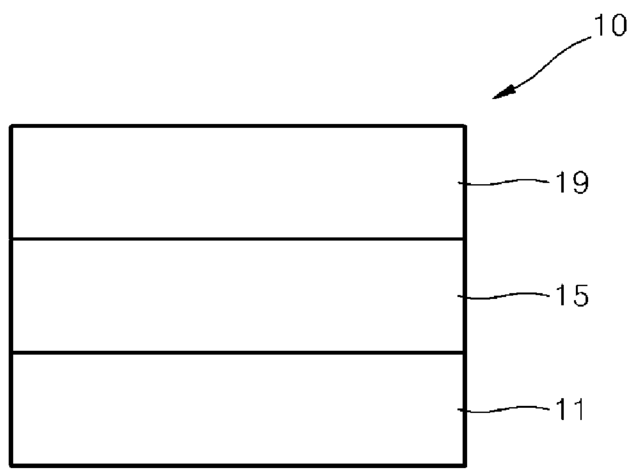
10
19
15
11

ORGANOMETALLIC COMPOUND, ORGANIC LIGHT-EMITTING DEVICE INCLUDING THE SAME, AND DIAGNOSTIC COMPOSITION INCLUDING THE ORGANOMETALLIC COMPOUND

CROSS-REFERENCE TO RELATED APPLICATION

This application claims priority to Korean Patent Applications Nos. 10-2018-0104040, filed on Aug. 31, 2018, and 10-2019-0105899, filed on Aug. 28, 2019, in the Korean Intellectual Property Office, and all the benefits accruing therefrom under 35 U.S.C. § 119, the content of which is incorporated herein in its entirety by reference.

BACKGROUND

1. Field

One or more embodiments relate to an organometallic compound, an organic light-emitting device including the organometallic compound, and a diagnostic composition including the organometallic compound.

2. Description of the Related Art

Organic light-emitting devices (OLEDs) are self-emission devices, which have superior characteristics in terms of a viewing angle, response time, brightness, driving voltage, and response speed, and which produce full-color images.

In an example, an organic light-emitting device includes an anode, a cathode, and an organic layer disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

Luminescent compounds may be used to monitor, sense, or detect a variety of biological materials including cells and proteins. An example of the luminescent compounds is a phosphorescent luminescent compound.

Various types of organic light emitting devices are known. However, there still remains a need in OLEDs having low driving voltage, high efficiency, high brightness, and long lifespan.

SUMMARY

Aspects of the present disclosure provide a novel organometallic compound, an organic light-emitting device including the same, and a diagnostic composition including the organometallic compound.

Additional aspects will be set forth in part in the description which follows and, in part, will be apparent from the description, or may be learned by practice of the presented embodiments.

An aspect of the present disclosure provides an organometallic compound represented by Formula 1:

$$M(L_1)_{n1}(L_2)_{n2} \quad \text{Formula 1}$$

In Formula 1,

M may be iridium (Ir), osmium (Os), titanium (Ti), hafnium (Hf), europium (Eu), rhodium (Rh), or ruthenium (Ru), $L_1$ may be a ligand represented by Formula 2, n1 may be 1, 2, or 3, wherein when n1 is 2 or more, two or more groups $L_1$ may be identical to or different from each other, $L_2$ may be a monodentate ligand, a bidentate ligand, a tridentate ligand, or a tetradentate ligand, n2 may be 0, 1, 2, 3, or 4, wherein when n2 is 2 or more, two or more groups $L_2$ may be identical to or different from each other, and $L_1$ and $L_2$ may be different from each other, Formula 2

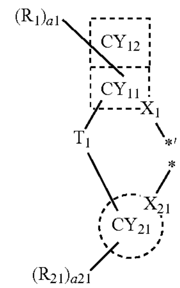

In Formula 2, $X_1$ and $X_{21}$ may each independently be C or N, ring $CY_{11}$, ring $CY_{12}$, and ring $CY_{21}$ may each independently be a $C_5$-$C_{30}$ carbocyclic group or a $C_1$-$C_{30}$ heterocyclic group, and ring $CY_{11}$ and ring $CY_{12}$ may be condensed with each other, $T_1$ may be *—N($R_2$)—*', *—B($R_2$)—*', *—P($R_2$)—*', *—C($R_2$)($R_3$)—*', *—Si($R_2$)($R_3$)—*, *—Ge($R_2$)($R_3$)—*', *—S—*', *—Se—*', *—O—*', *—C(=O)—*', *—S(=O)—*', *—S(=O)$_2$—*', *—C($R_2$)=*', *=C($R_2$)—*', *—C($R_2$)=C($R_3$)—*', *—C(=S)—*', or *—C≡C—*', wherein * and *' each indicate a binding site to a neighboring atom, $R_1$ to $R_3$ and $R_{21}$ may each independently be hydrogen, deuterium, —F, —Cl, —Br, —I, —$SF_5$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{60}$ heterocycloalkyl group, a substituted or unsubstituted $C_3$-$C_{10}$ cycloalkenyl group, a substituted or unsubstituted $C_1$-$C_{60}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(=O)($Q_8$)($Q_9$), —P($Q_8$)($Q_9$), or any combination thereof, a1 and a21 may each independently be an integer from 0 to 20, two or more of a plurality of groups $R_1$ may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of a plurality of groups $R_{21}$ may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of $R_1$ to $R_3$ and $R_{21}$ may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $R_{10a}$ is the same as defined in connection with $R_{21}$,

* and *' each indicate a binding site to M in Formula 1, and a substituent(s) of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{60}$ heterocycloalkyl group, the substituted $C_3$-$C_{10}$ cycloalkenyl group, the substituted $C_1$-$C_{60}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group may each independently be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —Ge($Q_{13}$)($Q_{14}$)($Q_{15}$), —B($Q_{16}$)($Q_{17}$), —P(=O)($Q_{18}$)($Q_{19}$), —P($Q_{18}$)($Q_{19}$), or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —Ge($Q_{23}$)($Q_{24}$)($Q_{25}$), —B($Q_{26}$)($Q_{27}$), —P(=O)($Q_{28}$)($Q_{29}$), —P($Q_{28}$)($Q_{29}$), or any combination thereof;

—N($Q_{31}$)($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), —P(=O)($Q_{38}$)($Q_{39}$), or —P($Q_{38}$)($Q_{39}$); or any combination thereof, and $Q_1$ to $Q_9$, $Q_{11}$ to $Q_{19}$, $Q_{21}$ to $Q_{29}$, and $Q_{31}$ to $Q_{39}$ may each independently be hydrogen; deuterium; —F; —Cl; —Br; —I; a hydroxyl group; a cyano group; a nitro group; an amino group; a guanidino group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_7$-$C_{60}$ arylalkyl group; a $C_1$-$C_{60}$ heteroaryl group; a $C_1$-$C_{60}$ heteroaryloxy group; a $C_1$-$C_{60}$ heteroarylthio group; a $C_2$-$C_{60}$ heteroarylalkyl group; a monovalent non-aromatic condensed polycyclic group; or a monovalent non-aromatic condensed heteropolycyclic group.

Another aspect of the present disclosure provides an organic light-emitting device including:

a first electrode;

a second electrode; and an organic layer disposed between the first electrode and the second electrode, wherein the organic layer includes an emission layer, and wherein the organic layer includes at least one organometallic compound represented by Formula 1.

Another aspect of the present disclosure provides a diagnostic composition including at least one organometallic compound represented by Formula 1.

BRIEF DESCRIPTION OF THE DRAWING

These and/or other aspects will become apparent and more readily appreciated from the following description of the embodiments, taken in conjunction with the FIGURE which is a schematic view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the FIGURES, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

An aspect of the present disclosure provides an organometallic compound represented by Formula 1 below:

$$M(L_1)_{n1}(L_2)_{n2} \quad \text{Formula 1}$$

In Formula 1, M may be iridium (Ir), osmium (Os), titanium (Ti), hafnium (Hf), europium (Eu), rhodium (Rh), or ruthenium (Ru).

In an exemplary embodiment, M may be Ir, but embodiments of the present disclosure are not limited thereto.

In Formula 1, $L_1$ may be a ligand represented by Formula 2:

Formula 2

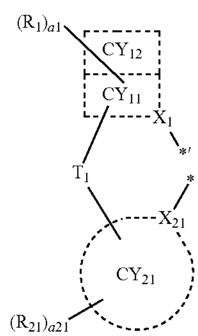

Formula 2 will be understood by referring to a detailed description thereof provided below.

In Formula 1, n1 indicates the number of groups $L_1$, and may be 1, 2, or 3. When n1 is 2 or more, two or more groups $L_1$ may be identical to or different from each other.

In Formula 1, $L_2$ may be a monodentate ligand, a bidentate ligand, a tridentate ligand, or a tetradentate ligand. $L_2$ will be understood by referring to a detailed description thereof provided below.

In Formula 1, n2 indicates the number of groups $L_2$, and may be 0, 1, 2, 3, or 4. When n2 is 2 or more, two or more groups $L_2$ may be identical to or different from each other.

In Formula 1, $L_1$ and $L_2$ may be different from each other. Thus, when n2 in Formula 1 is not 0, the organometallic compound represented by Formula 1 may be a heteroleptic complex.

In an embodiment, in Formula 1, i) M may be Ir or Os, and the sum of n1 and n2 may be 3 or 4; or ii) M may be Pt, and the sum of n1 and n2 may be 2.

In one or more embodiments, n2 in Formula 1 may be 1 or 2.

In Formula 2, $X_1$ and $X_{21}$ may each independently be C or N.

In an exemplary embodiment, $X_1$ may be N, and $X_{21}$ may be C, but embodiments of the present disclosure are not limited thereto.

In Formula 2, a bond between $X_1$ and M in Formula 1 may be a coordinate bond, and a bond between $X_{21}$ and M in Formula 1 may be a covalent bond. In this regard, the organometallic compound represented by Formula 1 may be electrically neutral.

In Formula 2, ring $CY_{11}$, ring $CY_{12}$, and ring $CY_{21}$ may each independently be a $C_5$-$C_{30}$ carbocyclic group or a $C_1$-$C_{30}$ heterocyclic group. Ring $CY_{11}$ and ring $CY_{12}$ may be condensed with each other.

In one or more embodiments, ring $CY_{11}$, ring $CY_{12}$, and ring $CY_{21}$ may each independently be i) a first ring, ii) a second ring, iii) a condensed ring in which two or more first rings are condensed with each other, iv) a condensed ring in which two or more second rings are condensed with each other, or v) a condensed ring in which one or more first rings are condensed with one or more second rings.

The first ring may be a cyclopentane group, a cyclopentadiene group, a furan group, a thiophene group, a pyrrole group, a silole group, an indene group, a benzofuran group, a benzothiophene group, an indole group, a benzosilole group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, or a triazasilole group.

The second ring may be an adamantane group, a norbornane group, a norbornene group, a bicyclo[1.1.1]pentane group, a bicyclo[2.1.1]hexane group, a bicyclo[2.2.1]heptane group, a bicyclo[2.2.2]octane group, a cyclohexane group, a cyclohexene group, a benzene group, a pyridine group, a pyrimidine group, a pyrazine group, a pyridazine group, or a triazine group.

In an embodiment, ring $CY_{11}$, ring $CY_{12}$, and ring $CY_{21}$ may each independently be a cyclopentene group, a cyclohexene group, a cycloheptene group, a benzene group, a naphthalene group, an anthracene group, a fluoranthene group, a phenanthrene group, a triphenylene group, a pyrene group, a chrysene group, a 1,2,3,4-tetrahydronaphthalene group, a pyrrole group, a borole group, a phosphole group, a cyclopentadiene group, a silole group, a germole group, a thiophene group, a selenophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a benzoquinoline group, a benzoisoquinoline group, a quinoxaline group, a quinazoline group, a phenanthroline group, a pyrazole group, an imidazole group, a triazole group, an azaborole group, an azaphosphole group, an azacyclopentadiene group, an azasilole group, an azagermole group, an azaselenophene group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group, but embodiments of the present disclosure are not limited thereto.

In an embodiment, ring $CY_{11}$ may be a pyridine group, a quinoline group, an isoquinoline group, a benzoquinoline group, or a benzoisoquinoline group; and/or ring $CY_{12}$ may be a benzene group, a naphthalene group, a phenanthrene group, a pyrrole group, a borole group, a phosphole group, a cyclopentadiene group, a silole group, a germole group, a thiophene group, a selenophene group, a furan group, a pyrazole group, an imidazole group, an azaborole group, an azaphosphole group, an azacyclopentadiene group, an azasilole group, an azagermole group, an azaselenophene group, an oxazole group, an isooxazole group, a thiazole group, or an isothiazole group; and/or ring $CY_{21}$ may be a benzene group, a pyridine group, a pyrimidine group, a naphthalene group, a fluorene group, a carbazole group, a dibenzofuran group, a dibenzothiophene group, or dibenzosilole group, but embodiments of the present disclosure are not limited thereto.

In Formula 2, $T_1$ may be *—N($R_2$)—*', *—B($R_2$)—*', *—P($R_2$)—*', *—C($R_2$)($R_3$)—*', *—Si($R_2$)($R_3$)—*', *—Ge($R_2$)($R_3$)—*', *—S—*', *—Se—*', *—O—*', *—C(═O)—*', *—S(═O)—*', *—S(═O)$_2$—*', *—C($R_2$)═*', *═C($R_2$)—*', *—C($R_2$)═C($R_3$)—*', *—C(═S)—*', or *—C≡C—*', wherein * and *' each indicate a binding site to a neighboring atom. $R_2$ and $R_3$ will be understood by referring to a detailed description thereof provided below. $R_2$ and $R_3$ may optionally, be linked via a single bond, a double bond, *—N($R_4$)—*', *—B($R_4$)—*', *—P($R_4$)—*', *—C($R_4$)($R_5$)—*', *—Si($R_4$)($R_5$)—*', *—Ge($R_4$)($R_5$)—*', *—S—*', *—Se—*', *—O—*', *C(═O)—*', *—S(═O)—*', *—S(═O)$_2$—*', *—C($R_4$)═*', *═C($R_4$)—*', *—C($R_4$)═C($R_5$)—*', *—C(═S)—*', or *—C≡C—*' to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$. $R_{10a}$ is the same as defined in connection with $R_{21}$. The $C_5$-$C_{30}$ carbocyclic group and the $C_1$-$C_{30}$ heterocyclic group are each the same as defined in connection with ring $CY_{21}$.

In an embodiment, $T_1$ in Formula 2 may be *—O—*'.

$R_1$ to $R_3$ and $R_{21}$ may each independently be hydrogen, deuterium, —F, —Cl, —Br, —I, —$SF_5$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{60}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(=O)($Q_8$)($Q_9$), or —P($Q_8$)($Q_9$), wherein $Q_1$ to $Q_9$ will be understood by referring to a detailed description thereof provided below.

In an embodiment, $R_1$ to $R_3$ and $R_{21}$ may each independently be:

hydrogen, deuterium, —F, —Cl, —Br, —I, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, —$SF_5$, $C_1$-$C_{20}$ alkyl group, or a $C_1$-$C_{20}$ alkoxy group;

a $C_1$-$C_{20}$ alkyl group and a $C_1$-$C_{20}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{20}$ alkoxy group, a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a pyridinyl group, a pyrimidinyl group, or any combination thereof;

a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterium-containing $C_2$-$C_{20}$ alkyl group, a $C_1$-$C_{20}$ alkoxy group, a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or any combination thereof; or —N($Q_1$)($Q_2$), —Si($Q_3$)($Q_4$)($Q_5$), —Ge($Q_3$)($Q_4$)($Q_5$), —B($Q_6$)($Q_7$), —P(=O)($Q_8$)($Q_9$), or —P($Q_8$)($Q_9$), and $Q_1$ to $Q_9$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CH_3$, —$CD_2CD_3$, —$CD_2CD_2H$, or —$CD_2CDH_2$; or an n-propyl group, an iso-propyl group, an n-butyl group, a sec-butyl group, an isobutyl group, a tert-butyl group, an n-pentyl group, a tert-pentyl group, a neo-pentyl group, an iso-pentyl group, a sec-pentyl group, a 3-pentyl group, a sec-iso-pentyl group, a phenyl group, a biphenyl group or a naphthyl group, each unsubstituted or substituted with deuterium, a $C_1$-$C_{10}$ alkyl group, a phenyl group, or any combination thereof, but embodiments of the present disclosure are not limited thereto.

In one or more embodiments, $R_1$ to $R_3$ and $R_{21}$ may each independently be hydrogen, deuterium, —F, a cyano group, a nitro group, —$SF_5$, —$CH_3$, —$CD_3$, —$CD_2H$, —$CDH_2$, —$CF_3$, —$CF_2H$, —$CFH_2$, a group represented by one of Formulae 9-1 to 9-66, a group represented by one of Formulae 9-1 to 9-66 in which at least one hydrogen is substituted with deuterium, a group represented by one of Formulae 10-1 to 10-118, a group represented by one of Formulae 10-1 to 10-118 in which at least one hydrogen is substituted with deuterium, a group represented by one of Formulae 10-201 to 10-342, a group represented by one of Formulae 10-201 to 10-342 in which at least one hydrogen is substituted with deuterium, —Si($Q_3$)($Q_4$)($Q_5$), or —Ge($Q_3$)($Q_4$)($Q_5$) (wherein detailed descriptions of $Q_3$ to $Q_5$ are the same as described above), but embodiments of the present disclosure are not limited thereto:

9-1
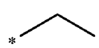

9-2
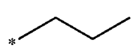

9-3
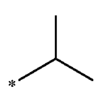

9-4
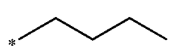

9-5
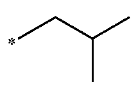

9-6
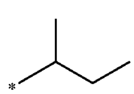

9-7
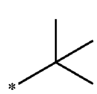

9-8
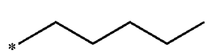

9-9
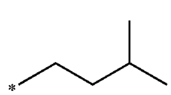

9-10
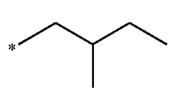

-continued 9-11
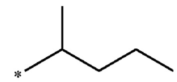

9-12
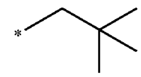

9-13
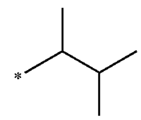

9-14
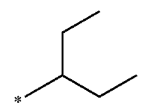

9-15
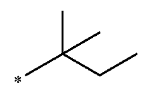

9-16
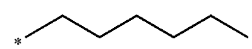

9-17
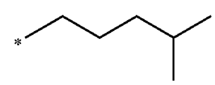

9-18
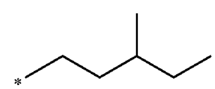

9-19
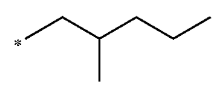

9-20
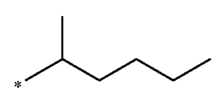

9-21
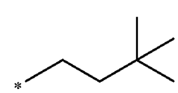

9-22
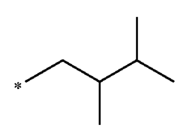

9-23
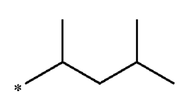

9-24
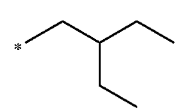

9-25
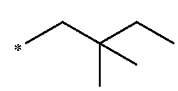

-continued
9-26
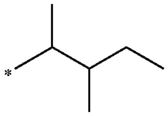
9-27
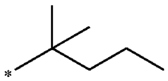
9-28
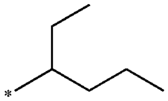
9-29
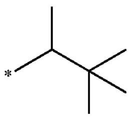
9-30
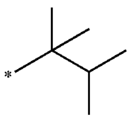
9-31
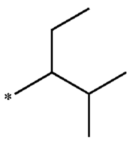
9-32
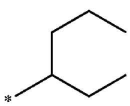
9-33
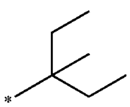
9-34
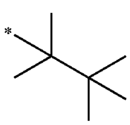
9-35
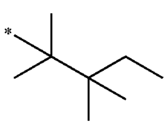
9-36
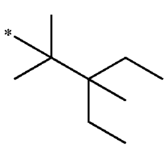
9-37
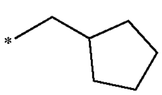
9-38
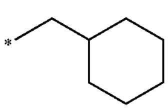
-continued
9-39
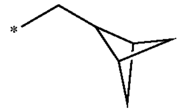
9-40
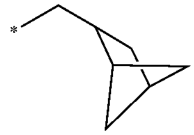
9-41
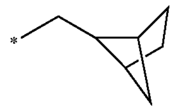
9-42
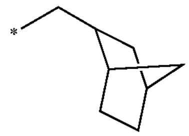
9-43
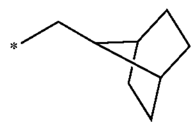
9-44
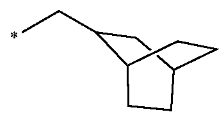
9-45
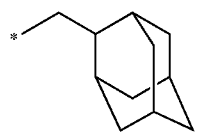
9-46
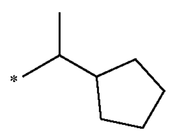
9-47
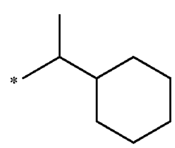
9-48
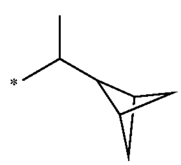
9-49
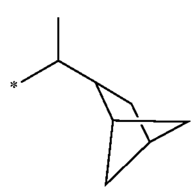

-continued
9-50
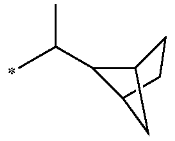
9-51
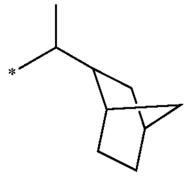
9-52
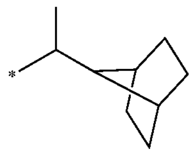
9-53
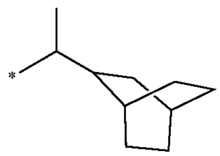
9-54
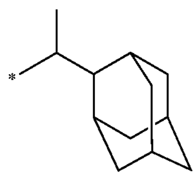
9-55
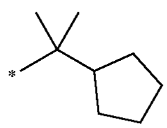
9-56
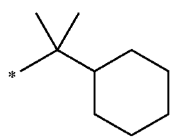
9-57
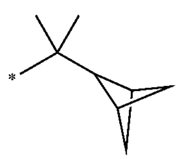
9-58
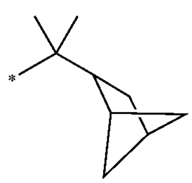
9-59
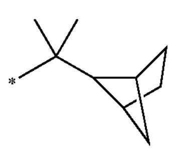
-continued
9-60
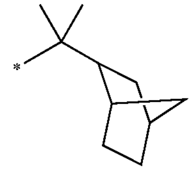
9-61
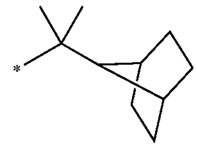
9-62
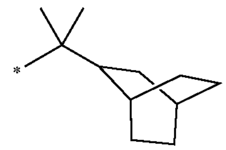
9-63
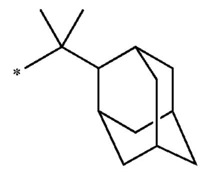
9-64
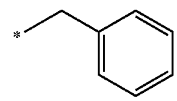
9-65
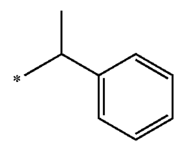
9-66
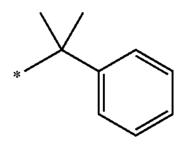
10-1
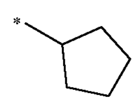
10-2
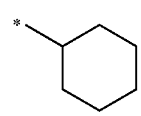
10-3
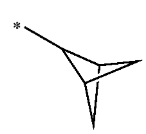
10-4
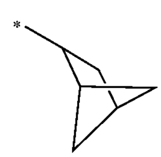

-continued
10-5
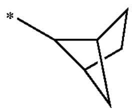
10-6
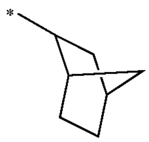
10-7
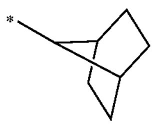
10-8
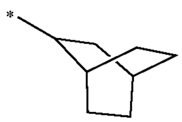
10-9
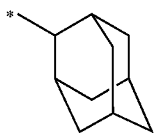
10-10
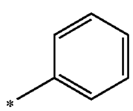
10-11
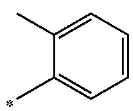
10-12
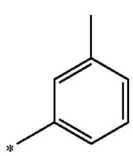
10-13
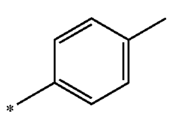
10-14
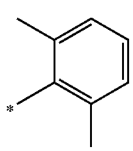
10-15
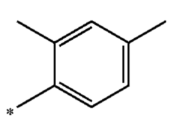
-continued
10-16
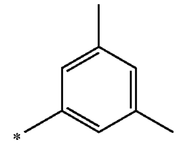
10-17
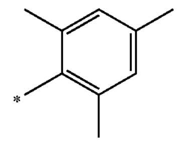
10-18
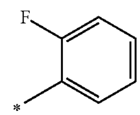
10-19
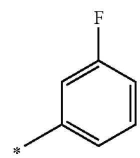
10-20
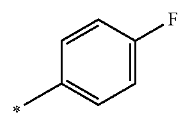
10-21
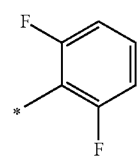
10-22
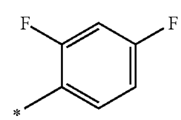
10-23
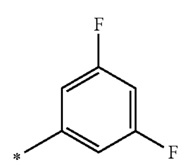
10-24
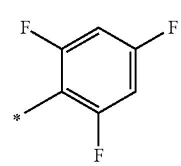
10-25
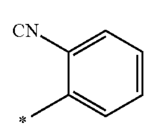

-continued
10-26
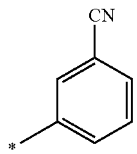
10-27
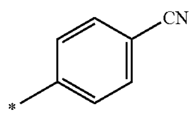
10-28
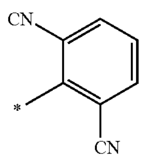
10-29
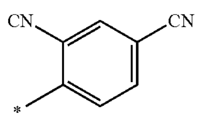
10-30
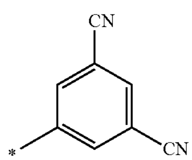
10-31
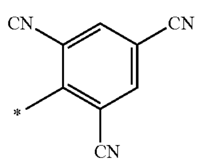
10-32
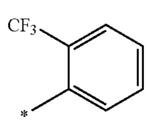
10-33
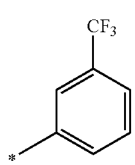
10-34
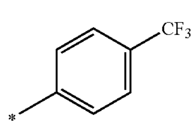
10-35
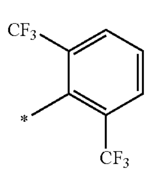
-continued
10-36
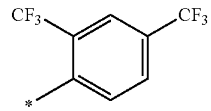
10-37
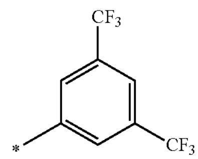
10-38
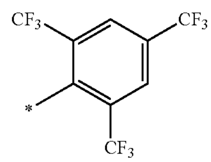
10-39
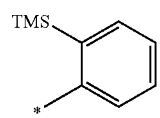
10-40
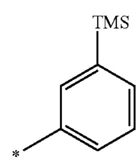
10-41
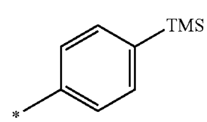
10-42
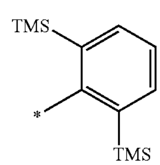
10-43
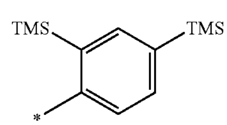
10-44
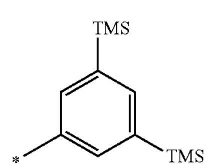
10-45
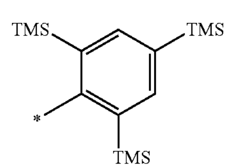

-continued
10-46
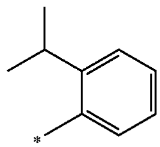
10-47
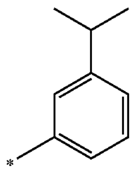
10-48
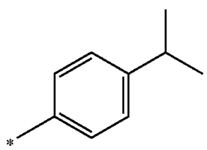
10-49
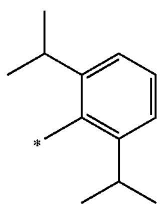
10-50
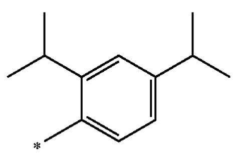
10-51
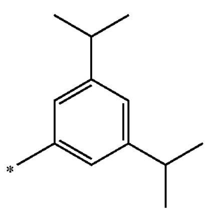
10-52
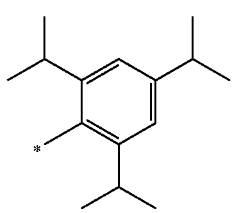
10-53
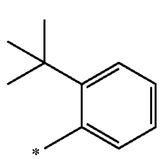
-continued
10-54
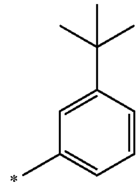
10-55
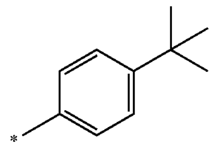
10-56
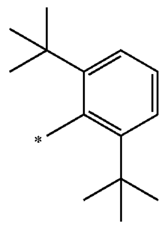
10-57
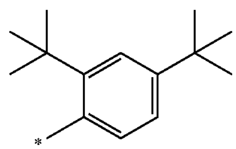
10-58
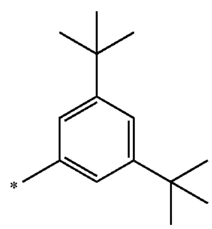
10-59
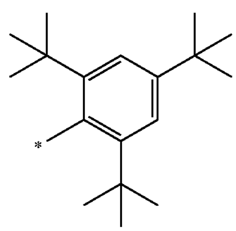
10-60
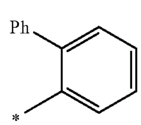
10-61
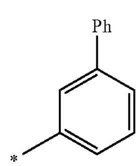

-continued
10-62
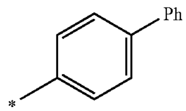
10-63
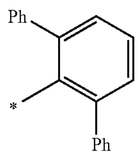
10-64
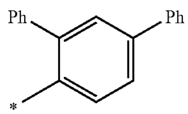
10-65
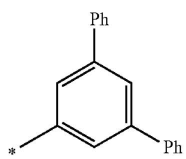
10-66
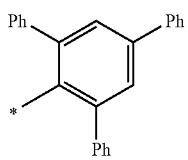
10-67
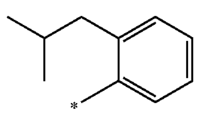
10-68
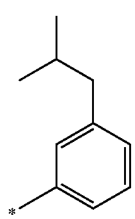
10-69
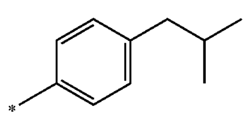
10-70
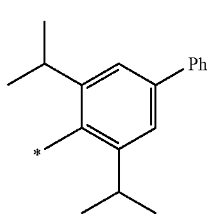
-continued
10-71
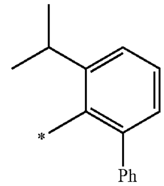
10-72
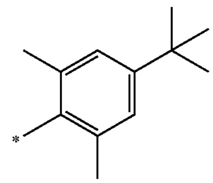
10-73
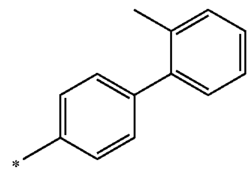
10-74
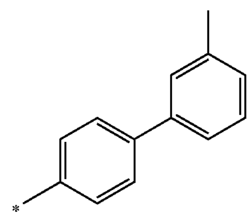
10-75
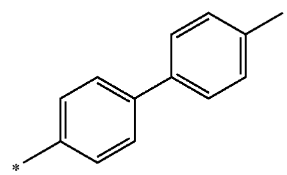
10-76
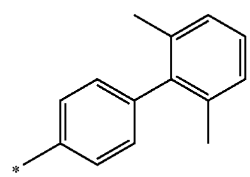
10-77
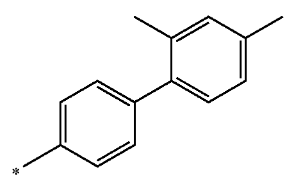
10-78
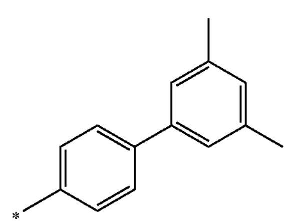

10-79
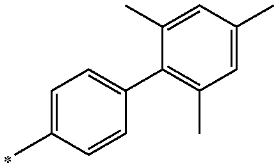
10-80
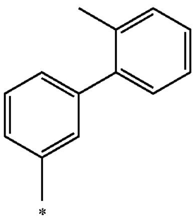
10-81
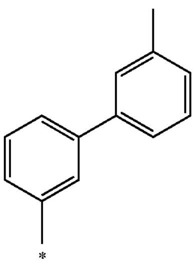
10-82
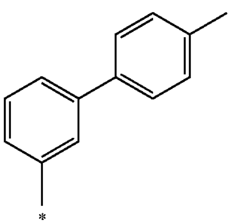
10-83
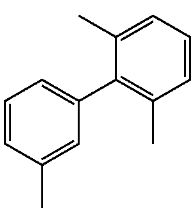
10-84
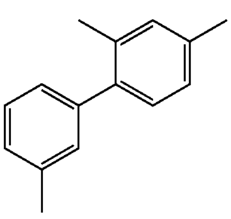
10-85
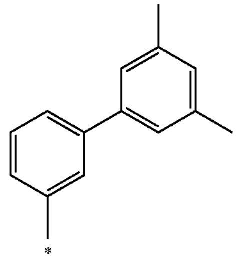
10-86
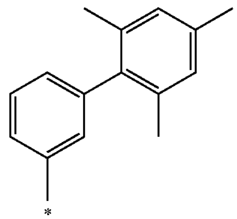
10-87
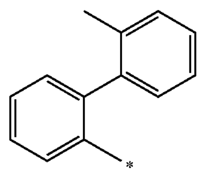
10-88
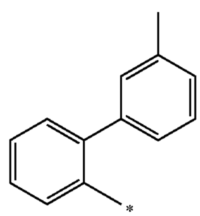
10-89
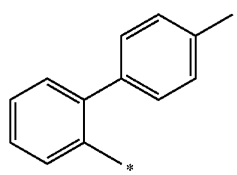
10-90
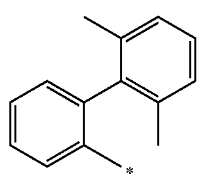
10-91
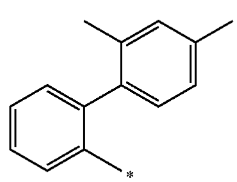

-continued
10-92
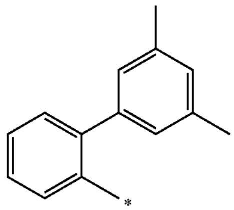
10-93
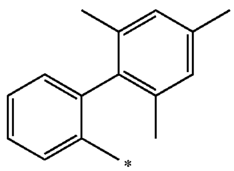
10-94
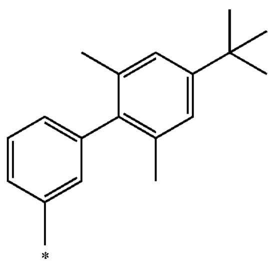
10-95
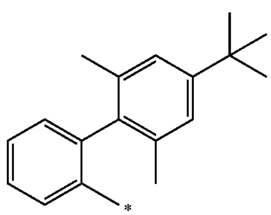
10-96
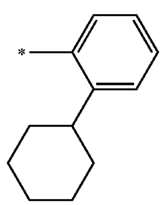
10-97
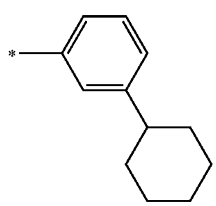
10-98
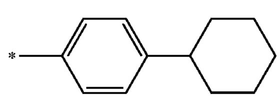
10-99
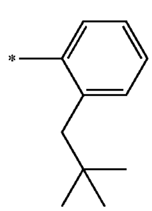
-continued
10-100
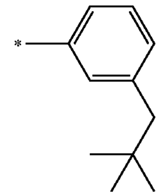
10-101
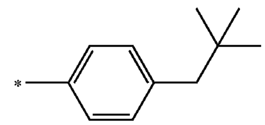
10-102
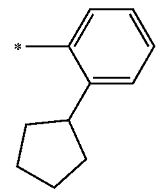
10-103
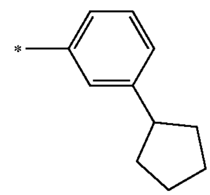
10-104
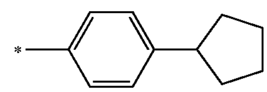
10-105
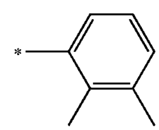
10-106
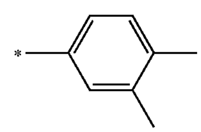
10-107
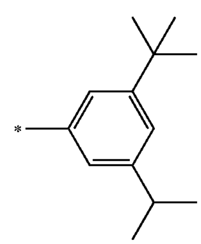
10-108
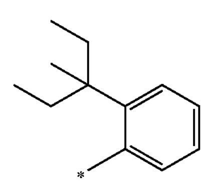

-continued
10-109
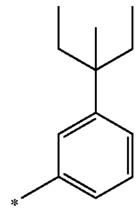
10-110
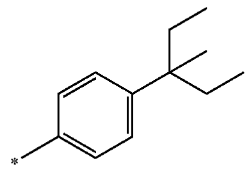
10-111
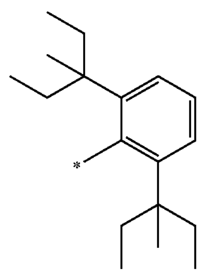
10-112
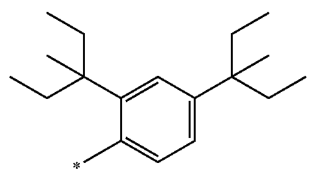
10-113
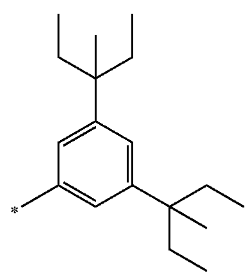
10-114
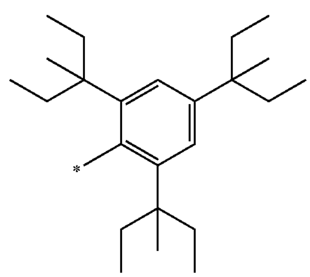
10-115
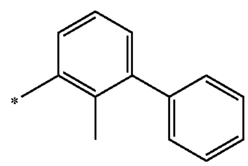
-continued
10-116
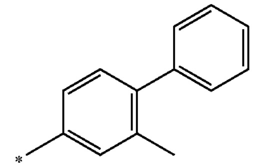
10-117
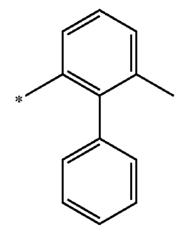
10-118
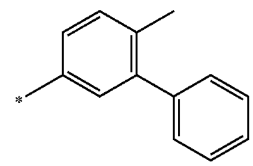
10-201
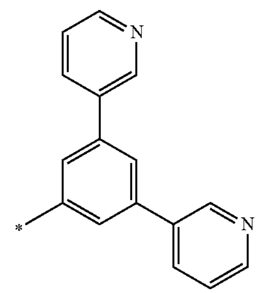
10-202
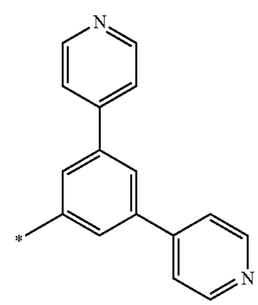
10-203
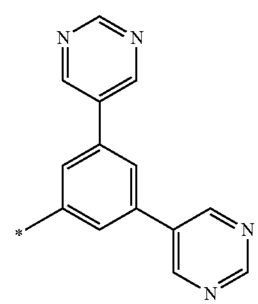

-continued
10-204
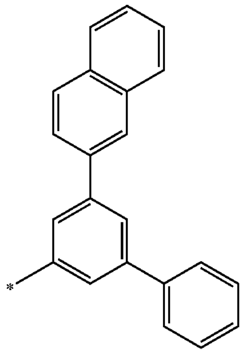
10-205
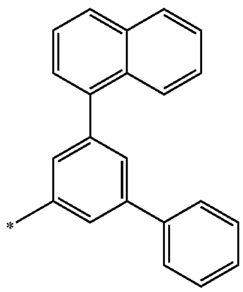
10-206
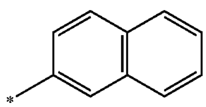
10-207
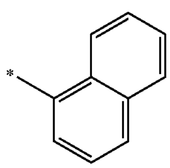
10-208
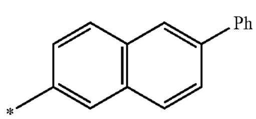
10-209
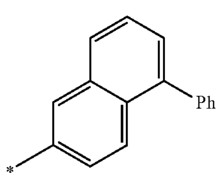
10-210
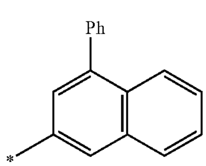
10-211
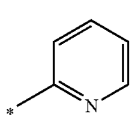
-continued
10-212
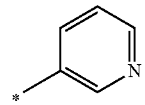
10-213
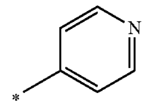
10-214
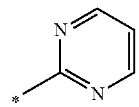
10-215
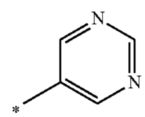
10-216
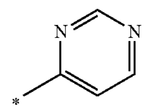
10-217
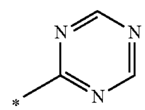
10-218
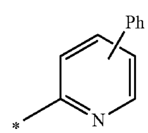
10-219
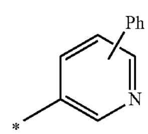
10-220
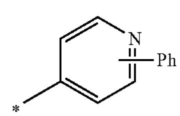
10-221
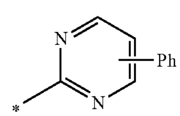
10-222
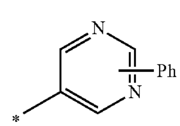
10-223
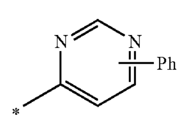

-continued
10-224
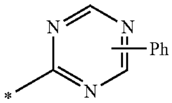
10-225
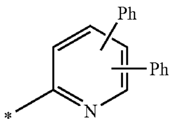
10-226
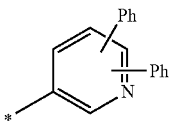
10-227
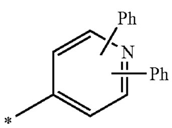
10-228
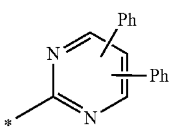
10-229
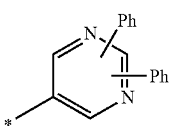
10-230
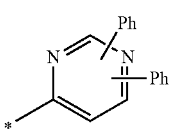
10-231
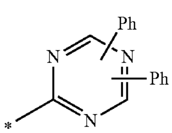
10-232
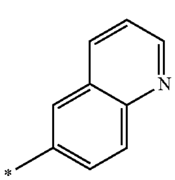
10-233
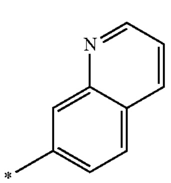
-continued
10-234
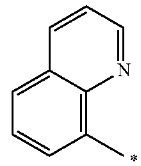
10-235
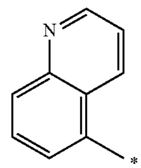
10-236
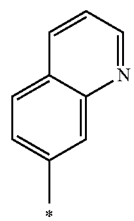
10-237
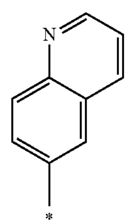
10-238
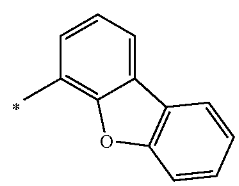
10-239
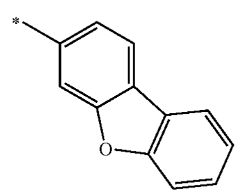
10-240
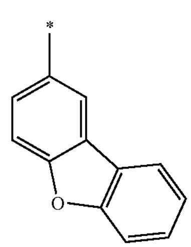

-continued
10-241
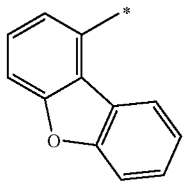
10-242
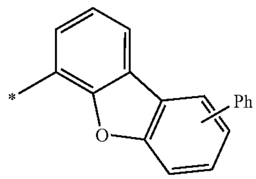
10-243
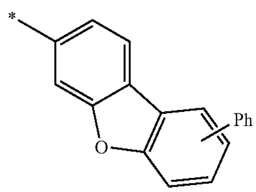
10-244
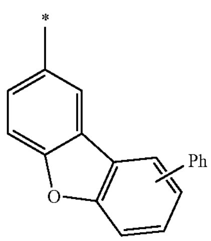
10-245
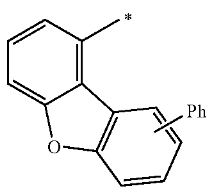
10-246
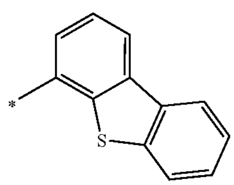
10-247
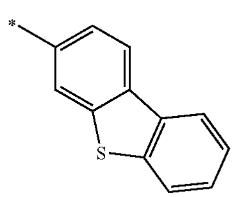
-continued
10-248
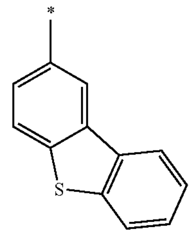
10-249
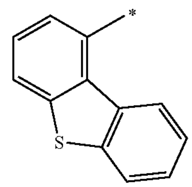
10-250
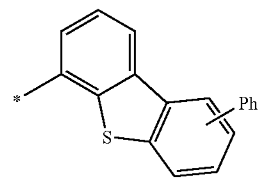
10-251
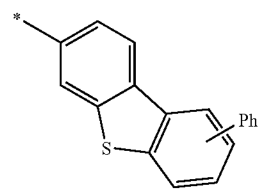
10-252
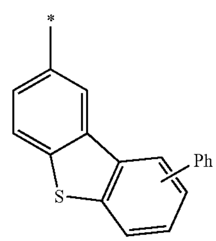
10-253
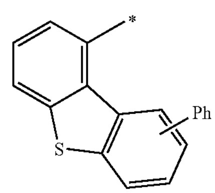
10-254
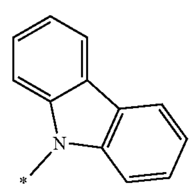

-continued
10-255
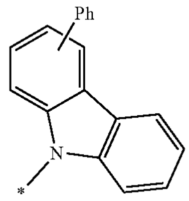
10-256
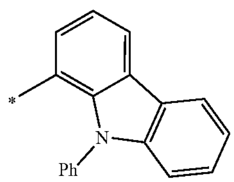
10-257
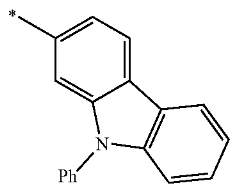
10-258
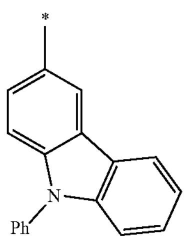
10-259
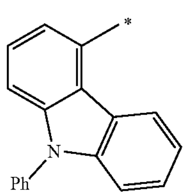
10-260
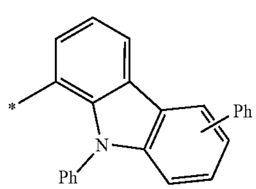
10-261
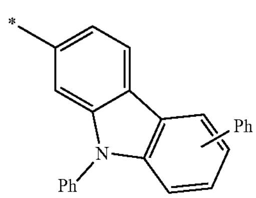
-continued
10-262
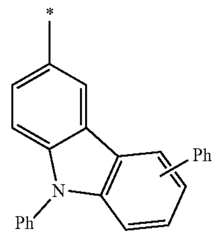
10-263
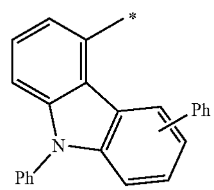
10-264
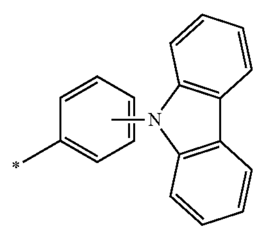
10-265
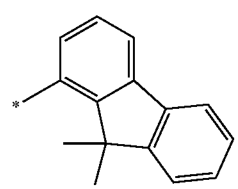
10-266
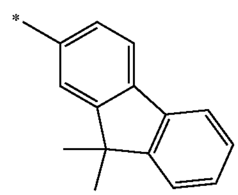
10-267
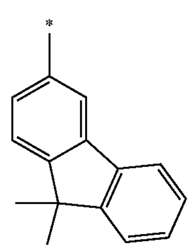
10-268
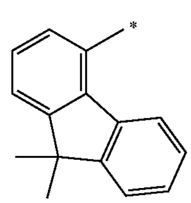

-continued
10-269
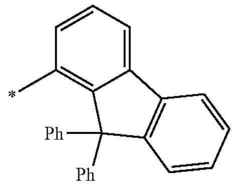
10-270
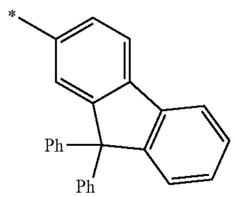
10-271
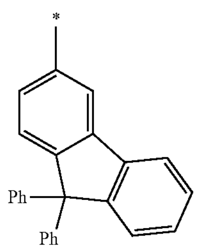
10-272
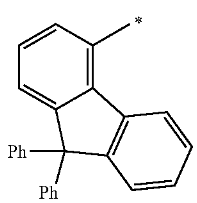
10-273
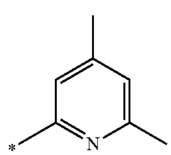
10-274
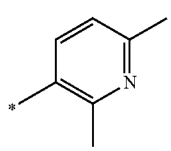
10-275
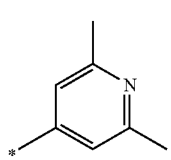
10-276
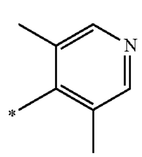
-continued
10-277
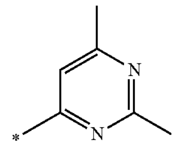
10-278
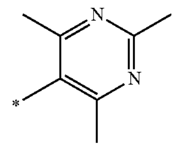
10-279
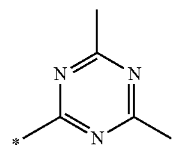
10-280
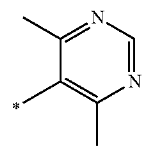
10-281
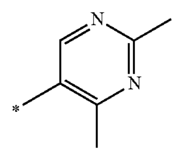
10-282
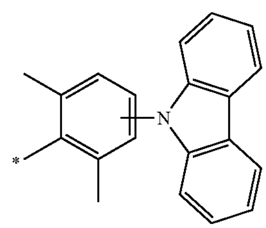
10-283
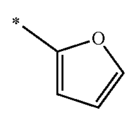
10-284
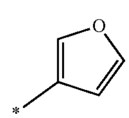
10-285
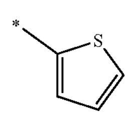
10-286
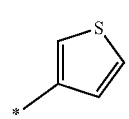

10-287
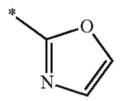
10-288
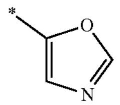
10-289
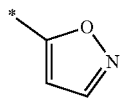
10-290
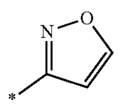
10-291
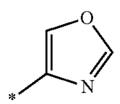
10-292
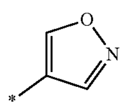
10-293
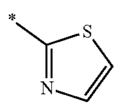
10-294
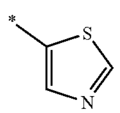
10-295
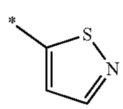
10-296
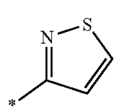
10-297
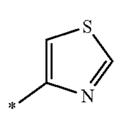
10-298
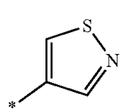
10-299
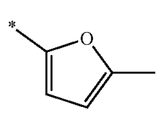
10-300
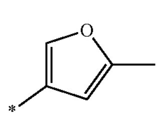
-continued
10-301
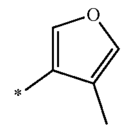
10-302
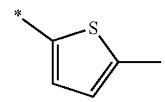
10-303
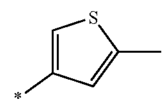
10-304
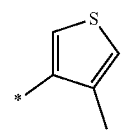
10-305
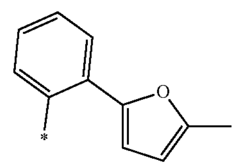
10-306
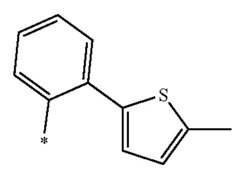
10-307
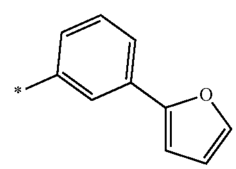
10-308
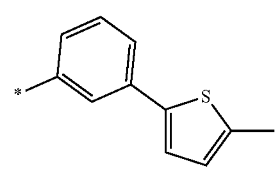
10-309
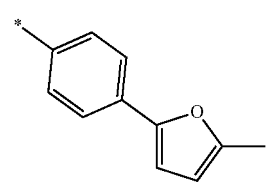
10-310
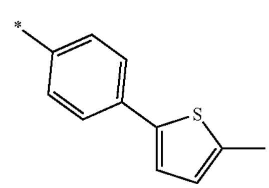

-continued
10-311
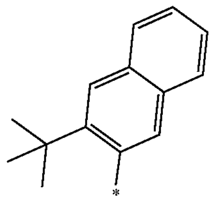
10-312
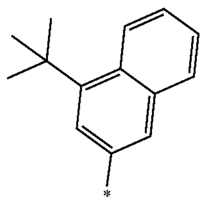
10-313
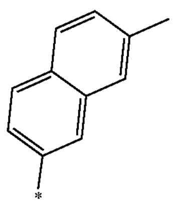
10-314
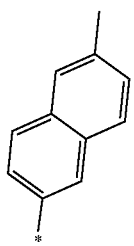
10-315
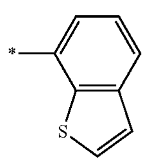
10-316
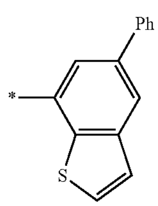
10-317
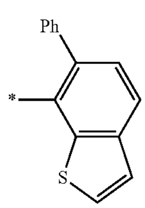
10-318
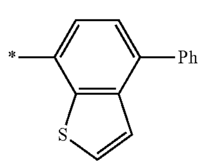
-continued
10-319
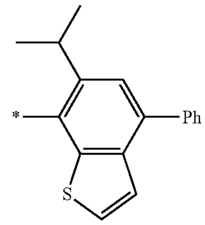
10-320
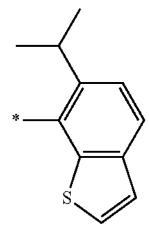
10-321
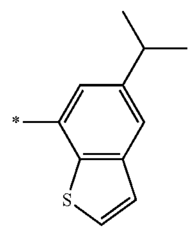
10-322
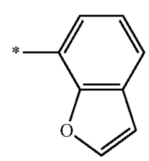
10-323
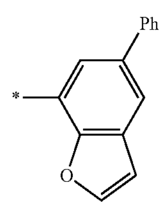
10-324
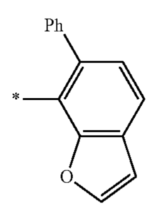
10-325
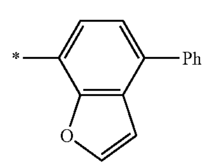

-continued
10-326
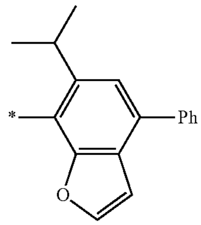
10-327
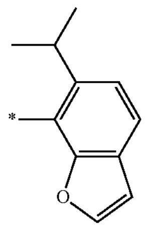
10-328
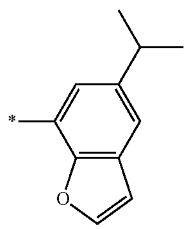
10-329
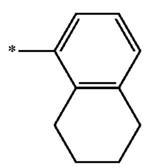
10-330
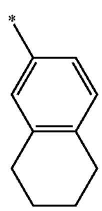
10-331
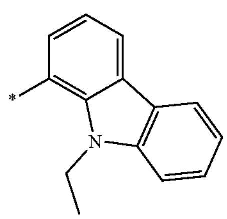
10-332
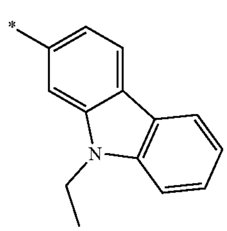
-continued
10-333
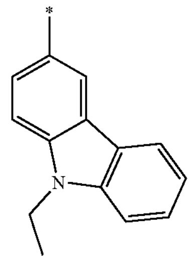
10-334
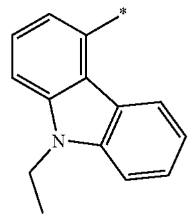
10-335
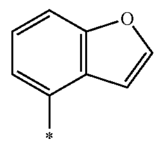
10-336
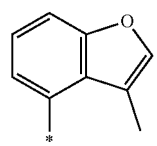
10-337
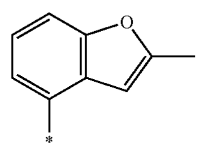
10-338
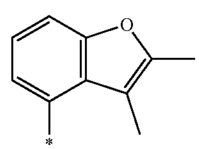
10-339
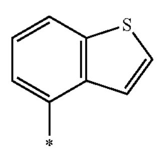
10-340
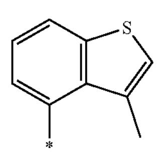
10-341
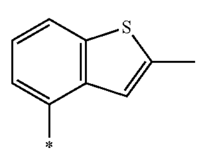

10-342

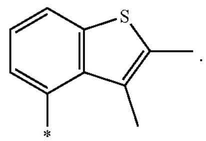

In Formulae 9-1 to 9-66, 10-1 to 10-118 and 10-201 to 10-342, * indicates a binding site to a neighboring atom, Ph indicates a phenyl group, or TMS indicates a trimethylsilyl group.

In an exemplary embodiment, Formula 9-33 may be a branched $C_6$ alkyl group and a tert-butyl group substituted with two methyl groups.

The "group represented by one of Formulae 9-1 to 9-66 in which at least one hydrogen is substituted with deuterium" may be, for example, a group represented by one of Formulae 9-501 to 9-514 and 9-601 to 9-638:

9-501

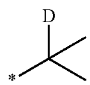

9-502

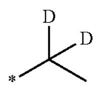

9-503

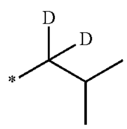

9-504

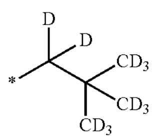

9-505

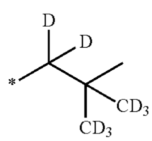

9-506

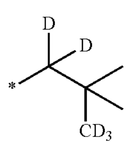

9-507

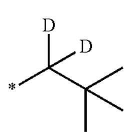

9-508

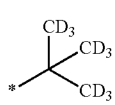

9-509

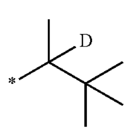

9-510

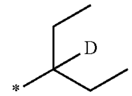

9-511

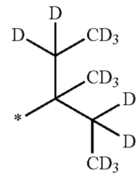

9-512

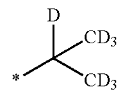

9-513

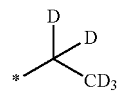

9-514

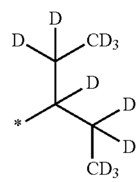

9-601

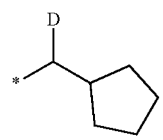

9-602

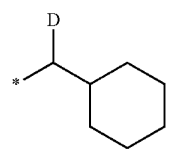

9-603

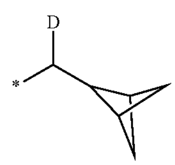

9-604

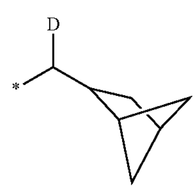

9-605

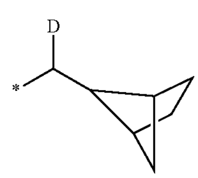

-continued
9-606
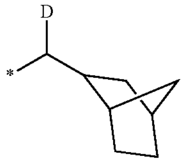
9-607
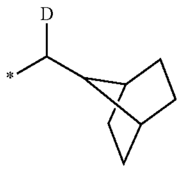
9-608
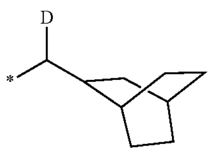
9-609
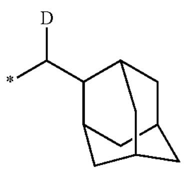
9-610
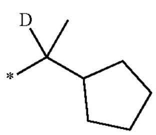
9-611
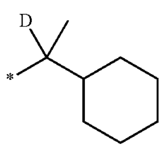
9-612
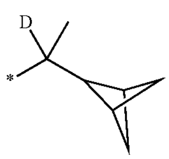
9-613
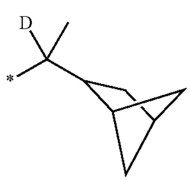
9-614
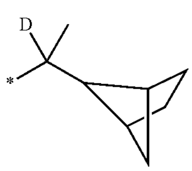
-continued
9-615
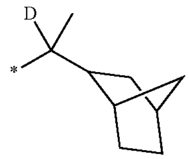
9-616
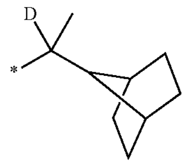
9-617
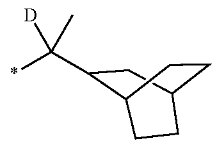
9-618
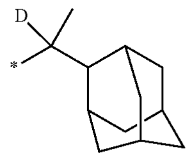
9-619
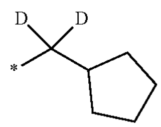
9-620
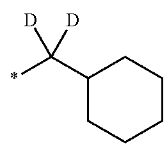
9-621
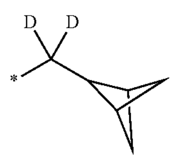
9-622
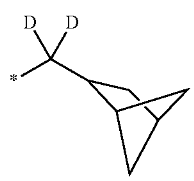
9-623
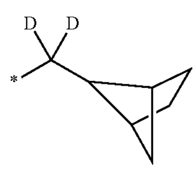
9-624
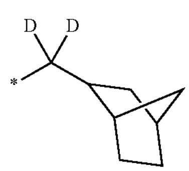

-continued
9-625
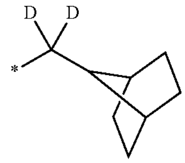
9-626
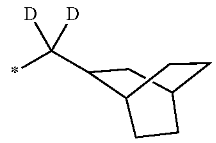
9-627
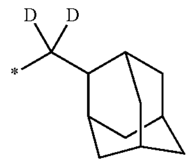
9-628
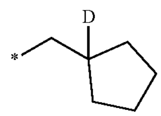
9-629
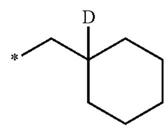
9-630
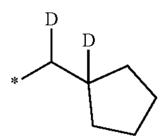
9-631
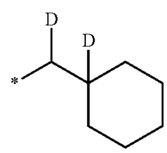
9-632
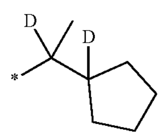
9-633
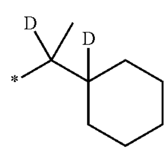
9-634
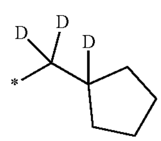
9-635
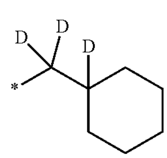
-continued
9-636
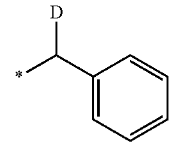
9-637
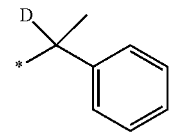
9-638
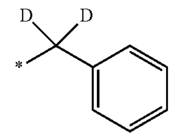
The "group represented by one of Formulae 10-1 to 10-118 in which at least one hydrogen is substituted with deuterium" may be, for example, a group represented by one of Formulae 10-501 to 10-546:
10-501
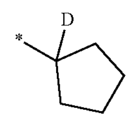
10-502
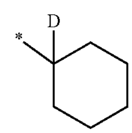
10-503
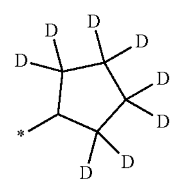
10-504
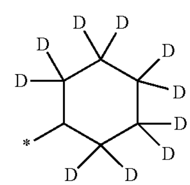
10-505
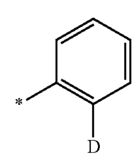
10-506
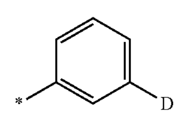

-continued
10-507
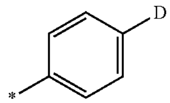
10-508
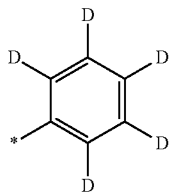
10-509
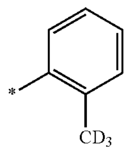
10-510
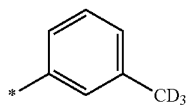
10-511
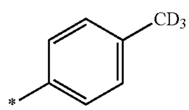
10-512
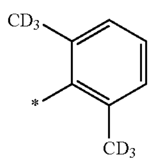
10-513
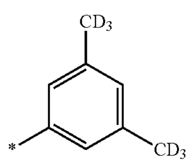
10-514
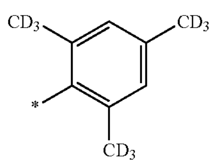
10-515
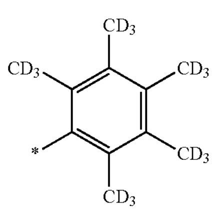
10-516
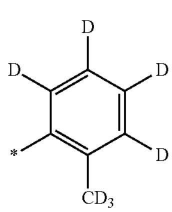
-continued
10-517
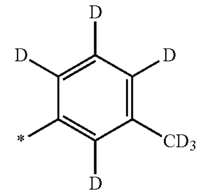
10-518
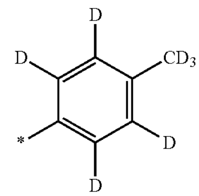
10-519
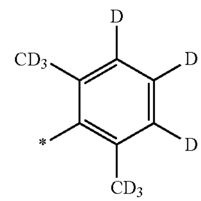
10-520
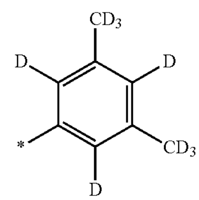
10-521
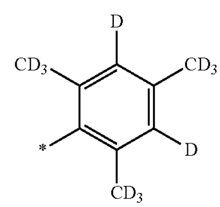
10-522
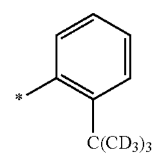
10-523
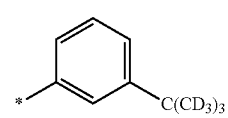
10-524
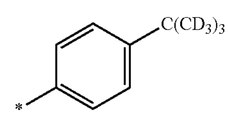
10-525
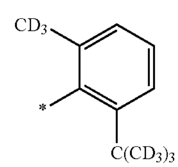

-continued
10-526
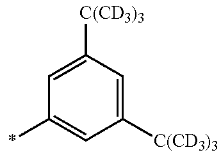
10-527
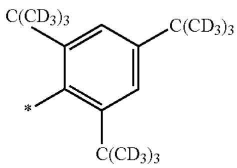
10-528
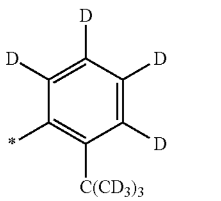
10-529
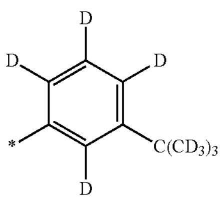
10-530
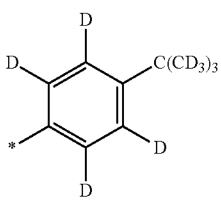
10-531
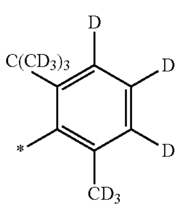
10-532
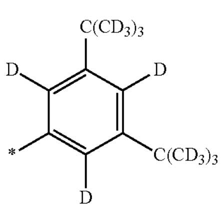
10-533
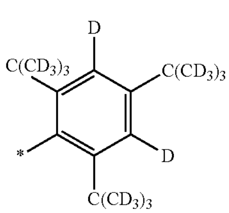
-continued
10-534
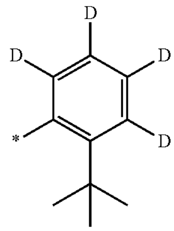
10-535
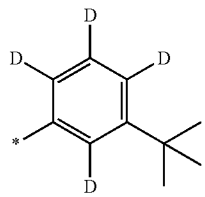
10-536
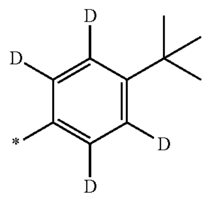
10-537
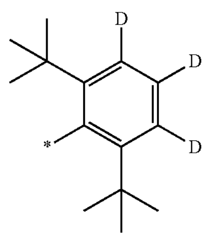
10-538
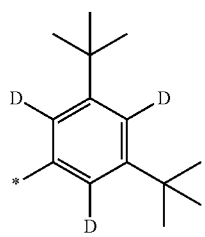
10-540
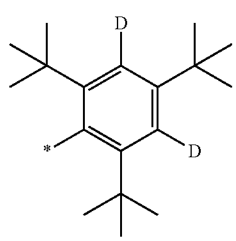
10-541
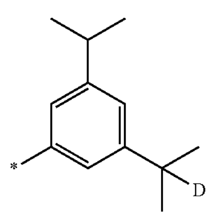

-continued 10-542

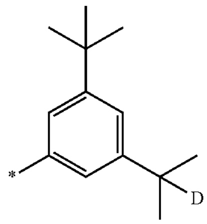

10-543

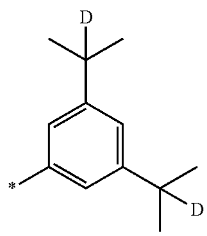

10-544

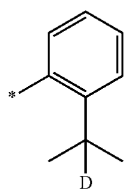

10-545

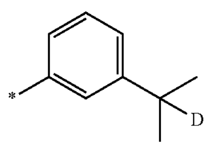

10-546

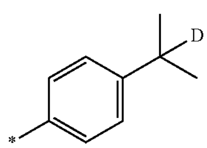

In Formula 2, a1 and a21 each indicate the number of groups $R_1$ and the number of groups $R_{21}$, respectively, and may each independently be an integer from 0 to 20. When a1 is 2 or more, two or more groups $R_1$ may be identical to or different from each other, and when a21 is 2 or more, two or more groups $R_{21}$ may be identical to or different from each other. For example, a1 and a21 may each independently be an integer from 0 to 10, but embodiments of the present disclosure are not limited thereto.

In an embodiment, i) two or more of a plurality of groups $R_1$ in Formula 2 may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, ii) two or more of a plurality of groups $R_{21}$ in Formula 2 may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, or iii) two or more of $R_1$ to $R_3$ and $R_{21}$ in Formula 2 may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$. Here, "a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$" may be, for example, an adamantane group, a norbornane group, a norbornene group, a bicyclo[1.1.1]pentane group, a bicyclo[2.1.1]hexane group, a bicyclo[2.2.1]heptane group, a bicyclo[2.2.2]octane group, a cyclopentane group, a cyclohexane group, a cycloheptane group, a cyclopentene group, a cyclohexene group, a cycloheptene group, a benzene group, a naphthalene group, an anthracene group, a phenanthrene group, a triphenylene group, a pyrene group, a chrysene group, a 1,2,3,4-tetrahydronaphthalene group, a pyrrole group, a borole group, a phosphole group, a cyclopentadiene group, a silole group, a germole group, a thiophene group, a selenophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a benzoquinoline group, a benzoisoquinoline group, a quinoxaline group, a quinazoline group, a phenanthroline group, a pyrazole group, an imidazole group, a triazole group, an azaborole group, an azaphosphole group, an azacyclopentadiene group, an azasilole group, an azagermole group, an azaselenophene group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group, each unsubstituted or substituted with at least one $R_{10a}$.

Non-limiting examples of the $C_1$-$C_{60}$ alkyl group, the $C_1$-$C_{20}$ alkyl group, and/or the $C_1$-$C_{10}$ alkyl group include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, or a tert-decyl group, each unsubstituted or substituted with a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, or any combination thereof, and the like, but embodiments of the present disclosure are not limited thereto.

Non-limiting examples of the $C_1$-$C_{60}$ alkoxy group, $C_1$-$C_{20}$ alkoxy group and/or $C_1$-$C_{10}$ alkoxy group include a methoxy group, an ethoxy group, a propoxy group, a butoxy group, or a pentoxy group, and the like, but embodiments of the present disclosure are not limited thereto.

Non-limiting examples of the $C_3$-$C_{10}$ cycloalkyl group include a cyclopropyl group, a cyclobutyl group, a cyclopentyl group, a cyclohexyl group, a cycloheptyl group, a cyclooctyl group, an adamantanyl group, a norbornanyl group, a bicyclo[1.1.1]pentyl group, a bicyclo[2.1.1]hexyl group, a bicyclo[2.2.1]heptyl group, a bicyclo[2.2.2]octyl group, and the like, but embodiments of the present disclosure are not limited thereto.

In Formula 2, * and *' each indicate a binding site to M in Formula 1.

In an embodiment, a group represented by

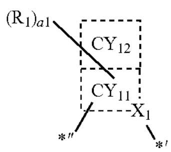

in Formula 2 may be a group represented by one of Formulae CY1-1 to CY1-69:

CY1-1

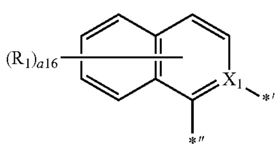

CY1-2

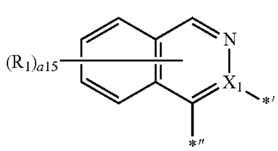

CY1-3

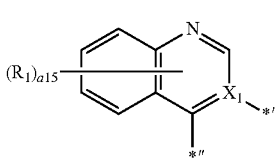

CY1-4

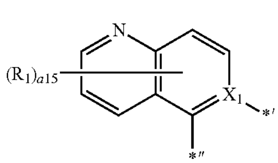

CY1-5

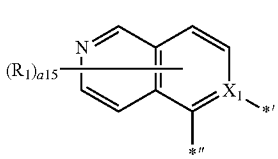

-continued

CY1-6

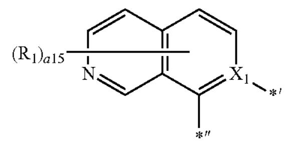

CY1-7

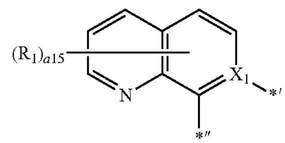

CY1-8

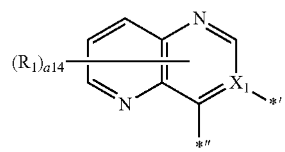

CY1-9

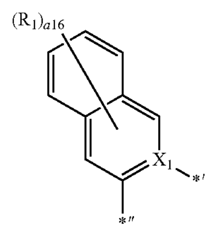

CY1-10

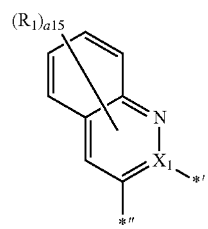

CY1-11

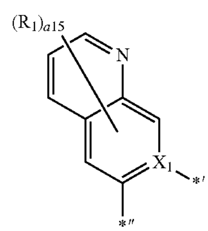

CY1-12

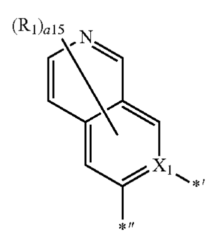

CY1-13

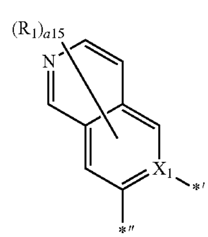

-continued
CY1-14
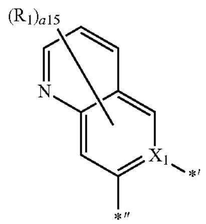
CY1-15
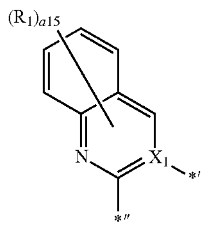
CY1-16
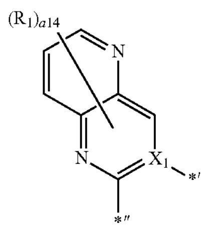
CY1-17
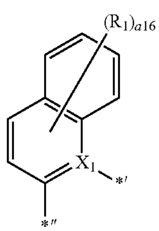
CY1-18
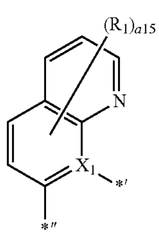
CY1-19
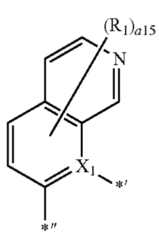
CY1-20
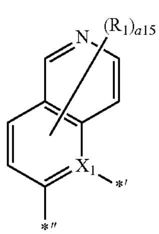
-continued
CY1-21
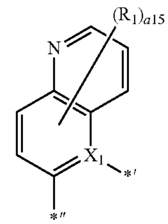
CY1-22
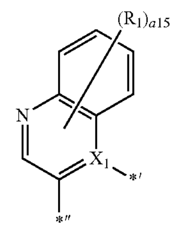
CY1-23
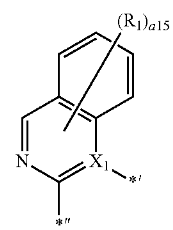
CY1-24
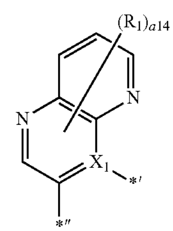
CY1-25
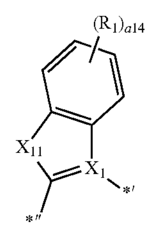
CY1-26
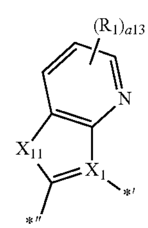
CY1-27
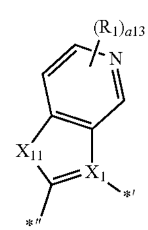

-continued
CY1-28
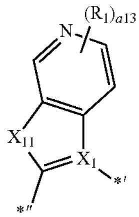
CY1-29
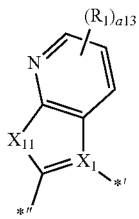
CY1-30
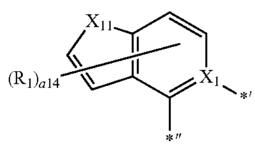
CY1-31
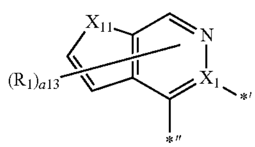
CY1-32
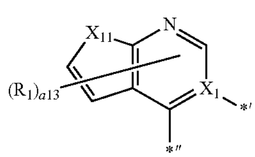
CY1-33
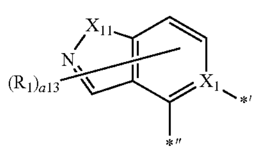
CY1-34
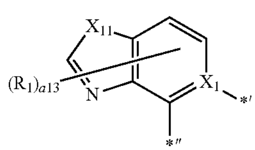
CY1-35
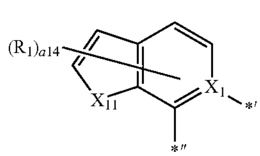
CY1-36
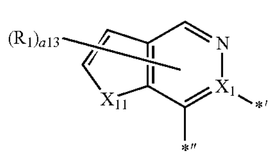
-continued
CY1-37
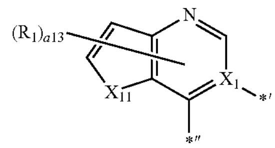
CY1-38
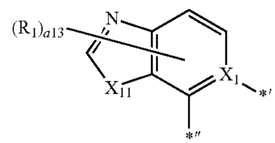
CY1-39
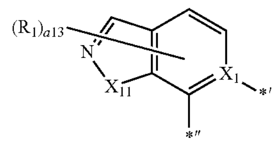
CY1-40
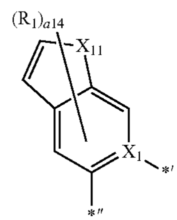
CY1-41
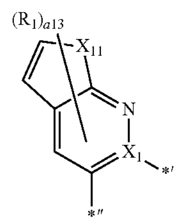
CY1-42
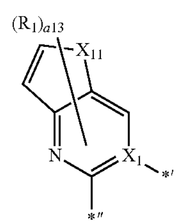
CY1-43
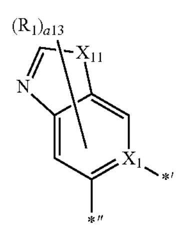
CY1-44
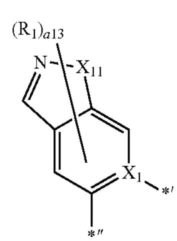

-continued
CY1-45
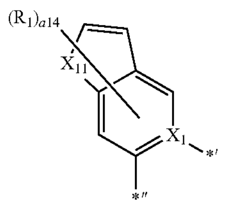
CY1-46
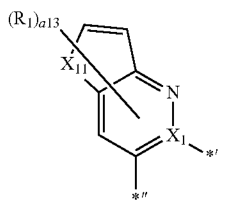
CY1-47
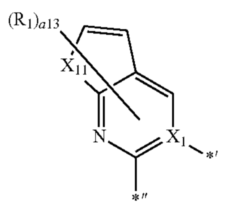
CY1-48
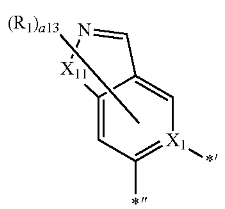
CY1-49
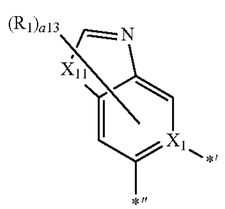
CY1-50
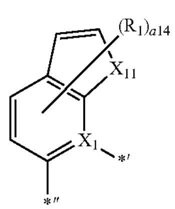
CY1-51
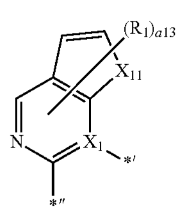
-continued
CY1-52
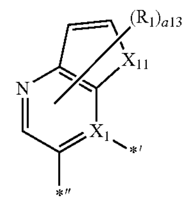
CY1-53
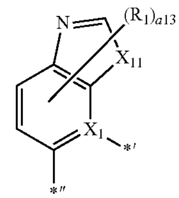
CY1-54
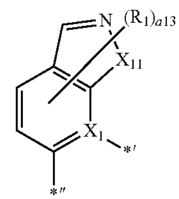
CY1-55
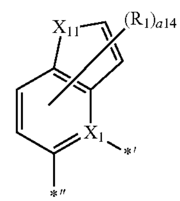
CY1-56
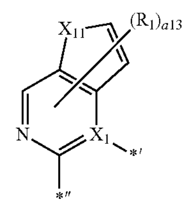
CY1-57
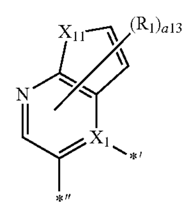
CY1-58
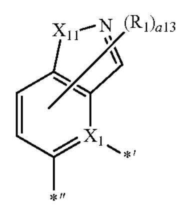
CY1-59
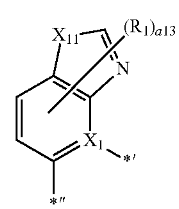

-continued

CY1-60

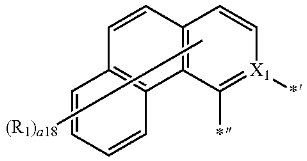

CY1-61

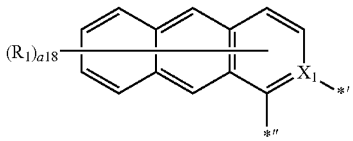

CY1-62

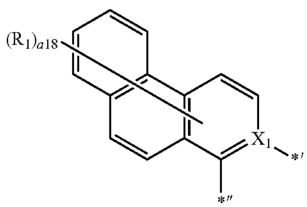

CY1-63

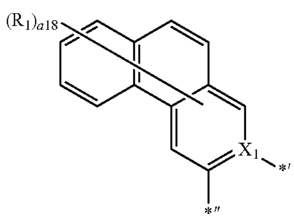

CY1-64

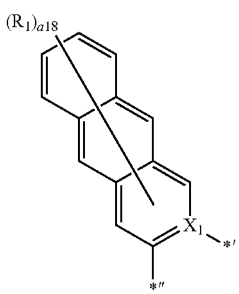

CY1-65

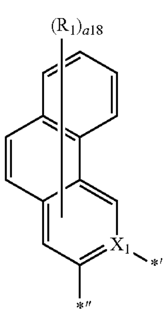

-continued

CY1-66

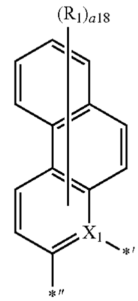

CY1-67

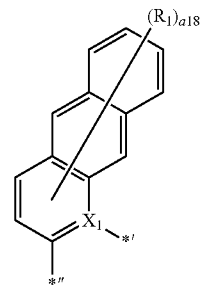

CY1-68

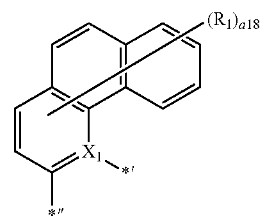

CY1-69

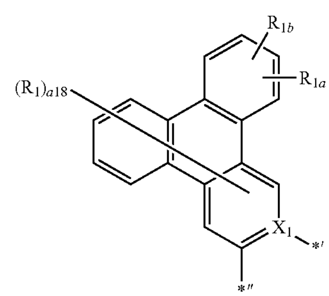

In Formulae CY1-1 to CY1-69, $X_1$ and $R_1$ are the same as described above, $X_{11}$ may be O, S, Se, $N(R_{19})$, $C(R_{19a})(R_{19b})$, or $Si(R_{19a})(R_{19b})$, $R_{19}$, $R_{19a}$, $R_{19b}$, $R_{1a}$ and $R_{1b}$ may each be the same as defined in connection with $R_1$, a18 may be an integer from 0 to 8, a16 may be an integer from 0 to 6, a15 may be an integer from 0 to 5, a14 may be an integer from 0 to 4, a13 may be an integer from 0 to 3,

*" indicates a binding site to $T_1$ in Formula 2, and

*' indicates a binding site to M in Formula 1.

In one or more embodiments, a group represented by
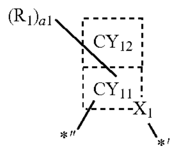
in Formula 2 may be a group represented by one of Formulae CY1(1) to CY1(165):
CY1(1)
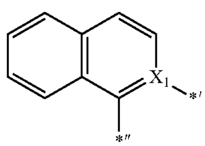
CY1(2)
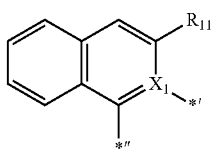
CY1(3)
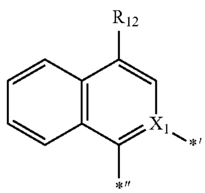
CY1(4)
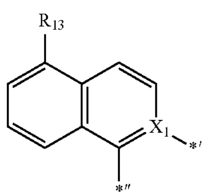
CY1(5)
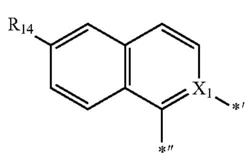
CY1(6)
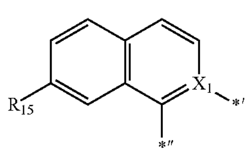
CY1(7)
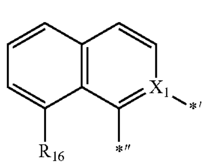
-continued
CY1(8)
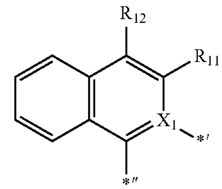
CY1(9)
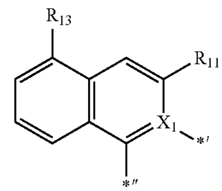
CY1(10)
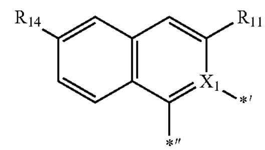
CY1(11)
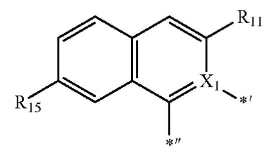
CY1(12)
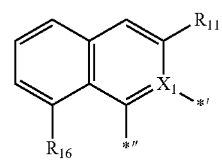
CY1(13)
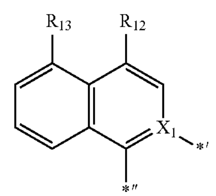
CY1(14)
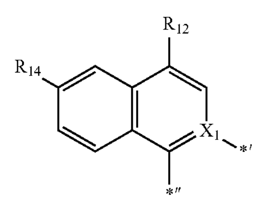
CY1(15)
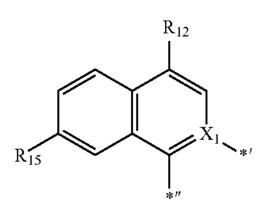

-continued
CY1(16)
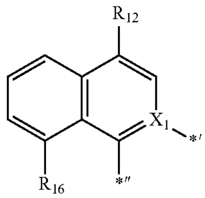
CY1(17)
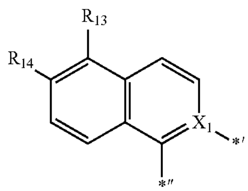
CY1(18)
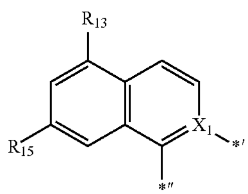
CY1(19)
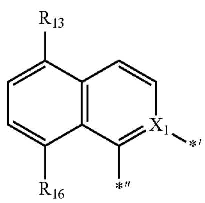
CY1(20)
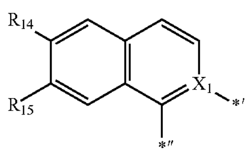
CY1(21)
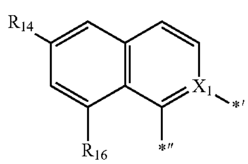
CY1(22)
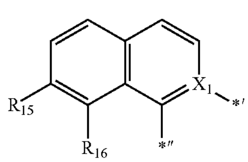
CY1(23)
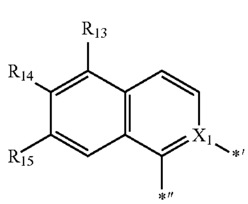
-continued
CY1(24)
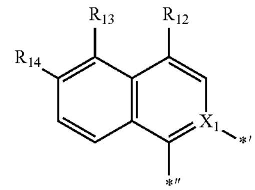
CY1(25)
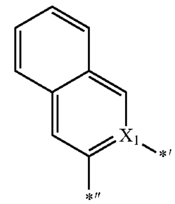
CY1(26)
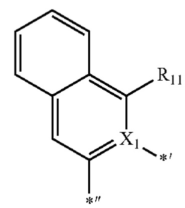
CY1(27)
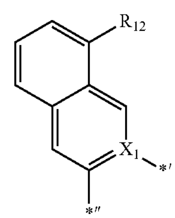
CY1(28)
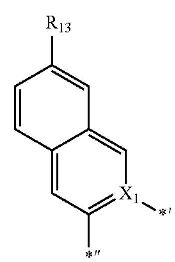
CY1(29)
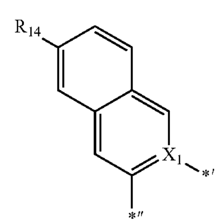
CY1(30)
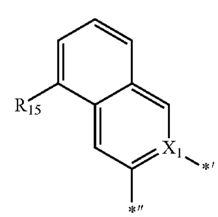

-continued
CY1(31)
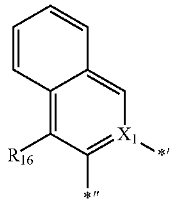
CY1(32)
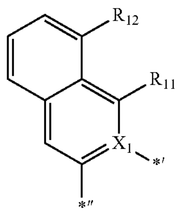
CY1(33)
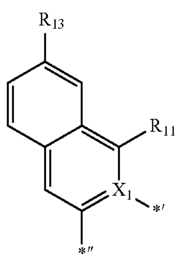
CY1(34)
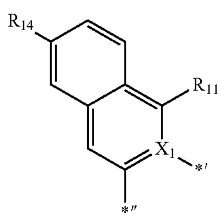
CY1(35)
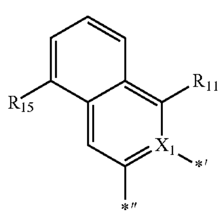
CY1(36)
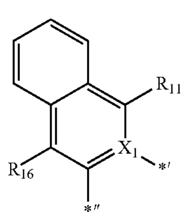
CY1(37)
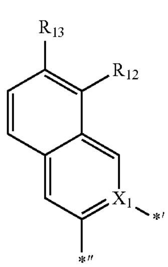
-continued
CY1(38)
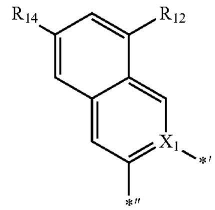
CY1(39)
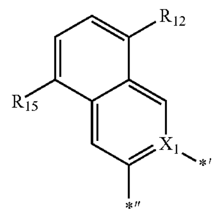
CY1(40)
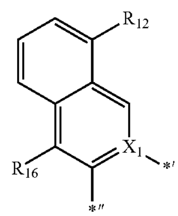
CY1(41)
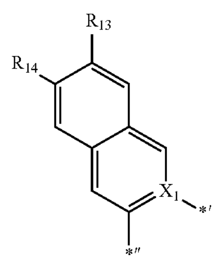
CY1(42)
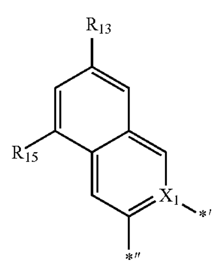
CY1(43)
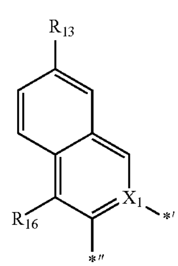

-continued
CY1(44)
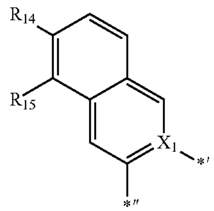
CY1(45)
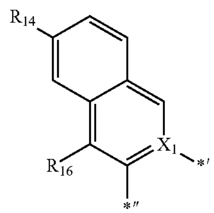
CY1(46)
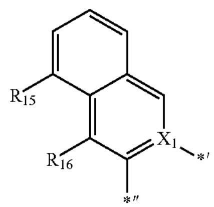
CY1(47)
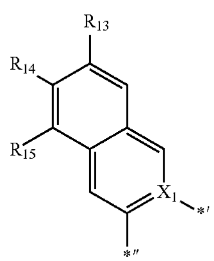
CY1(48)
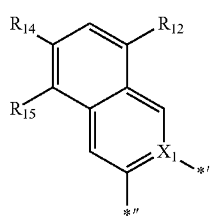
CY1(49)
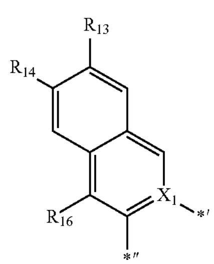
CY1(50)
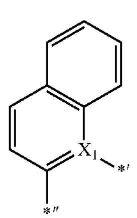
-continued
CY1(51)
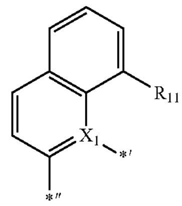
CY1(52)
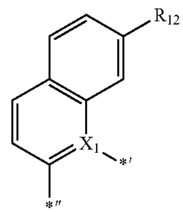
CY1(53)
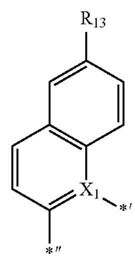
CY1(54)
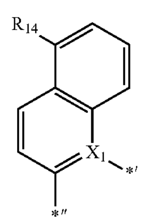
CY1(55)
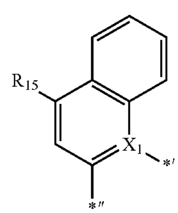
CY1(56)
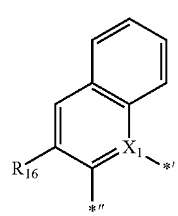
CY1(57)
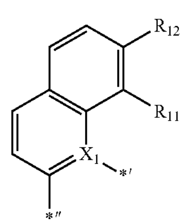

-continued
CY1(58)
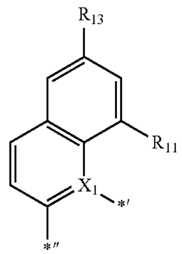
CY1(59)
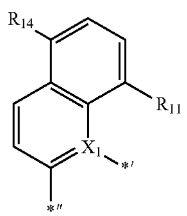
CY1(60)
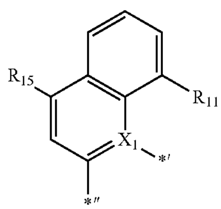
CY1(61)
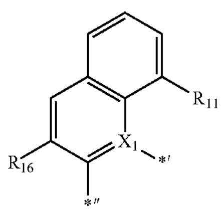
CY1(62)
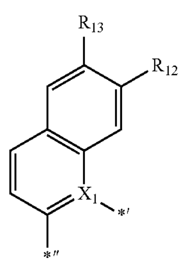
CY1(63)
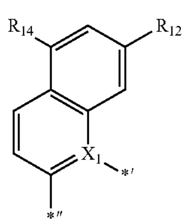
CY1(64)
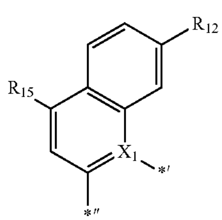
-continued
CY1(65)
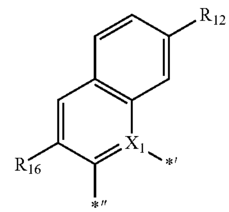
CY1(66)
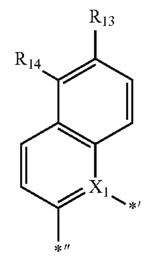
CY1(67)
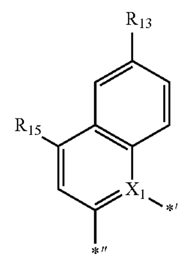
CY1(68)
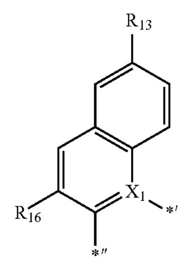
CY1(69)
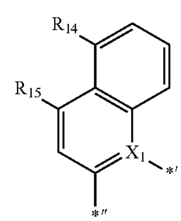
CY1(70)
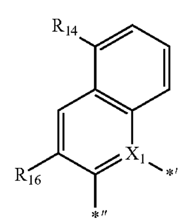
CY1(71)
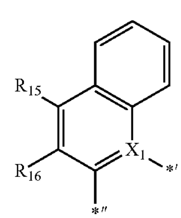

CY1(72)
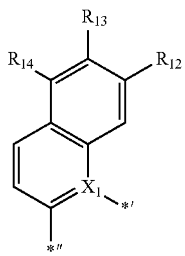
CY1(73)
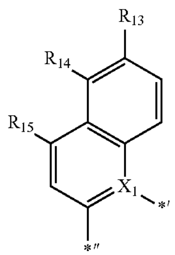
CY1(74)
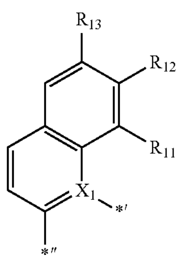
CY1(75)
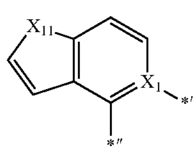
CY1(76)
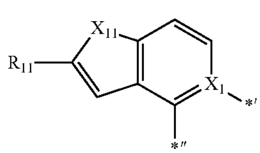
CY1(77)
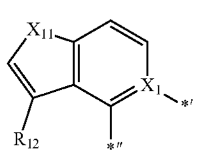
CY1(78)
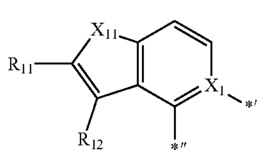
CY1(79)
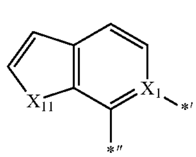
CY1(80)
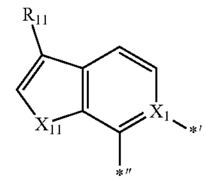
CY1(81)
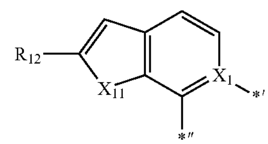
CY1(82)
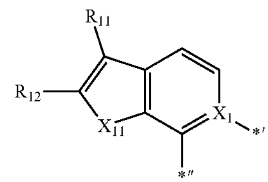
CY1(83)
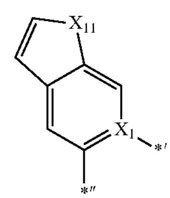
CY1(84)
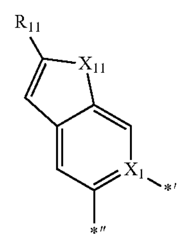
CY1(85)
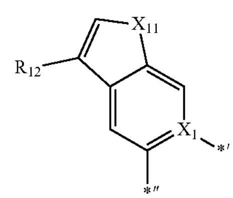
CY1(86)
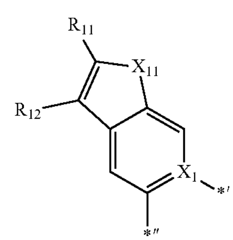
CY1(87)
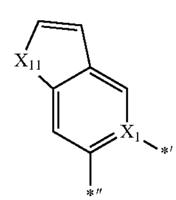

-continued
CY1(88)
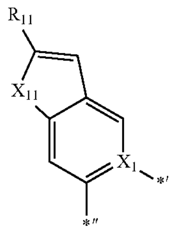
CY1(89)
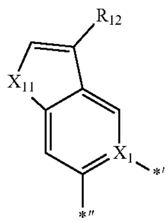
CY1(90)
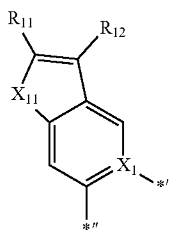
CY1(91)
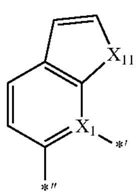
CY1(92)
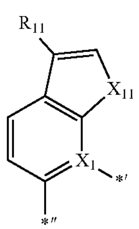
CY1(93)
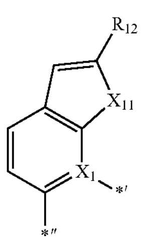
CY1(94)
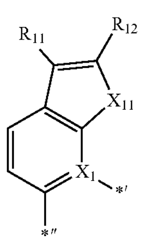
-continued
CY1(95)
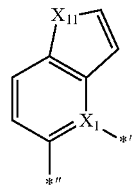
CY1(96)
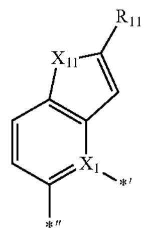
CY1(97)
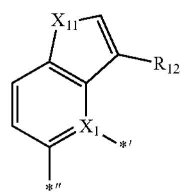
CY1(98)
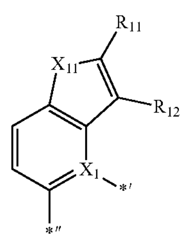
CY1(99)
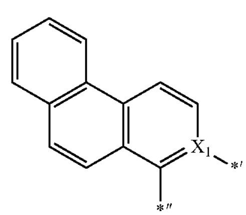
CY1(100)
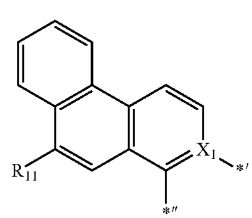
CY1(101)
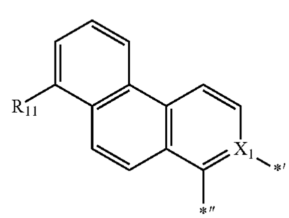

CY1(102)
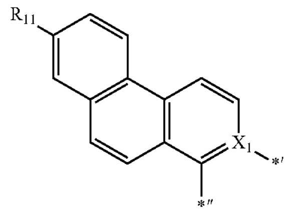
CY1(103)
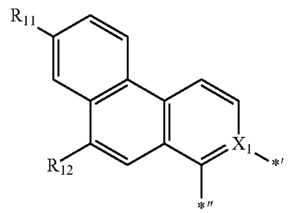
CY1(104)
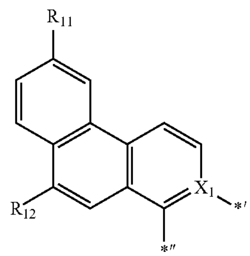
CY1(105)
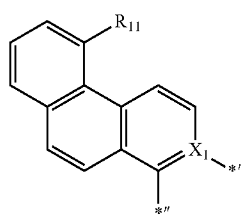
CY1(106)
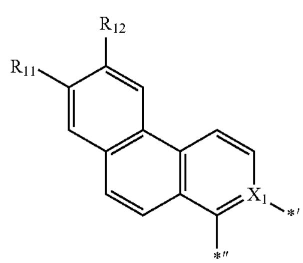
CY1(107)
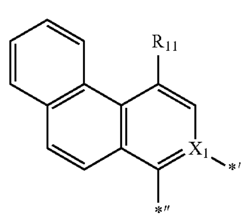
CY1(108)
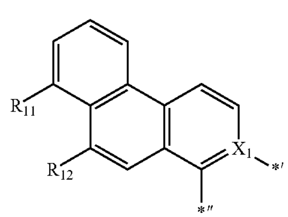
CY1(109)
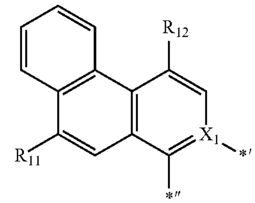
CY1(110)
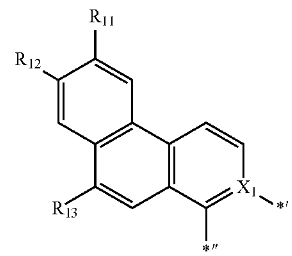
CY1(111)
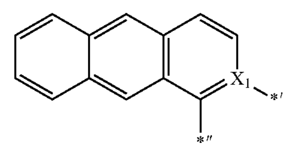
CY1(112)
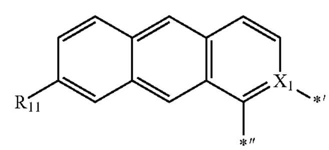
CY1(113)
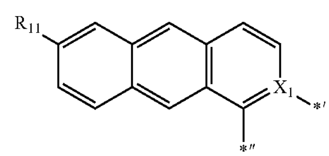
CY1(114)
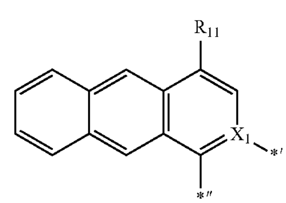
CY1(115)
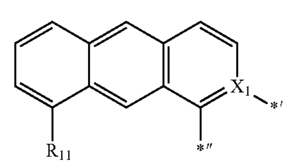
CY1(116)
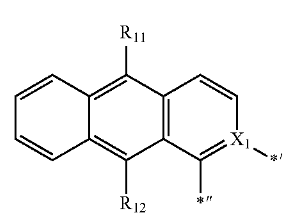

-continued
CY1(117)
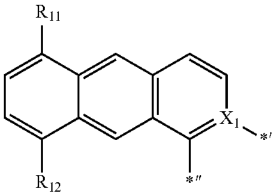
CY1(118)
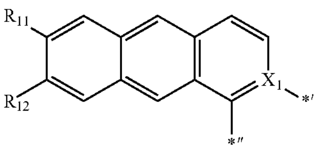
CY1(119)
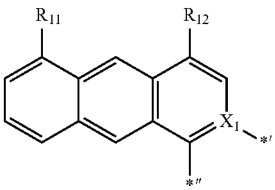
CY1(120)
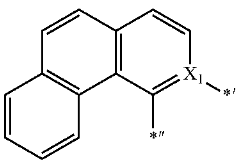
CY1(121)
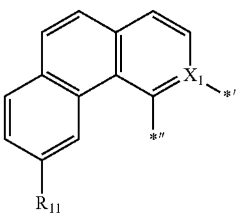
CY1(122)
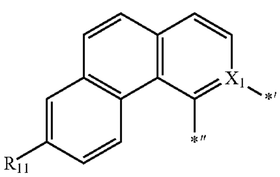
CY1(123)
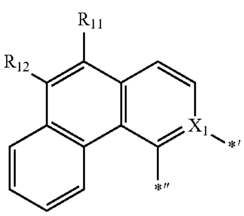
CY1(124)
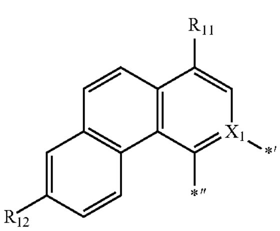
-continued
CY1(125)
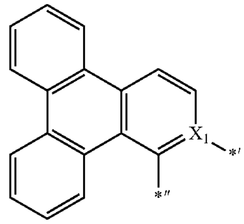
CY1(126)
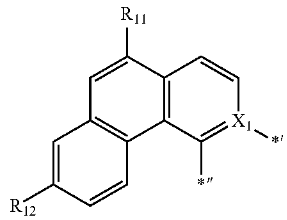
CY1(127)
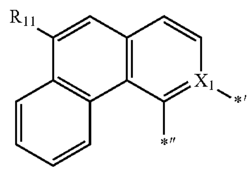
CY1(128)
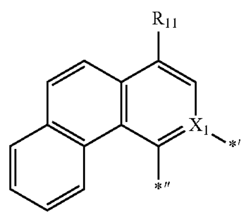
CY1(129)
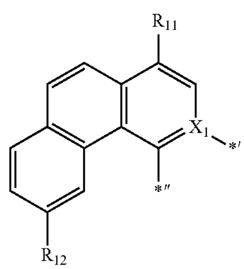
CY1(130)
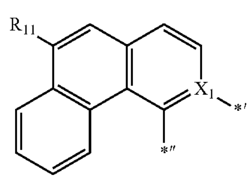
CY1(131)
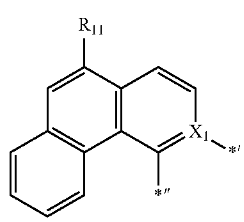

CY1(132)
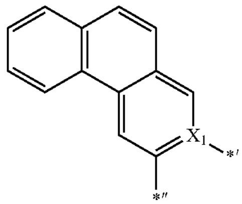
CY1(133)
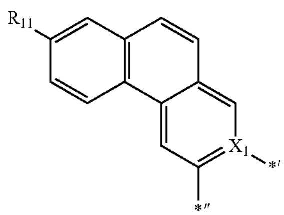
CY1(134)
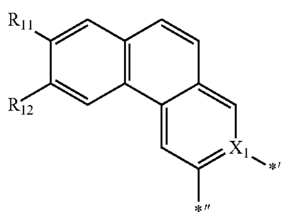
CY1(135)
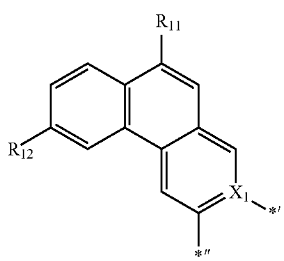
CY1(136)
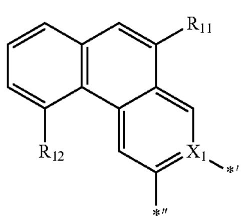
CY1(137)
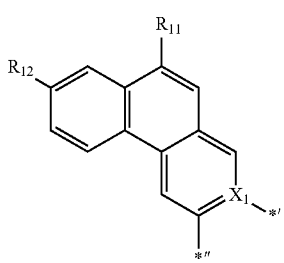
CY1(138)
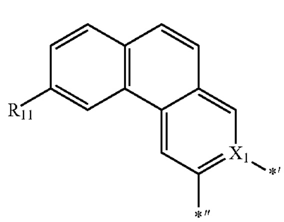
CY1(139)
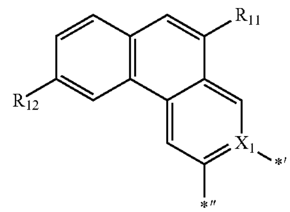
CY1(140)
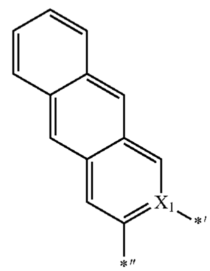
CY1(141)
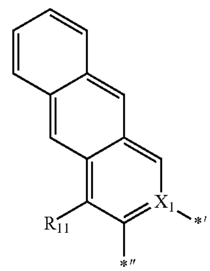
CY1(142)
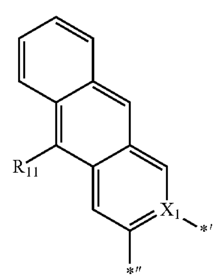
CY1(143)
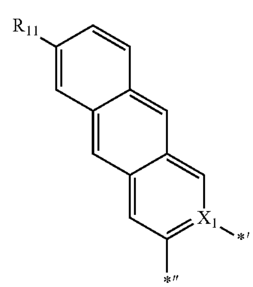
CY1(144)
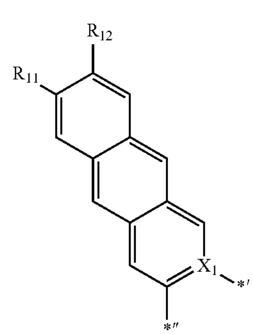

-continued
CY1(145)
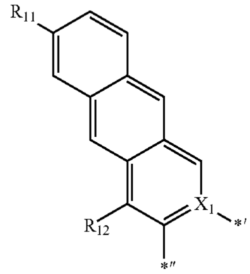
CY1(146)
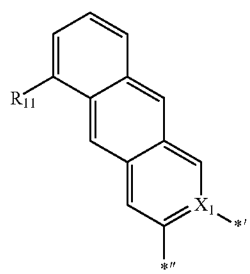
CY1(147)
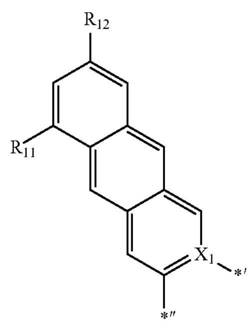
CY1(148)
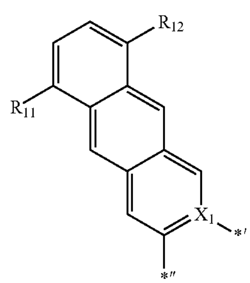
CY1(149)
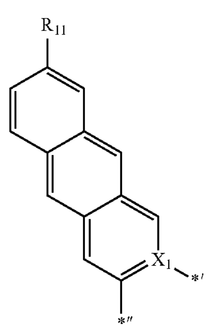
-continued
CY1(150)
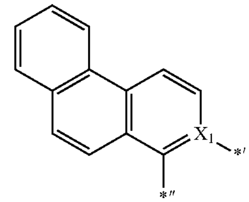
CY1(151)
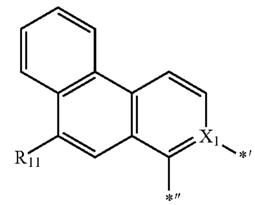
CY1(152)
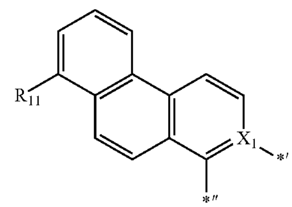
CY1(153)
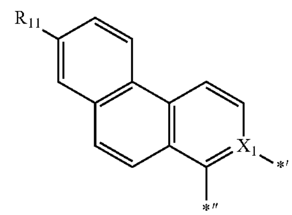
CY1(154)
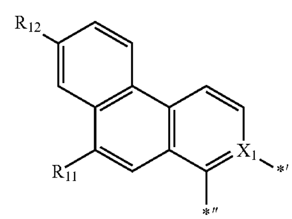
CY1(155)
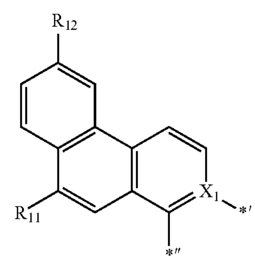
CY1(156)
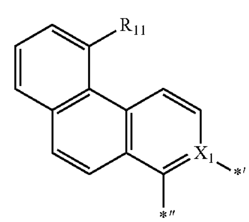

-continued

CY1(157)

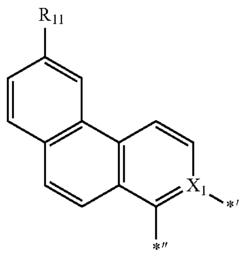

CY1(158)

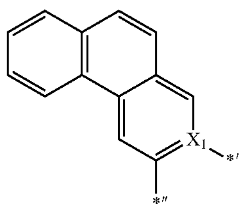

CY1(159)

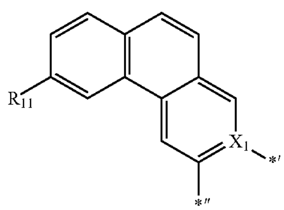

CY1(160)

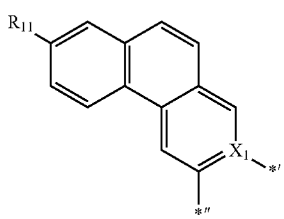

CY1(161)

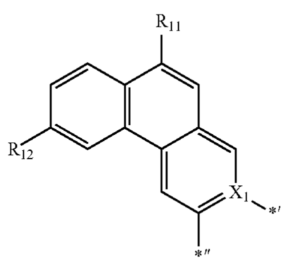

CY1(162)

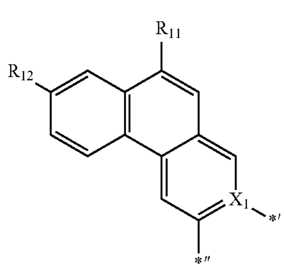

-continued

CY1(163)

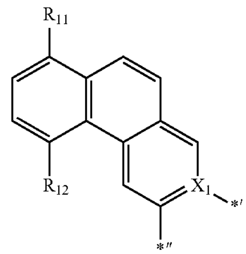

CY1(164)

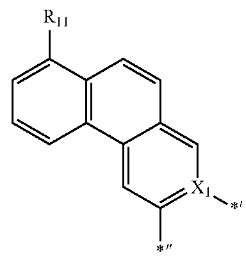

CY1(165)

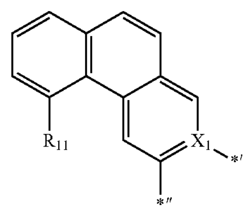

In Formulae CY1(1) to CY1(165), $X_1$ and $X_{11}$ are the same as described above, $R_{11}$ to $R_{16}$ may each be the same as defined in connection with $R_1$, provided that, $R_{11}$ to $R_{16}$ are not hydrogen,

*" indicates a binding site to $T_1$ in Formula 2, and

*' indicates a binding site to M in Formula 1.

In one or more embodiments, a group represented by

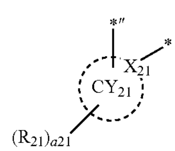

in Formula 2 may be a group represented by one of Formulae CY21-1 to CY21-25:

CY21-1

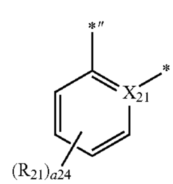

CY21-2

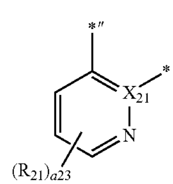

-continued
CY21-3
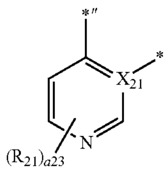
CY21-4
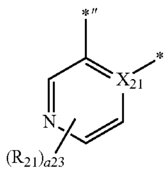
CY21-5
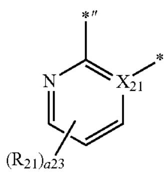
CY21-6
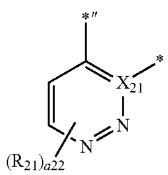
CY21-7
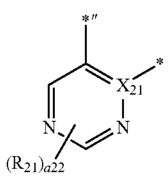
CY21-8
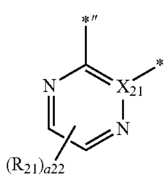
CY21-9
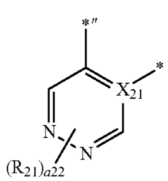
CY21-10
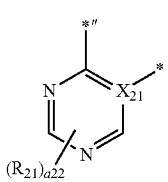
-continued
CY21-11
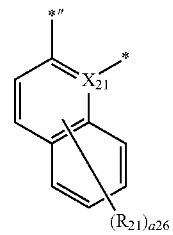
CY21-12
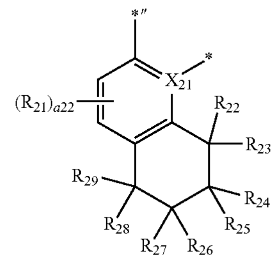
CY21-13
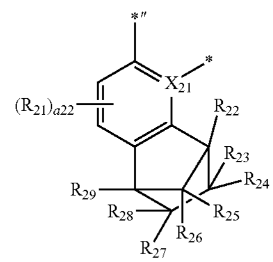
CY21-14
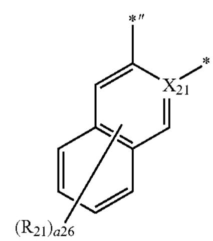
CY21-15
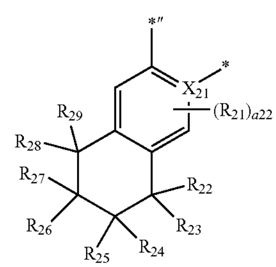
CY21-16
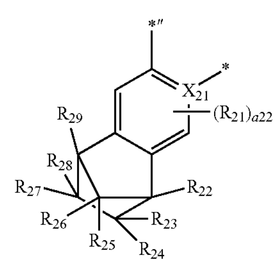

-continued

CY21-17

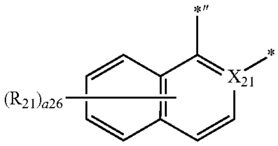

CY21-18

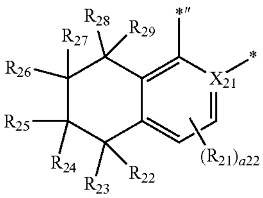

CY21-19

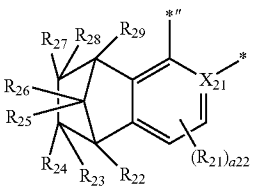

CY21-20

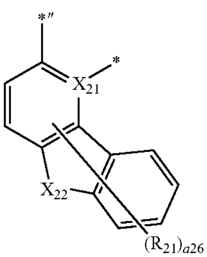

CY21-21

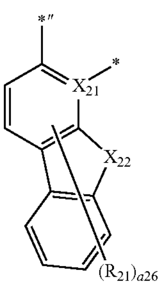

CY21-22

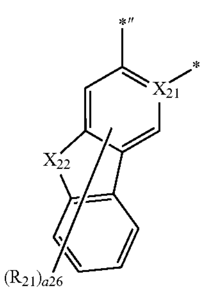

CY21-23

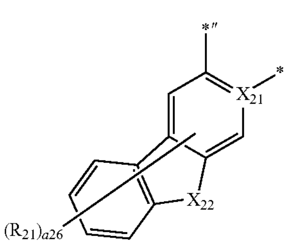

-continued

CY21-24

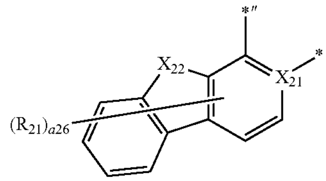

CY21-25

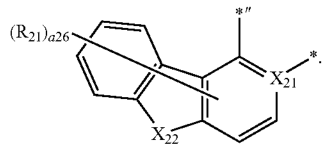

In Formulae CY21-1 to CY21-25, $X_{21}$ and $R_{21}$ are the same as described above, $X_{22}$ may be $C(R_{22})(R_{23})$, $N(R_{22})$, O, S, or $Si(R_{22})(R_{23})$, $R_{22}$ to $R_{29}$ may each be the same as defined in connection with $R_{21}$, a26 may be an integer from 0 to 6, a24 may be an integer from 0 to 4, a23 may be an integer from 0 to 3, a22 may be an integer from 0 to 2,

*" indicates a binding site to $T_1$ in Formula 2, and

* indicates a binding site to M in Formula 1.

In one or more embodiments, a group represented by

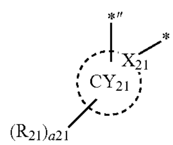

in Formula 2 may be a group represented by one of Formulae CY21(1) to CY21 (56) and CY21-20 to CY21-25:

CY21(1)

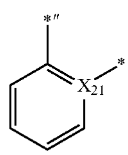

CY21(2)

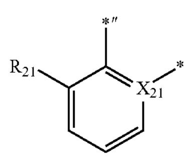

CY21(3)

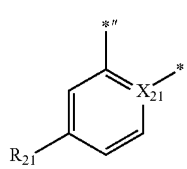

-continued
CY21(4)
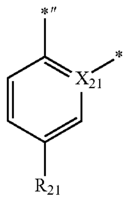
CY21(5)
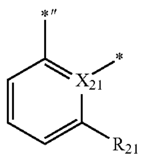
CY21(6)
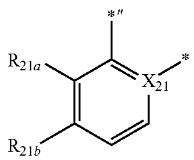
CY21(7)
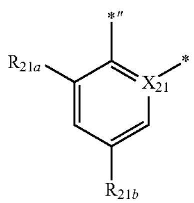
CY21(8)
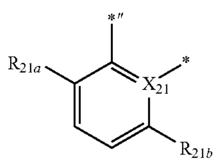
CY21(9)
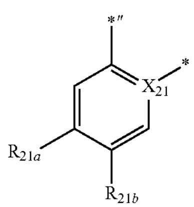
CY21(10)
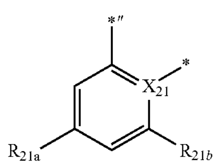
CY21(11)
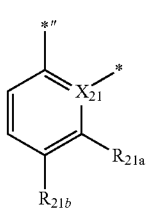
-continued
CY21(12)
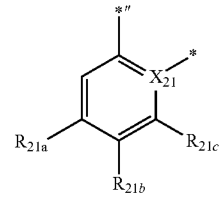
CY21(13)
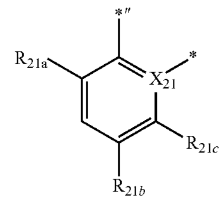
CY21(14)
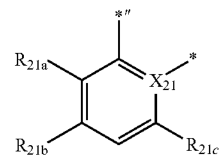
CY21(15)
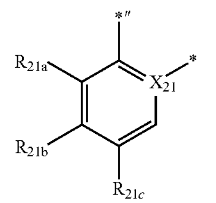
CY21(16)
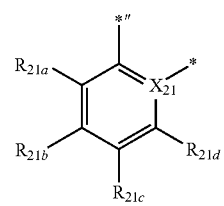
CY21(17)
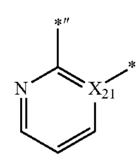
CY21(18)
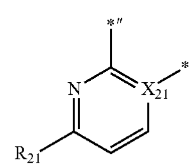
CY21(19)
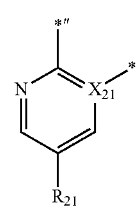

-continued
CY21(20)
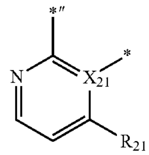
CY21(21)
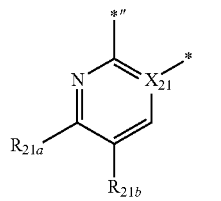
CY21(22)
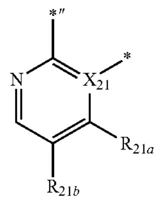
CY21(23)
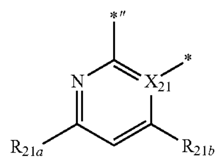
CY21(24)
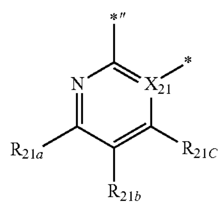
CY21(25)
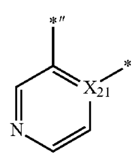
CY21(26)
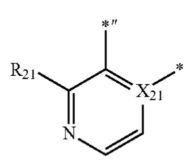
CY21(27)
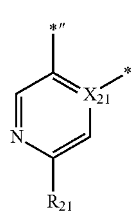
-continued
CY21(28)
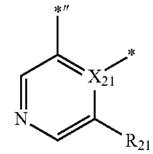
CY21(29)
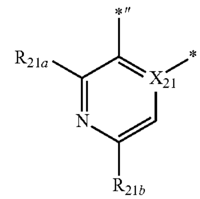
CY21(30)
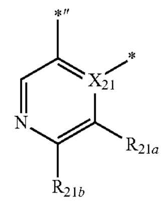
CY21(31)
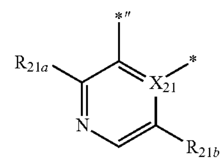
CY21(32)
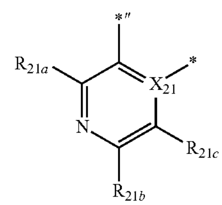
CY21(33)
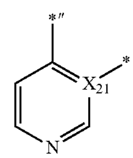
CY21(34)
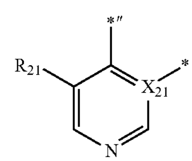
CY21(35)
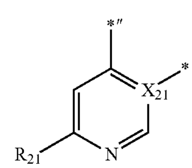
CY21(36)
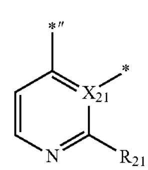

-continued
CY21(37)
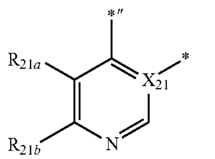
CY21(38)
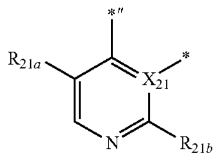
CY21(39)
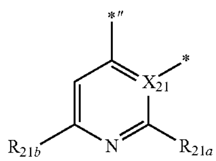
CY21(40)
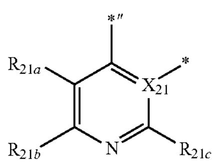
CY21(41)
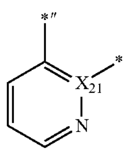
CY21(42)
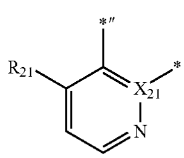
CY21(43)
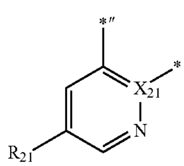
CY21(44)
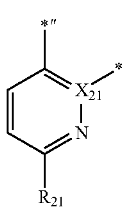
CY21(45)
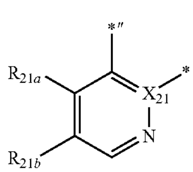
-continued
CY21(46)
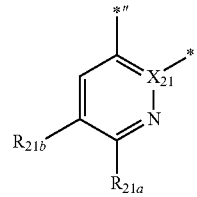
CY21(47)
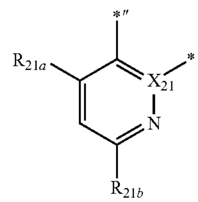
CY21(48)
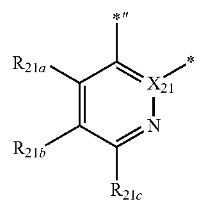
CY21(49)
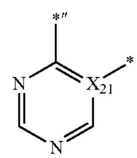
CY21(50)
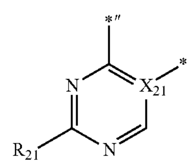
CY21(51)
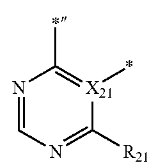
CY21(52)
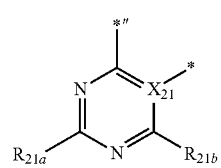
CY21(53)
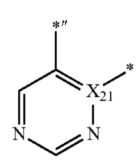
CY21(54)
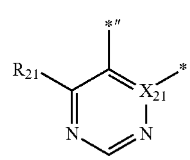

-continued

CY21(55)

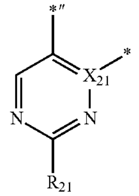

CY21(56)

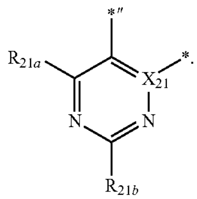

In Formulae CY21(1) to CY21(56), $X_{21}$ and $R_{21}$ are the same as described above, $R_{21a}$ to $R_{21d}$ may each be the same as defined in connection with $R_{21}$, wherein each of $R_{21}$ and $R_{21a}$ to $R_{21d}$ may not be hydrogen,

*" indicates a binding site to $T_1$ in Formula 2, and

* indicates a binding site to M in Formula 1.

In Formula 1, $L_2$ may be a bidentate ligand each linked to M in Formula 1 via O, S, Se, N, C, P, Si, or As.

In an embodiment, $L_2$ in Formula 1 may be a bidentate ligand represented by Formula 3:

Formula 3

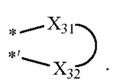

In Formula 3, $X_{31}$ and $X_{32}$ may each independently be O, S, Se, N, C, P, Si, or As,

indicates a linking group linking $X_{31}$ and $X_{32}$ together, and

* and *' each indicate a binding site to M in Formula 1.

In one or more embodiments, in Formula 3, $X_{31}$ and $X_{32}$ may each independently be O, S, Se, or N, but embodiments of the present disclosure are not limited thereto.

In one or more embodiments, in Formula 3, i) $X_{31}$ and $X_{32}$ may each be O; or ii) $X_{31}$ may be N, and $X_{32}$ may be C, but embodiments of the present disclosure are not limited thereto.

In one or more embodiments, $L_2$ in Formula 1 may be a monodentate ligand, such as $I^-$, $Br^-$, $Cl^-$, sulfide, nitrate, azide, hydroxide, cyanate, isocyanate, thiocyanate, water, acetonitrile, pyridine, ammonia, carbon monoxide, $P(Ph)_3$, $P(Ph)_2CH_3$, $PPh(CH_3)_2$, or $P(CH_3)_3$, but embodiments of the present disclosure are not limited thereto.

In one or more embodiments, $L_2$ in Formula 1 may be a bidentate ligand, such as oxalate, acetylacetonate, picolinic acid, 1,2-bis(diphenylphosphino)ethane, 1,1-bis(diphenylphosphino)methane, glycinate, or ethylenediamine, but embodiments of the present disclosure are not limited thereto.

In one or more embodiments, $L_2$ in Formula 1 may be a group represented by one of Formulae 3A to 3F:

3A

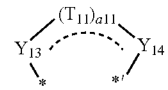

3B

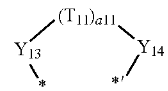

3C

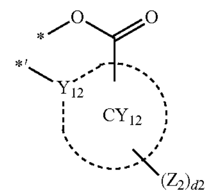

3D

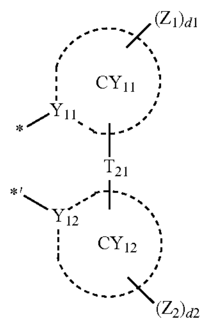

3E

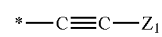

3F

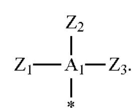

In Formulae 3A to 3F, $Y_{13}$ may be O, N, $N(Z_1)$, $P(Z_1)(Z_2)$, or $As(Z_1)(Z_2)$, $Y_{14}$ may be O, N, $N(Z_3)$, $P(Z_3)(Z_4)$, or $As(Z_3)(Z_4)$, $T_{11}$ may be a single bond, a double bond, *—$C(Z_{11})(Z_{12})$—*', *—$C(Z_{11})$=$C(Z_{12})$—*', *=$C(Z_{11})$—*', *—$C(Z_{11})$=*', *=$C(Z_{11})$—$C(Z_{12})$=$C(Z_{13})$—*', *—$C(Z_{11})$=$C(Z_{12})$—$C(Z_{13})$=*', *—$N(Z_{11})$—*', or a $C_5$-$C_{30}$ carbocyclic group unsubstituted or substituted with at least one $Z_{11}$, a11 may be an integer from 1 to 10, when a11 is 2 or more, two or more groups $T_{11}$ are identical to or different from each other, $Y_{11}$ and $Y_{12}$ may each independently be C or N, $T_{21}$ may be a single bond, a double bond, O, S, $C(Z_{11})(Z_{12})$, $Si(Z_{11})(Z_{12})$, or $N(Z_{11})$, ring $CY_{11}$ and ring $CY_{12}$ may each independently be a $C_5$-$C_{30}$ carbocyclic group or a $C_1$-$C_{30}$ heterocyclic group, $A_1$ may be P or As, $Z_1$ to $Z_4$ and $Z_{11}$ to $Z_{13}$ may each be the same as defined in connection with $R_{21}$, d1 and d2 may each independently be an integer from 0 to 10, and

* and *' each indicate a binding site to M in Formula 1.

In Formulae 3A to 3F, the $C_5$-$C_{30}$ carbocyclic group and the $C_1$-$C_{30}$ heterocyclic group may each be the same as defined in connection with ring $CY_{21}$.

For example, a group represented by
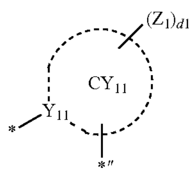
in Formula 3D may be a group represented by one of Formulae CY11-1 to CY11-34, and/or
a group represented by
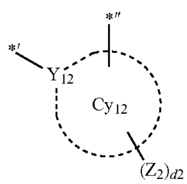
in Formula 3C or 3D may be a group represented by one of Formulae CY12-1 to CY12-34:
CY11-1
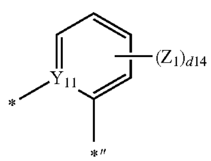
CT11-2
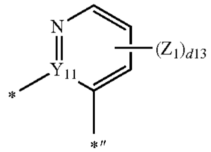
CY11-3
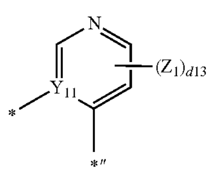
CY11-4
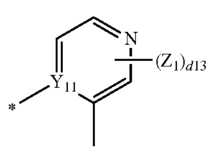
CY11-5
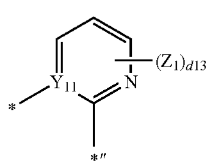
-continued
CY11-6
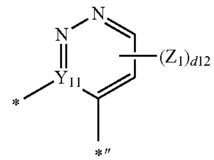
CY11-7
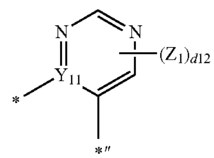
CY11-8
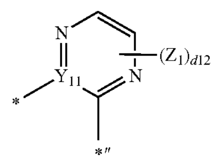
CY11-9
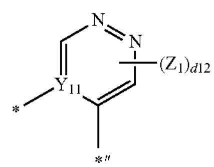
CY11-10
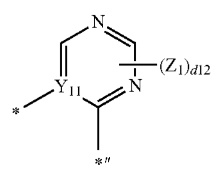
CY11-11
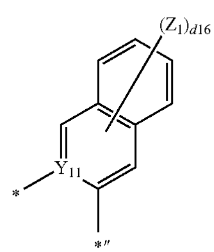
CY11-12
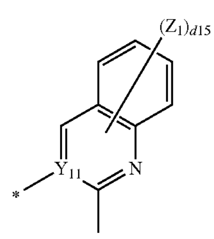

-continued
CY11-13
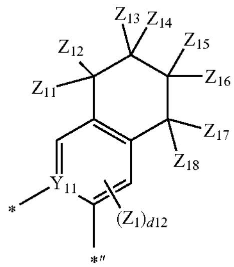
CY11-14
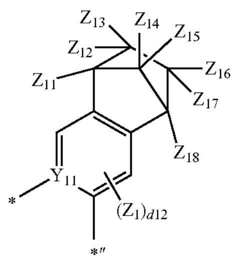
CY11-15
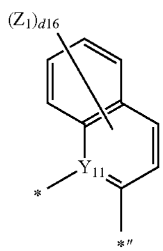
CY11-16
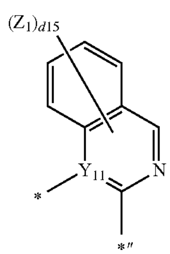
CY11-17
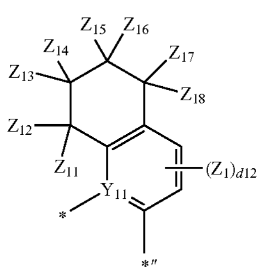
CY11-18
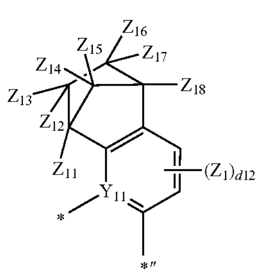
-continued
CY11-19
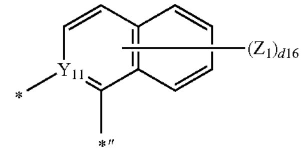
CY11-20
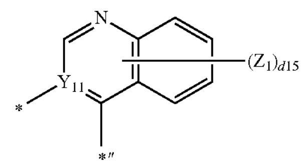
CY11-21
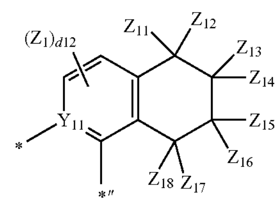
CY11-22
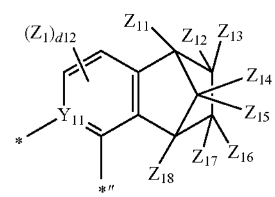
CY11-23
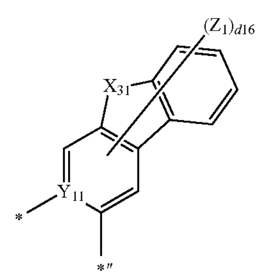
CY11-24
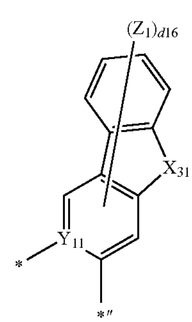

-continued
CY11-25
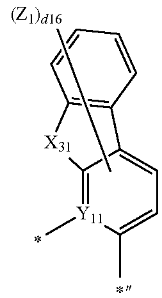
CY11-26
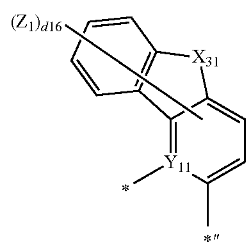
CY11-27
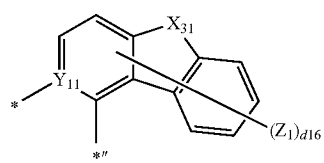
CY11-28
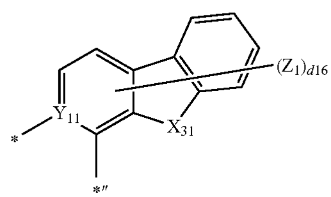
CY11-29
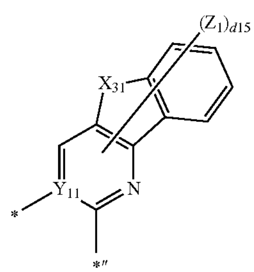
CY11-30
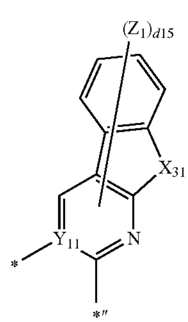
-continued
CY11-31
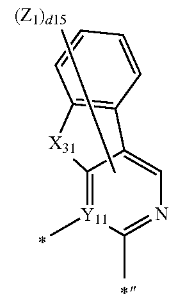
CY11-32
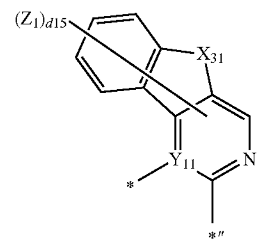
CY11-33
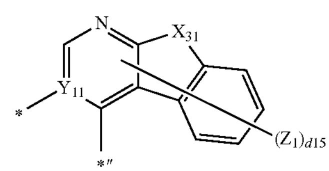
CY11-34
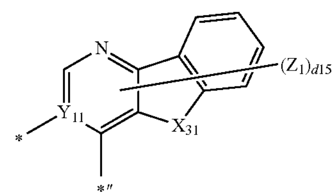
CY12-1
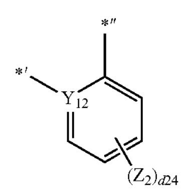
CY12-2
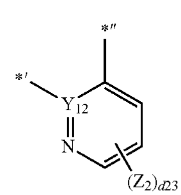
CY12-3
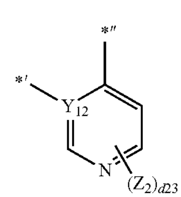

-continued
CY12-4
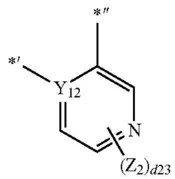
CY12-5
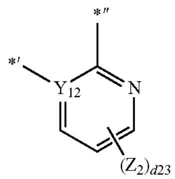
CY12-6
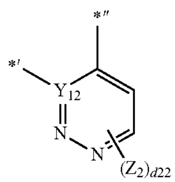
CY12-7
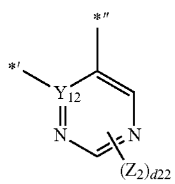
CY12-8
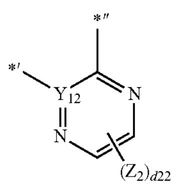
CY12-9
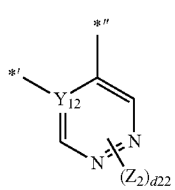
CY12-10
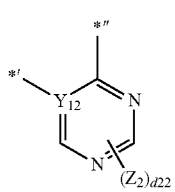
CY12-11
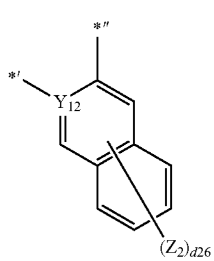
-continued
CY12-12
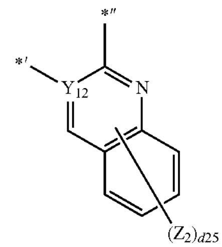
CY12-13
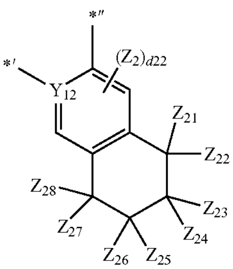
CY12-14
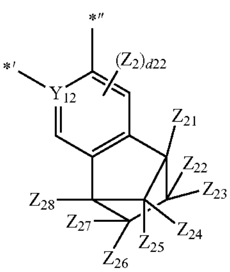
CY12-15
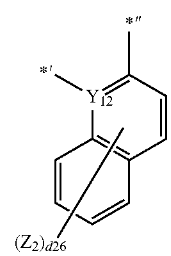
CY12-16
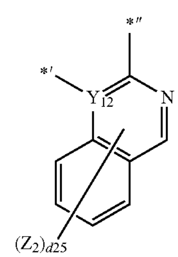
CY12-17
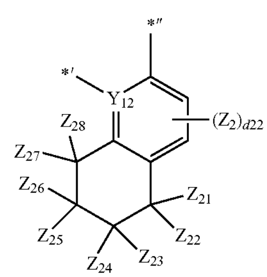

-continued
CY12-18
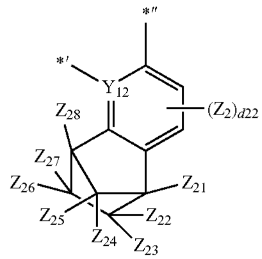
CY12-19
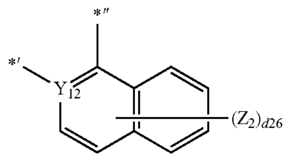
CY12-20
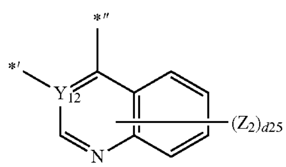
CY12-21
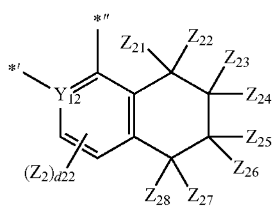
CY12-22
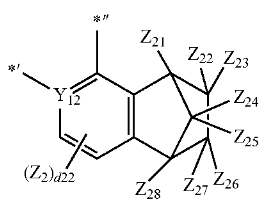
CY12-23
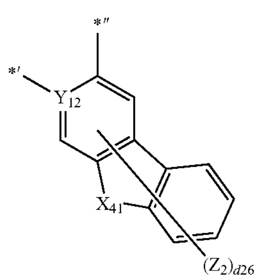
CY12-24
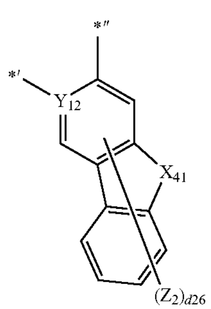
-continued
CY12-25
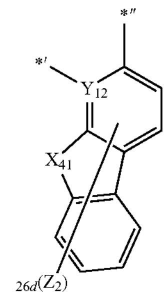
CY12-26
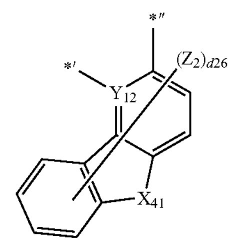
CY12-27
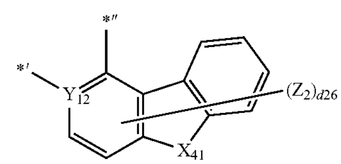
CY12-28
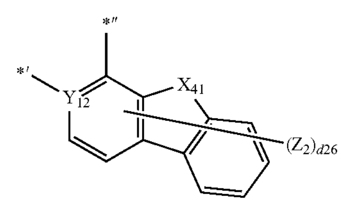
CY12-29
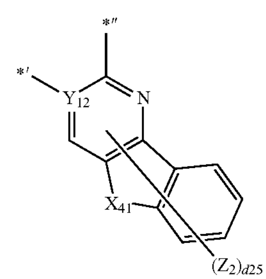
CY12-30
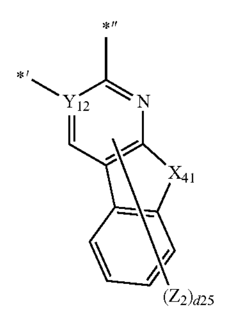

-continued

CY12-31

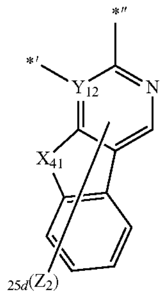

CY12-32

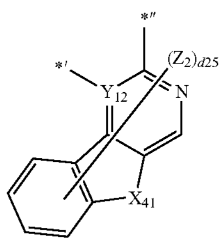

CY12-33

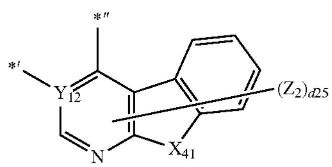

CY12-34

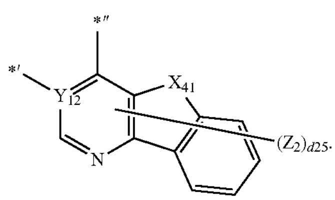

In Formulae CY11-1 to CY11-34 and CY12-1 to CY12-34,

- $X_{31}$ may be O, S, $N(Z_{11})$, $C(Z_{11})(Z_{12})$, or $Si(Z_{11})(Z_{12})$,
- $X_{41}$ may be O, S, $N(Z_{21})$, $C(Z_{21})(Z_{22})$, or $Si(Z_{21})(Z_{22})$,
- $Y_{11}$, $Y_{12}$, $Z_1$, and $Z_2$ are the same as described above,
- $Z_{11}$ to $Z_{18}$ and $Z_{21}$ to $Z_{28}$ may each be the same as defined in connection with $R_{21}$,
- d12 and d22 may each independently be an integer from 0 to 2,
- d13 and d23 may each independently be an integer from 0 to 3,
- d14 and d24 may each independently be an integer from 0 to 4,
- d15 and d25 may each independently be an integer from 0 to 5,
- d16 and d26 may each independently be an integer from 0 to 6, and
- in Formulae CY11-1 to CY11-34 and CY12-1 to CY12-34, * and *' each indicate a binding site to M in Formula 1, and *" indicates a binding site to a neighboring atom in Formula 3C or to $T_{21}$ in Formula 3D.

In an embodiment, $L_2$ in Formula 1 may be a group represented by one of Formulae 3-1(1) to 3-1(66) and 3-1(301) to 3-1(309), but embodiments of the present disclosure are not limited thereto:

3-1(1)

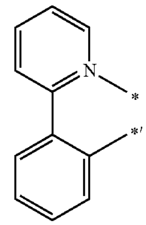

3-1(2)

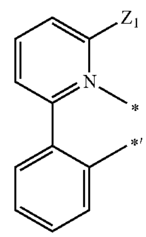

3-1(3)

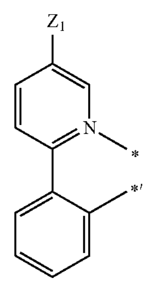

3-1(4)

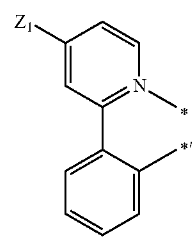

3-1(5)

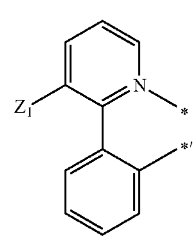

3-1(6)

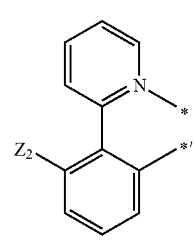

-continued
3-1(7)
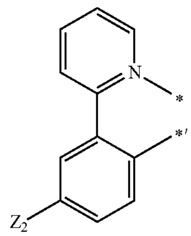
3-1(8)
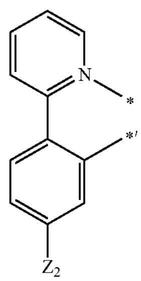
3-1(9)
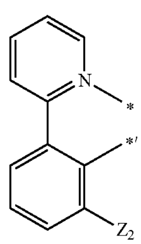
3-1(10)
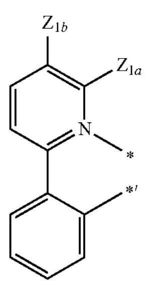
3-1(11)
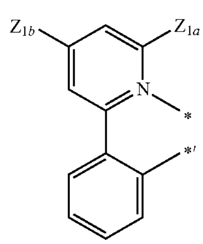
3-1(12)
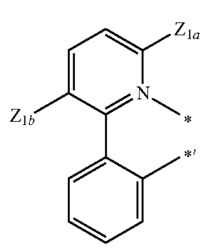
-continued
3-1(13)
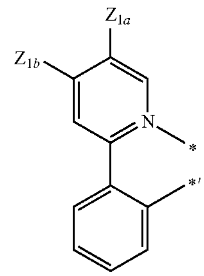
3-1(14)
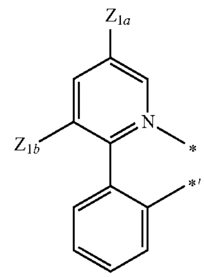
3-1(15)
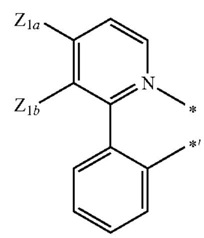
3-1(16)
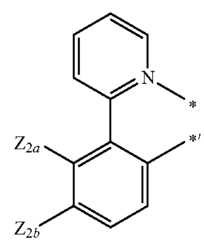
3-1(17)
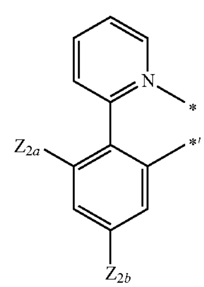
3-1(18)
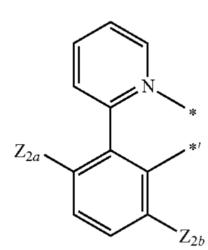

-continued
3-1(19)
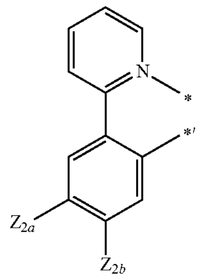
3-1(20)
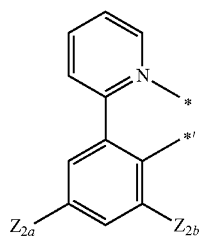
3-1(21)
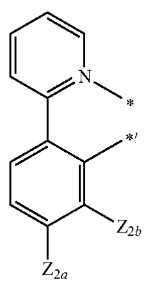
3-1(22)
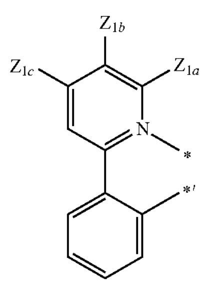
3-1(23)
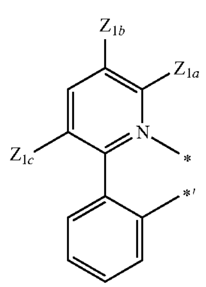
3-1(24)
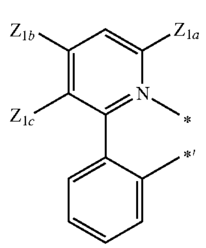
-continued
3-1(25)
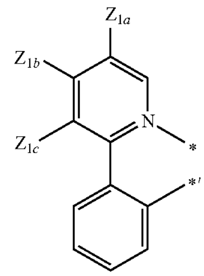
3-1(26)
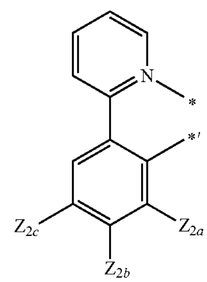
3-1(27)
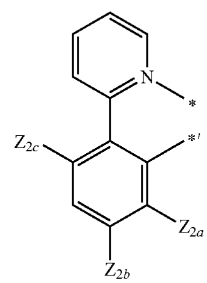
3-1(28)
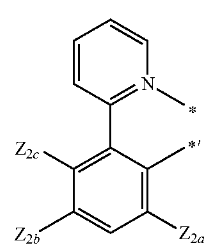
3-1(29)
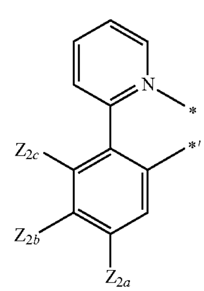

-continued
3-1(30)
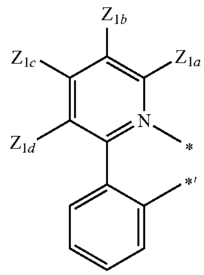
3-1(31)
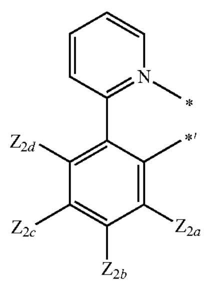
3-1(32)
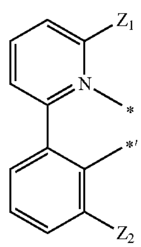
3-1(33)
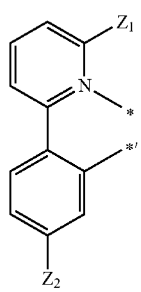
3-1(34)
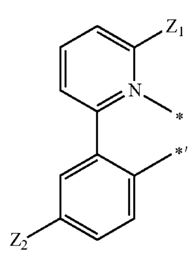
3-1(35)
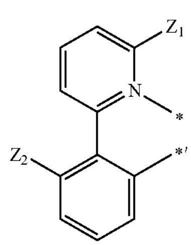
-continued
3-1(36)
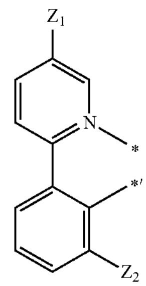
3-1(37)
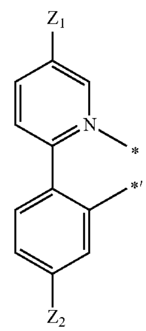
3-1(38)
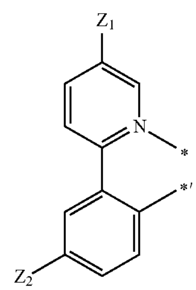
3-1(39)
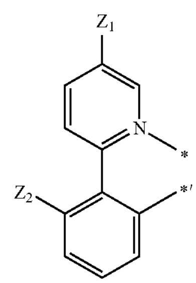
3-1(40)
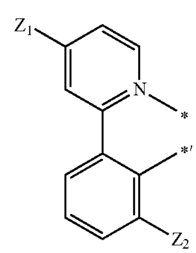

-continued
3-1(41)
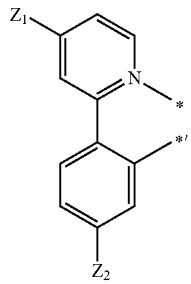
3-1(42)
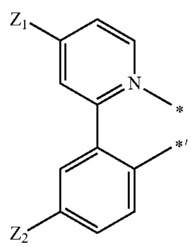
3-1(43)
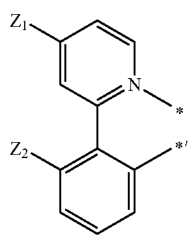
3-1(44)
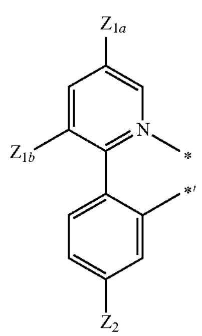
3-1(45)
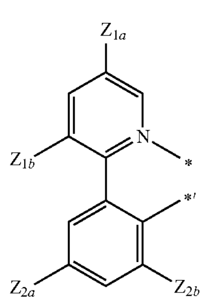
-continued
3-1(46)
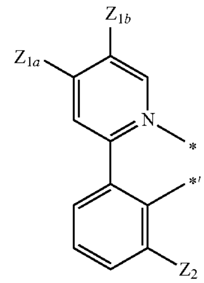
3-1(47)
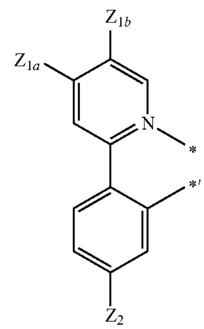
3-1(48)
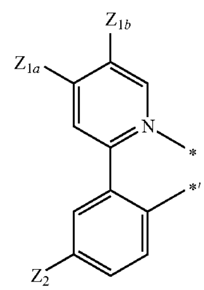
3-1(49)
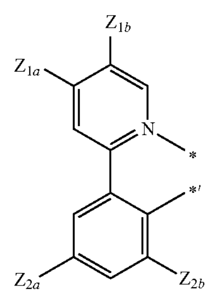
3-1(50)
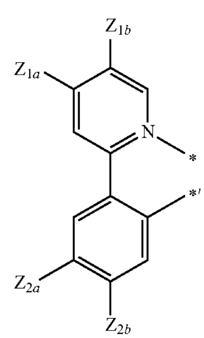

-continued
3-1(51)
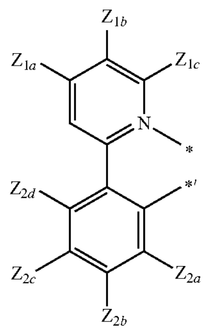
3-1(52)
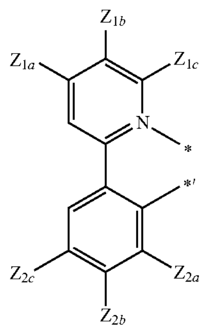
3-1(53)
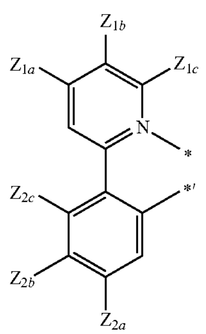
3-1(54)
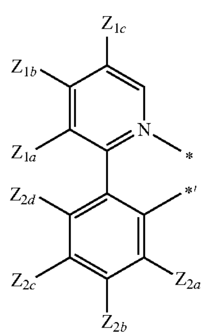
3-1(55)
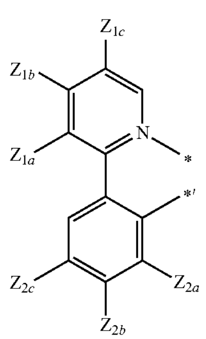
-continued
3-1(56)
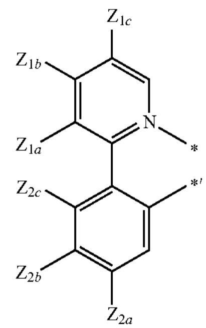
3-1(57)
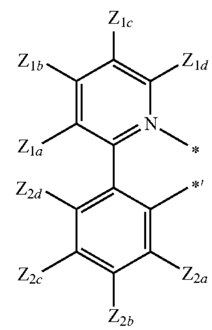
3-1(58)
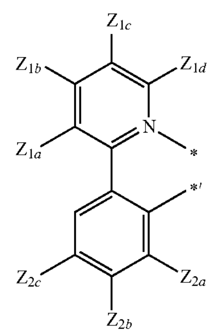
3-1(59)
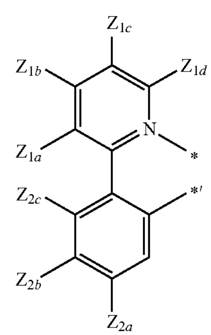
3-1(60)
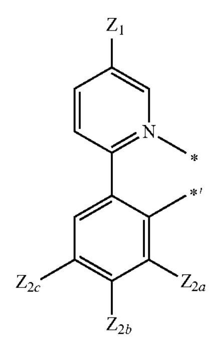

-continued
3-1(61)
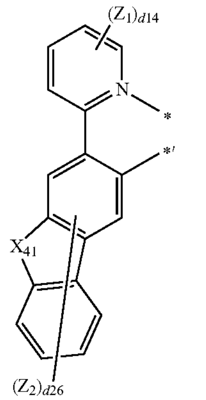
3-1(62)
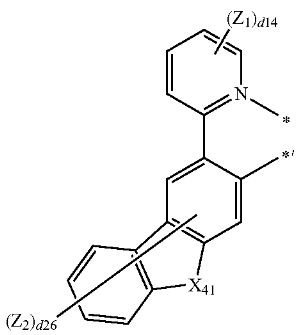
3-1(63)
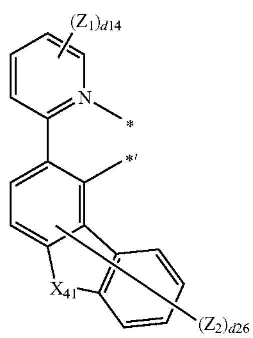
3-1(64)
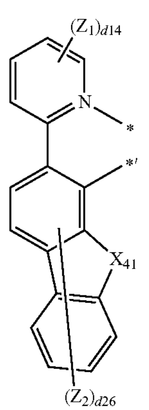
-continued
3-1(65)
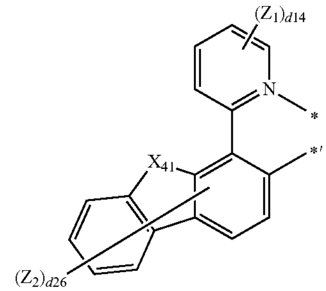
3-1(301)
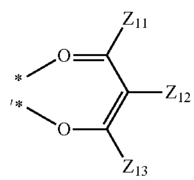
3-1(302)
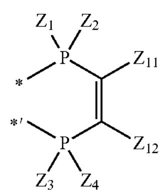
3-1(303)
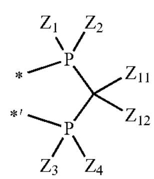
3-1(304)
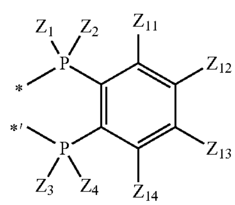
3-1(305)
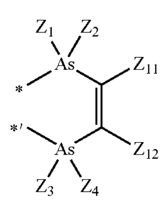
3-1(306)
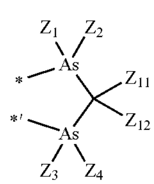

-continued 3-1(307)

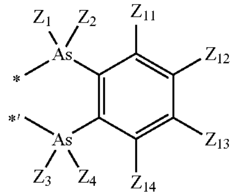

3-1(308)

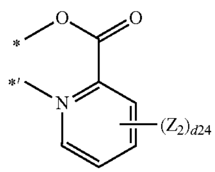

3-1(309)

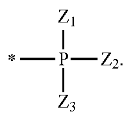

In Formulae 3-1 (1) to 3-1(66) and 3-1(301) to 3-1(309), $X_{41}$ may be O, S, $N(Z_{21})$, $C(Z_{21})(Z_{22})$, or $Si(Z_{21})(Z_{22})$, $Z_1$ to $Z_4$, $Z_{1a}$, $Z_{1b}$, $Z_{1c}$, $Z_{1d}$, $Z_{2a}$, $Z_{2b}$, $Z_{2c}$, $Z_{2d}$, and $Z_{11}$ to $Z_{14}$ may each be the same as defined in connection with $R_{21}$, d14 may be an integer from 0 to 4, d26 may be an integer from 0 to 6,

* and *' each indicate a binding site to M in Formula 1.

In an embodiment, $L_2$ in Formula 1 may be a group represented by Formula 3-1(301).

In an embodiment, at least one of $Z_{11}$ and $Z_{13}$ in Formula 3-1(301) may not be a methyl group.

In an embodiment, $Z_{11}$ and $Z_{13}$ in Formula 3-1(301) may not be a methyl group, simultaneously.

In an embodiment, at least one of $Z_{11}$ and $Z_{13}$ in Formula 3-1 (301) may each independently be a substituted or unsubstituted $C_3$-$C_{60}$ alkyl group, or a substituted or unsubstituted $C_3$-$C_{10}$ cycloalkyl group.

In an embodiment, $Z_{11}$ and $Z_{13}$ in Formula 3-1(301) may each independently be a substituted or unsubstituted $C_3$-$C_{60}$ alkyl group, or a substituted or unsubstituted $C_3$-$C_{10}$ cycloalkyl group.

In an embodiment, at least one of $Z_{11}$ and $Z_{13}$ in Formula 3-1 (301) may each independently be a substituted or unsubstituted $C_3$-$C_{10}$ cycloalkyl group.

In an embodiment, $Z_{11}$ and $Z_{13}$ in Formula 3-1(301) may each independently be a substituted or unsubstituted $C_3$-$C_{10}$ cycloalkyl group.

In an embodiment, $Z_{11}$ and $Z_{13}$ in Formula 3-1(301) may each independently be:

a $C_3$-$C_{20}$ alkyl group;

a $C_3$-$C_{20}$ alkyl group substituted with deuterium, a $C_1$-$C_{10}$ alkyl group, a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a bicyclo[1.1.1]pentyl group, a bicyclo [2.1.1]hexyl group, a bicyclo[2.2.1]heptyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, or any combination thereof; or a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, each unsubstituted or substituted with deuterium, a $C_1$-$C_{20}$ alkyl group, a deuterium-containing $C_2$-$C_{20}$ alkyl group (for example, *—$C(CD_3)_3$), a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, or any combination thereof.

In an embodiment, $L_2$ in Formula 1 may be a group represented by Formula 3-1-1, but embodiments of the present disclosure are not limited thereto:

3-1-1

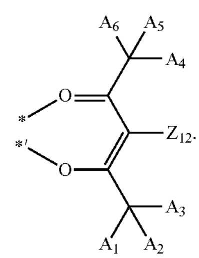

In Formula 3-1-1, $Z_{12}$ may be the same as defined in connection with $R_{21}$, $A_2$ and $A_5$ may each independently be hydrogen, deuterium, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, or a substituted or unsubstituted monovalent non-aromatic condensed heteropolycyclic group, $A_1$, $A_3$, $A_4$, and $A_6$ may each independently be a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, or a substituted or unsubstituted monovalent non-aromatic condensed heteropolycyclic group, two or more of $A_1$ to $A_6$ may optionally be linked to form a $C_5$-$C_{30}$ carbocyclic group unsubstituted or substituted with at least one $R_{1a}$ or a $C_1$-$C_{30}$ heterocyclic group unsubstituted or substituted with at least one $R_{1a}$, $R_{1a}$ may be the same as defined in connection with $Z_{12}$, a substituent(s) of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{60}$ heterocycloalkenyl group, the substituted $C_6$-$C_{60}$ aryl group, the substituted $C_6$-$C_{60}$ aryloxy group, the substituted $C_6$-$C_{60}$ arylthio group, a substituted or unsubstituted $C_7$-$C_{60}$ arylalkyl group, the substituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, the substituted monovalent non-aromatic condensed polycyclic group, and the substituted monovalent non-aromatic condensed heteropolycyclic group may be:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, $—Ge(Q_{13})(Q_{14})(Q_{15})$, $—B(Q_{16})(Q_{17})$, $—P(=O)(Q_{18})(Q_{19})$, $—P(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, or a monovalent non-aromatic condensed heteropolycyclic group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—Ge(Q_{23})(Q_{24})(Q_{25})$, $—B(Q_{26})(Q_{27})$, $—P(=O)(Q_{28})(Q_{29})$, $—P(Q_{28})(Q_{29})$, or any combination thereof;

$—N(Q_{31})(Q_{32})$, $—Si(Q_{33})(Q_{34})(Q_{35})$, $—Ge(Q_{33})(Q_{34})(Q_{35})$, $—B(Q_{36})(Q_{37})$, $—P(=O)(Q_{38})(Q_{39})$, or $—P(Q_{38})(Q_{39})$; or any combination thereof.

In an exemplary embodiment, $Q_{11}$ to $Q_{19}$, $Q_{21}$ to $Q_{29}$, and $Q_{31}$ to $Q_{39}$ may each independently be hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_7$-$C_{60}$ arylalkyl group; a $C_1$-$C_{60}$ heteroaryl group; a $C_1$-$C_{60}$ heteroaryloxy group; a $C_1$-$C_{60}$ heteroarylthio group; a $C_7$-$C_{60}$ arylalkyl group; a $C_2$-$C_{60}$ heteroarylalkyl group; a $C_1$-$C_{60}$ heteroaryloxy group; a $C_1$-$C_{60}$ heteroarylthio group; a $C_2$-$C_{60}$ heteroarylalkyl group; a monovalent non-aromatic condensed polycyclic group; or a monovalent non-aromatic condensed heteropolycyclic group.

In an embodiment, $A_1$ to $A_6$ and $Z_{12}$ in Formula 3-1-1 may each independently be:

hydrogen, deuterium, a cyano group, $C_1$-$C_{20}$ alkyl group, or a $C_1$-$C_{20}$ alkoxy group;

a $C_1$-$C_{20}$ alkyl group and a $C_1$-$C_{20}$ alkoxy group, each substituted with deuterium, —F, —$CD_3$, —$CD_2H$, —$CDH_2$, —$CF_3$, —$CF_2H$, —$CFH_2$, a cyano group, a $C_1$-$C_{10}$ alkyl group, a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, or any combination thereof; or a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, or a terphenyl group, each unsubstituted or substituted with deuterium, —F, —$CD_3$, —$CD_2H$, —$CDH_2$, —$CF_3$, —$CF_2H$, —$CFH_2$, a cyano group, a $C_1$-$C_{20}$ alkyl group, a deuterium-containing $C_2$-$C_{20}$ alkyl group (for example, *—C$(CD_3)_3$), a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, or any combination thereof;

wherein each of $A_1$, $A_3$, $A_4$, and $A_6$ may not be hydrogen nor deuterium.

In an embodiment, $A_1$ to $A_6$ and $Z_{12}$ in Formula 3-1-1 may each independently be:

hydrogen or deuterium;

a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, or a sec-isopentyl group, each unsubstituted or substituted with deuterium, a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, or any combination thereof; or a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, or a terphenyl group, each unsubstituted or substituted with deuterium, —F, —$CD_3$, —$CD_2H$, —$CDH_2$, —$CF_3$, —$CF_2H$, —$CFH_2$, a cyano group, a $C_1$-$C_{20}$ alkyl group, a deuterium-containing $C_2$-$C_{20}$ alkyl group (for example, *—C$(CD_3)_3$), a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, or any combination thereof;

wherein each of $A_1$, $A_3$, $A_4$, and $A_6$ may not be hydrogen nor deuterium.

In one or more embodiments, all of $A_1$ to $A_6$ in Formula 3-1-1 may not be hydrogen.

In one or more embodiments, all of $A_1$ to $A_6$ in Formula 3-1-1 may not be hydrogen nor deuterium.

In one or more embodiments, $L_1$ in Formula 1 may include at least one deuterium.

In one or more embodiments, $L_1$ in Formula 1 may include at least one fluoro group (—F).

In one or more embodiments, in Formula 2, a1 may not be 0 (zero) and at least one $R_1$ in number of a1 may include at least one deuterium.

In one or more embodiments, in Formula 2, a1 may not be 0 (zero) and at least one $R_1$ in number of a1 may include at least one fluoro group (—F).

In one or more embodiments, in Formula 2, a1 may be 0, 1 or 2.

In one or more embodiments, in Formula 2, a condensed cyclic group in which a ring $CY_{11}$ and a ring $CY_{12}$ are condensed with each other may have two, three or four rings which are condensed with each other.

The organometallic compound represented by Formula 1 may emit visible light having a maximum emission wavelength of, for example, about 450 nm or more and about 700 nm or less. In an exemplary device, the visible light may be a red light.

The terms "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, and an azadibenzothiophene 5,5-dioxide group" as used herein each refer to a hetero-ring having the same backbone as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, and a dibenzothiophene 5,5-dioxide group", in which at least one carbon atom constituting a ring of the aforementioned groups is replaced with nitrogen atom.

In an embodiment, the organometallic compound may be one of Compounds 1 to 366, but embodiments of the present disclosure are not limited thereto:

1

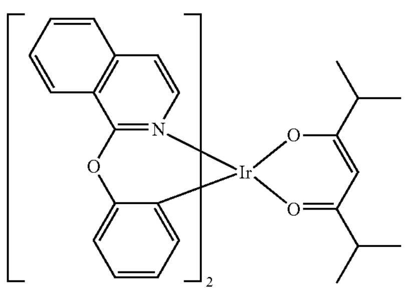

2

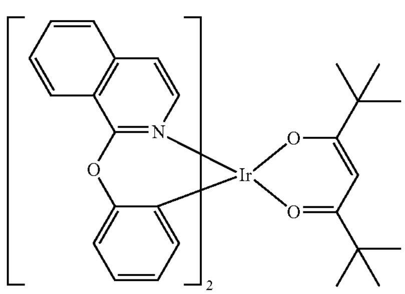

3

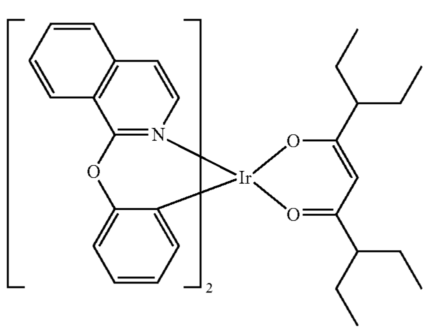

-continued

4

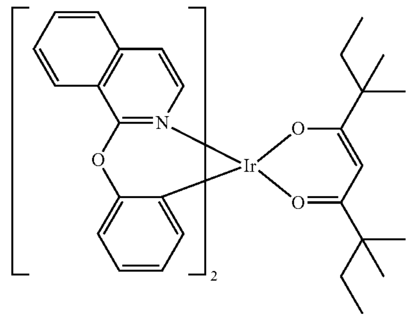

5

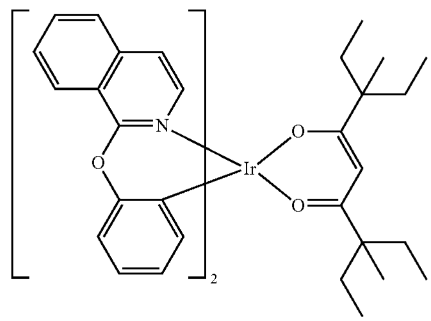

6

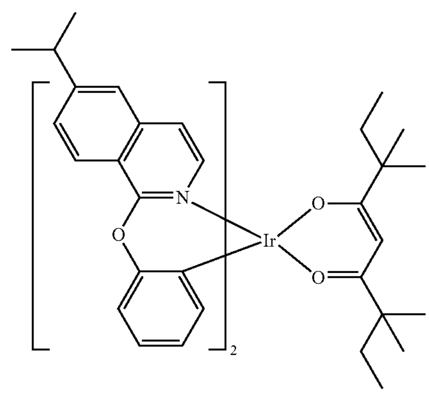

7

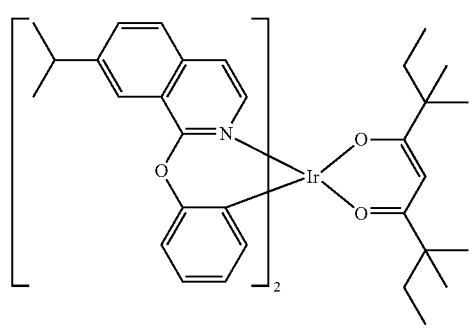

-continued
8
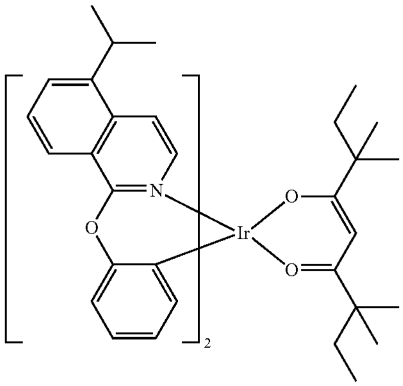
9
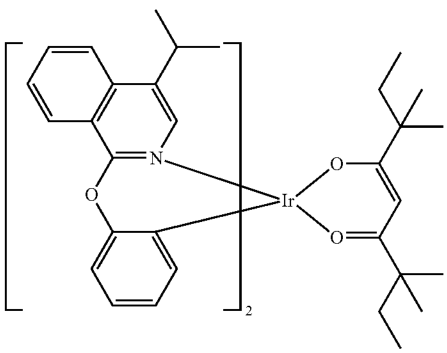
10
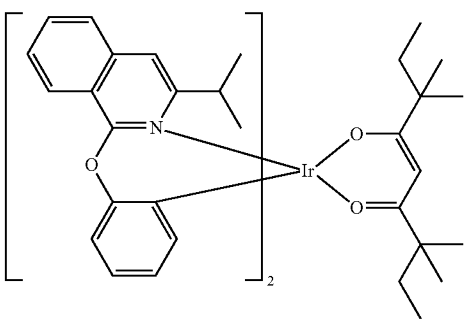
11
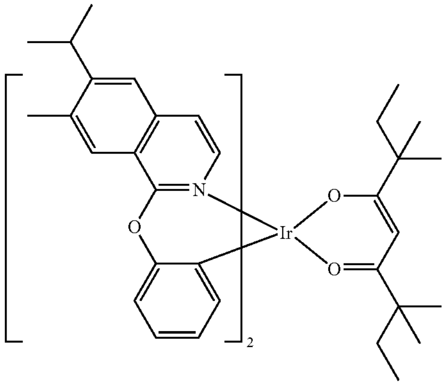
-continued
12
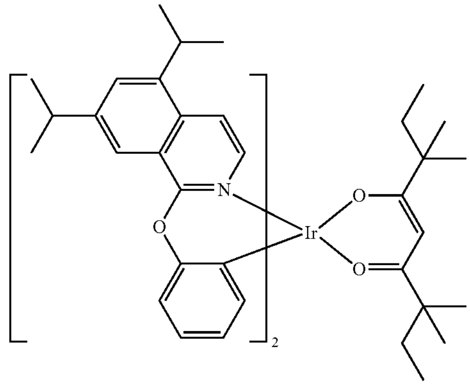
13
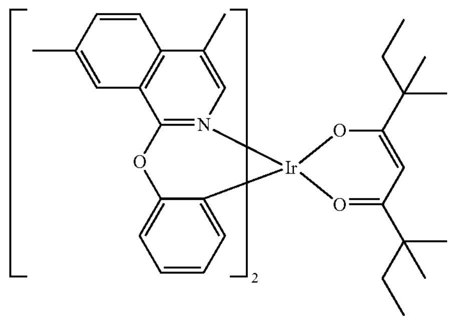
14
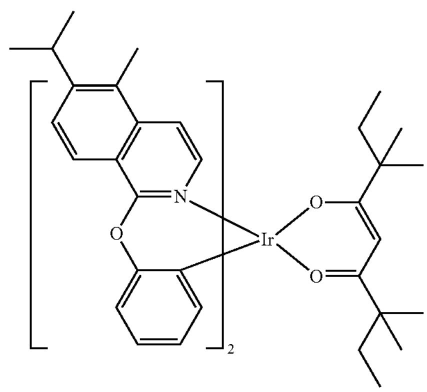
15
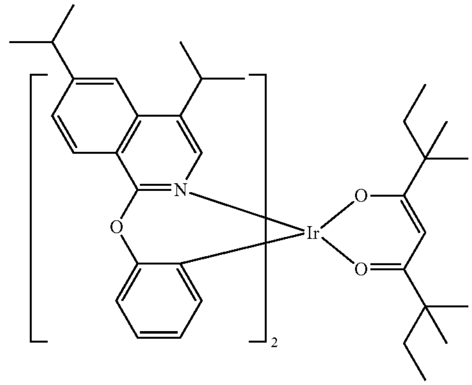

-continued
16
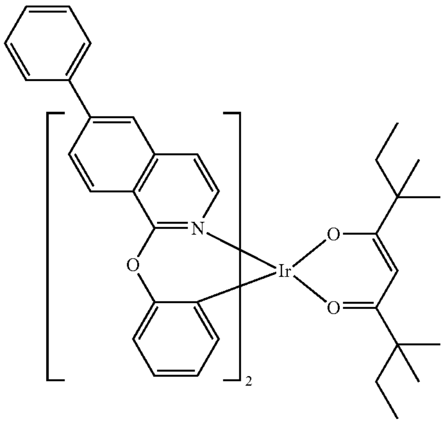
17
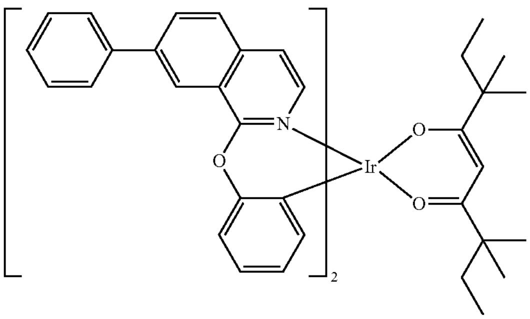
18
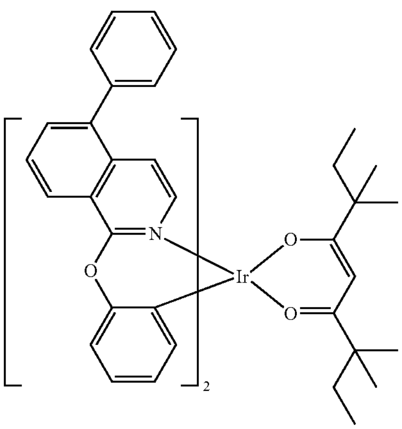
19
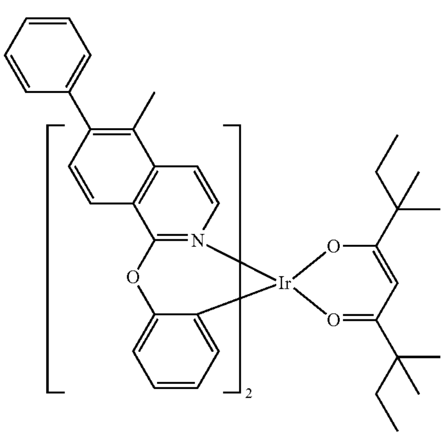
-continued
20
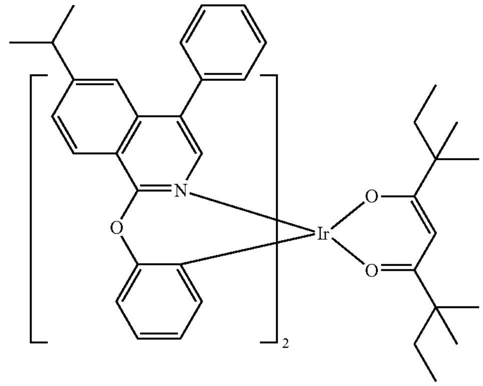
21
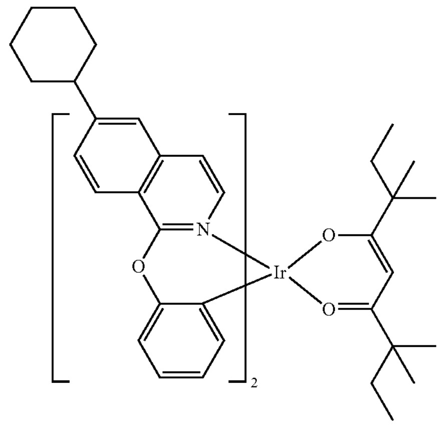
22
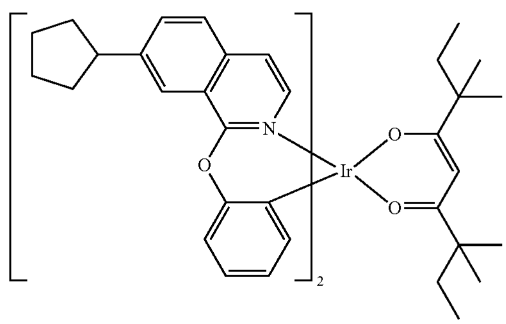
23
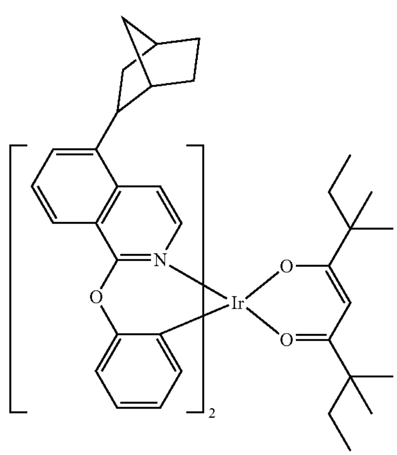

-continued
24
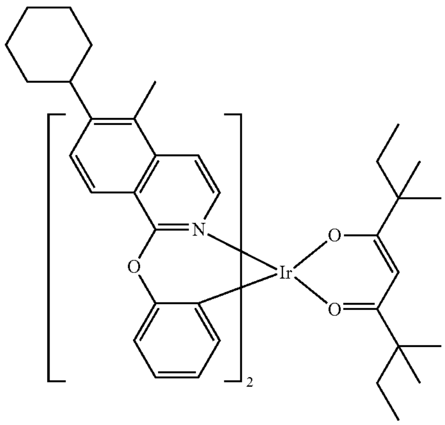
25
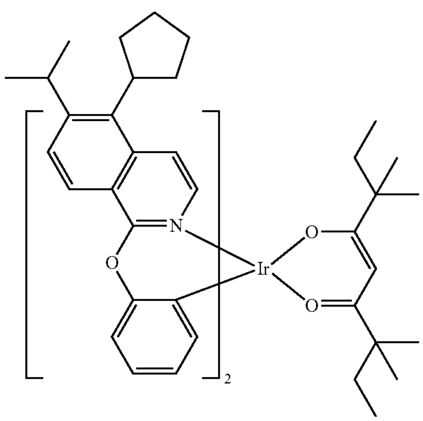
26
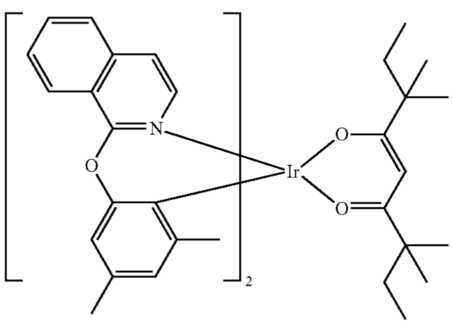
27
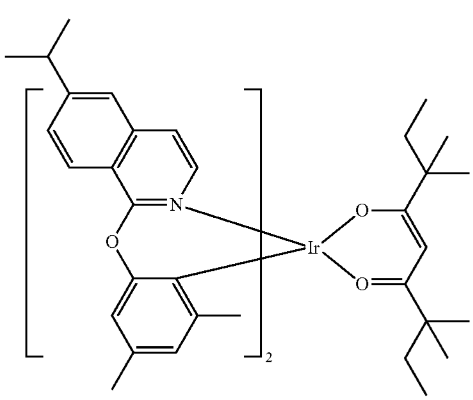
-continued
28
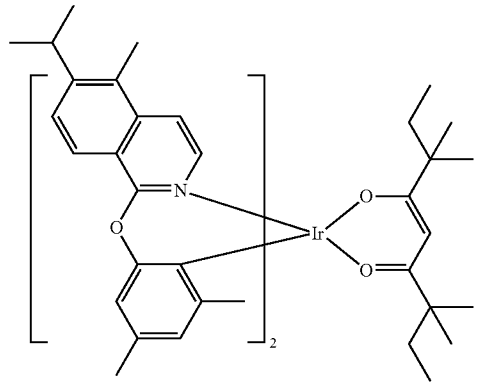
29
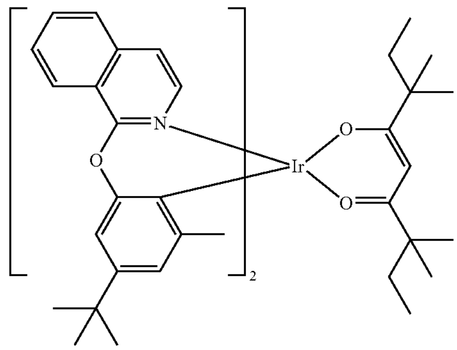
30
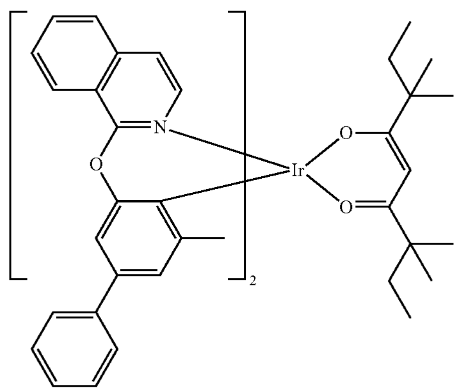
31
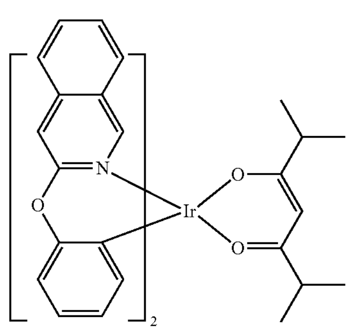

-continued
32
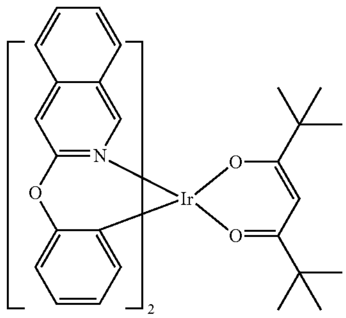
-
33
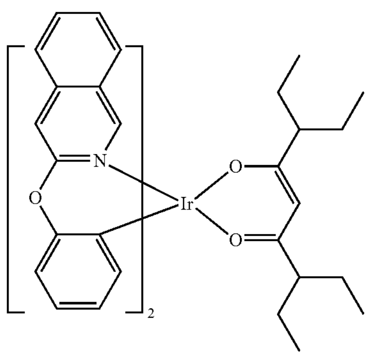
34
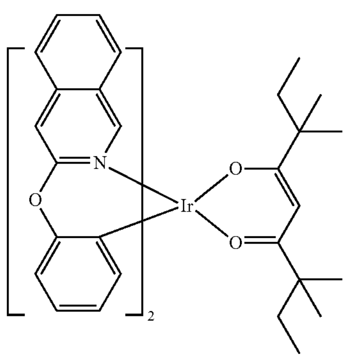
35
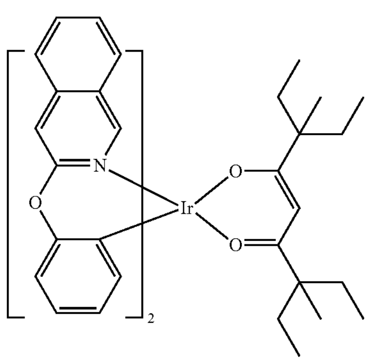
-continued
36
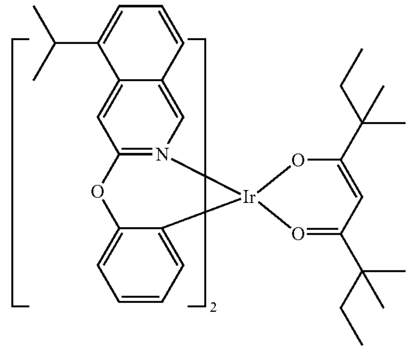
37
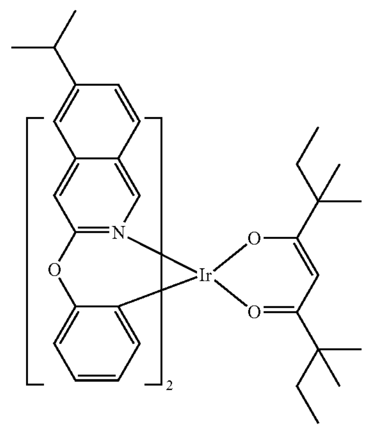
38
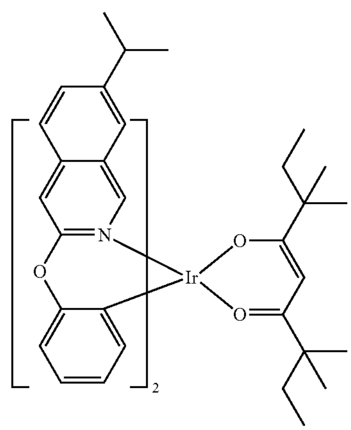
39
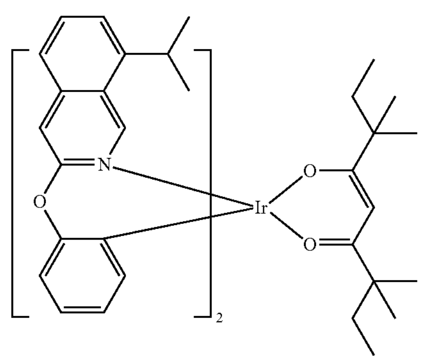

-continued
40
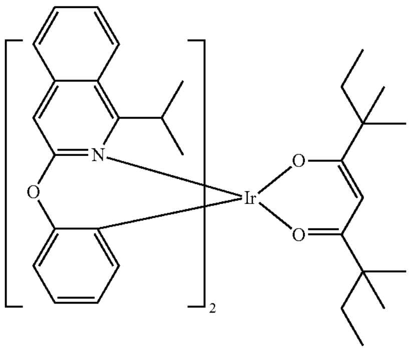
41
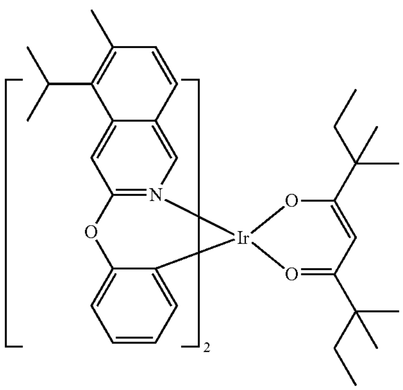
42
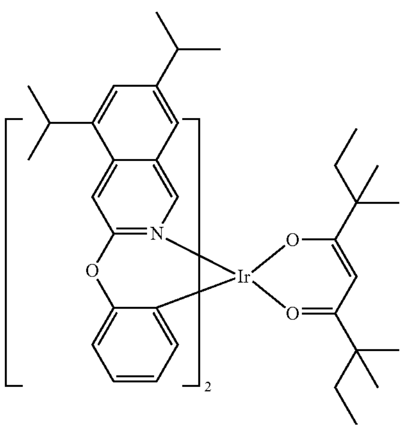
43
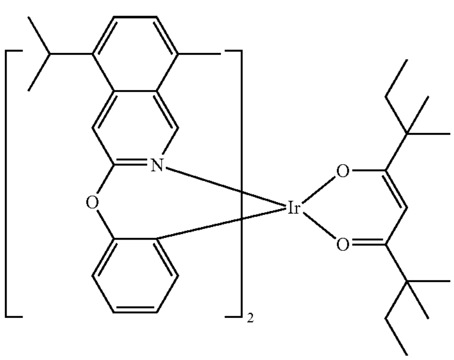
-continued
44
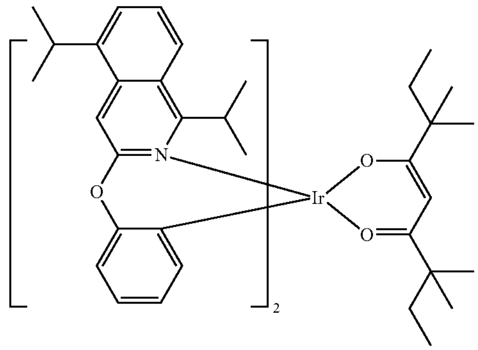
45
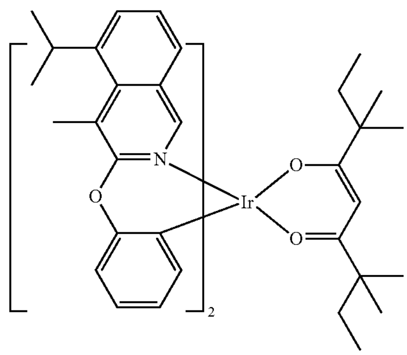
46
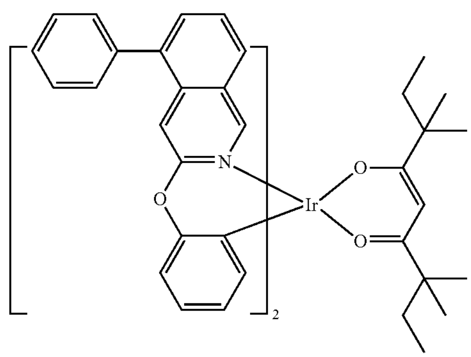
47
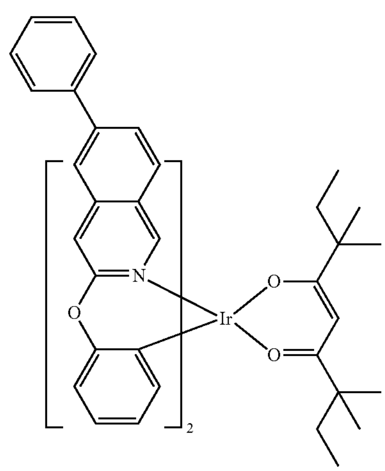

-continued
48
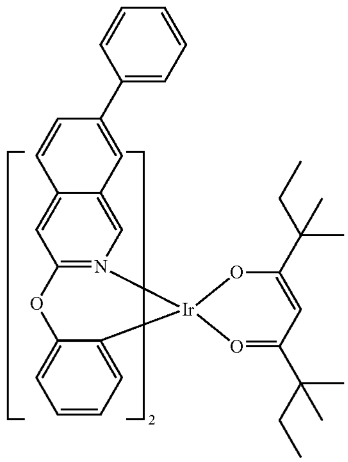
49
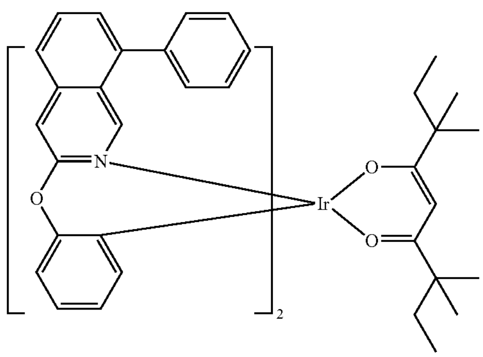
50
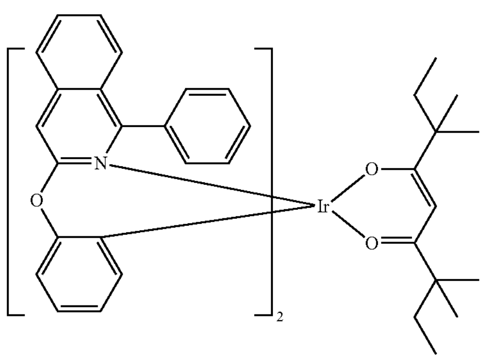
51
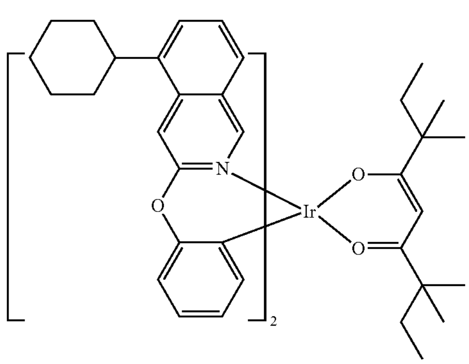
-continued
52
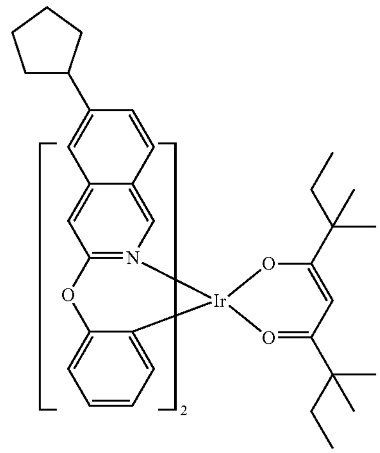
53
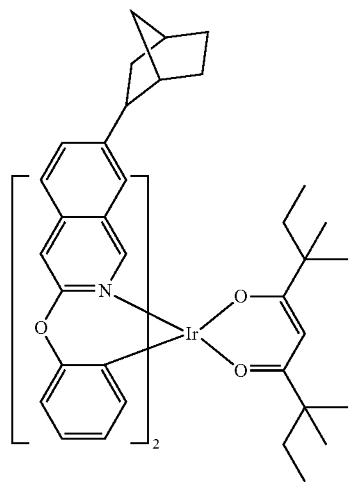
54
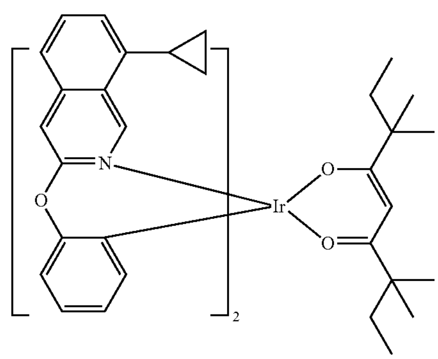
55
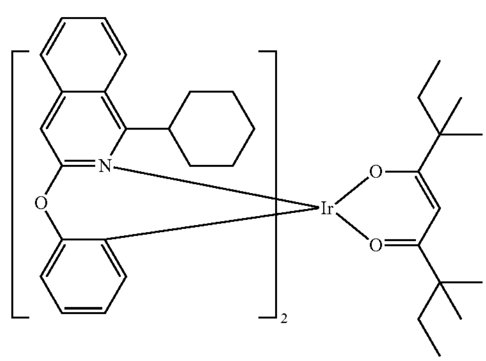

-continued
56
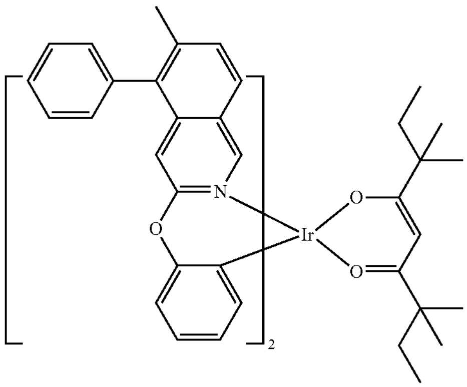
57
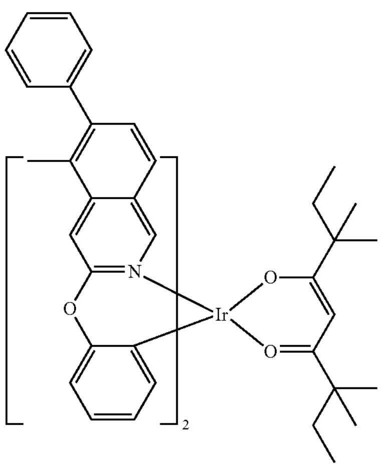
58
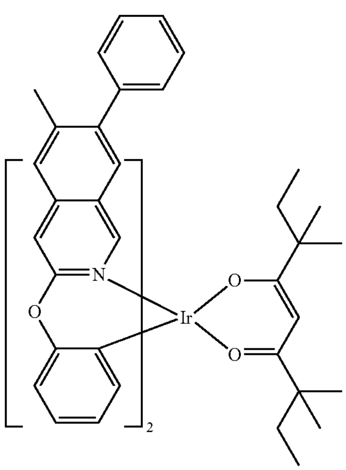
-continued
59
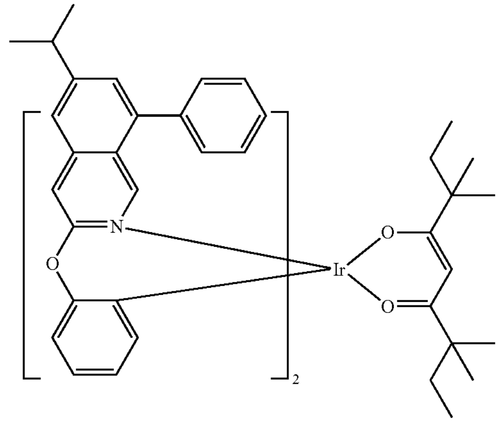
60
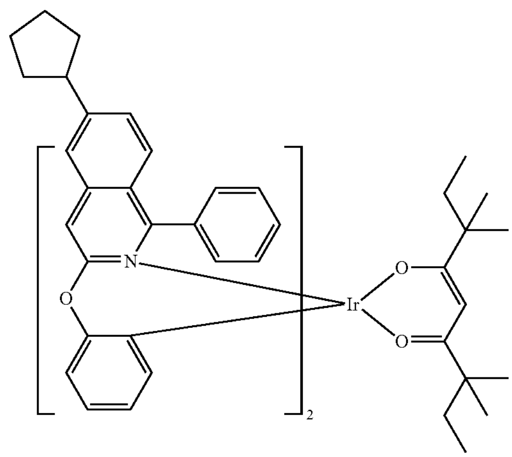
61
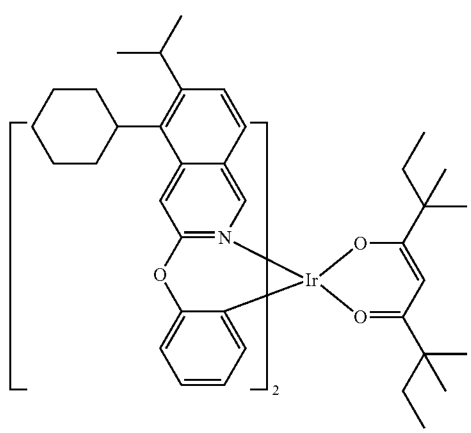

-continued
62
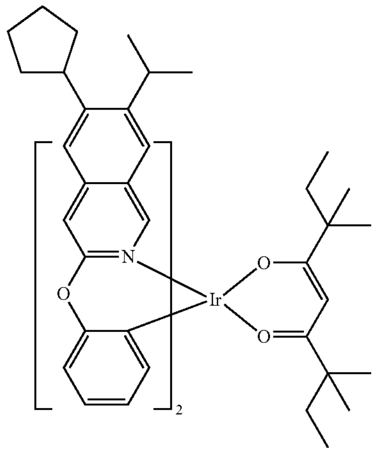
63
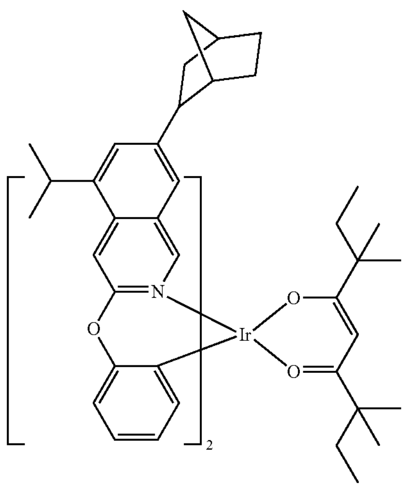
64
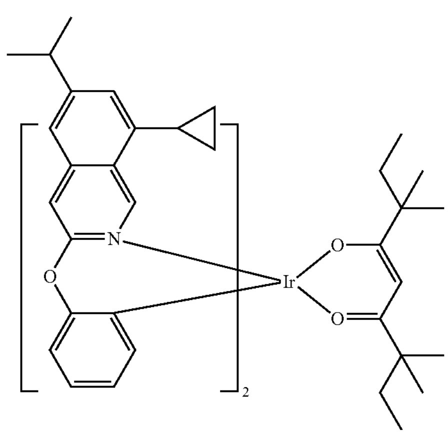
-continued
65
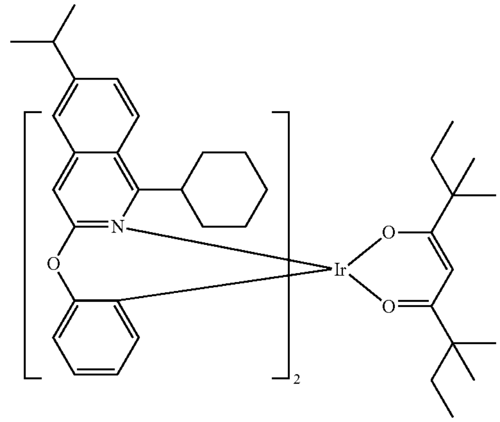
66
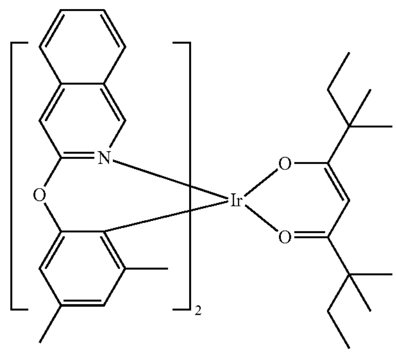
67
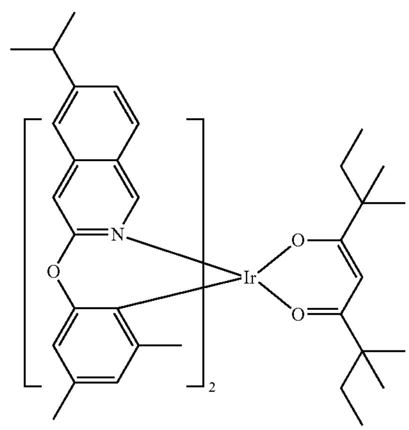
68
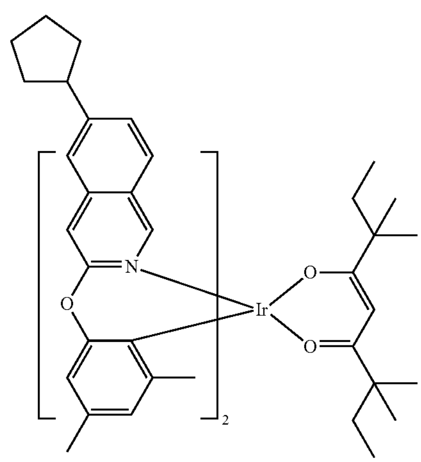

-continued
69
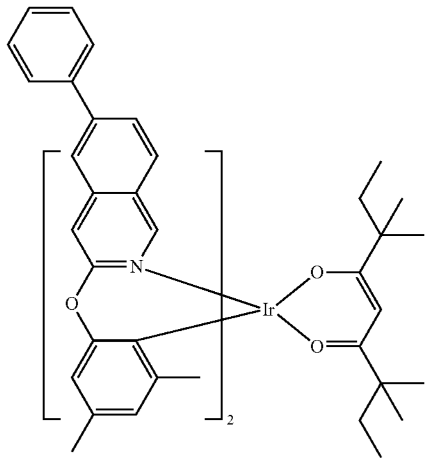
70
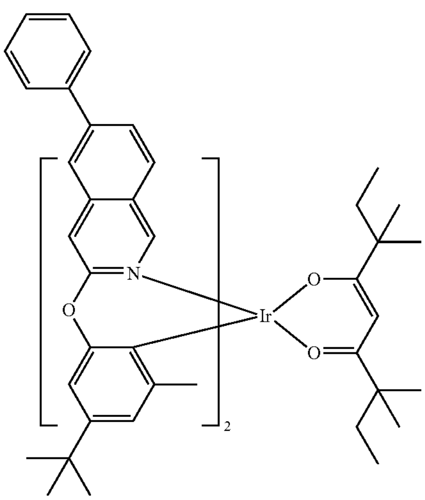
71
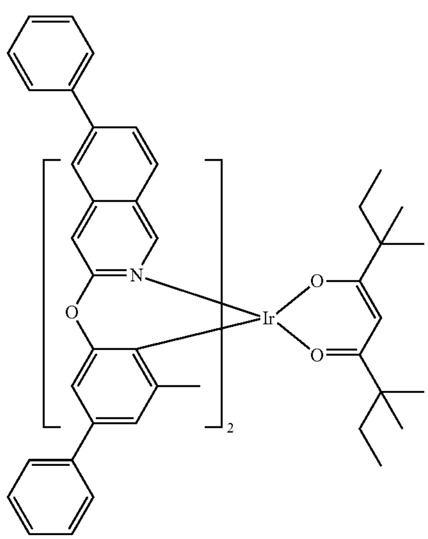
-continued
72
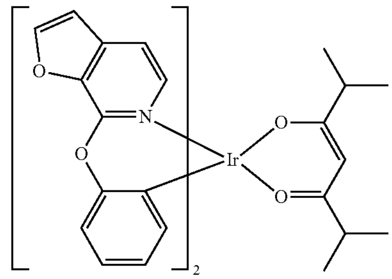
73
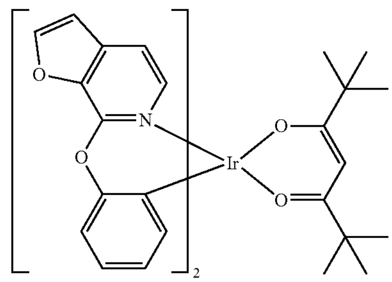
74
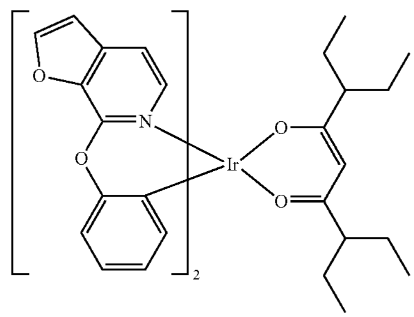
76
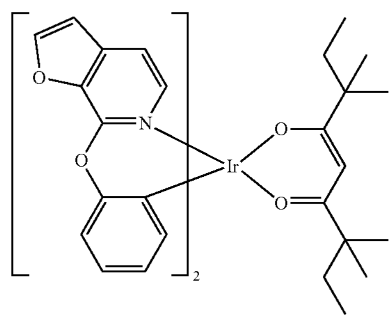
76
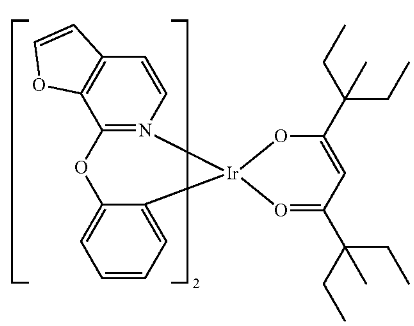

-continued
77
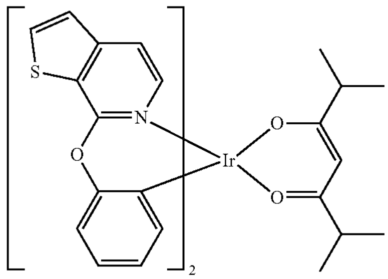
78
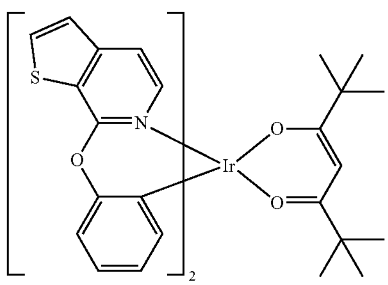
79
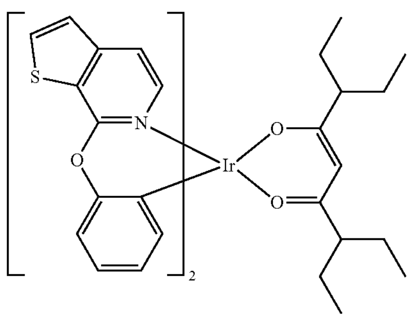
80
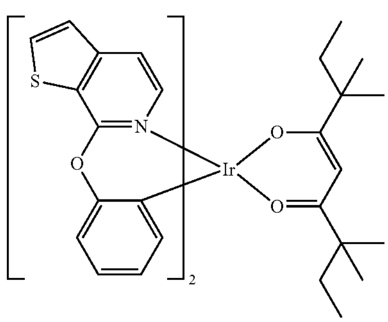
81
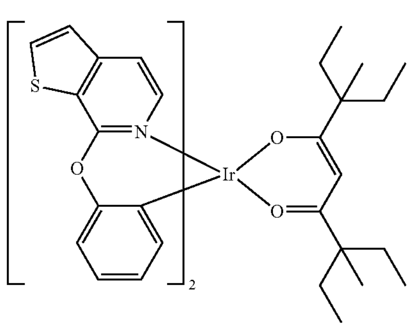
-continued
82
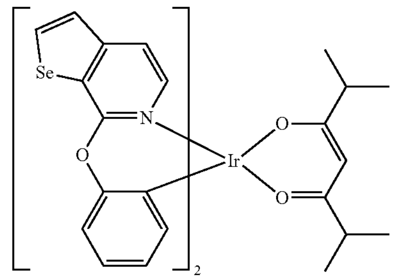
83
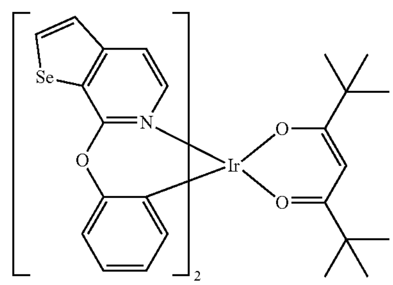
84
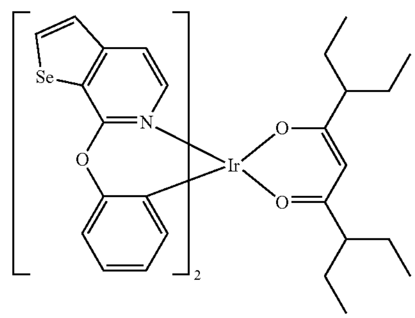
85
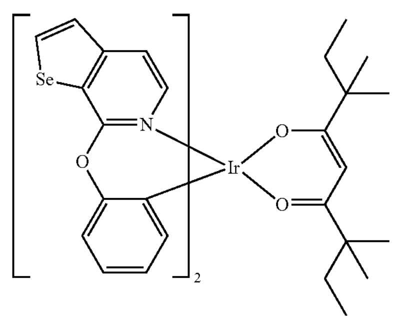
86
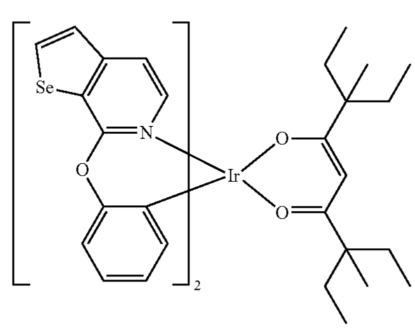

-continued
87
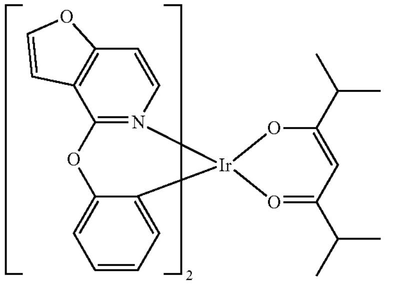
88
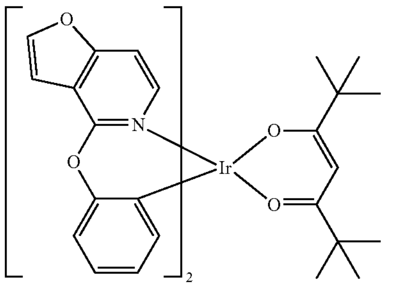
89
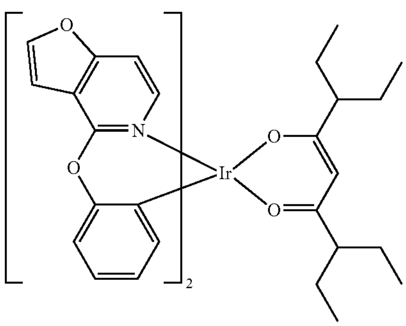
90
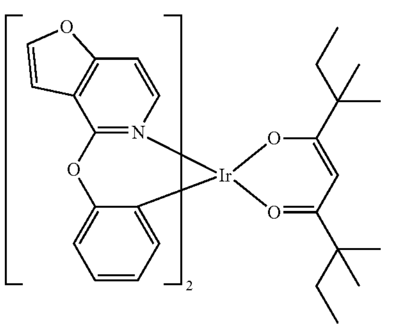
91
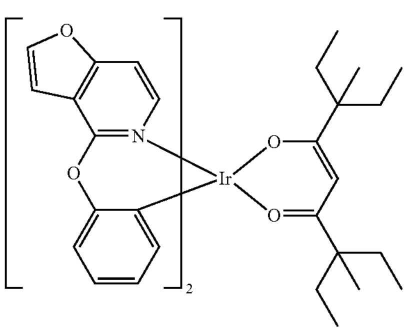
-continued
92
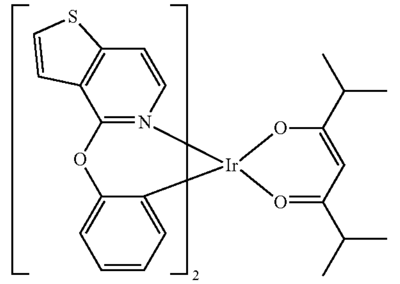
93
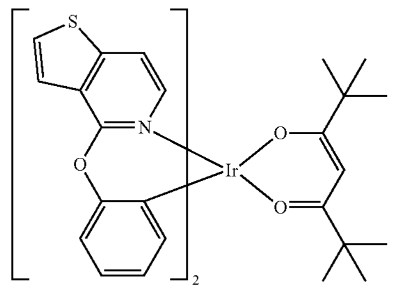
94
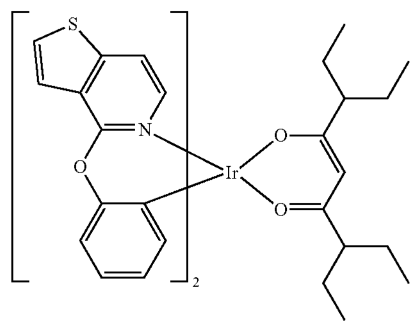
95
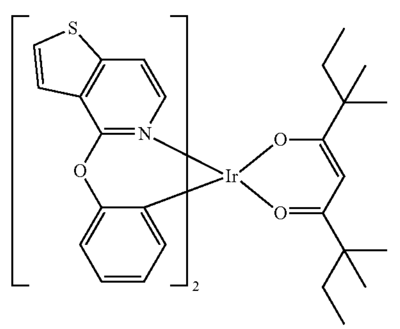
96
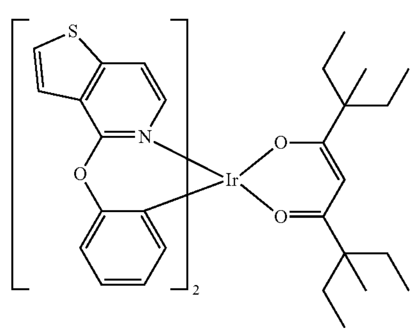

97
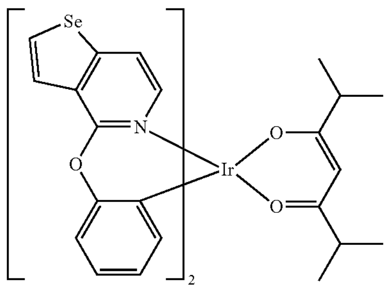
98
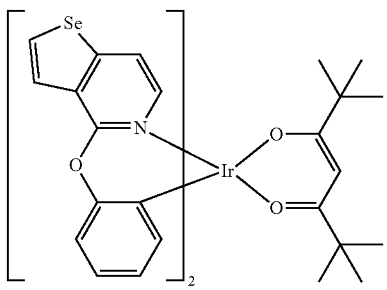
99
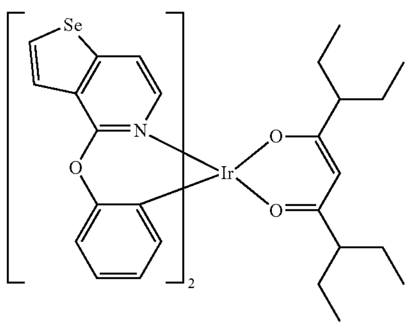
100
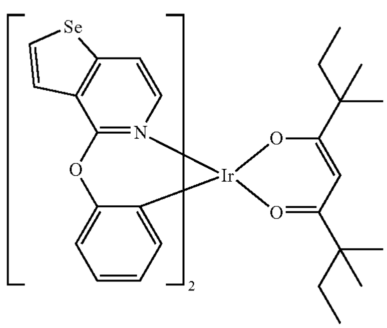
101
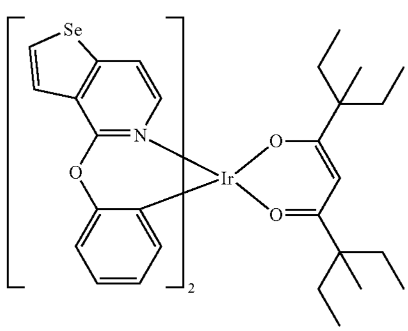
102
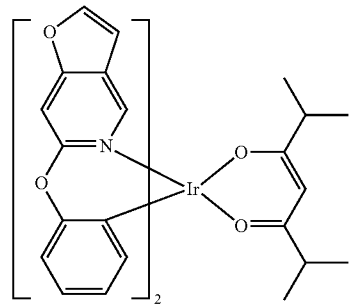
103
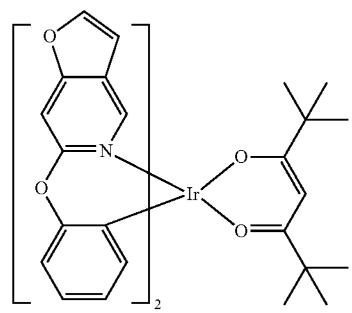
104
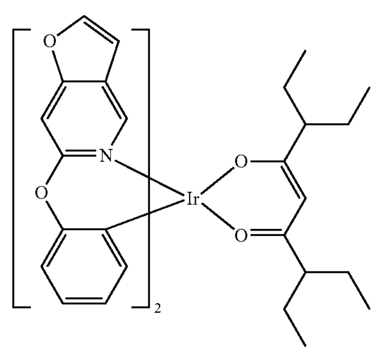
105
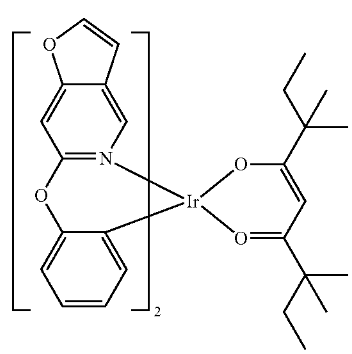

-continued
106
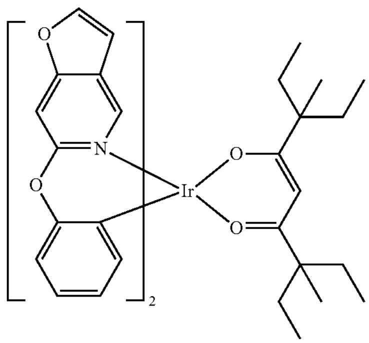
107
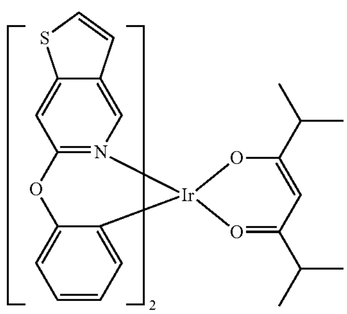
108
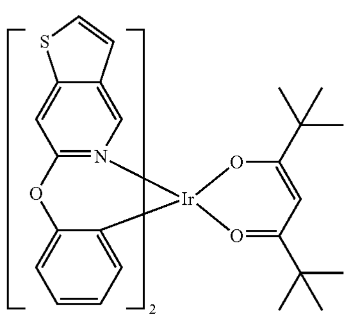
109
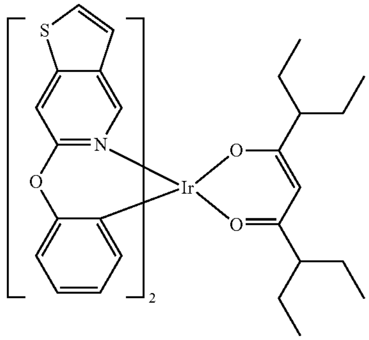
-continued
110
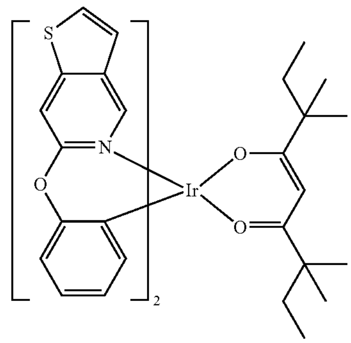
111
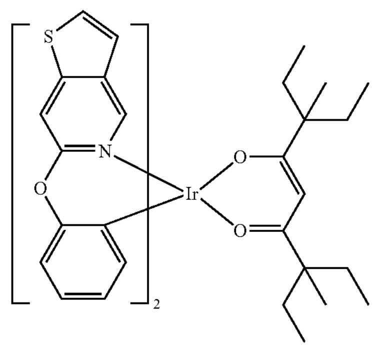
112
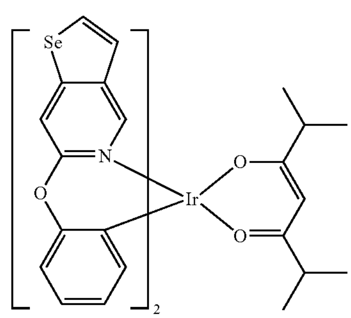
113
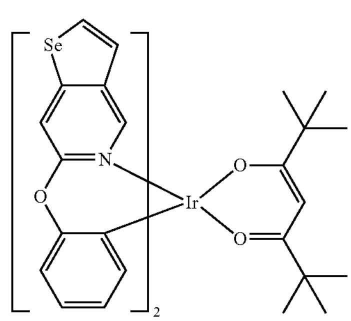

-continued
114
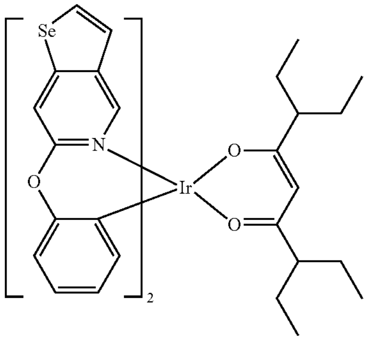
115
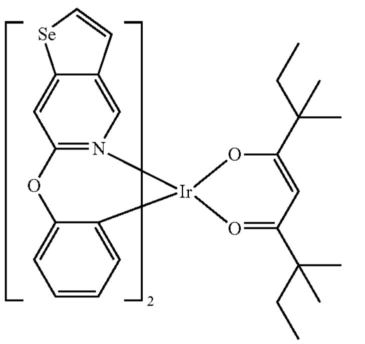
116
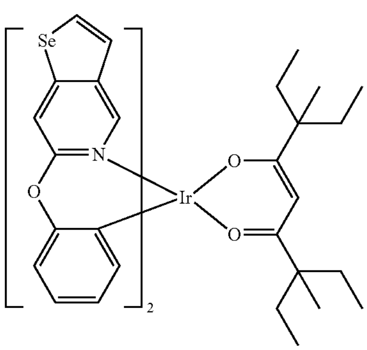
117
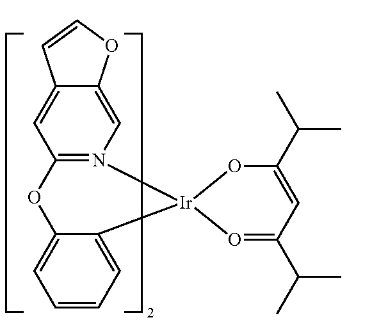
-continued
118
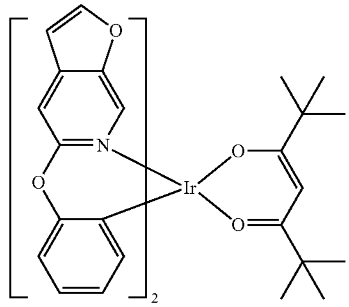
119
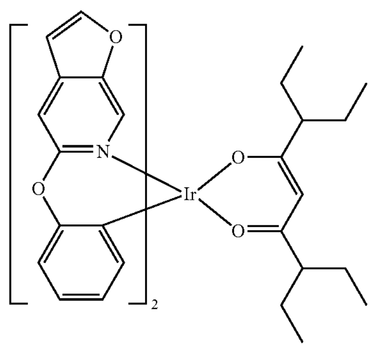
120
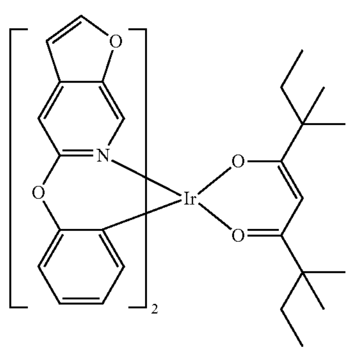
121
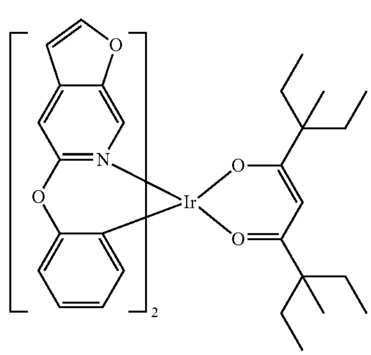

-continued
122
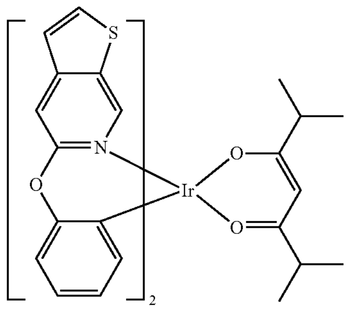
123
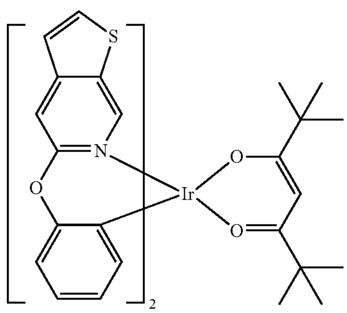
124
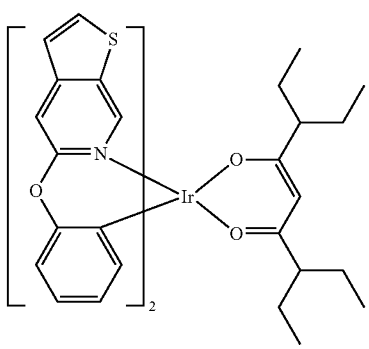
125
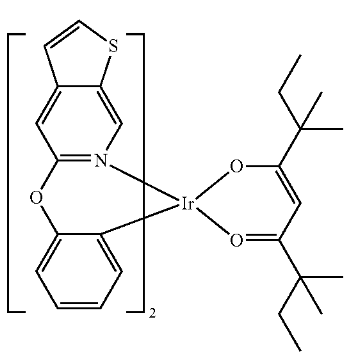
-continued
126
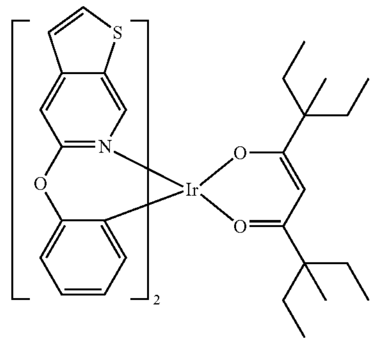
127
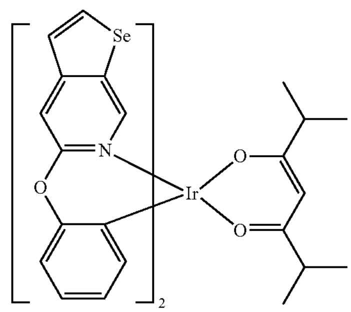
128
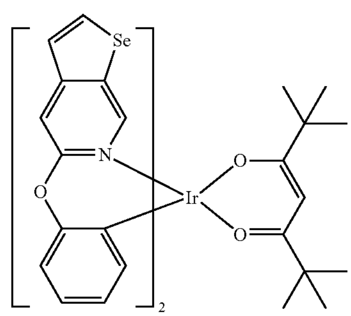
129
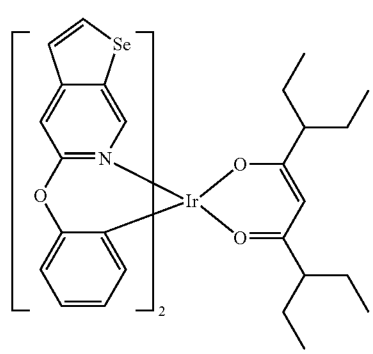

-continued
130
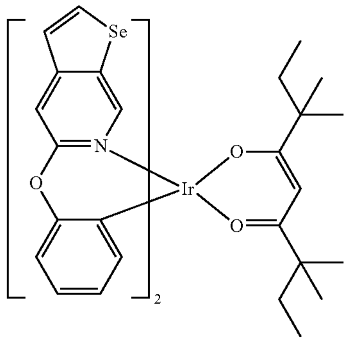
131
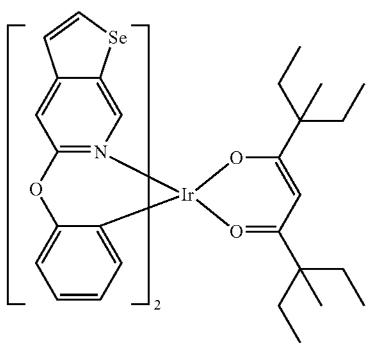
132
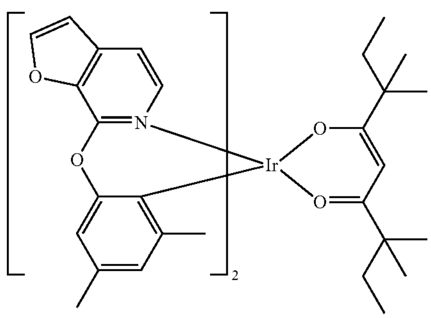
133
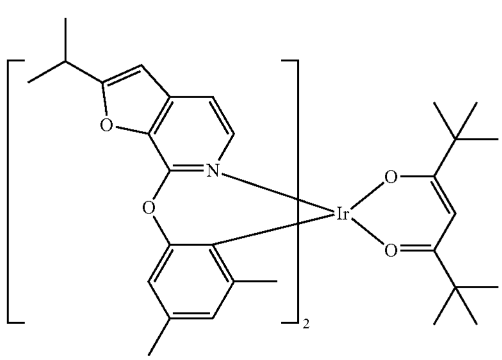
-continued
134
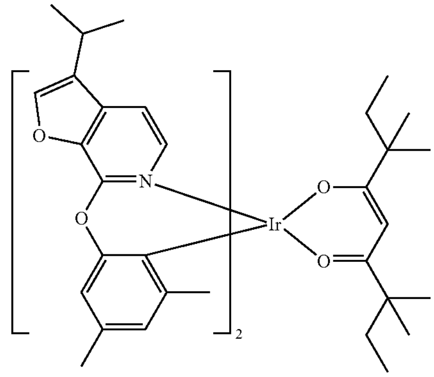
135
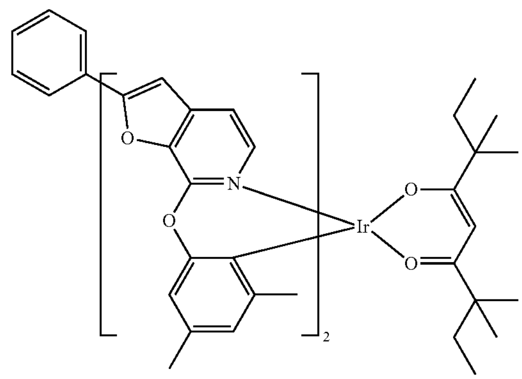
136
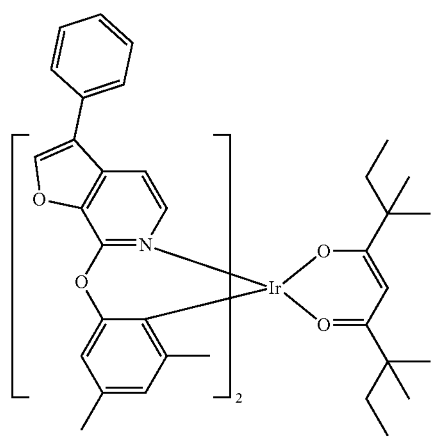
137
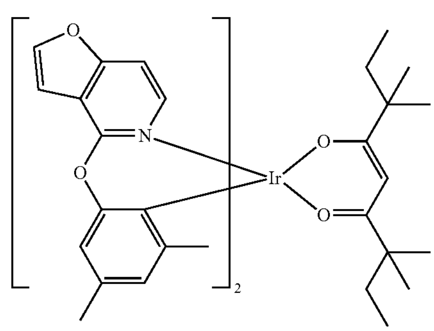

-continued
138
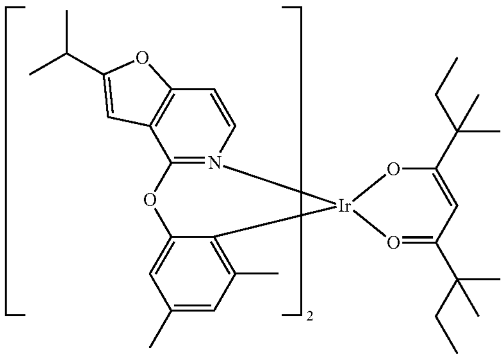
139
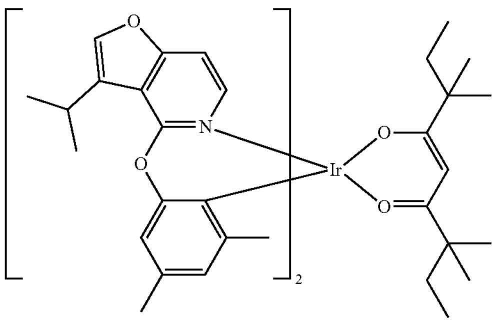
140
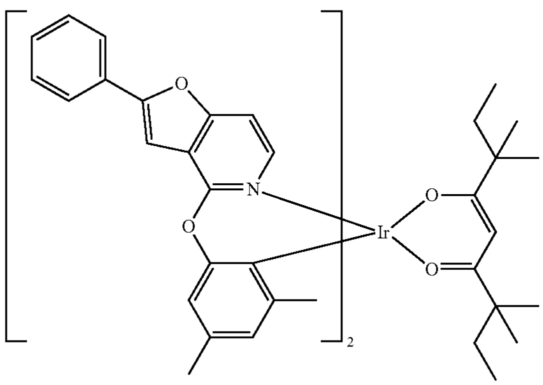
141
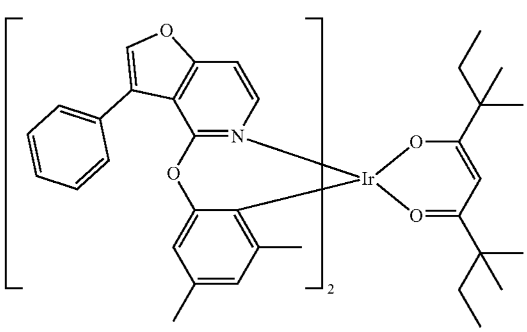
-continued
142
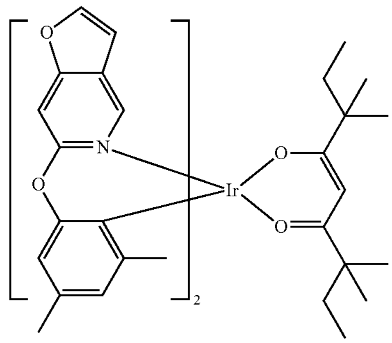
143
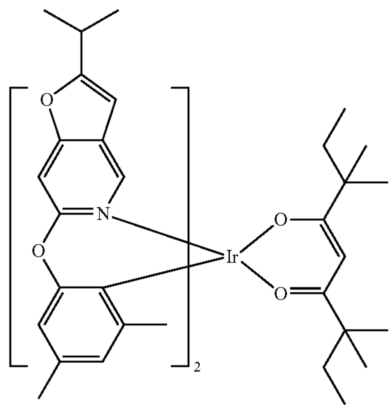
144
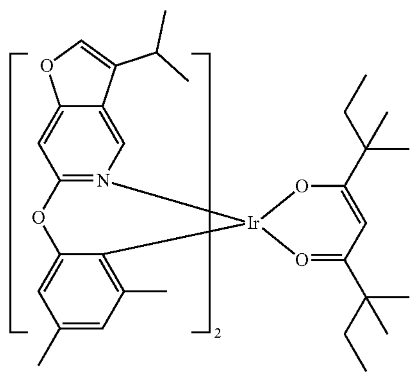
145
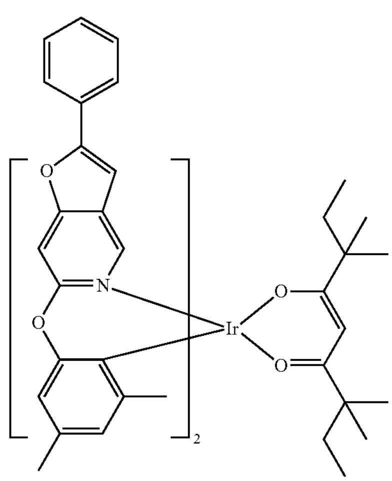

-continued
146
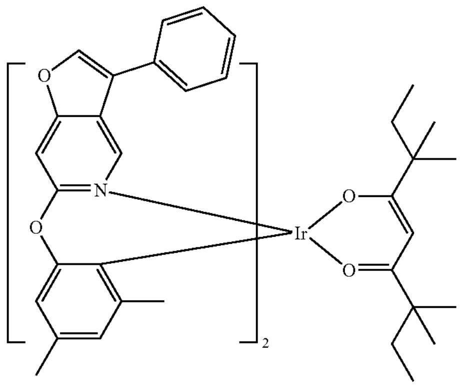
147
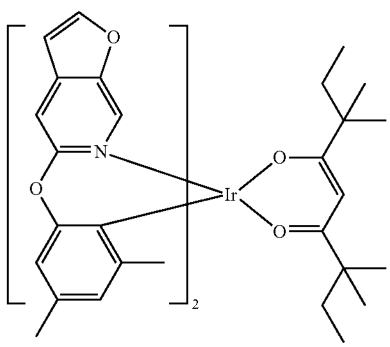
148
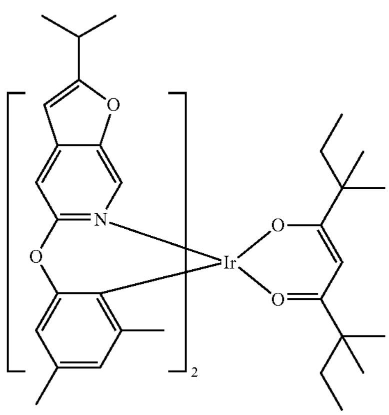
149
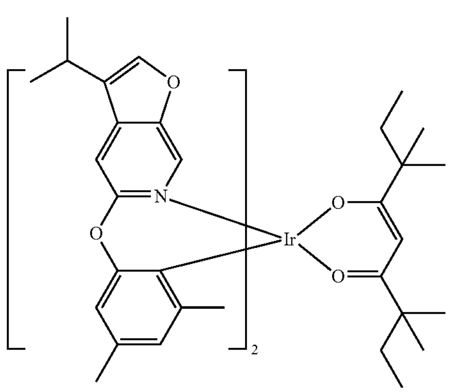
-continued
150
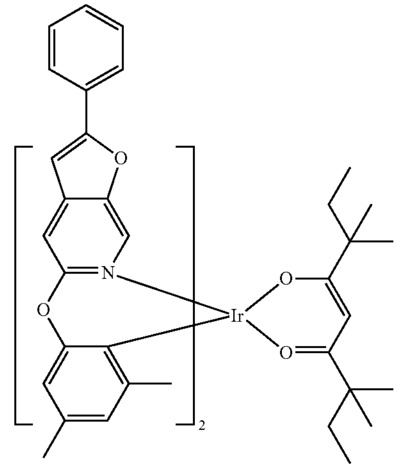
151
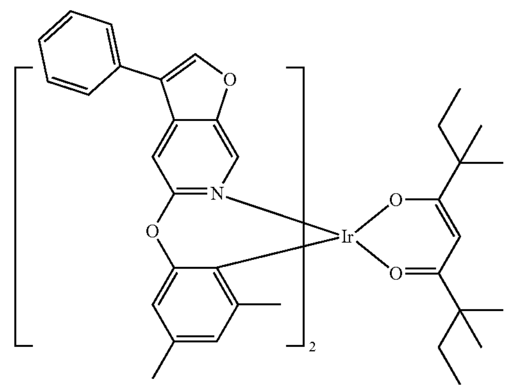
152
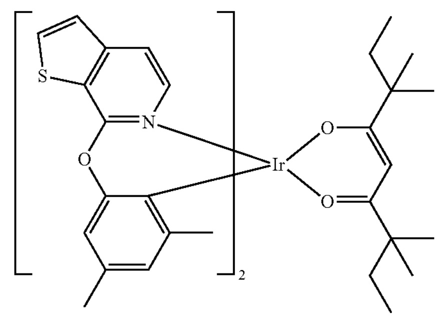
153
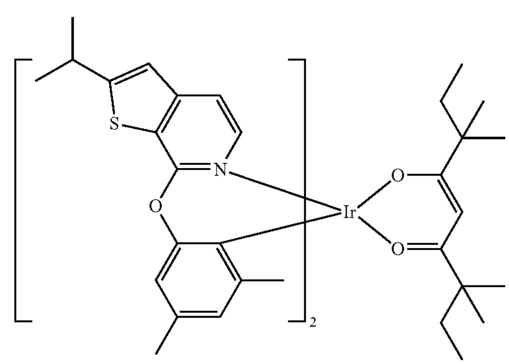

-continued
154
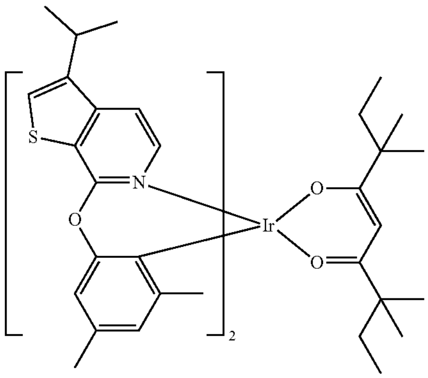
155
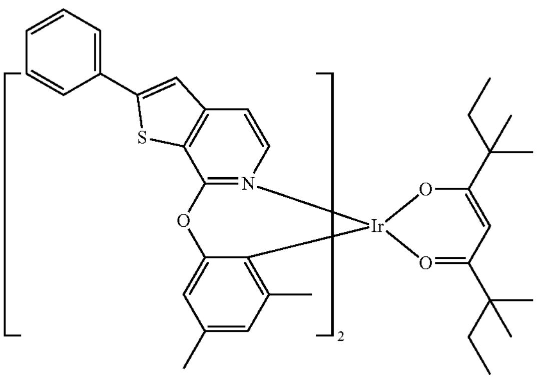
156
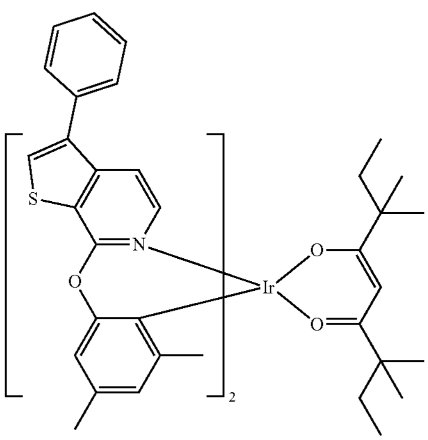
157
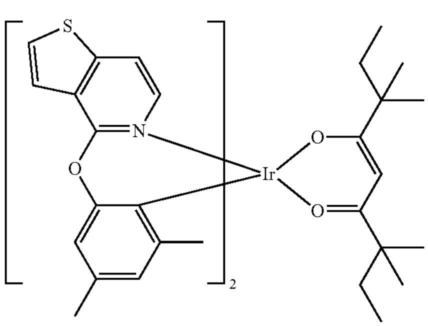
158
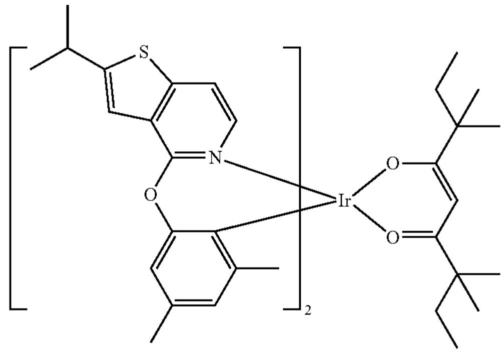
159
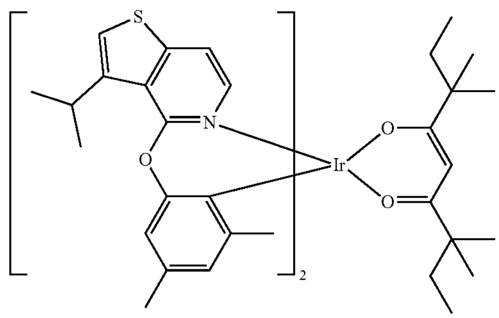
160
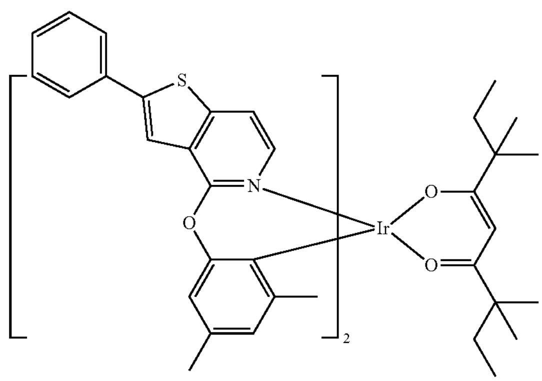
161
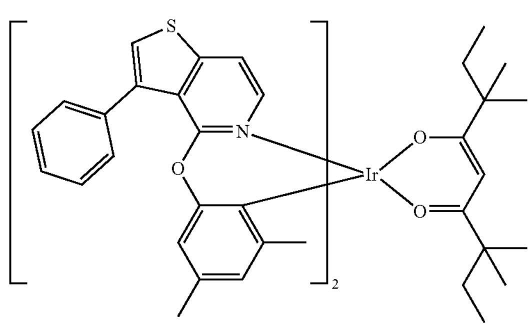

-continued
162
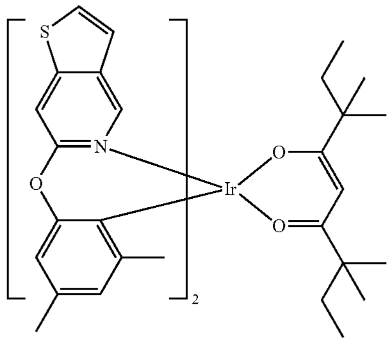
163
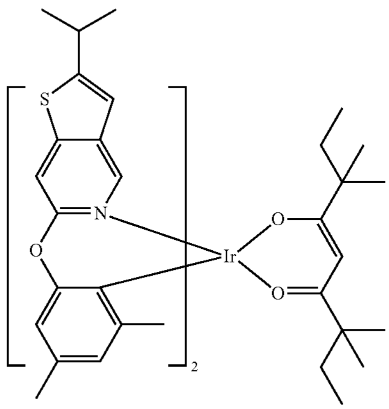
164
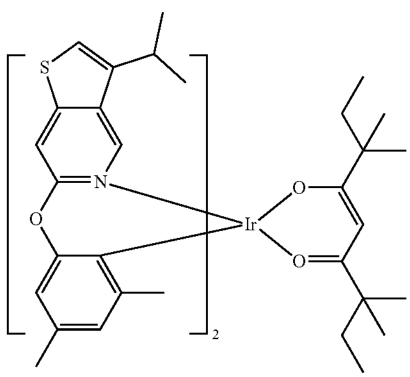
165
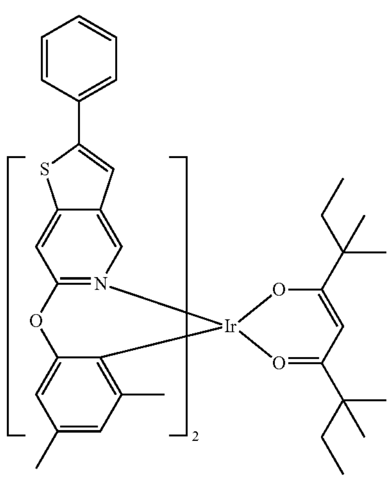
-continued
166
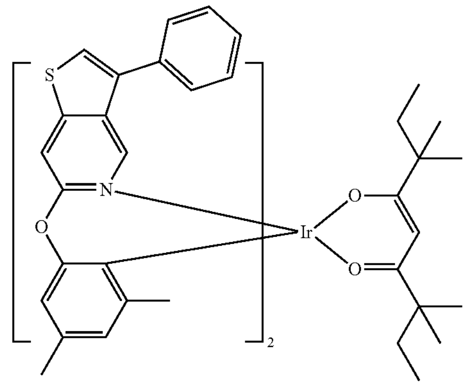
167
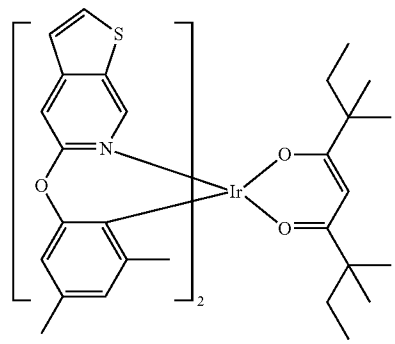
168
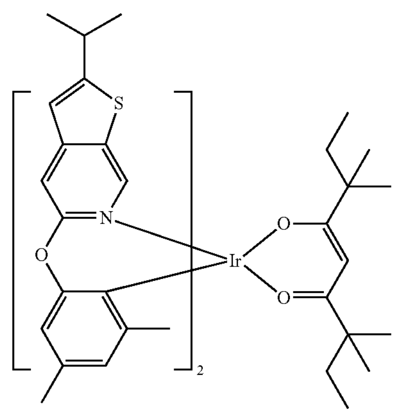
169
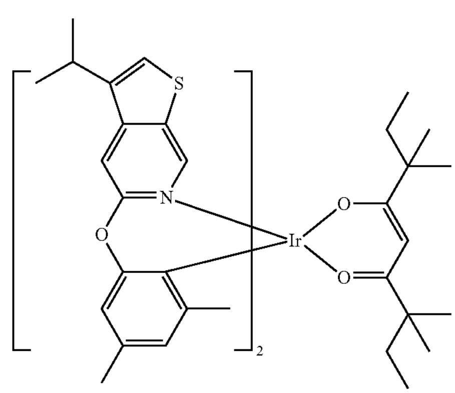

-continued
170
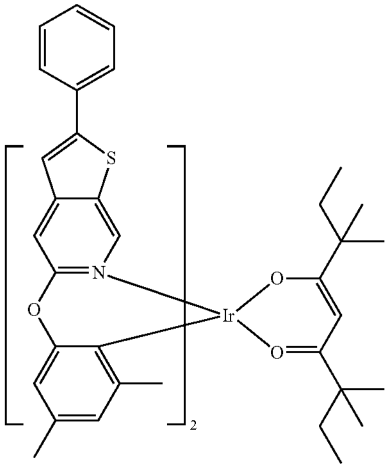
171
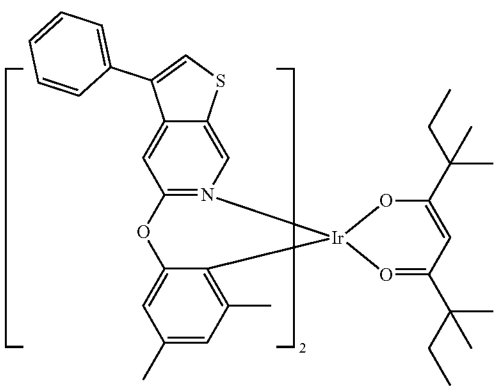
172
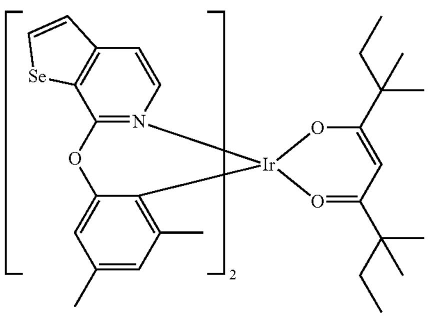
173
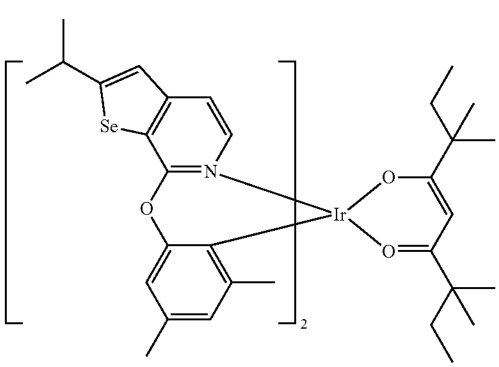
-continued
174
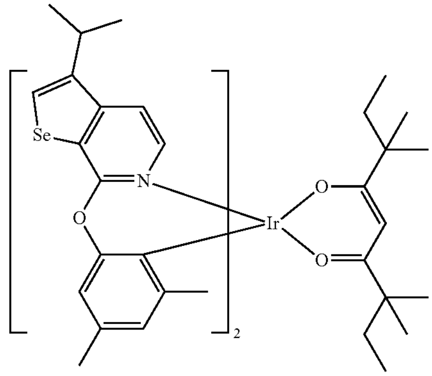
175
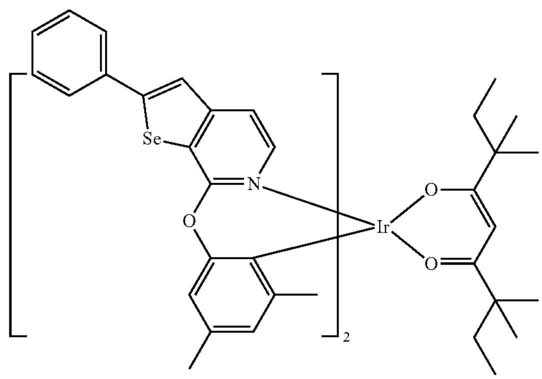
176
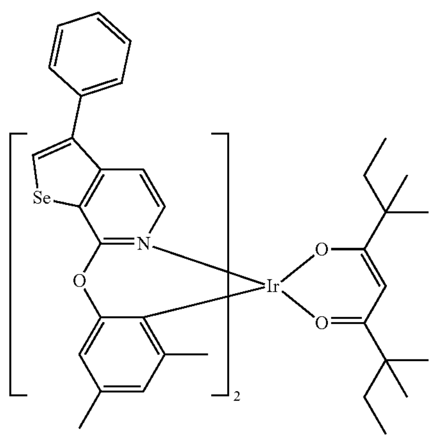
177
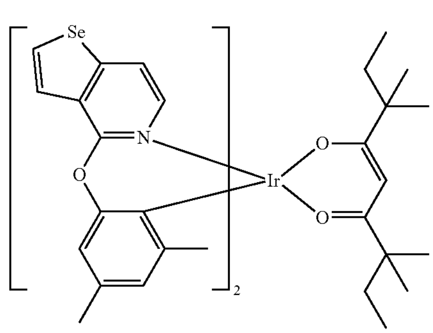

178
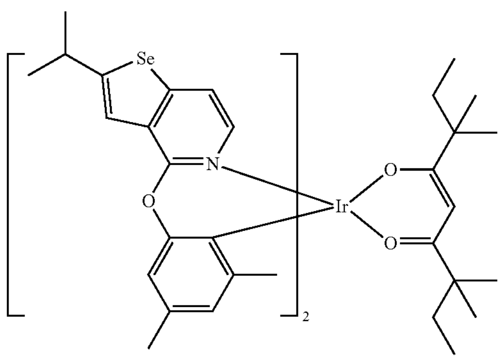
179
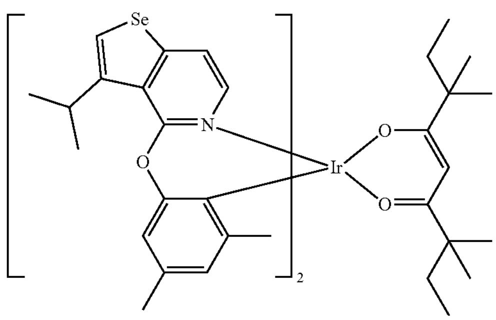
180
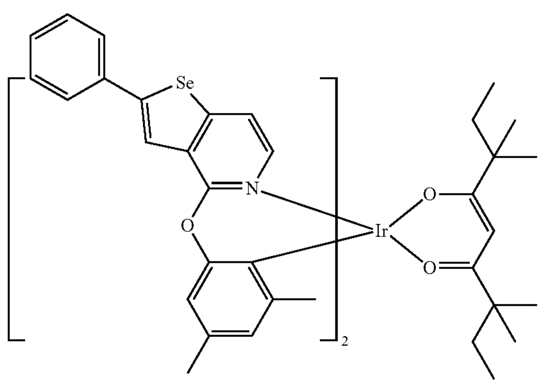
181
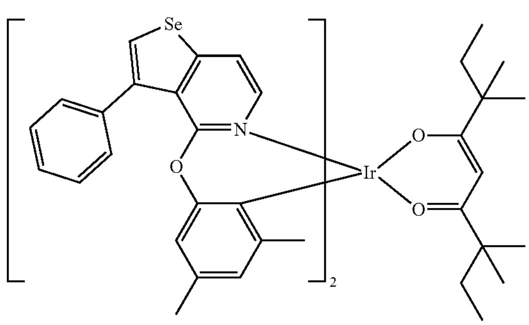
182
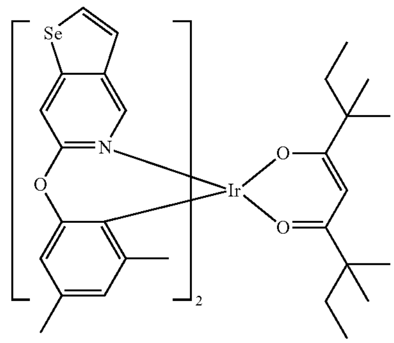
183
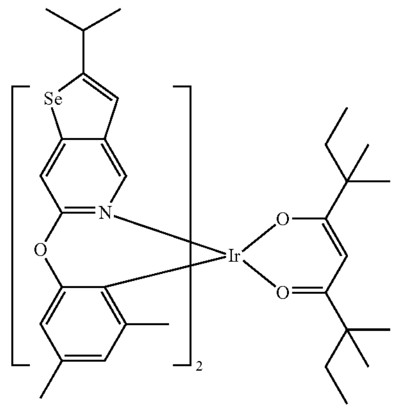
184
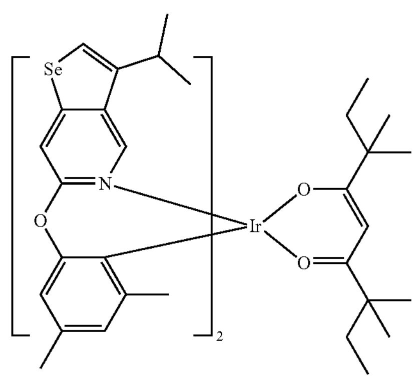
185
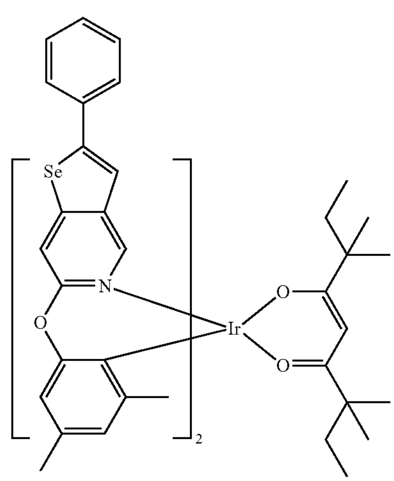

-continued
186
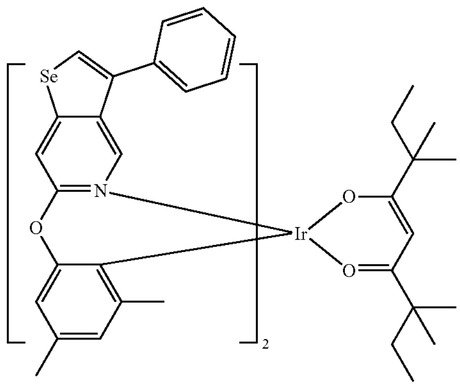
187
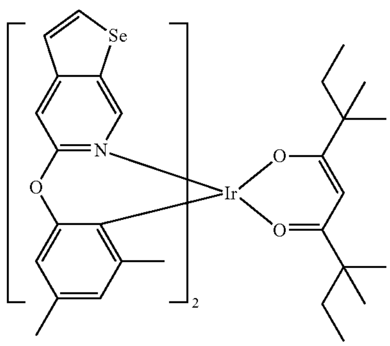
188
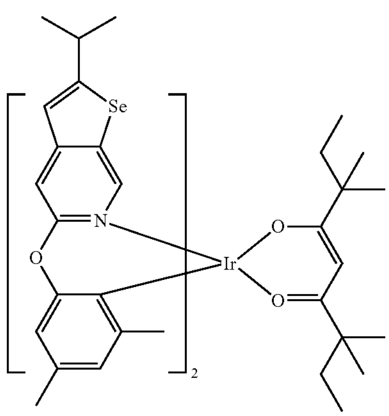
189
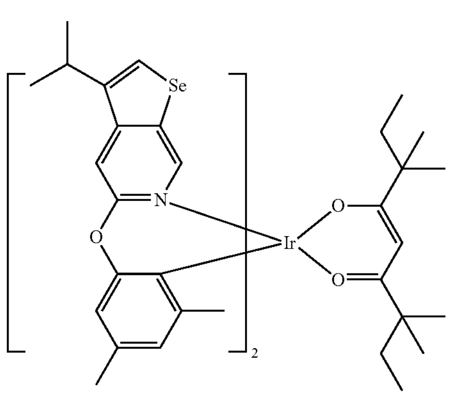
-continued
190
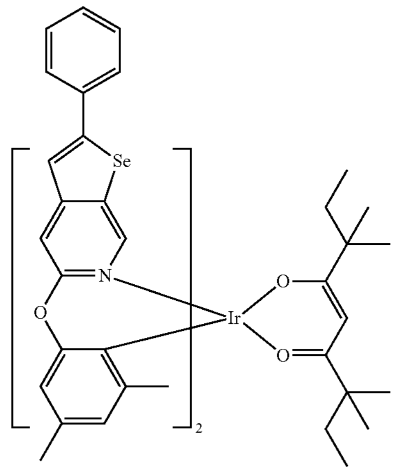
191
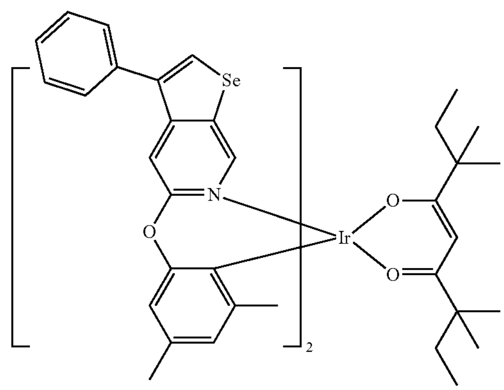
192
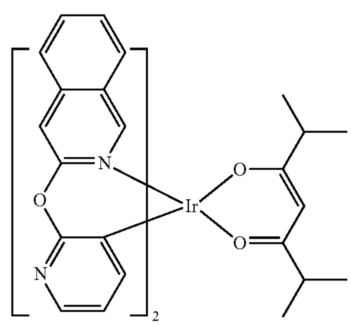
193
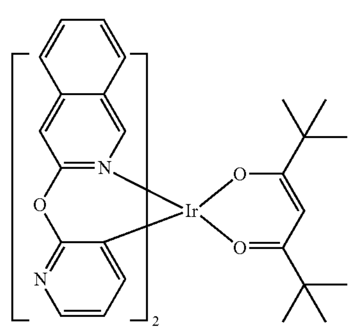

-continued
194
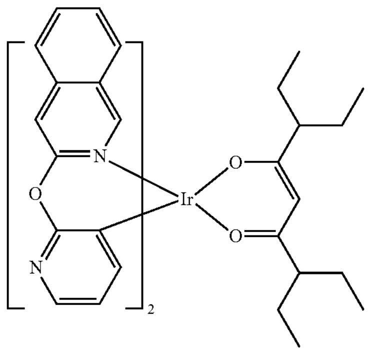
195
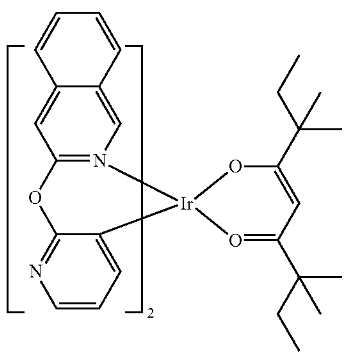
196
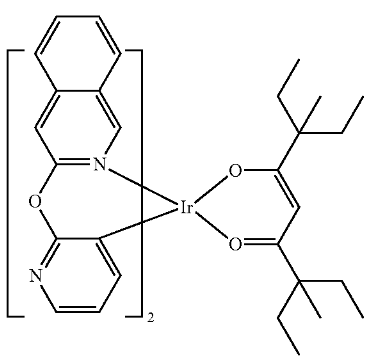
197
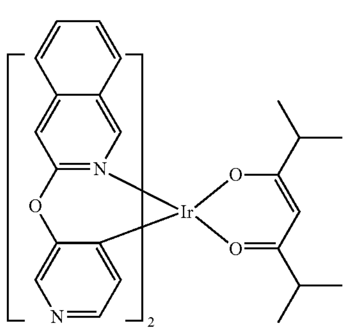
-continued
198
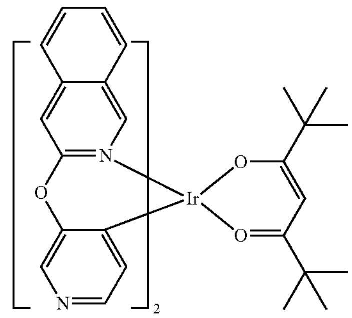
199
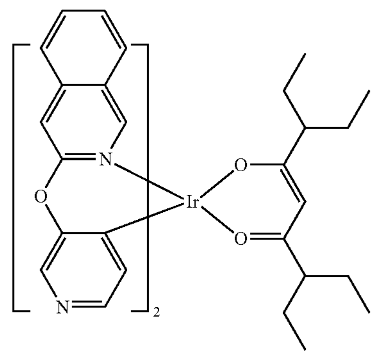
200
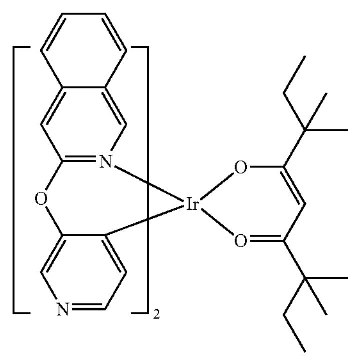
201
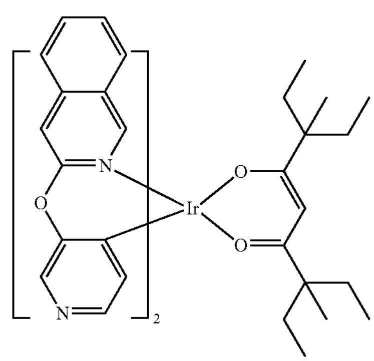

-continued
202
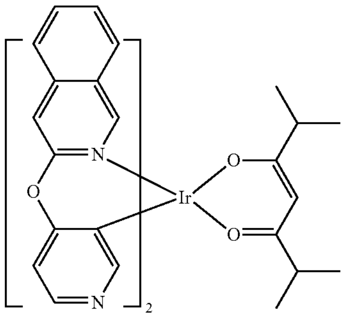
203
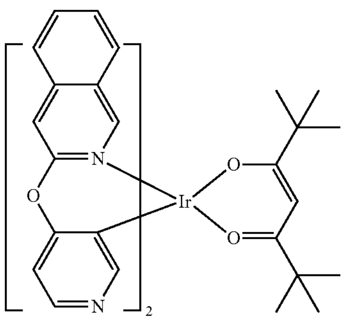
204
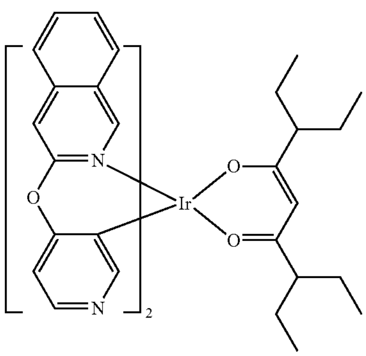
205
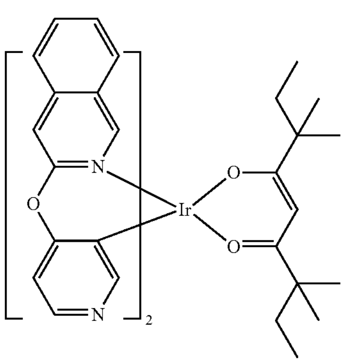
-continued
206
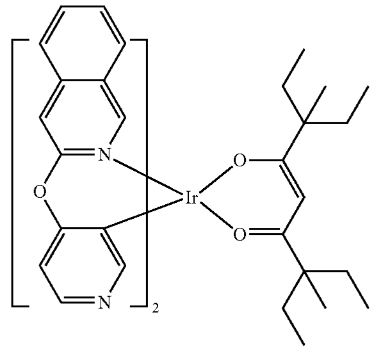
207
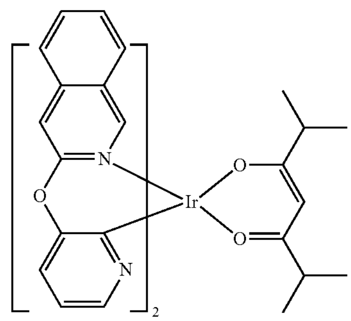
208
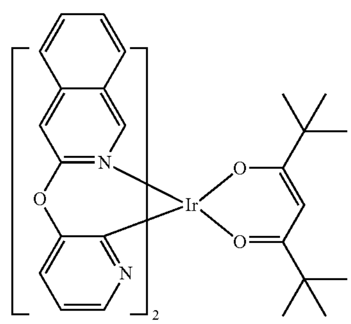
209
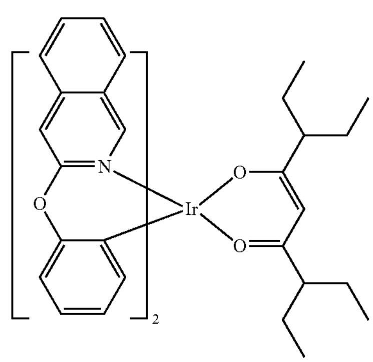

-continued
210
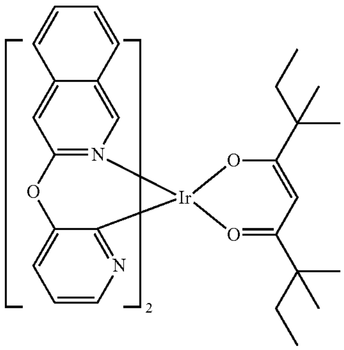
211
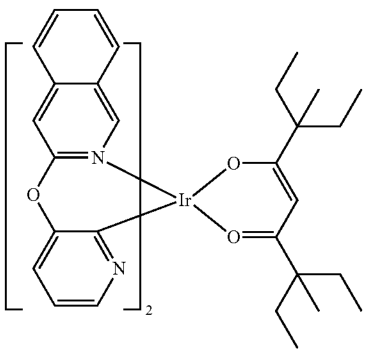
212
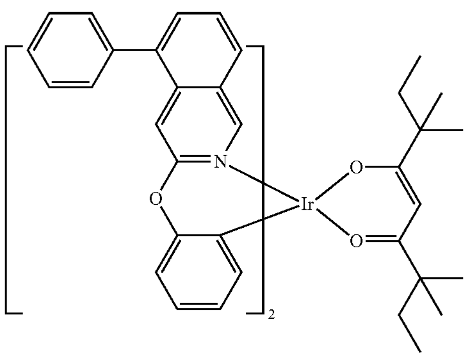
213
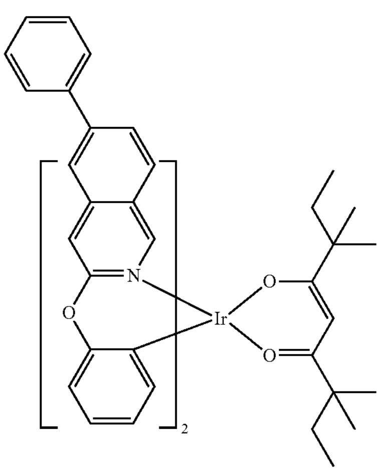
-continued
214
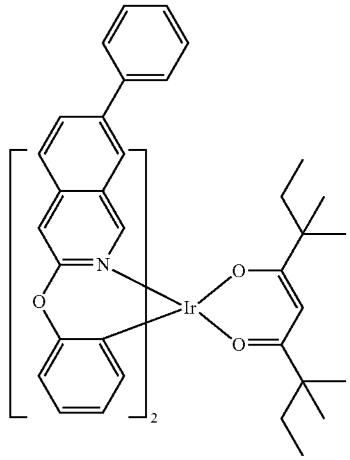
215
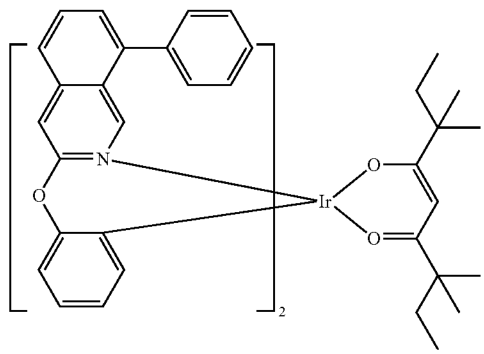
216
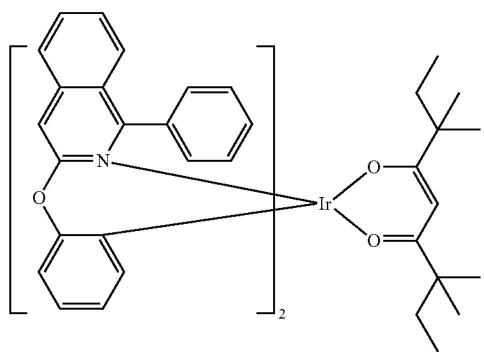
217
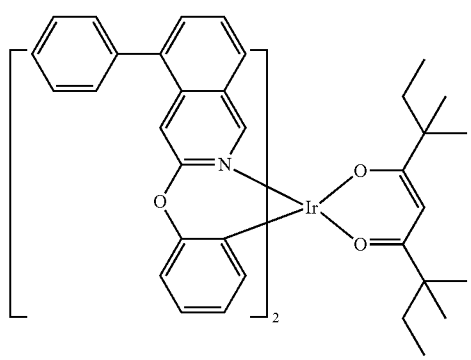

-continued
218
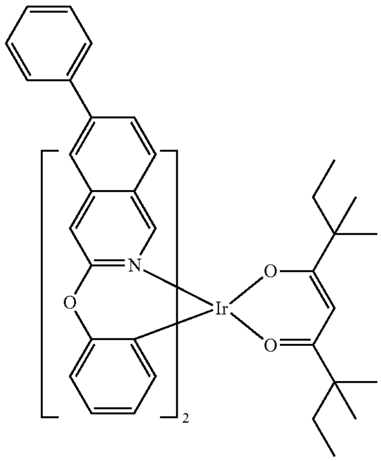
219
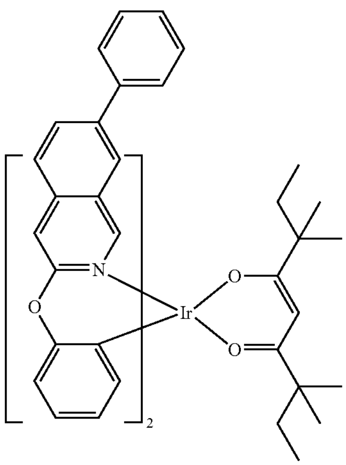
220
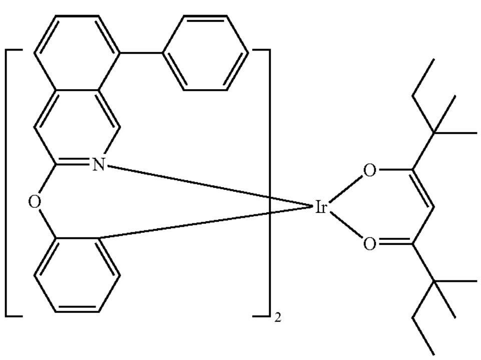
221
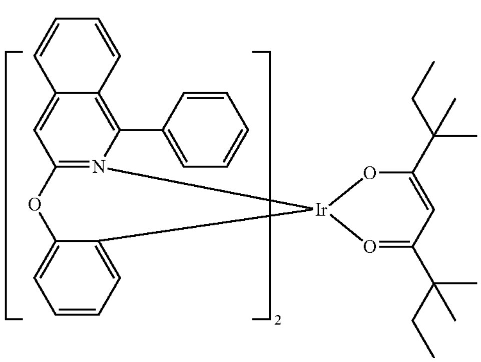
-continued
222
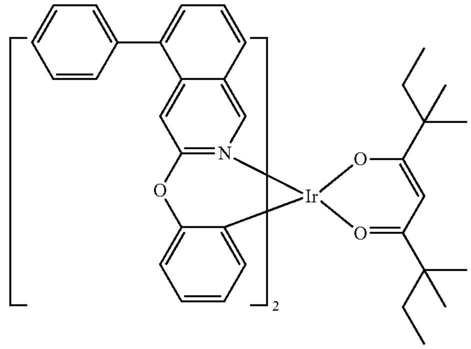
223
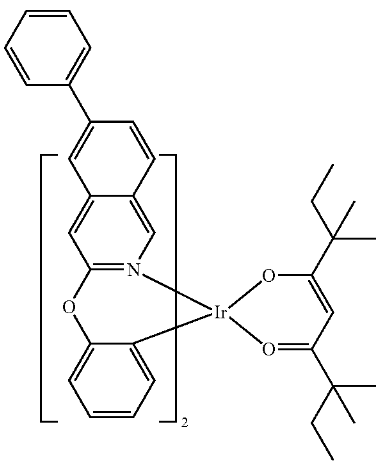
224
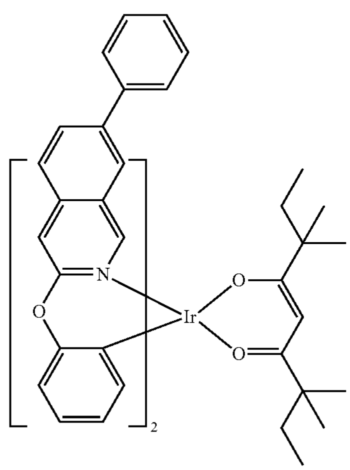
225
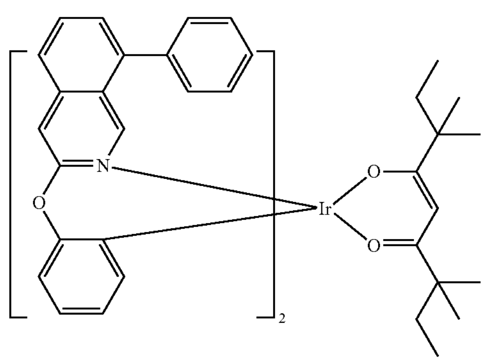

-continued
226
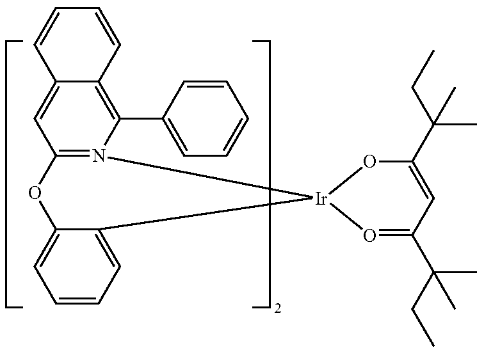
227
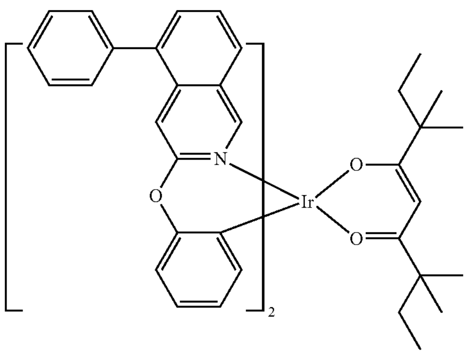
228
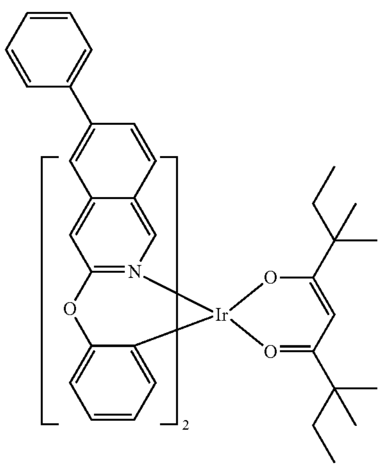
229
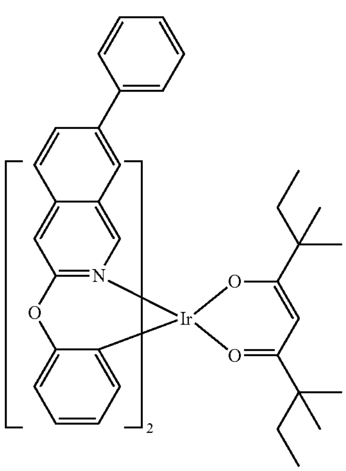
-continued
230
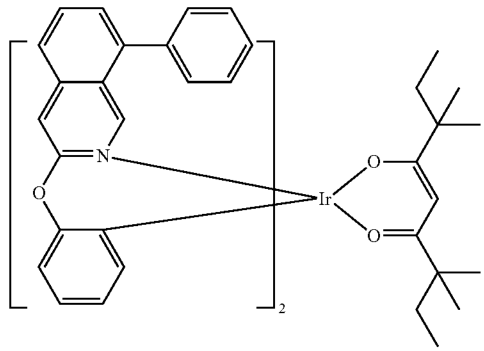
231
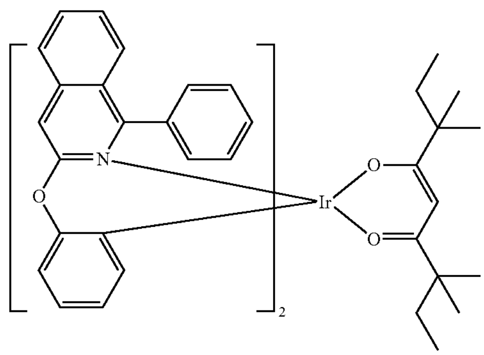
232
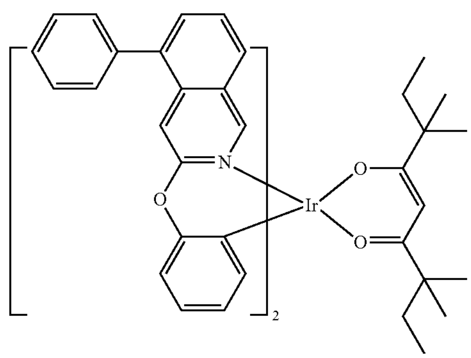
233
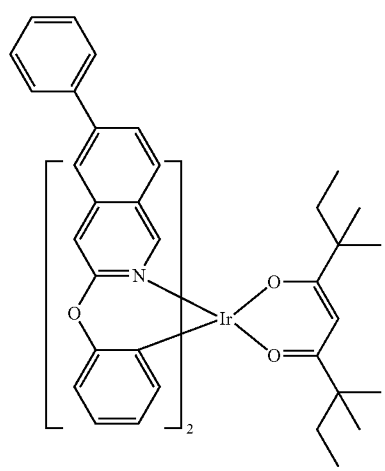

234
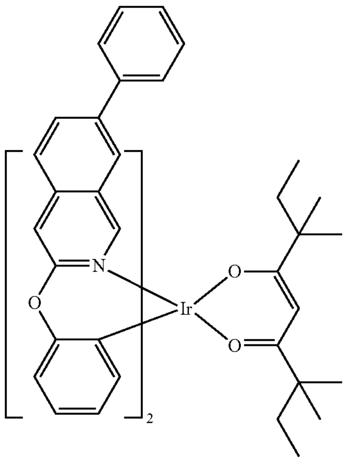
235
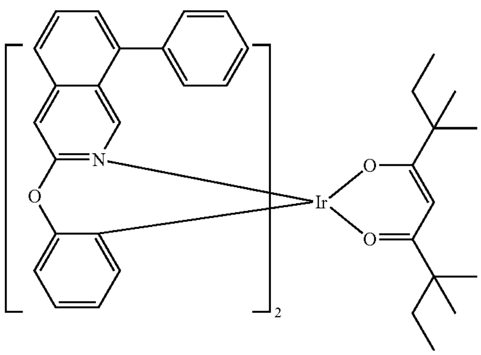
236
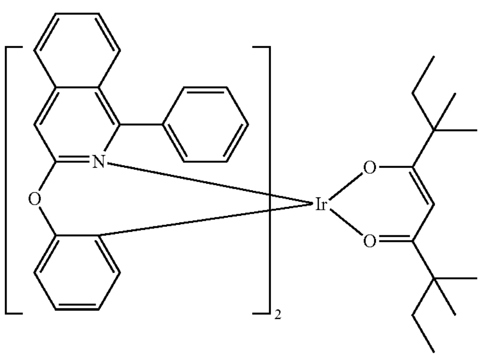
237
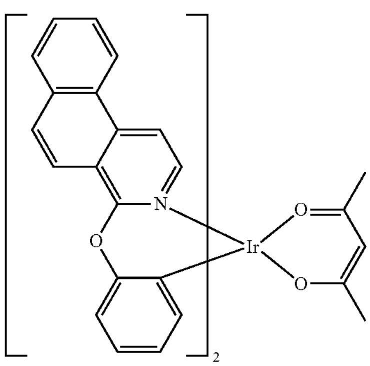
238
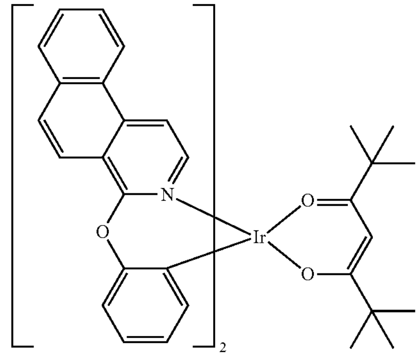
239
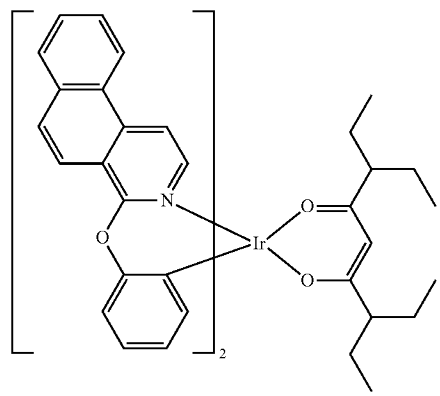
240
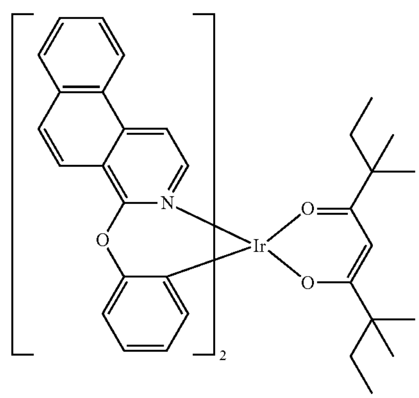
241
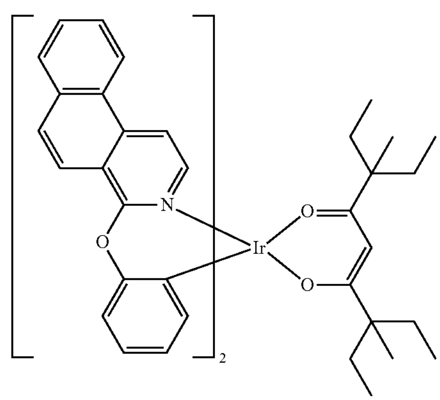

-continued
242
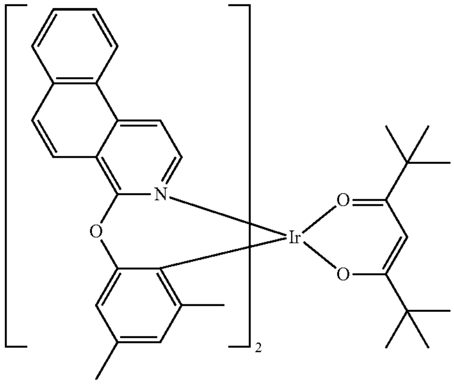
243
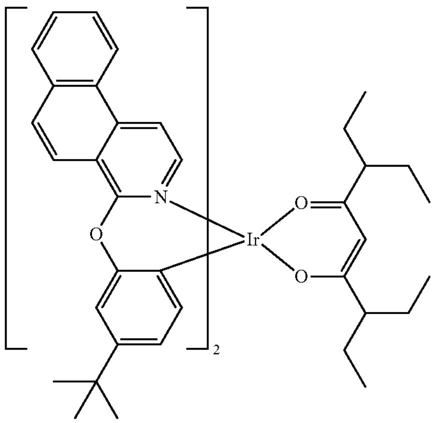
244
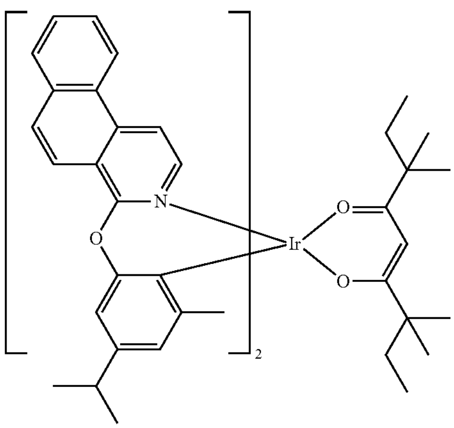
245
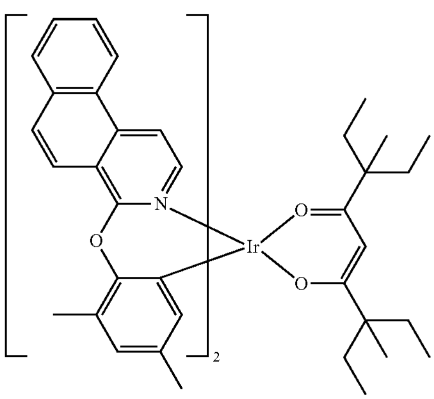
-continued
246
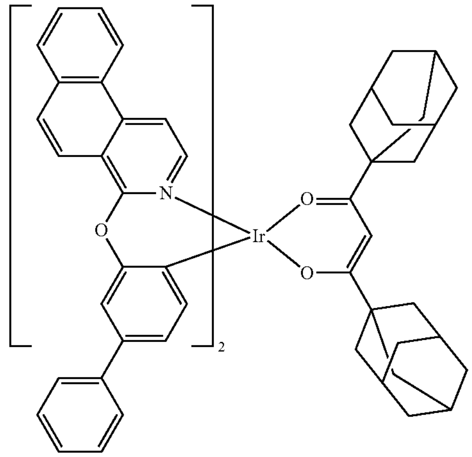
247
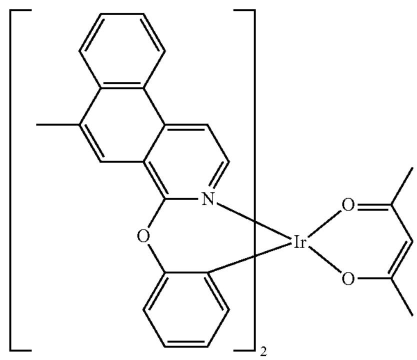
248
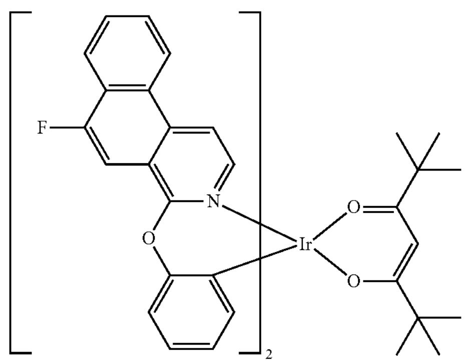
249
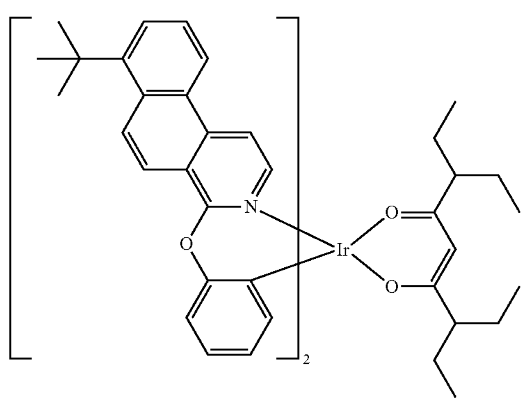

-continued
250
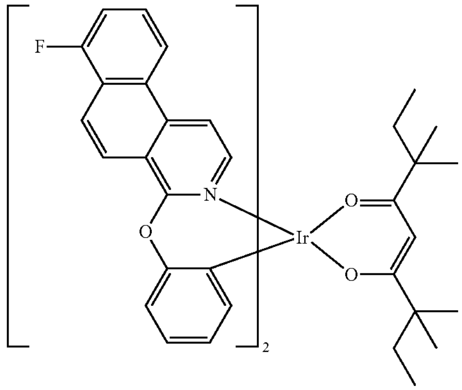
251
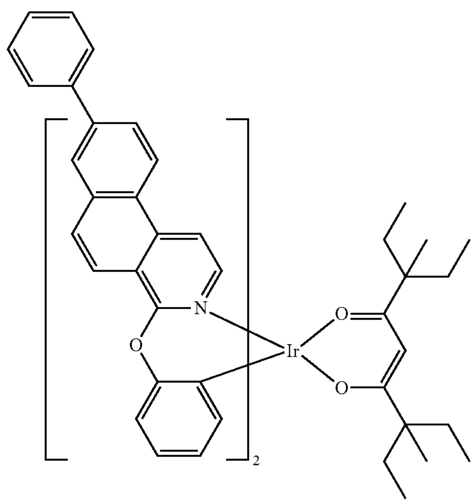
252
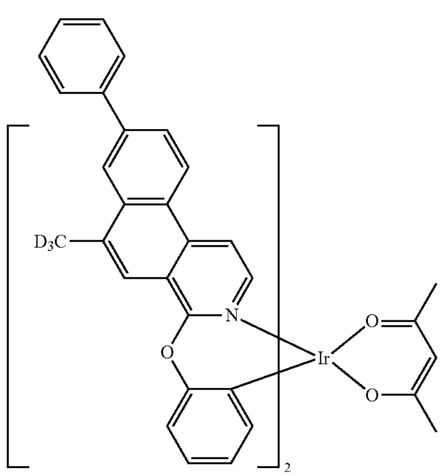
-continued
253
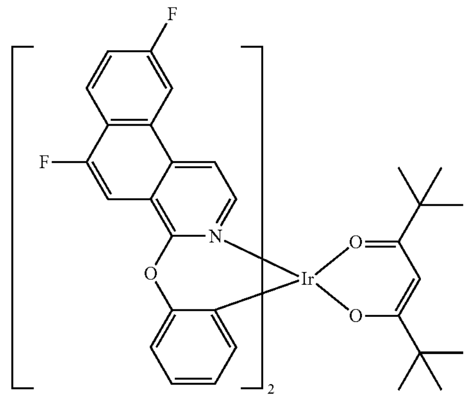
254
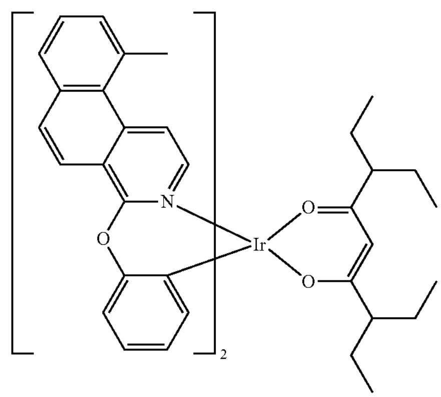
255
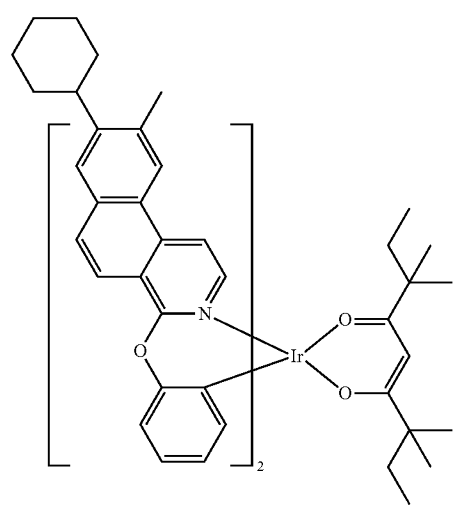

256
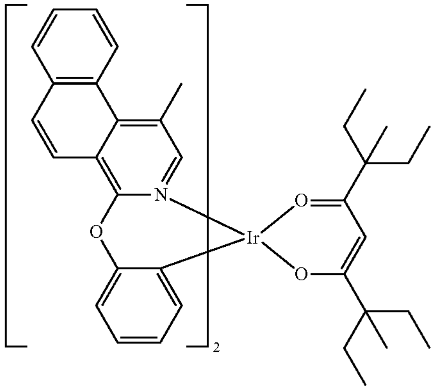
257
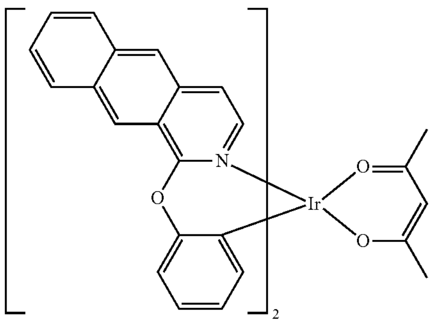
258
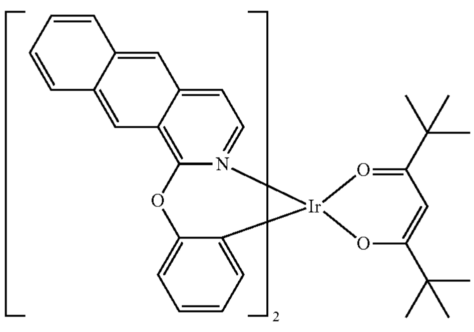
259
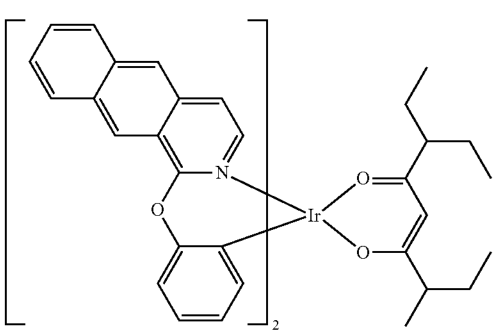
260
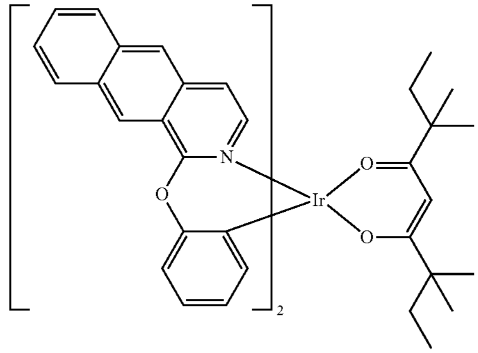
261
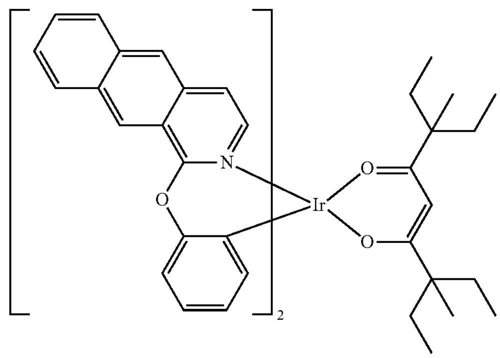
262
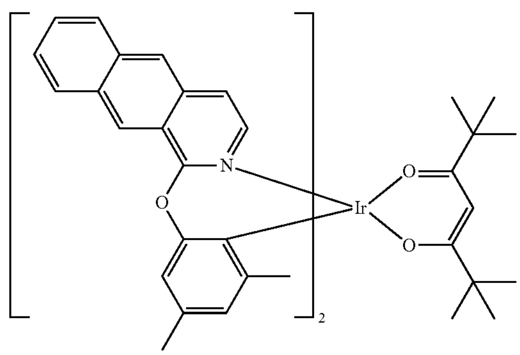
263
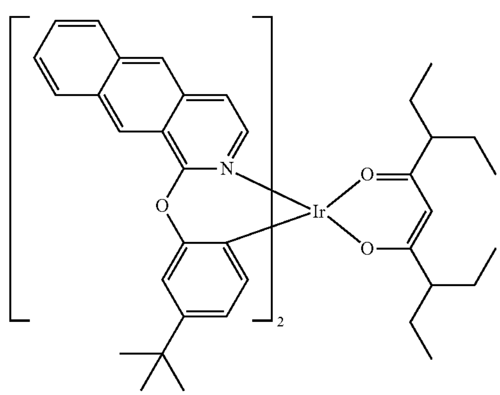

264
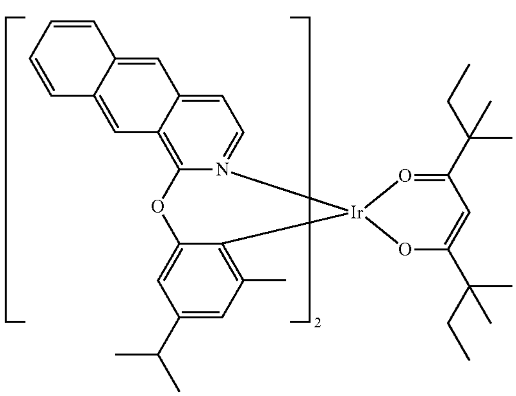
265
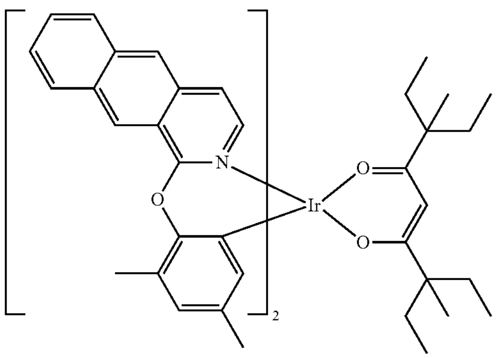
266
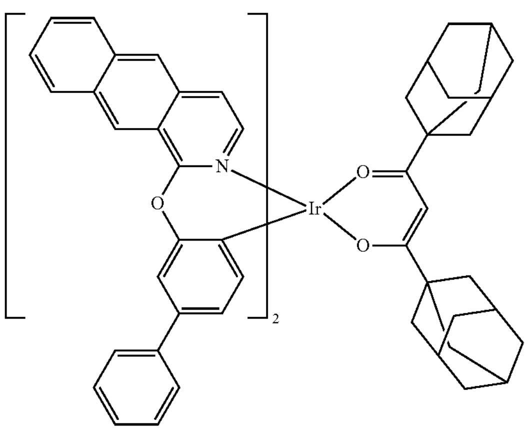
267
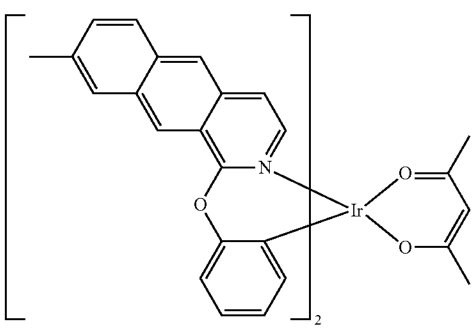
268
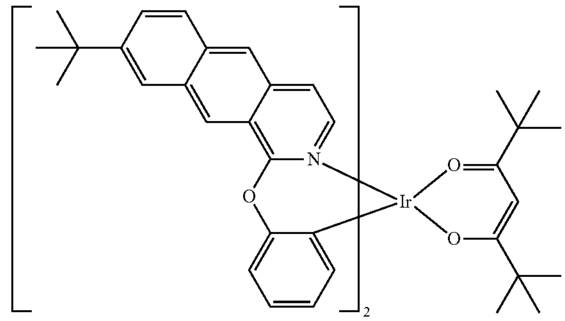
269
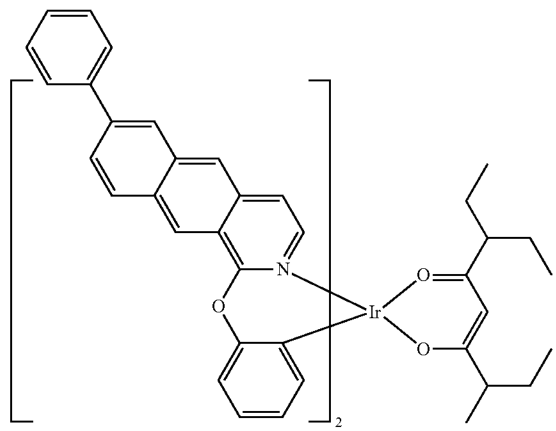
270
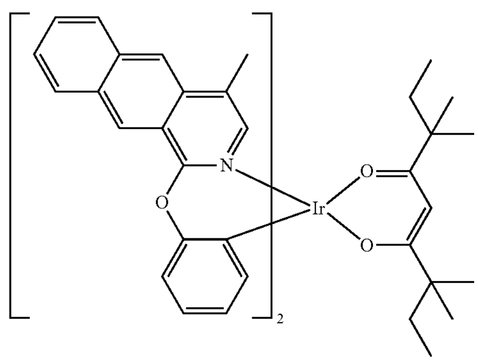
271
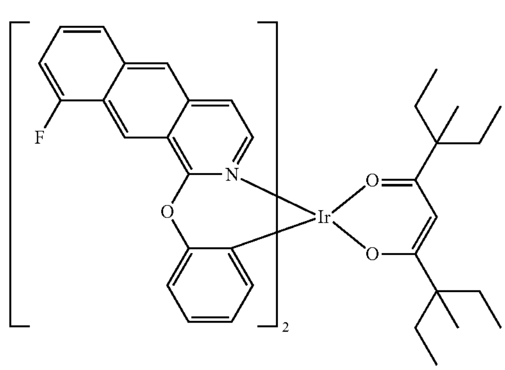

272
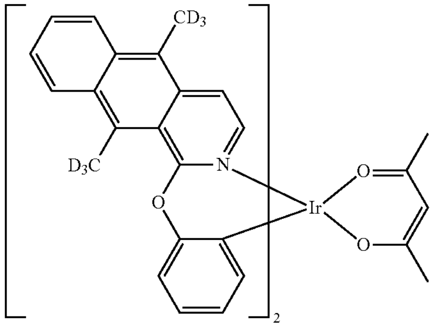
273
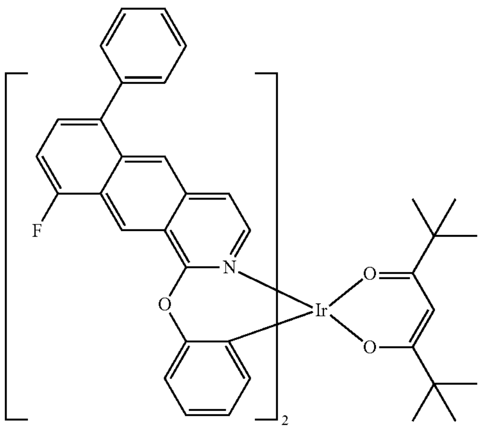
274
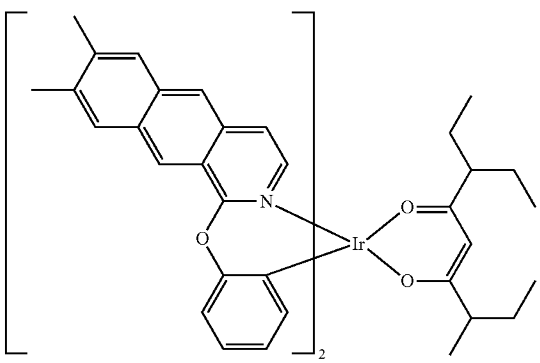
275
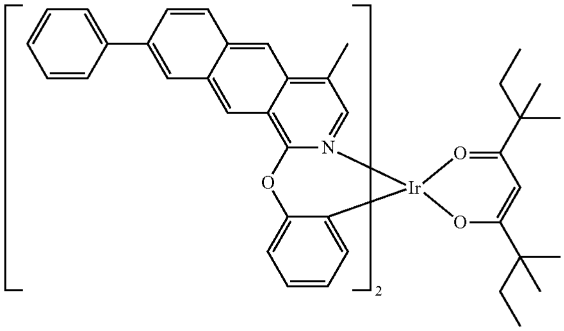
276
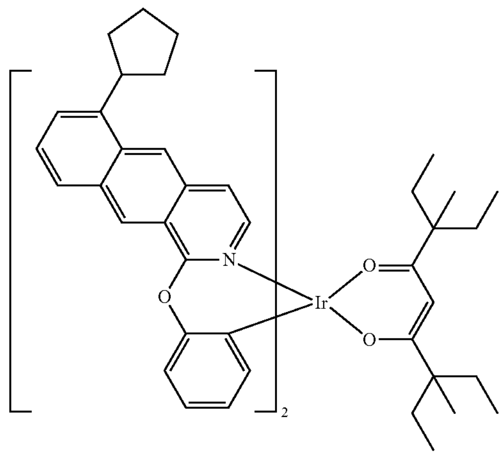
277
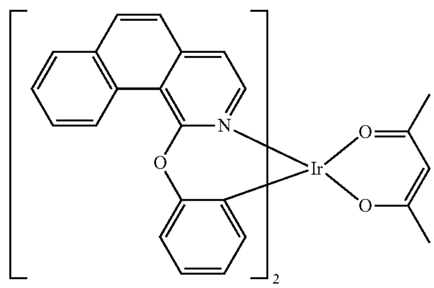
278
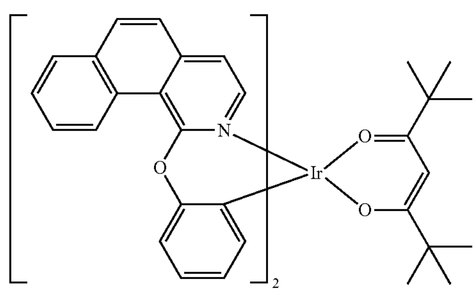
279
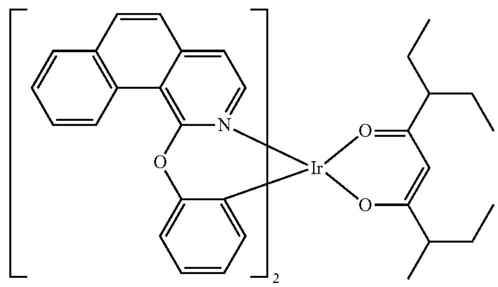

-continued
280
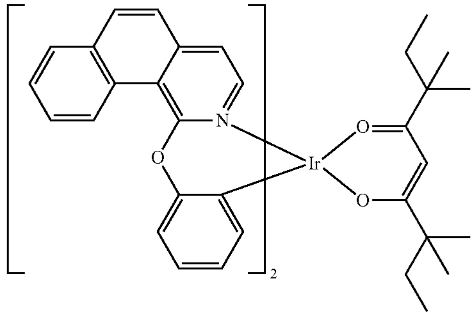
281
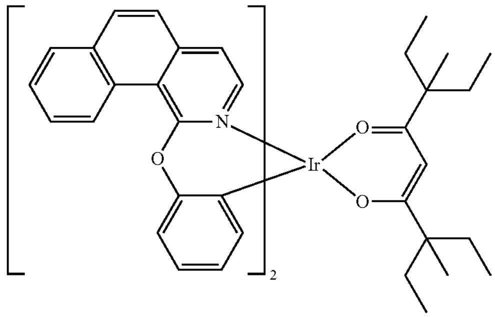
282
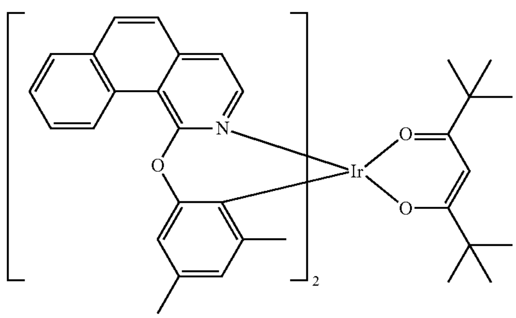
283
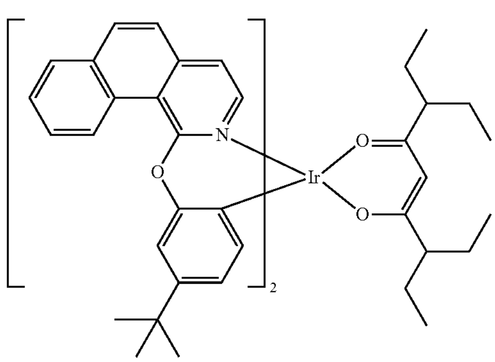
-continued
284
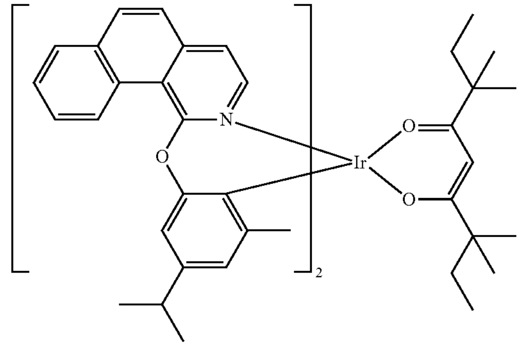
285
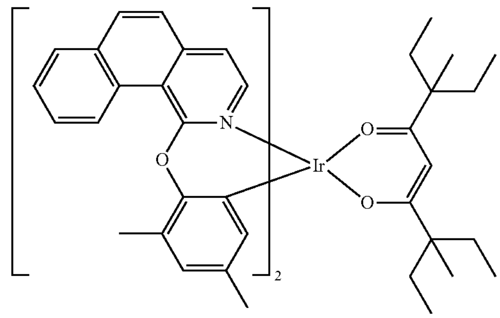
286
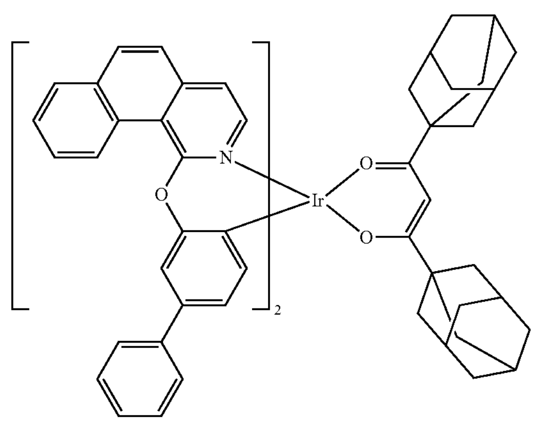
287
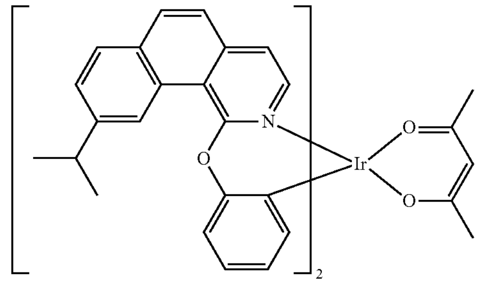

-continued
288
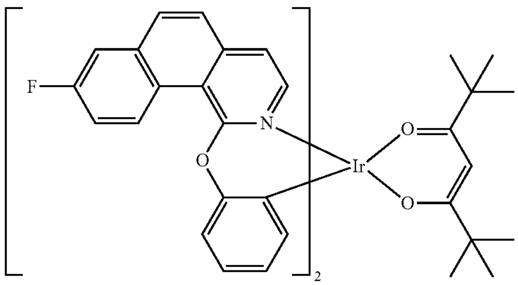
289
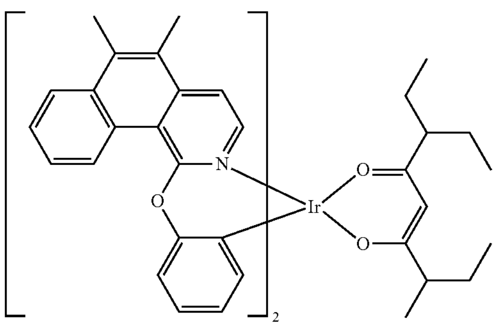
290
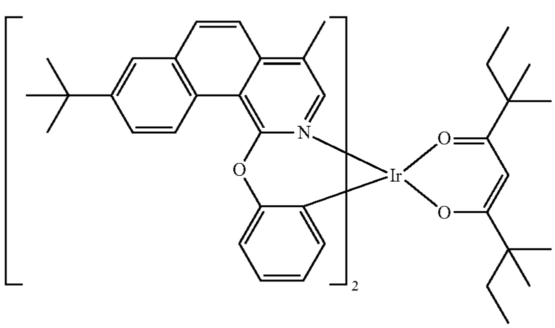
291
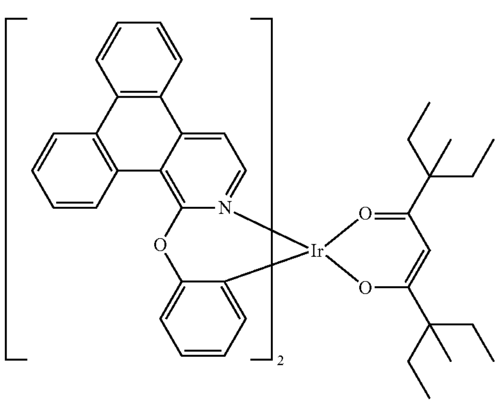
-continued
292
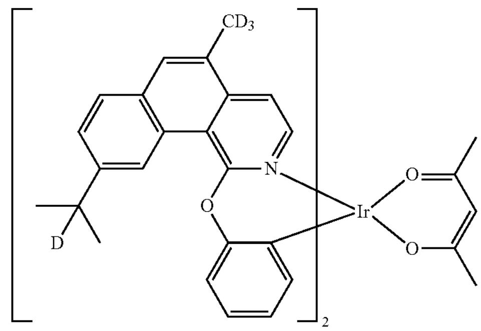
293
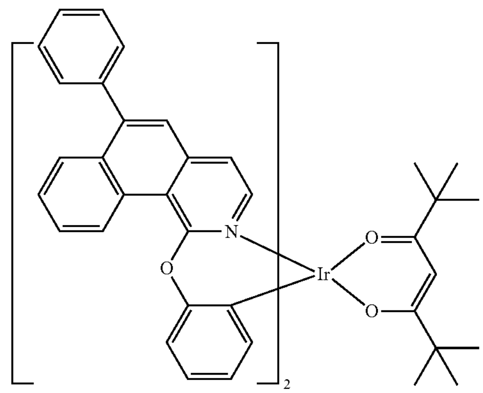
294
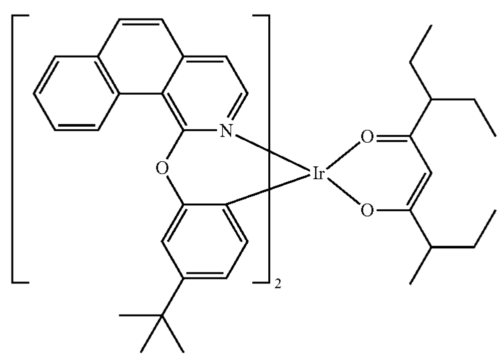
295
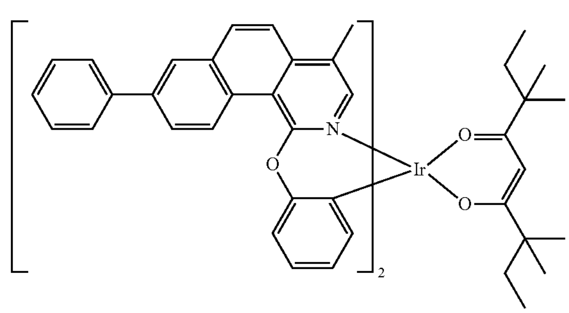

296
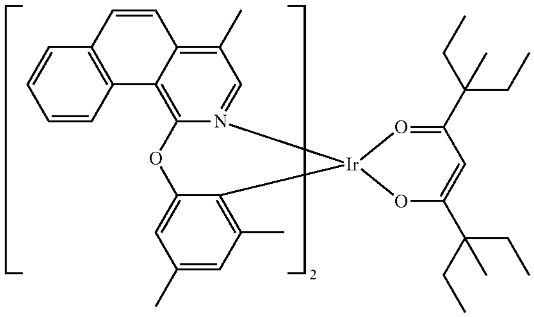
297
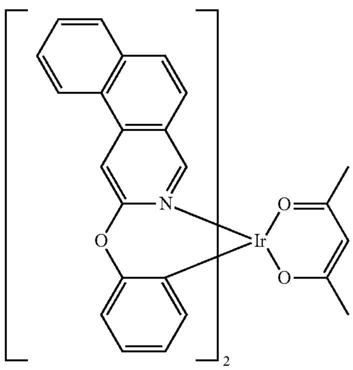
298
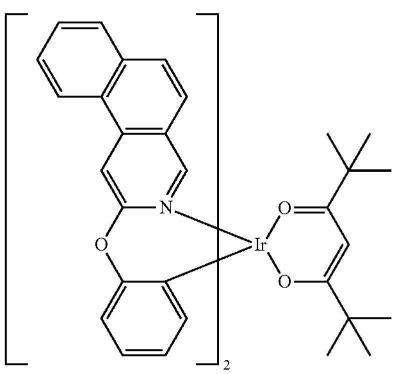
299
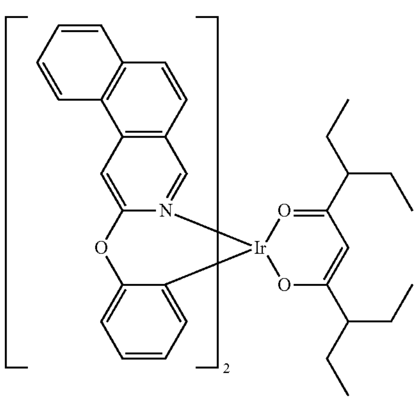
300
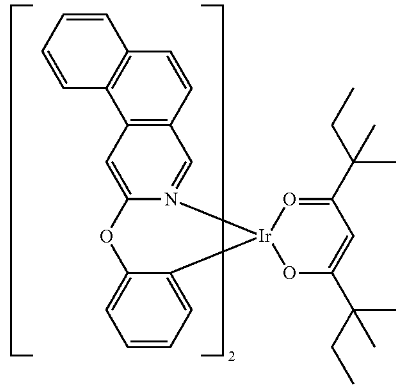
301
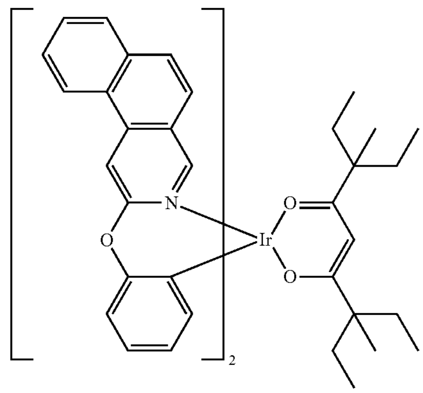
302
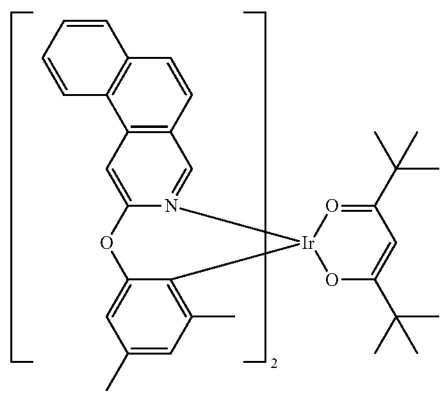
303
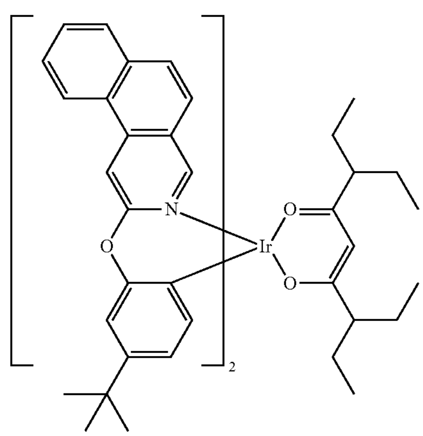

-continued
304
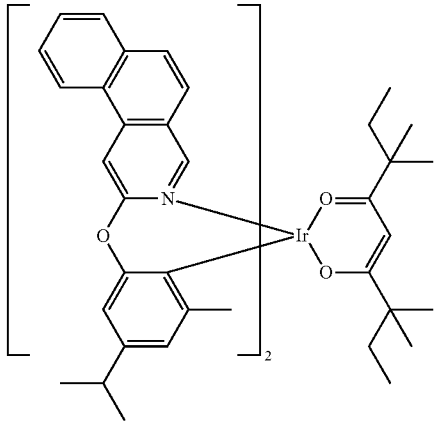
305
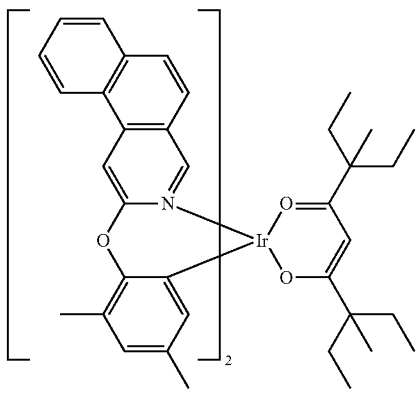
306
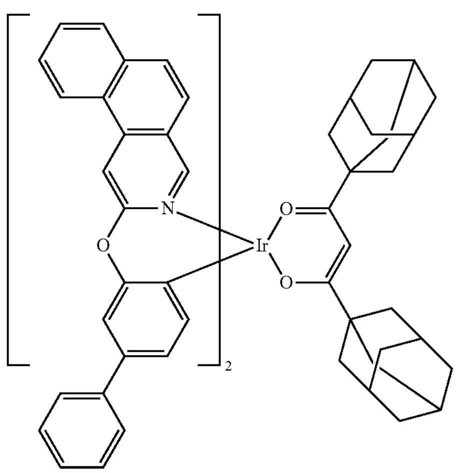
307
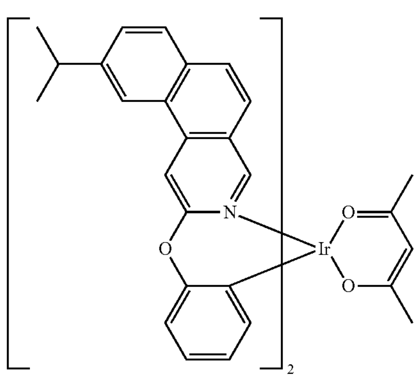
-continued
308
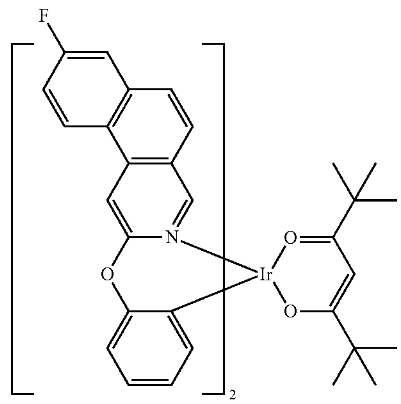
309
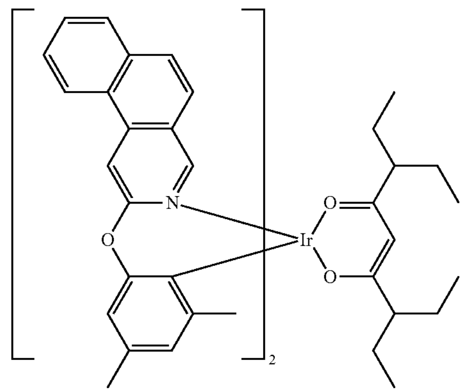
310
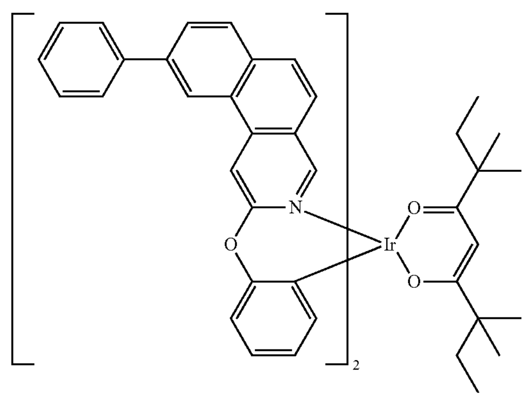
311
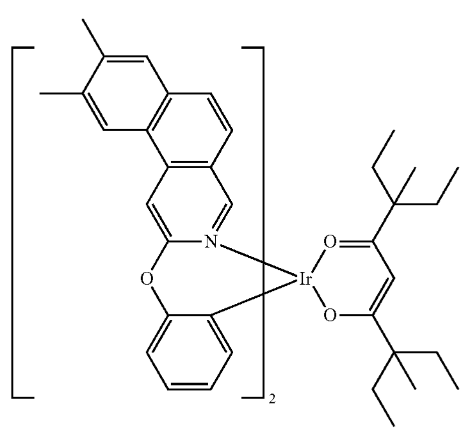

-continued
312
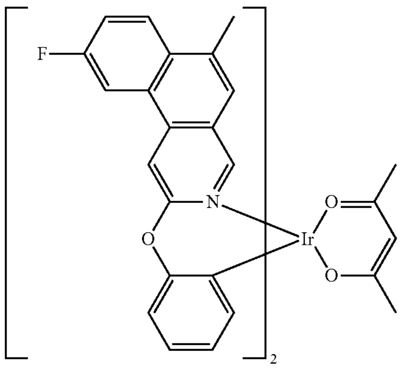
313
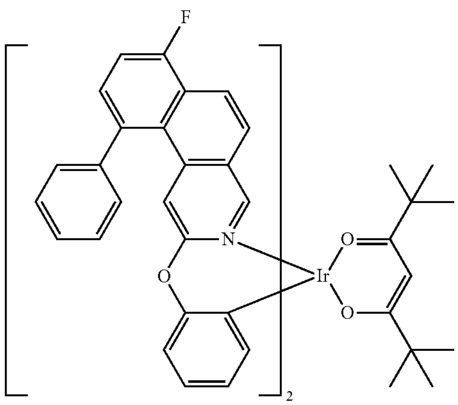
314
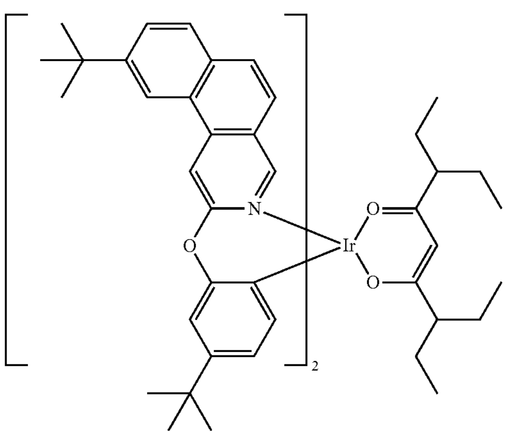
315
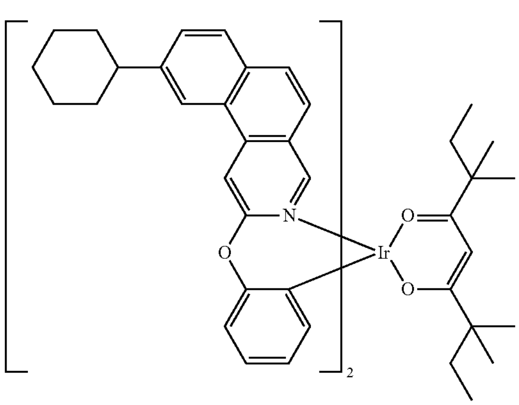
-continued
316
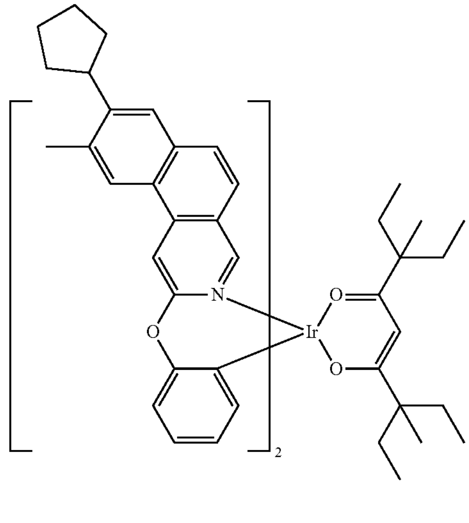
317
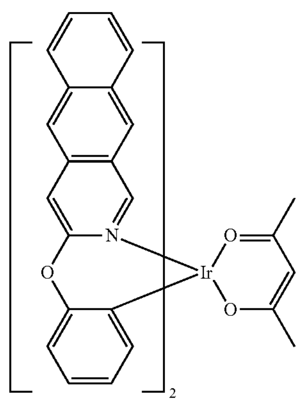
318
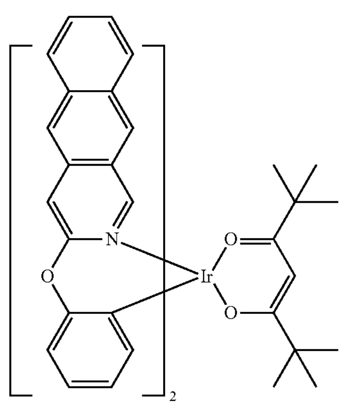

-continued
319
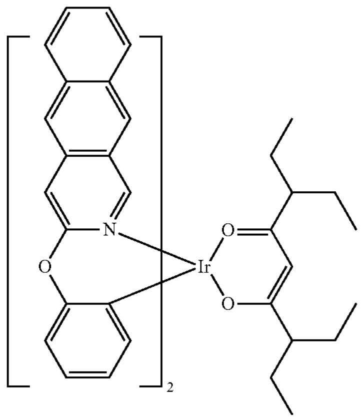
320
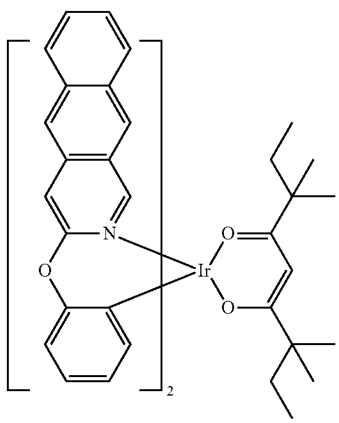
321
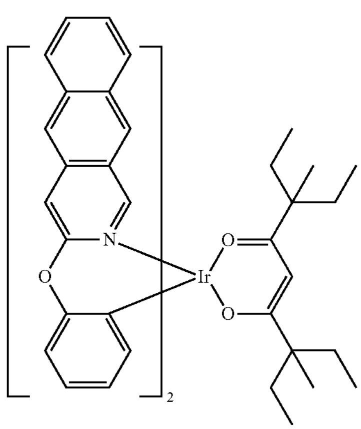
-continued
322
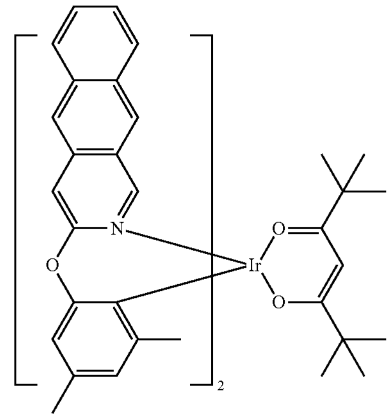
323
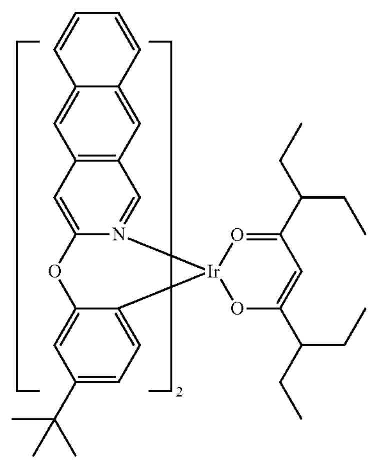
324
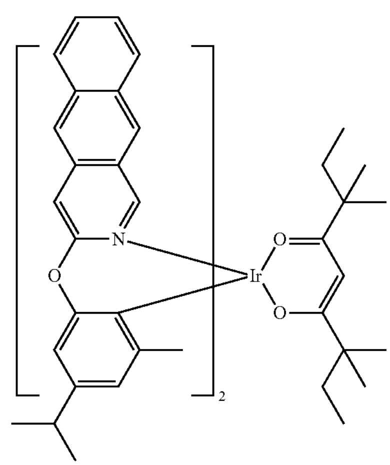

325
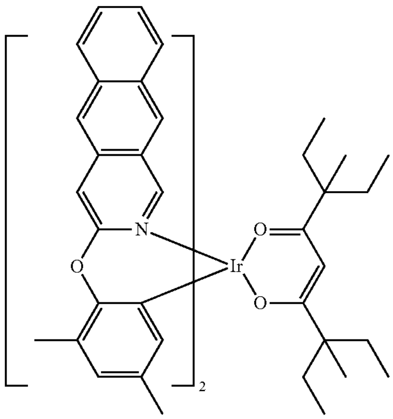
326
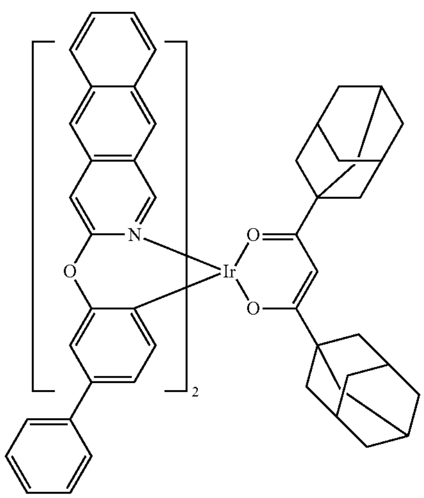
327
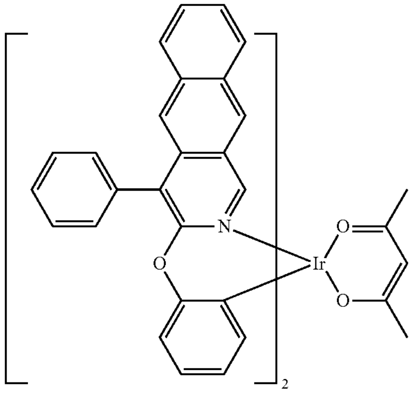
328
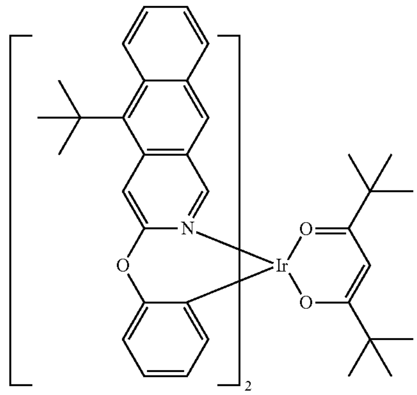
329
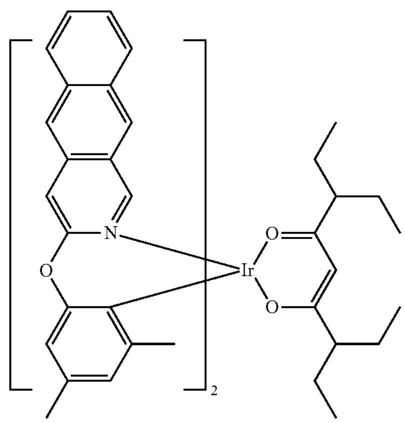
330
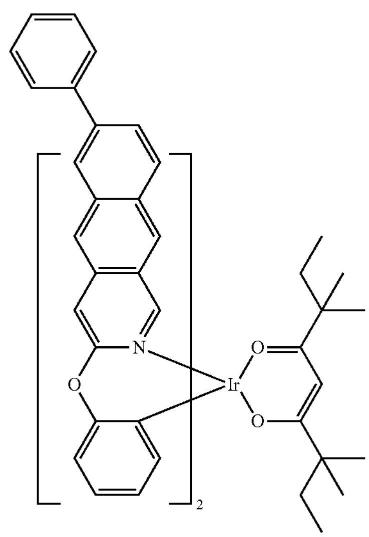

-continued
331
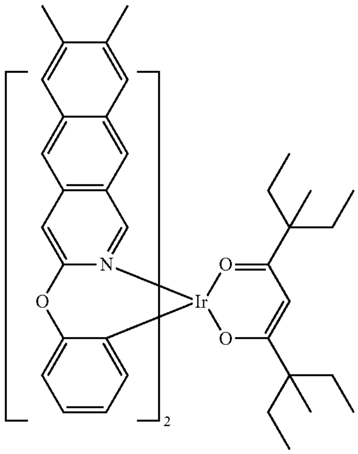
332
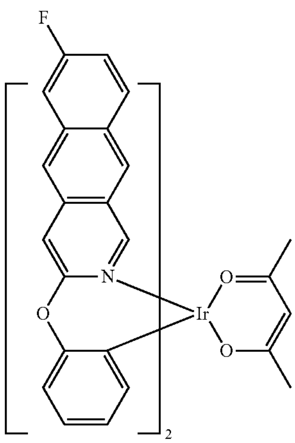
333
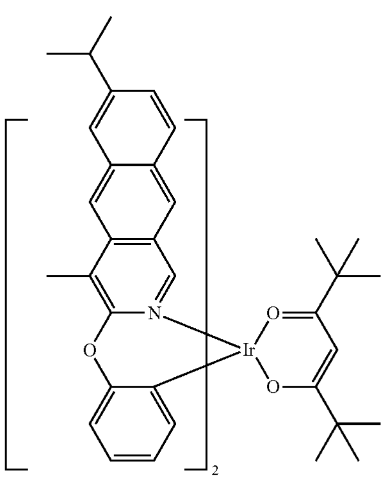
-continued
334
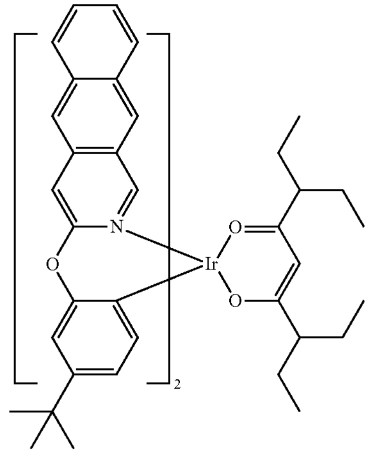
335
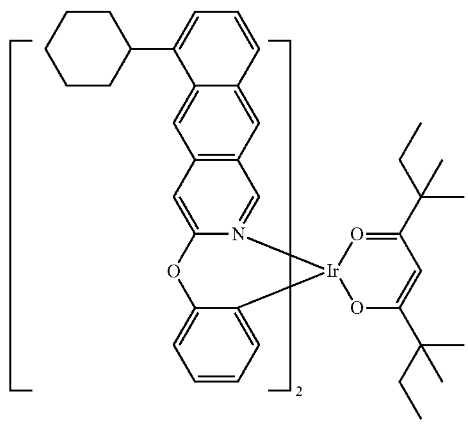
336
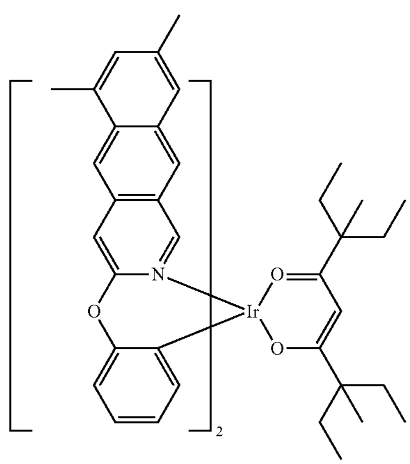

-continued
337
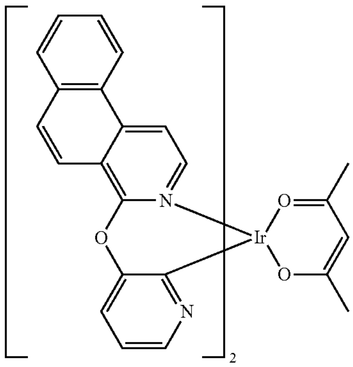
338
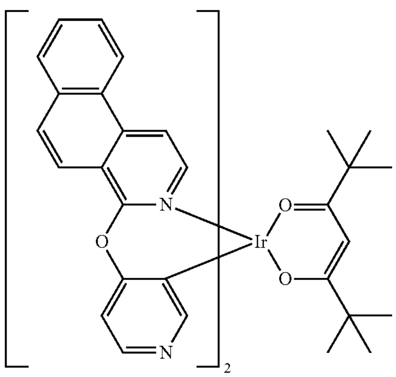
339
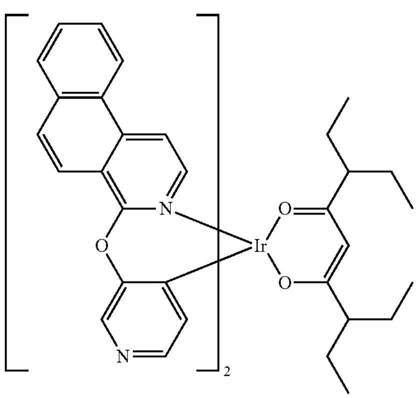
340
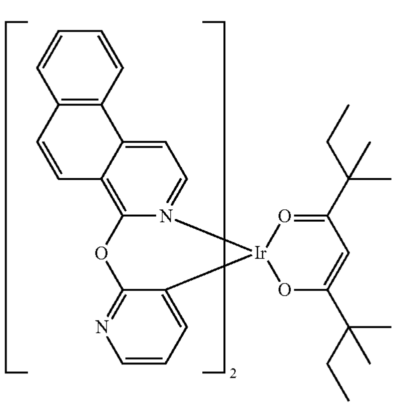
-continued
341
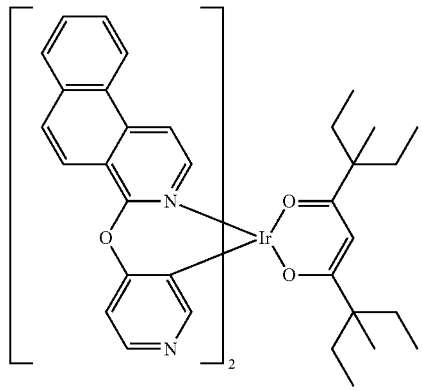
342
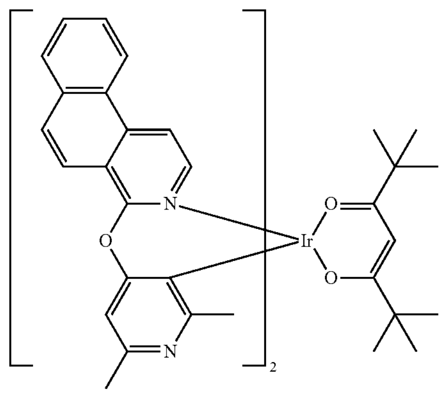
343
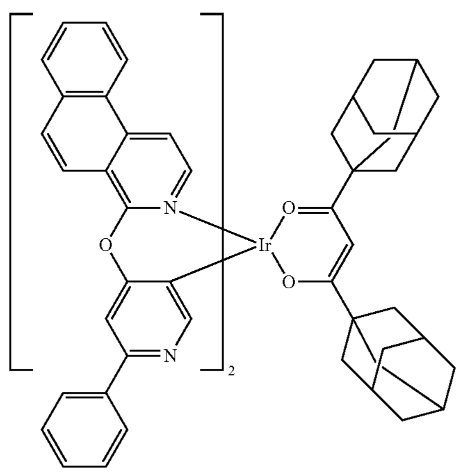
344
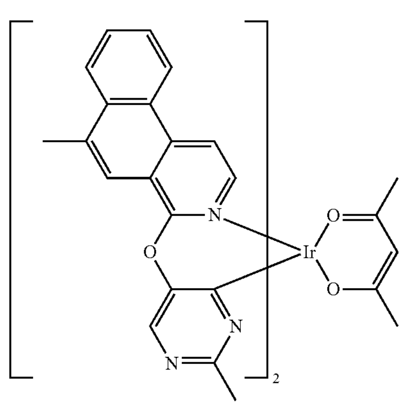

-continued
345
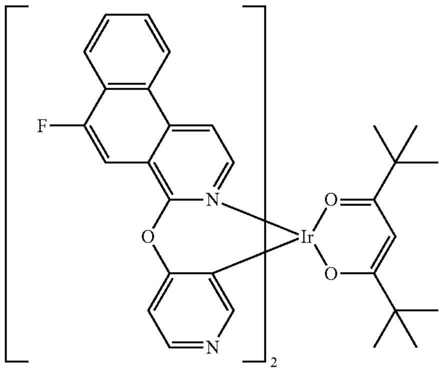
346
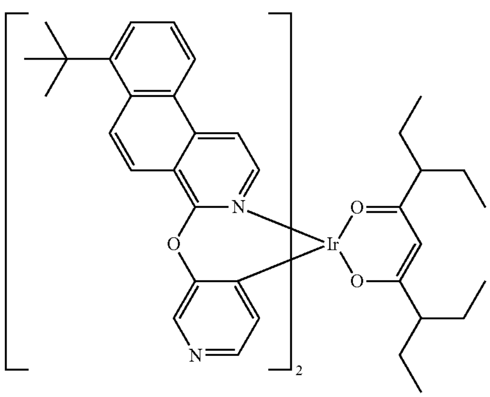
347
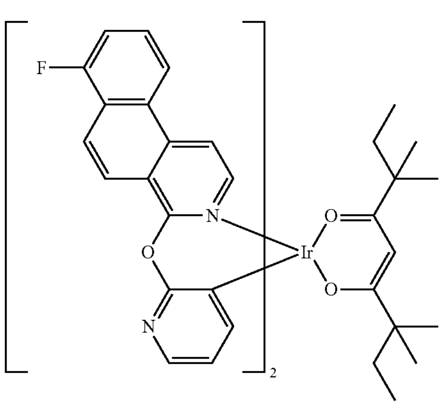
-continued
348
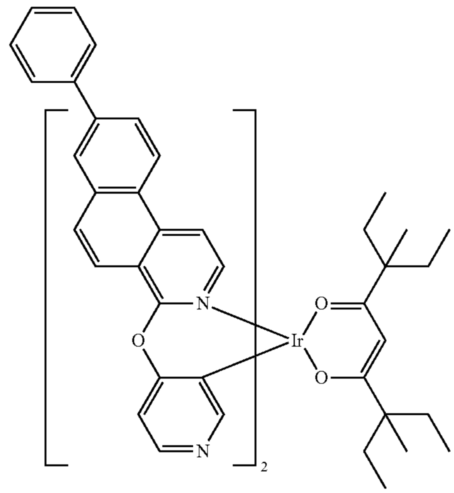
349
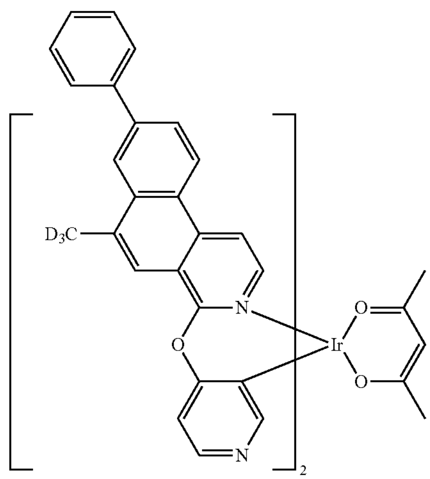
350
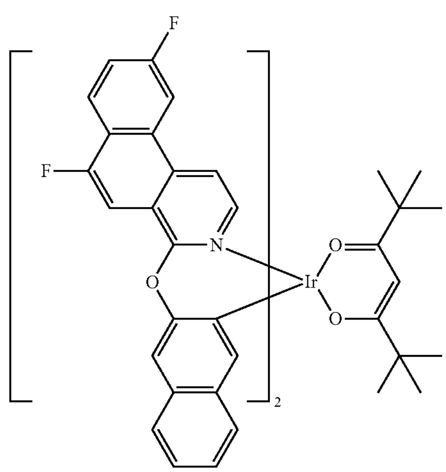

-continued
351
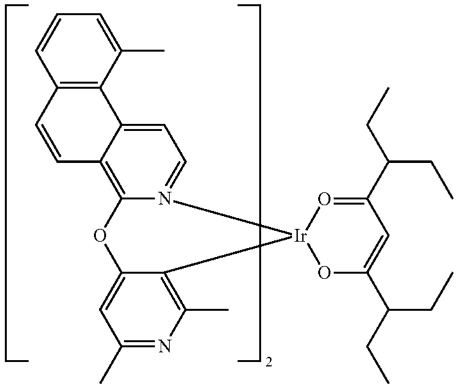
352
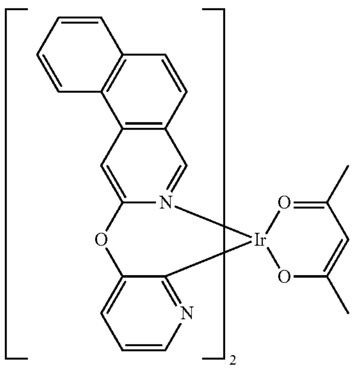
353
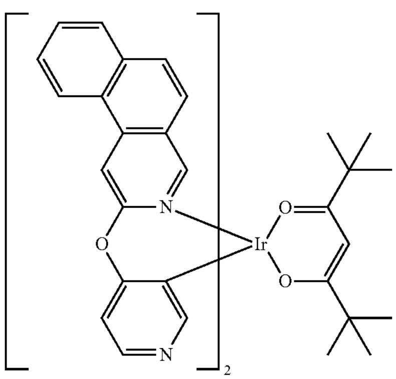
354
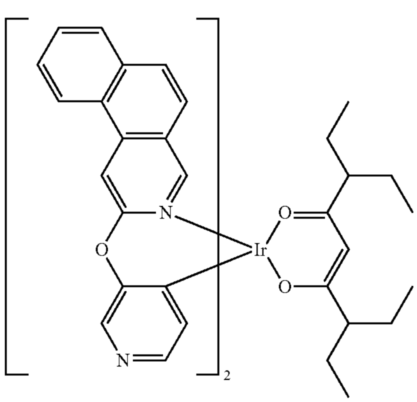
-continued
355
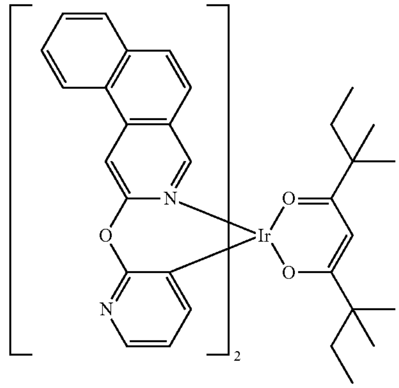
356
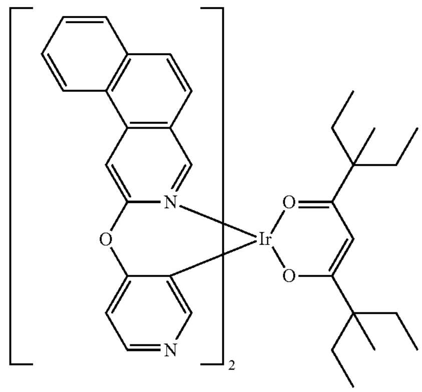
357
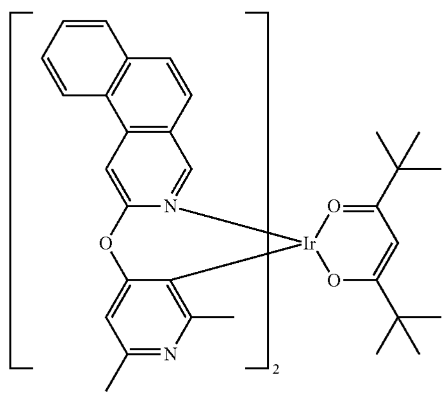
358
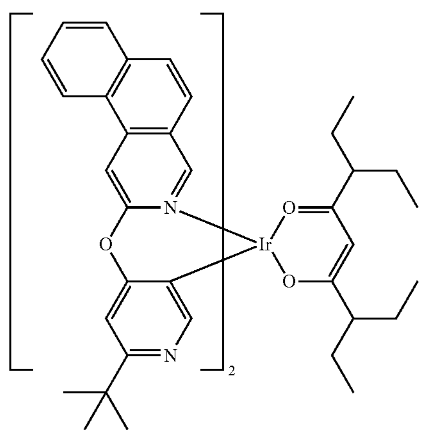

-continued
359
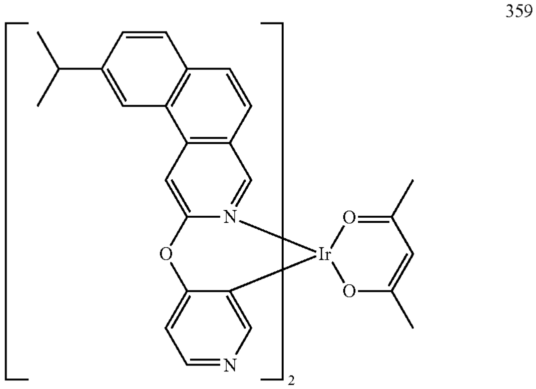
360
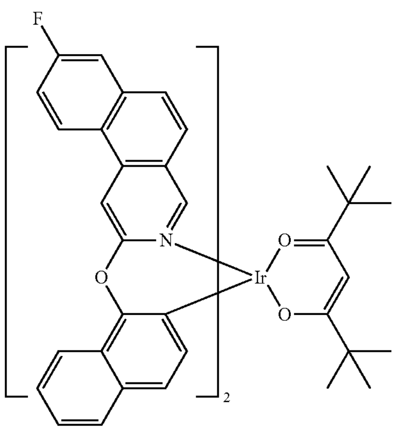
361
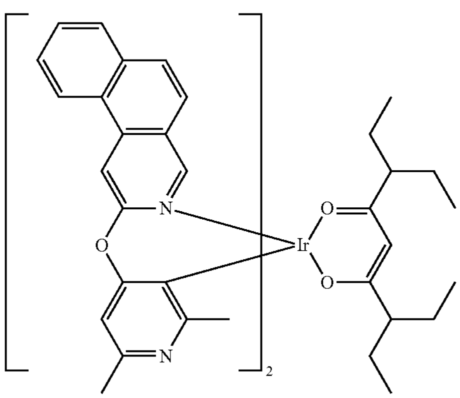
362
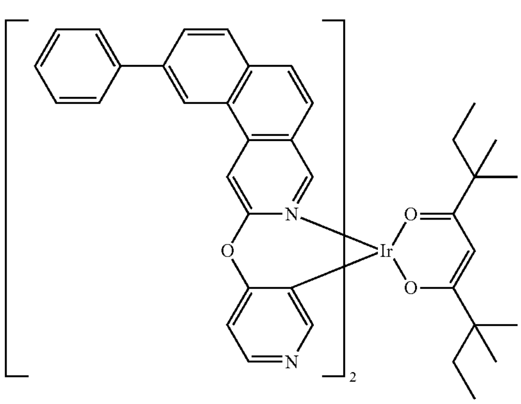
-continued
363
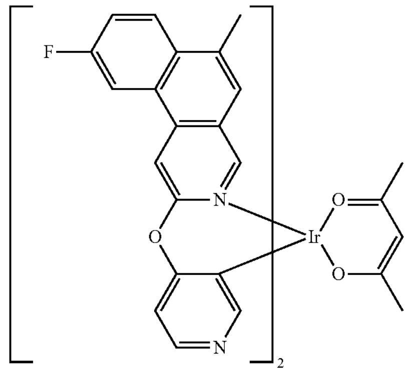
364
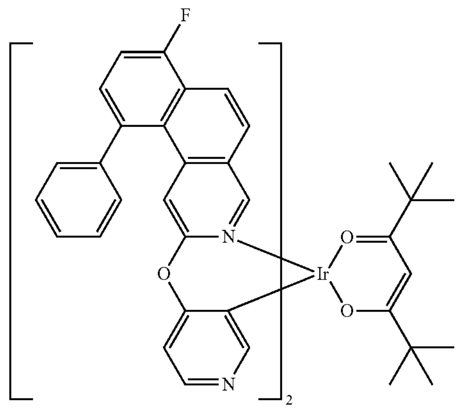
365
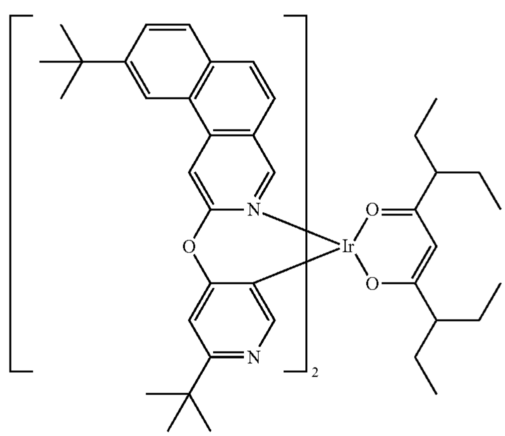
366
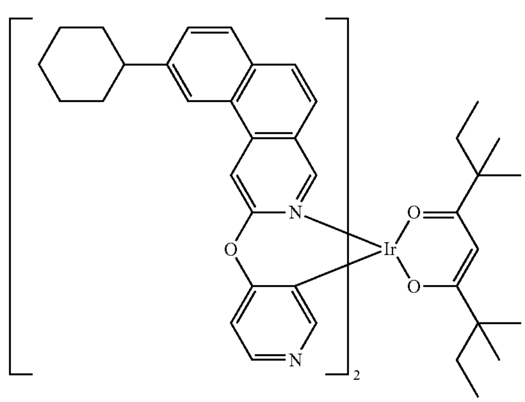

In the organometallic compound represented by Formula 1, $L_1$ may be a ligand represented by Formula 2, and n1 which indicates the number of groups $L_1$ may be 1, 2, or 3. In an exemplary embodiment, the organometallic compound may be a ligand linked to metal M, and essentially includes at least one ligand represent by Formula 2.

In Formula 2, ring $CY_{11}$ and ring $CY_{12}$ may be condensed with each other. In this regard, in the ligand represented by Formula 2, a conjugate length of a moiety (a phore) concerning a lowest unoccupied molecular orbital (LUMO) may increase, thereby increasing the electron transition. Accordingly, the organometallic compound including the ligand represented by Formula 2 may have increased radiative decay, and therefore, an electronic device, for example, an organic light-emitting device, including the organometallic compound represented by Formula 1 may have improved luminescence efficiency, improved external quantum efficiency and/or improved lifetime.

In addition, $T_1$ in Formula 2 may be $*—N(R_2)—*'$, $*—B(R_2)—*'$, $*—P(R_2)—*'$, $*—C(R_2)(R_3)—*'$, $*—Si(R_2)(R_3)—*'$, $*—Ge(R_2)(R_3)—*'$, $*—S—*'$, $*—Se—*'$, $*—O—*'$, $*—C(=O)—*'$, $*—S(=O)—*'$, $*—S(=O)_2—*'$, $*—C(R_2)=*'$, $*=C(R_2)—*'$, $*—C(R_2)=C(R_3)—*'$, $*—C(=S)—*'$, or $*—C≡C—*'$. That is, $T_1$ in Formula 2 may not be a single bond. In this regard, a non-covalent electron included in $T_1$ in the organometallic compound represented by Formula 1 may increase a spin-orbital coupling effect between the metal and the ligand, and therefore, an electronic device, for example, an organic light-emitting device, including the organometallic compound represented by Formula 1 may have improved luminescence efficiency, improved external quantum efficiency and/or improved lifetime.

Furthermore, metal M in Formula 1 may be Ir, Os, Ti, Hf, Eu, Rh, or Ru. Although not limited to a particular theory, the organometallic compound represented by Formula 1 and having metal M may have, for example, a large spin-orbital coupling value relative to Pt. In this regard, the interphase transition between a triplet state and a singlet triplet may increase, thereby having improved quantum luminescence efficiency and relatively short decay time. Therefore, an electronic device, for example, an organic light-emitting device, including the organometallic compound represented by Formula 1 may have improved lifespan.

A highest occupied molecular orbital (HOMO) energy level, a lowest unoccupied molecular orbital (LUMO) energy level, a band gap, a singlet (Si) energy level and a triplet (Ti) energy level of some of the organometallic compound represented by Formula 1 were evaluated by using a Gaussian 09 program accompanied with optimization of molecular structure according to B3LYP-based density functional theory (DFT). Results thereof are shown in Table 1 below.

TABLE 1

| Compound No. | HOMO (eV) | LUMO (eV) | Band gap (eV) | $S_1$ (eV) | $T_1$ (eV) |
|---|---|---|---|---|---|
| 2 | −4.69 | −1.59 | 3.10 | 2.37 | 2.46 |
| 32 | −4.71 | −1.94 | 2.77 | 2.14 | 2.10 |
| 33 | −4.70 | −1.94 | 2.76 | 2.14 | 2.10 |
| 47 | −4.67 | −2.20 | 2.47 | 2.06 | 2.03 |
| 69 | −4.51 | −2.01 | 2.50 | 1.93 | 1.90 |

Referring to Table 1, it is confirmed that the organometallic compound represented by Formula 1 has such electric characteristics that are suitable for use in an electric device, for example, for use as a dopant for an organic light-emitting device.

Synthesis methods of the organometallic compound represented by Formula 1 may be recognizable by one of ordinary skill in the art by referring to Synthesis Examples provided below.

The organometallic compound represented by Formula 1 is suitable for use in an organic layer of an organic light-emitting device, for example, for use as a dopant in an emission layer of the organic layer. Thus, another aspect provides an organic light-emitting device that includes: a first electrode; a second electrode; and an organic layer that is disposed between the first electrode and the second electrode and includes an organic layer including an emission layer and at least one of the organometallic compounds represented by Formula 1.

The organic light-emitting device may have, due to the inclusion of an organic layer including the organometallic compound represented by Formula 1, an improved driving voltage, an improved external quantum efficiency, an improved long lifespan, and an improved low roll-off ratio.

The organometallic compound represented by Formula 1 may be used between a pair of electrodes of an organic light-emitting device. For example, the organometallic compound represented by Formula 1 may be included in the emission layer. In this regard, the organometallic compound may act as a dopant, and the emission layer may further include a host (that is, an amount of the organometallic compound represented by Formula 1 is smaller than an amount of the host). The emission layer may emit visible light having a maximum emission wavelength of, for example, about 450 nanometers (nm) or more and about 700 nm or less.

The expression "(an organic layer) includes at least one organometallic compound" as used herein may include an embodiment in which "(an organic layer) includes identical organometallic compounds represented by Formula 1" and an embodiment in which "(an organic layer) includes two or more different organometallic compounds represented by Formula 1".

In an exemplary embodiment, the organic layer may include, as the organometallic compound, only Compound 1. In this regard, Compound 1 may be included only in the emission layer of the organic light-emitting device. In one or more embodiments, the organic layer may include, as the organometallic compound, Compound 1 and Compound 2. In this regard, Compound 1 and Compound 2 may be included in an identical layer (for example, Compound 1 and Compound 2 all may exist in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In an embodiment, in the organic light-emitting device, the first electrode may be an anode, the second electrode may be a cathode, and the organic layer may further include a hole transport region between the first electrode and the emission layer and an electron transport region between the emission layer and the second electrode, wherein the hole transport region may include a hole injection layer, a hole transport layer, an electron blocking layer, or a buffer layer, or any combination thereof, and the electron transport region may include a hole blocking layer, an electron transport layer, an electron injection layer, or any combination thereof.

The term "organic layer" used herein refers to a single layer and/or a plurality of layers disposed between the first electrode and the second electrode of an organic light-emitting device. The "organic layer" may include, in addition to an organic compound, an organometallic complex including metal.

The FIGURE is a schematic cross-sectional view of an organic light-emitting device 10 according to an embodiment. Hereinafter, the structure of an organic light-emitting device according to an embodiment and a method of manufacturing an organic light-emitting device according to an embodiment will be described in connection with the FIGURE. The organic light-emitting device 10 includes a first electrode 11, an organic layer 15, and a second electrode 19, which are sequentially stacked.

A substrate may be additionally disposed under the first electrode 11 or above the second electrode 19. For use as the substrate, any substrate that is used in general organic light-emitting devices may be used, and the substrate may be a glass substrate or a transparent plastic substrate, each having excellent mechanical strength, thermal stability, transparency, surface smoothness, ease of handling, and water resistance.

The first electrode 11 may be formed by depositing or sputtering a material for forming the first electrode 11 on the substrate. The first electrode 11 may be an anode. The material for forming the first electrode 11 may be selected from materials with a high work function to facilitate hole injection. The first electrode 11 may be a reflective electrode, a semi-transmissive electrode, or a transmissive electrode. The material for forming the first electrode may be, for example, indium tin oxide (ITO), indium zinc oxide (IZO), tin oxide ($SnO_2$), and zinc oxide (ZnO). In one or more embodiments, the material for forming the first electrode 11 may be metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including two or more layers. In an embodiment, the first electrode 11 may have a three-layered structure of ITO/Ag/ITO, but the structure of the first electrode 110 is not limited thereto.

The organic layer 15 is disposed on the first electrode 11.

The organic layer 15 may include a hole transport region, an emission layer, and an electron transport region.

The hole transport region may be disposed between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, which are sequentially stacked in this stated order from the first electrode 11.

When the hole transport region includes a hole injection layer, the hole injection layer may be formed on the first electrode 11 by using one or more suitable methods, for example, vacuum deposition, spin coating, casting, and/or Langmuir-Blodgett (LB) deposition.

When a hole injection layer is formed by vacuum deposition, the deposition conditions may vary according to a material that is used to form the hole injection layer, and the structure and thermal characteristics of the hole injection layer. In an exemplary embodiment, the deposition conditions may include a deposition temperature of about 100 degree Celsius (° C.) to about 500° C., a vacuum pressure of about $10^{-8}$ torr to about $10^{-3}$ torr, and a deposition rate of about 0.01 angstrom per seconds (A/sec) to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201 below, a compound represented by Formula 202 below, or any combination thereof:

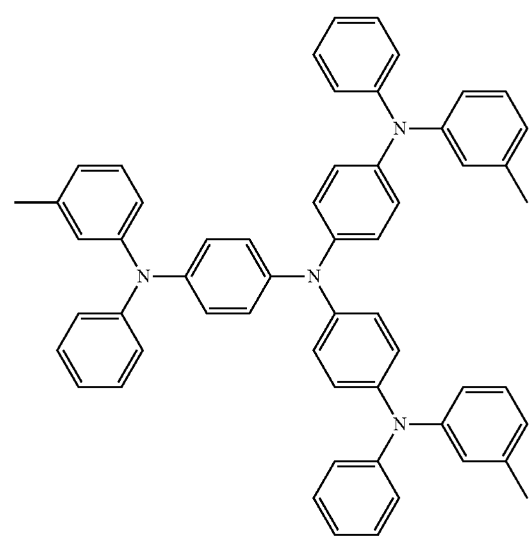

m-MTDATA

-continued
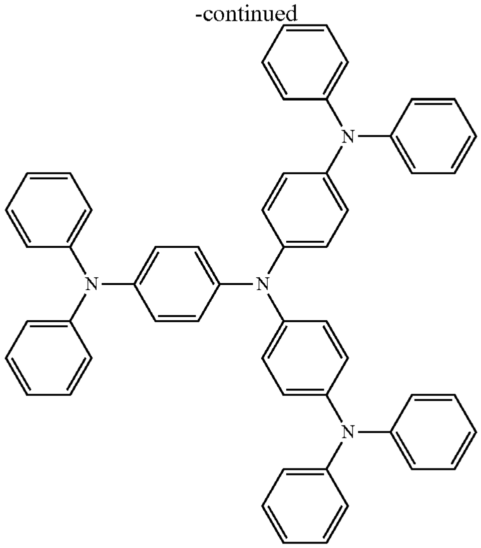
TDATA
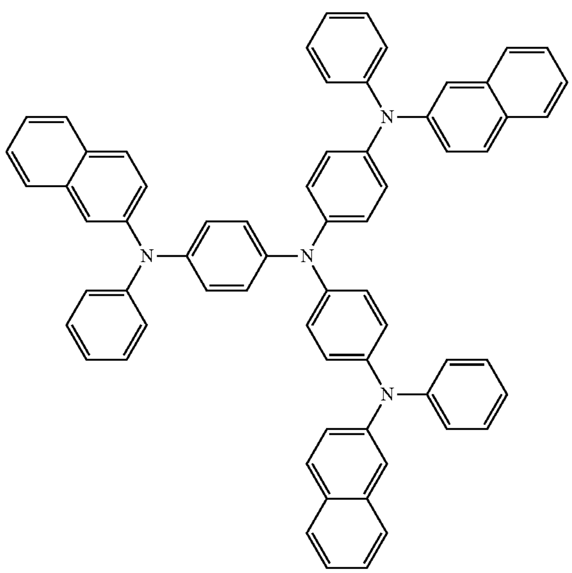
2-TNATA
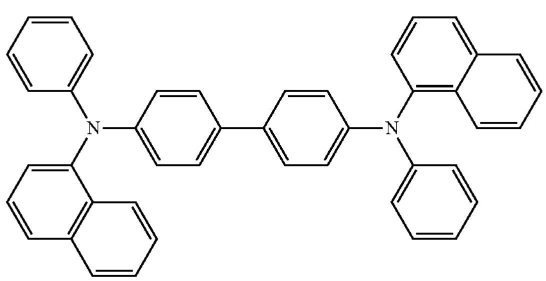
NPB
-continued
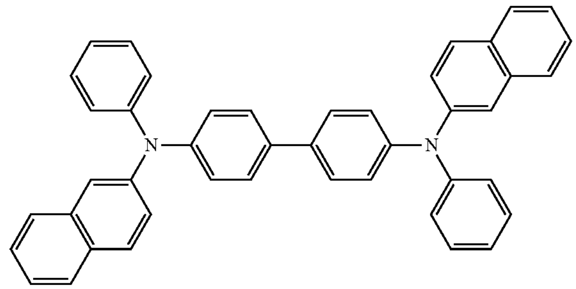
β-NPB
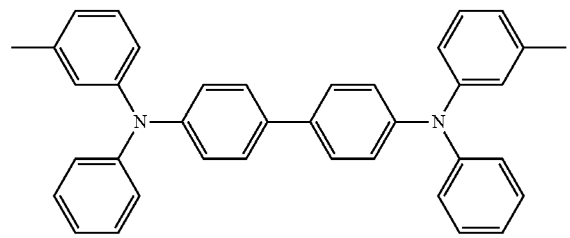
TPD
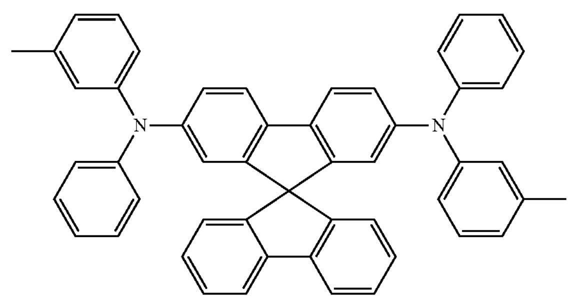
Spiro-TPD
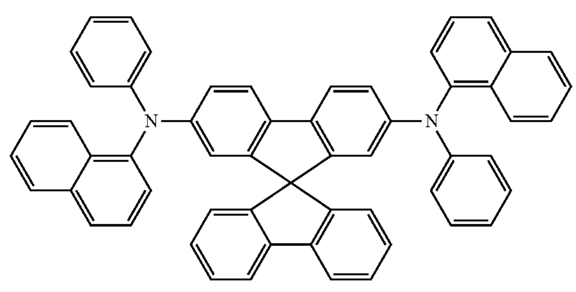
Spiro-NPB
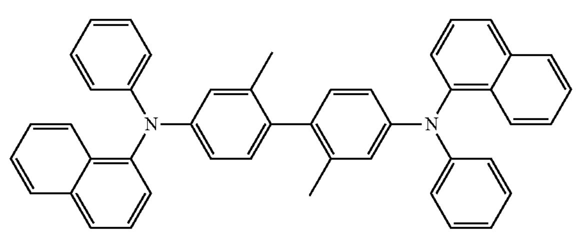
methylated NPB -continued

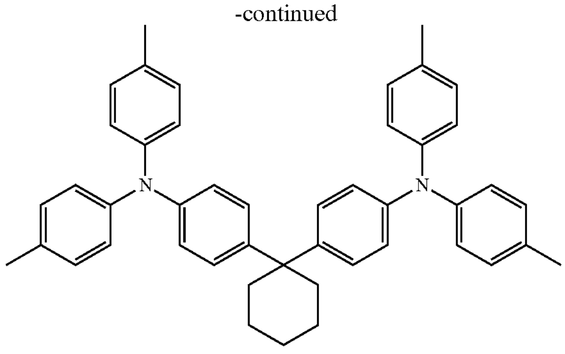

TAPC

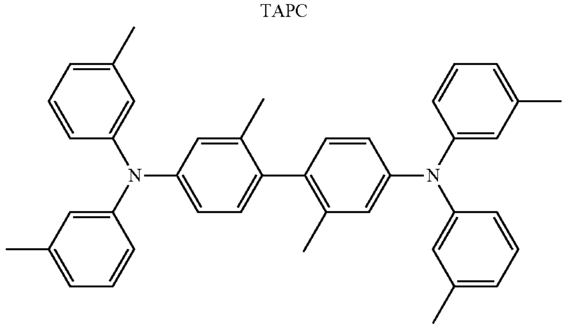

HMTPD

Formula 201

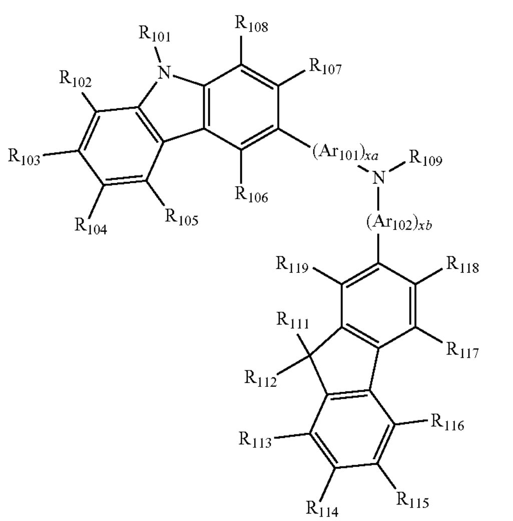

Formula 202

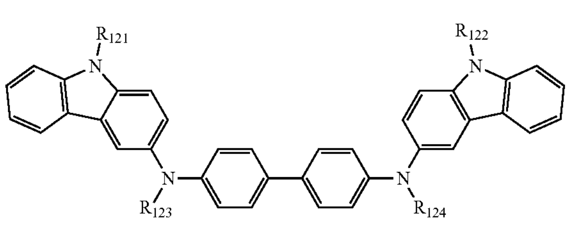

$Ar_{101}$ and $Ar_{102}$ in Formula 201 may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with deuterium, —F, —Cl, —Br, —I, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, or any combination thereof.

In Formula 201, xa and xb may each independently be an integer from 0 to 5, or may be 0, 1, or 2. In an exemplary embodiment, xa may be 1 and xb may be 0, but xa and xb are not limited thereto.

In Formulae 201 and 202, $R_{101}$ to $R_{108}$, $R_{111}$ to $R_{119}$, and $R_{121}$ to $R_{124}$ may each independently be:

hydrogen, deuterium, —F, —Cl, —Br, —I, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, pentyl group, a hexyl group, and the like), or a $C_1$-$C_{10}$ alkoxy group (for example, a methoxy group, an ethoxy group, a propoxy group, a butoxy group, a pentoxy group, and the like);

a $C_1$-$C_{10}$ alkyl group or a $C_1$-$C_{10}$ alkoxy group, each substituted with deuterium, —F, —Cl, —Br, —I, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, or any combination thereof; or a phenyl group, a naphthyl group, an anthracenyl group, a fluorenyl group, or a pyrenyl group, each unsubstituted or substituted with deuterium, —F, —Cl, —Br, —I, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, or any combination thereof, but embodiments of the present disclosure are not limited thereto.

In Formula 201, $R_{109}$ may be a phenyl group, a naphthyl group, an anthracenyl group, or a pyridinyl group, each unsubstituted or substituted with deuterium, —F, —Cl, —Br, —I, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyridinyl group, or any combination thereof.

In an embodiment, the compound represented by Formula 201 may be represented by Formula 201A, but embodiments of the present disclosure are not limited thereto:

Formula 201A
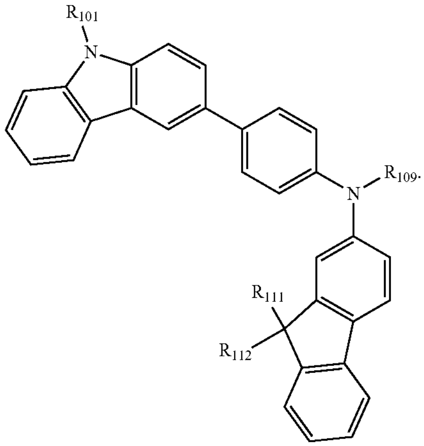
Detailed descriptions about $R_{101}$, $R_{111}$, $R_{112}$, and $R_{109}$ in Formula 201A are the same as described provided herein.
For example, the compound represented by Formula 201, and the compound represented by Formula 202 may include compounds HT1 to HT20 illustrated below, but are not limited thereto:
HT1
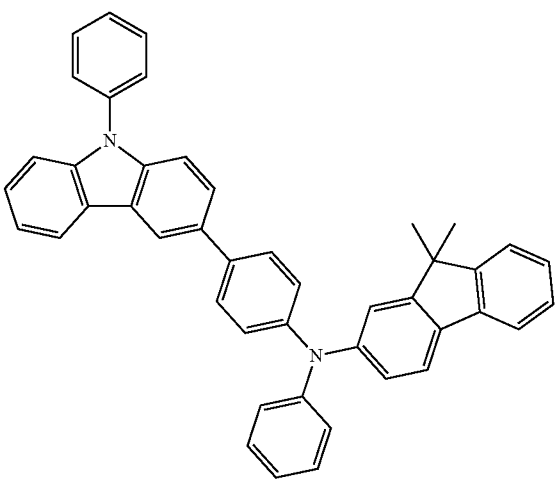
-continued
HT2
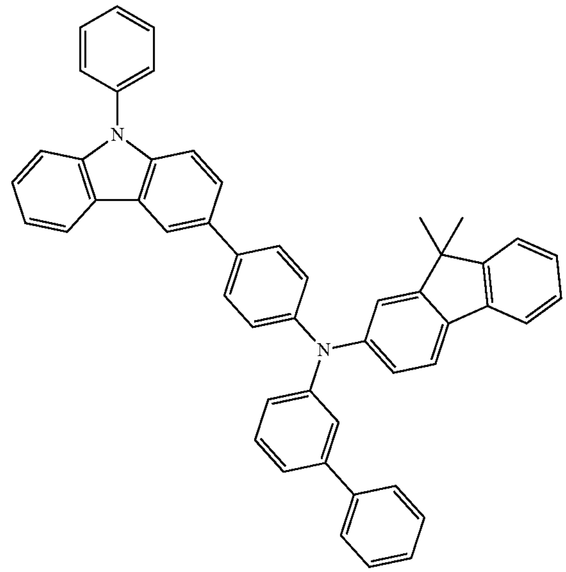
HT3
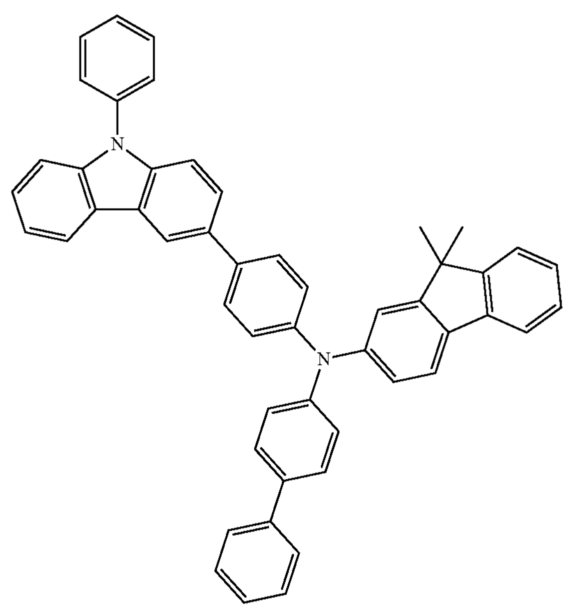

-continued
HT4
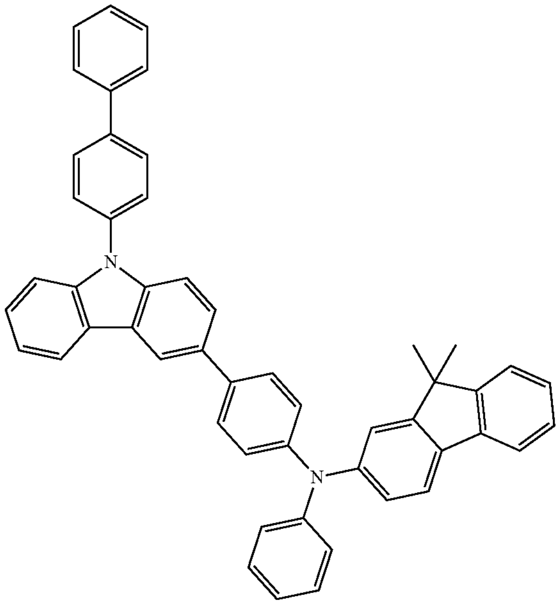
HT5
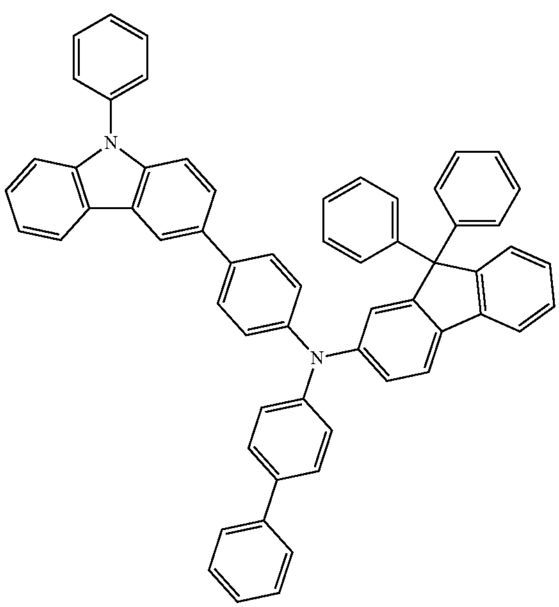
-continued
HT6
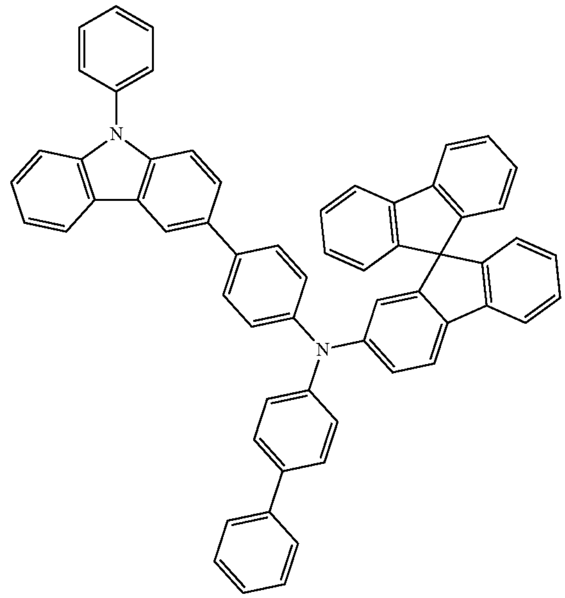
HT7
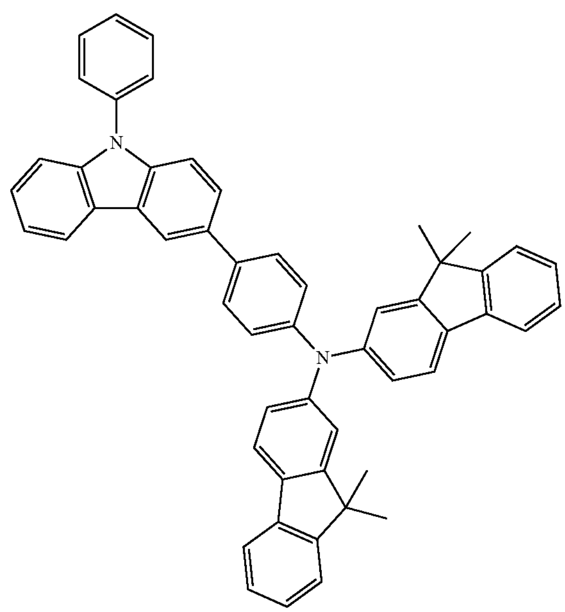

-continued
HT8
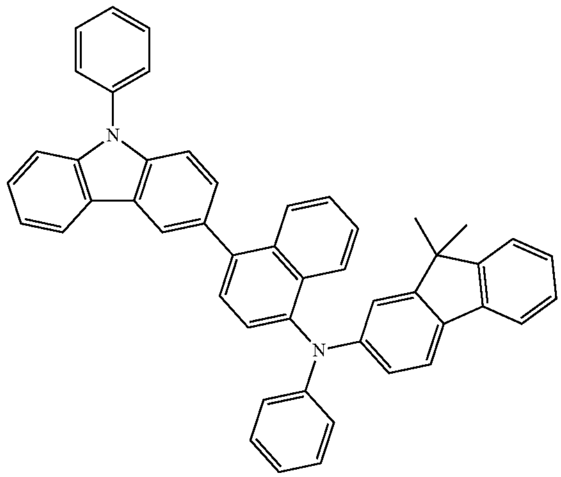
HT9
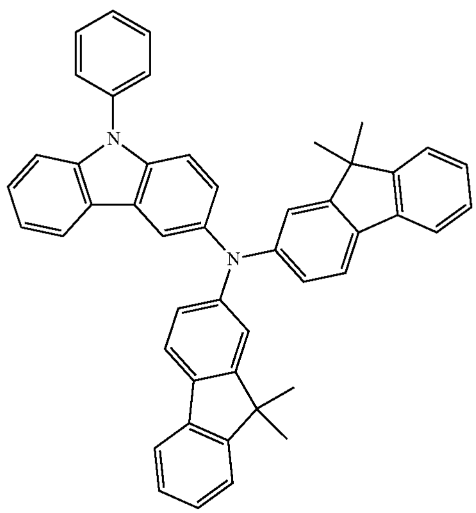
HT10
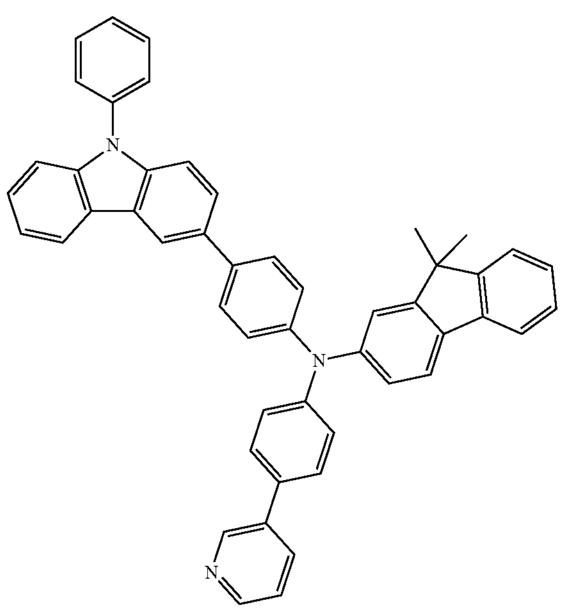
-continued
HT11
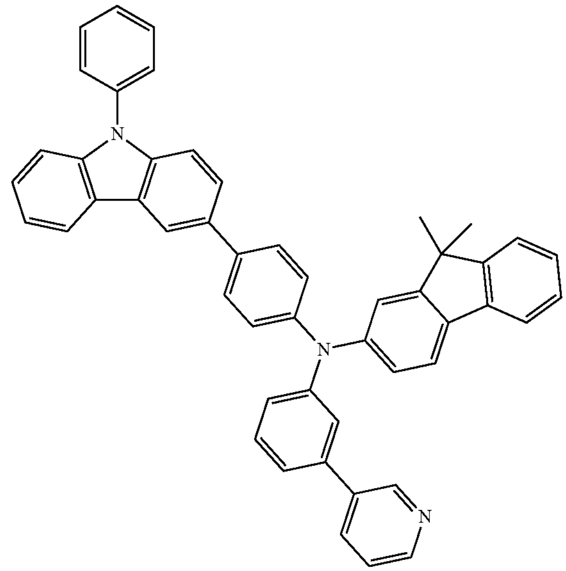
HT12
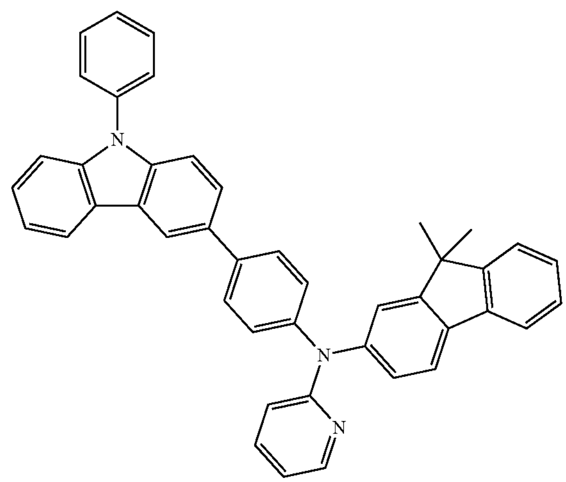
HT13
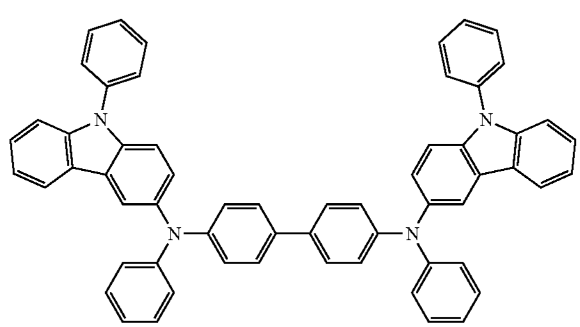

-continued

HT14

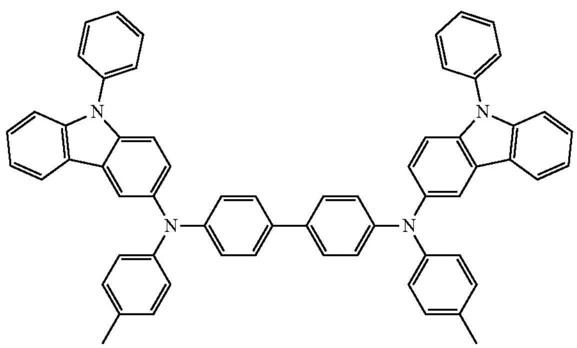

HT15

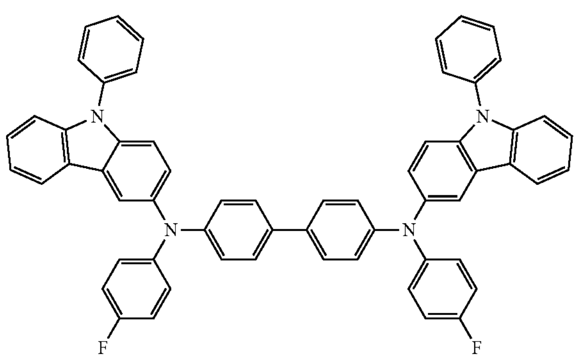

HT16

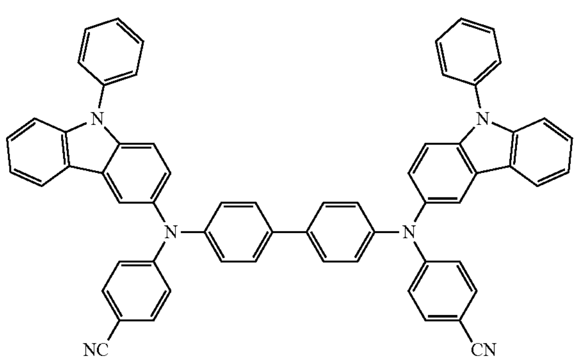

HT17

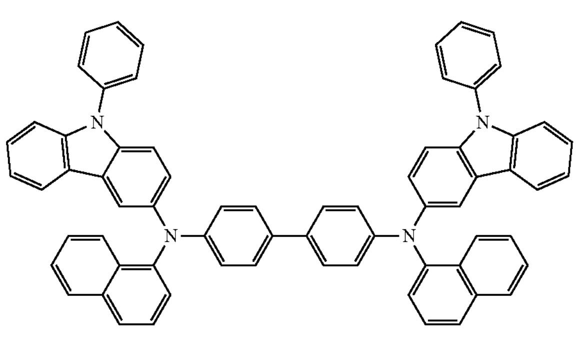

-continued

HT18

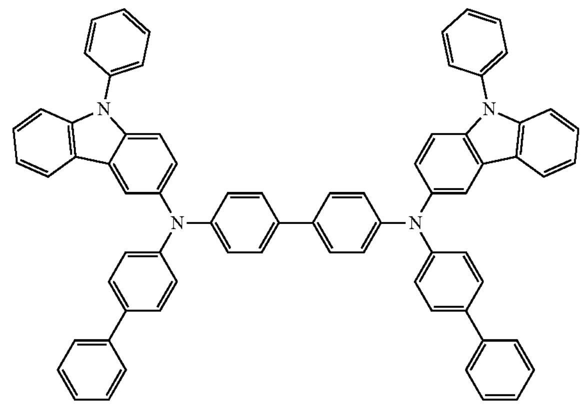

HT19

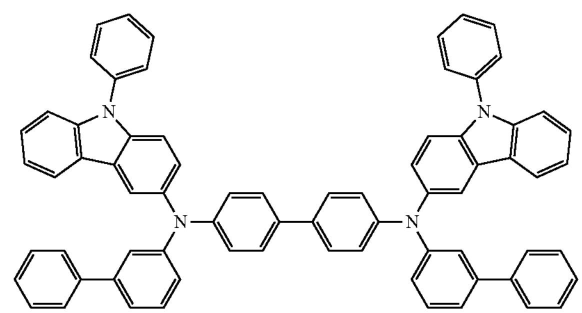

HT20

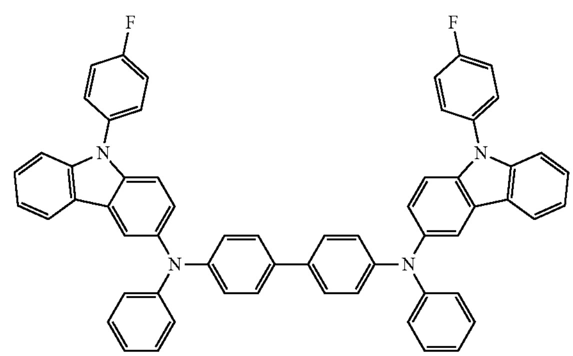

A thickness of the hole transport region may be from about 100 angstrom (A) to about 10,000 Å, for example, about 100 Å to about 3,000 Å. When the hole transport region includes at least one selected from a hole injection layer and a hole transport layer, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example about 100 Å to about 1,500 Å. While not wishing to be bound by theory, it is understood that when the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be a quinone derivative, a metal oxide, a cyano group-containing compound, or any combination thereof, but embodiments of the present disclosure are not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenum oxide; and a cyano group-containing compound, such as Compound HT-D1 below, but are not limited thereto:

HT-D1

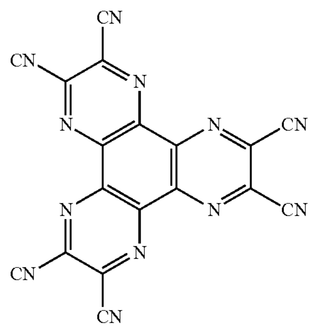

F4-TCNQ

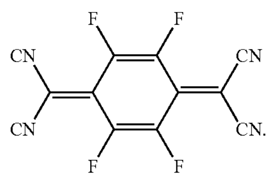

The hole transport region may include a buffer layer.

Also, the buffer layer may compensate for an optical resonance distance according to a wavelength of light emitted from the emission layer, and thus, efficiency of a formed organic light-emitting device may be improved.

Also, when the hole transport region includes an electron blocking layer, a material for the electron blocking layer may be a material for the hole transport region described above and materials for a host to be explained later. However, the material for the electron blocking layer is not limited thereto. In an exemplary embodiment, when the hole transport region includes an electron blocking layer, a material for the electron blocking layer may be mCP, which will be explained later.

Then, an emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a compound that is used to form the emission layer.

The emission layer may include a host and a dopant, and the dopant may include the organometallic compound represented by Formula 1.

The host may include TPBi, TBADN, ADN (also referred to as "DNA"), CBP, CDBP, TCP, mCP, one of Compounds H50 to H52, or any combination thereof:

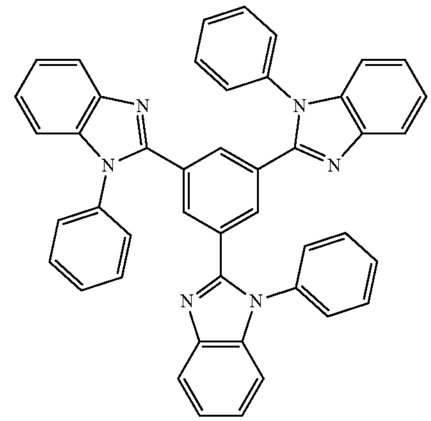

TPBi

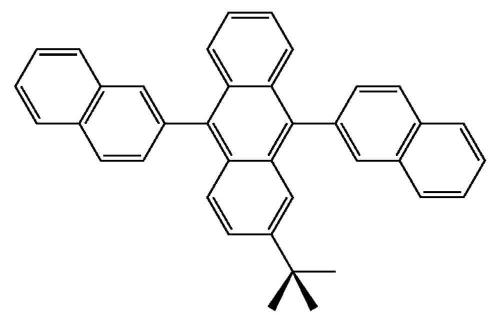

TBADN

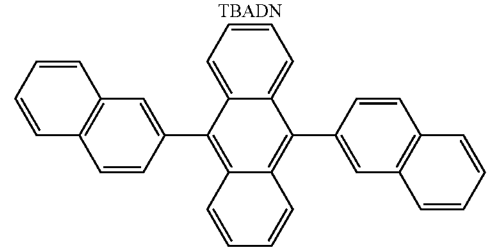

ADN

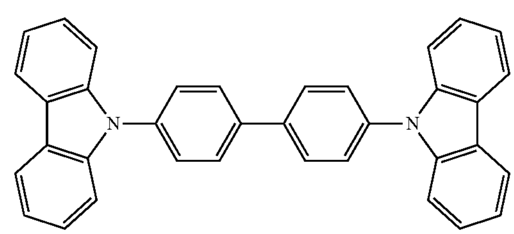

CBP

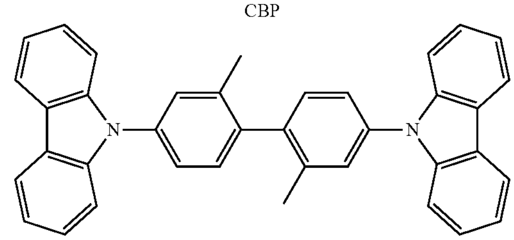

CDBP

-continued

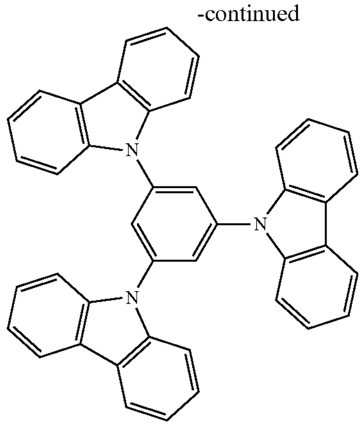

TCP

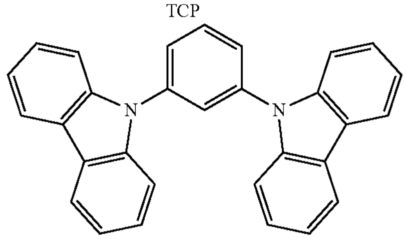

mCP

H50

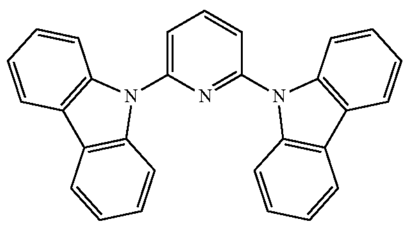

H51

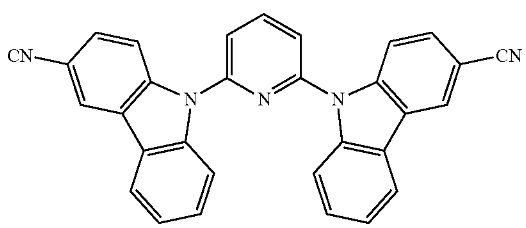

H52

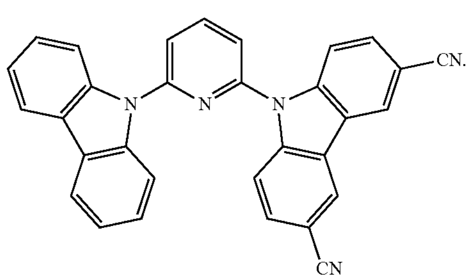

When the organic light-emitting device is a full-color organic light-emitting device, the emission layer may be patterned into a red emission layer, a green emission layer, and/or a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host, but embodiments of the present disclosure are not limited thereto.

The dopant may be an organometallic compound represented by Formula 1 described above. In an exemplary device, the dopant may be a red phosphorescent dopant.

A thickness of the emission layer may be in a range of about 100 Å to about 1,000 Å, for example, about 200 Å to about 600 Å. While not wishing to be bound by theory, it is understood that when the thickness of the emission layer is within this range, improved light-emission characteristics may be obtained without a substantial increase in driving voltage.

An electron transport region may be disposed on the emission layer.

The electron transport region may include a hole blocking layer, an electron transport layer, an electron injection layer, or any combination thereof.

In an exemplary embodiment, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, BCP, Bphen, BAlq, or any combination thereof, but embodiments of the present disclosure are not limited thereto:

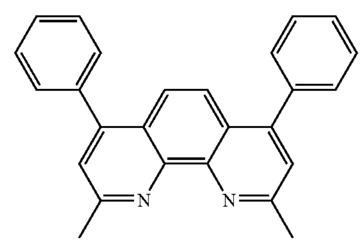

BCP

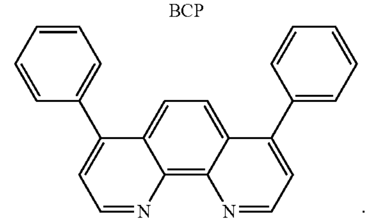

Bphen

A thickness of the hole blocking layer may be from about 20 Å to about 1,000 Å, for example, about 30 Å to about 300 Å. While not wishing to be bound by theory, it is understood that when the thickness of the hole blocking layer is within these ranges, the hole blocking layer may have improved hole blocking characteristics without a substantial increase in driving voltage.

The electron transport layer may include BCP, Bphen, $Alq_3$, BAlq, TAZ, NTAZ, or any combination thereof:

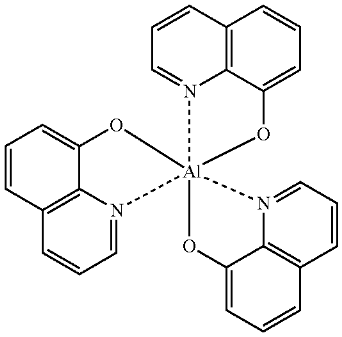
Alq3
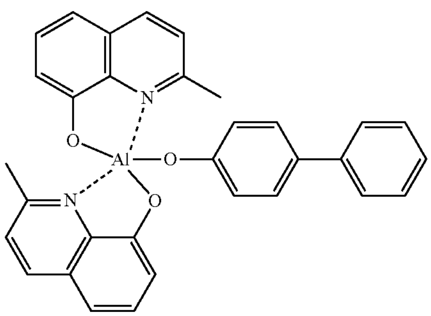
BAlq
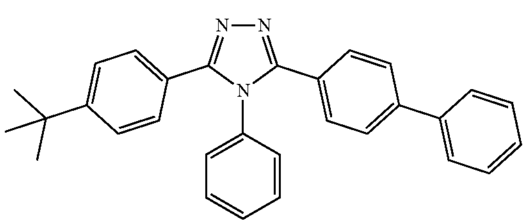
TAZ
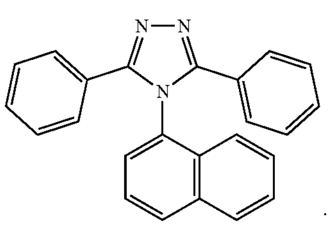
NTAZ
In one or more embodiments, the electron transport layer may include one of ET1 to ET25 or any combination thereof, but are not limited thereto:
ET1
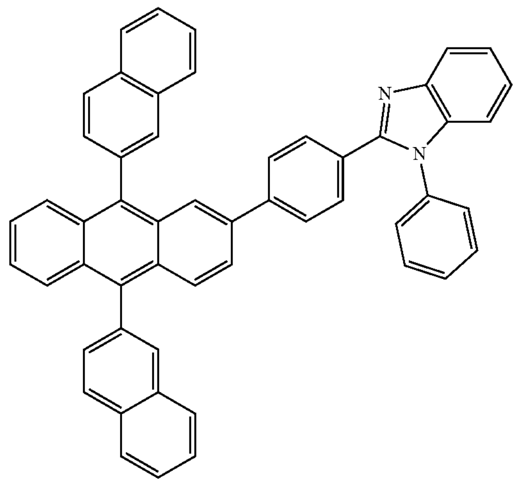
ET2
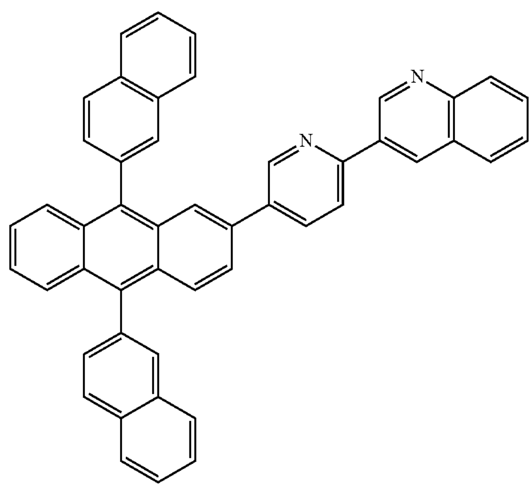
ET3
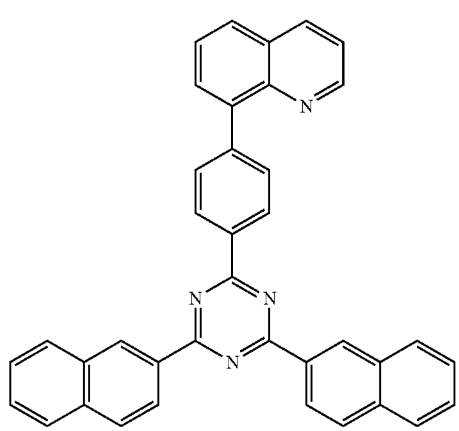

-continued
ET4
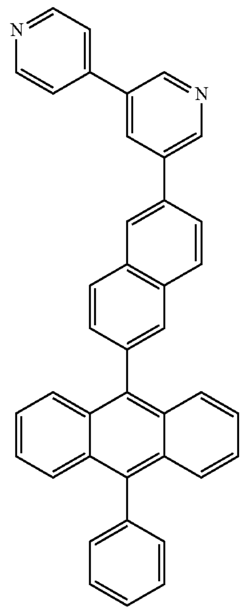
ET5
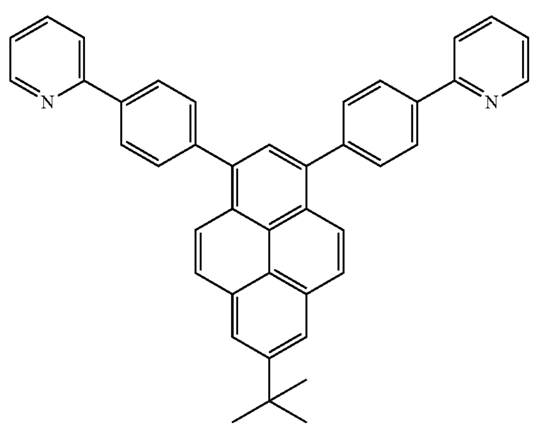
ET6
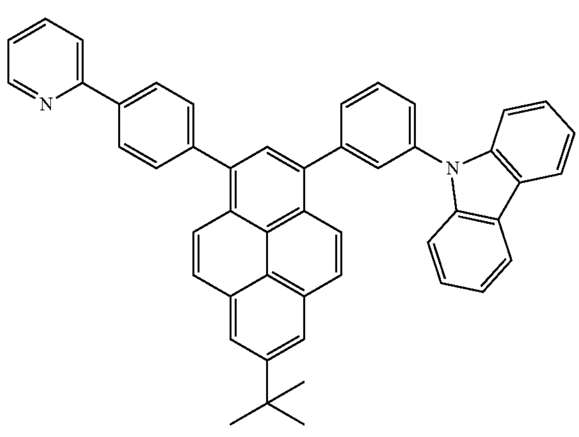
-continued
ET7
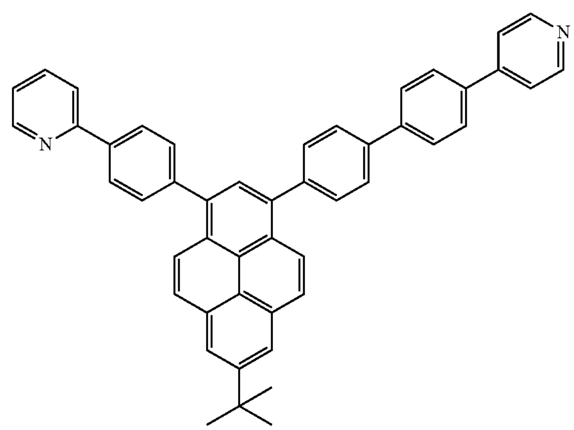
ET8
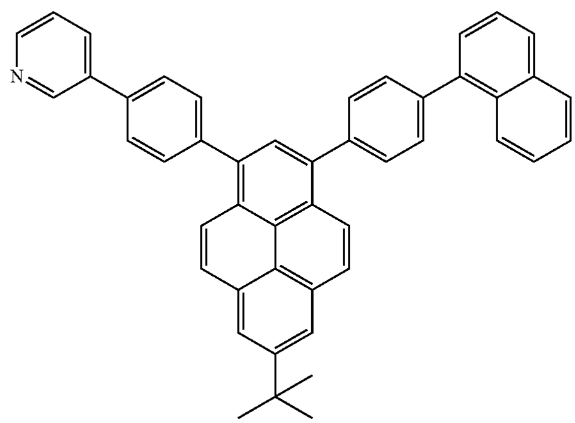
ET9
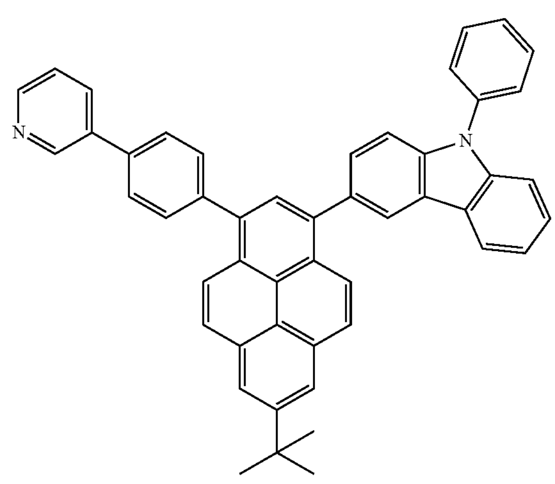

-continued
ET10
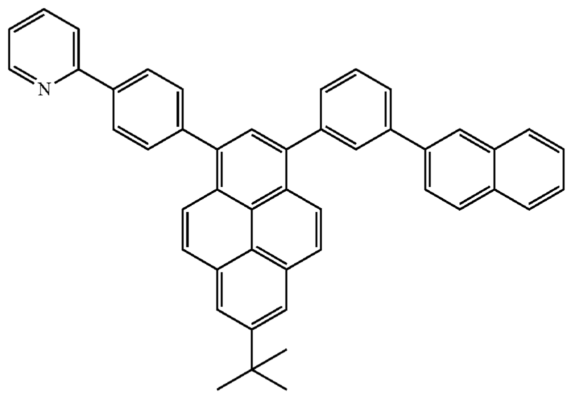
ET11
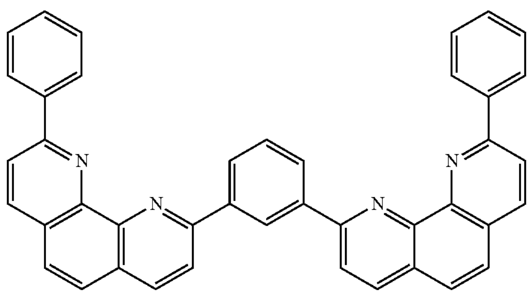
ET12
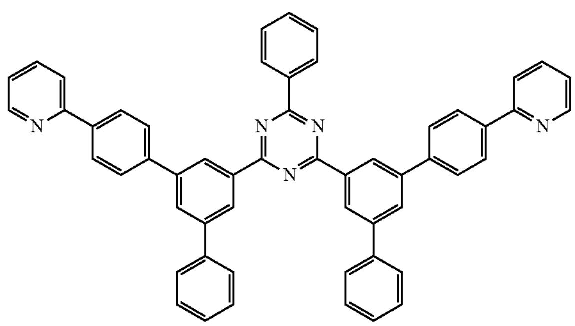
ET13
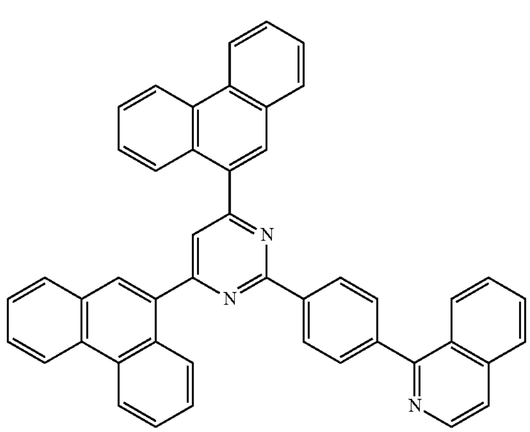
-continued
ET14
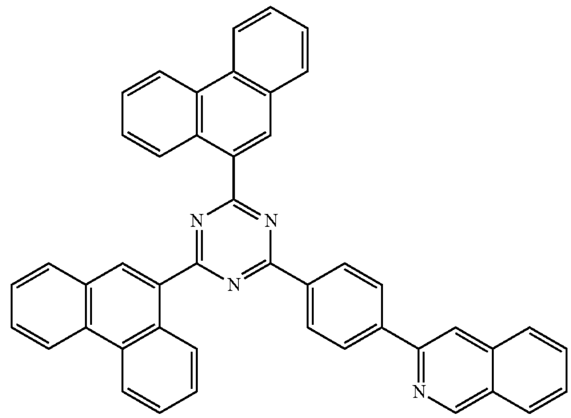
ET15
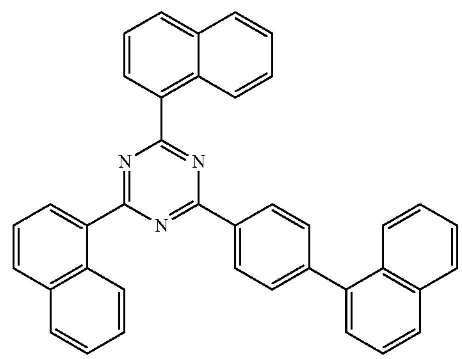
ET16
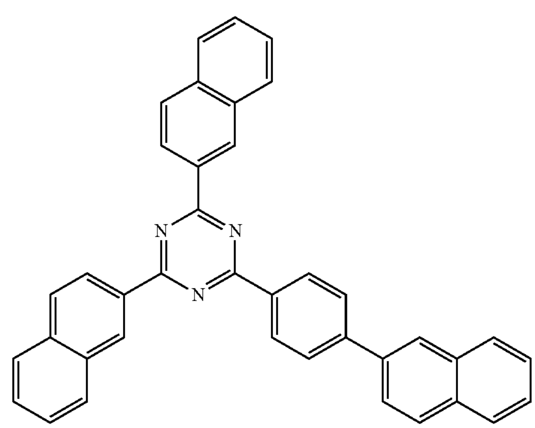

-continued
ET17
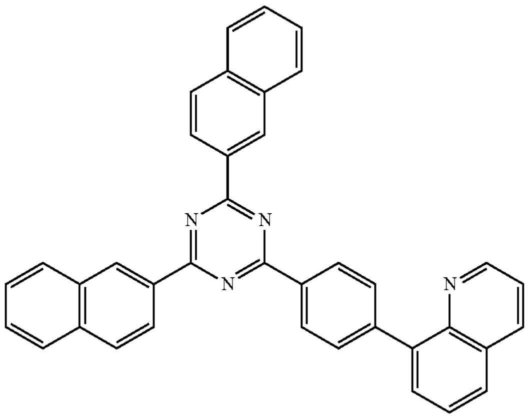
ET18
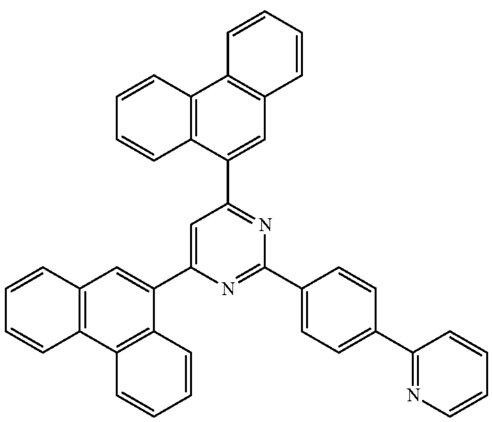
ET19
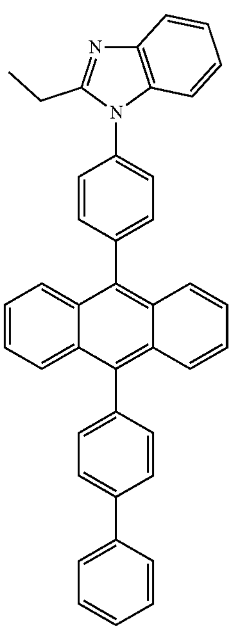
-continued
ET20
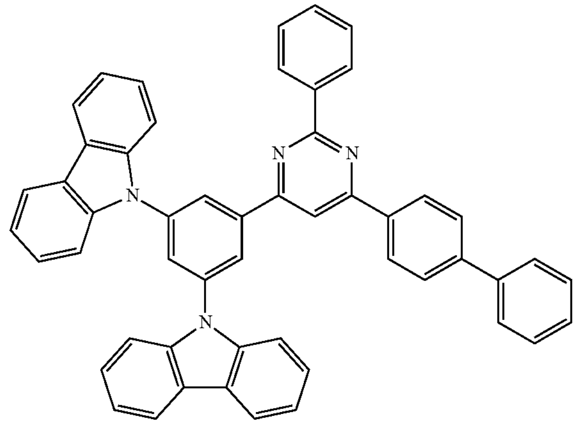
ET21
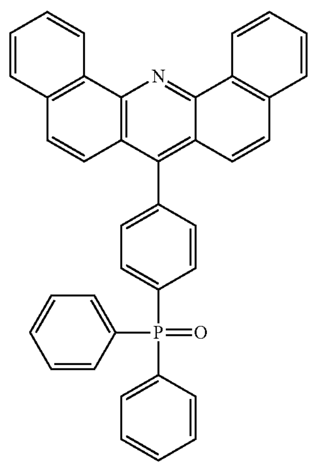
ET22
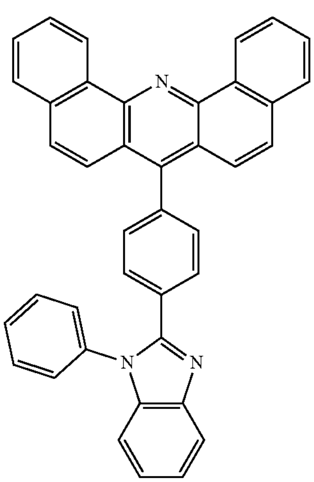

-continued

ET23

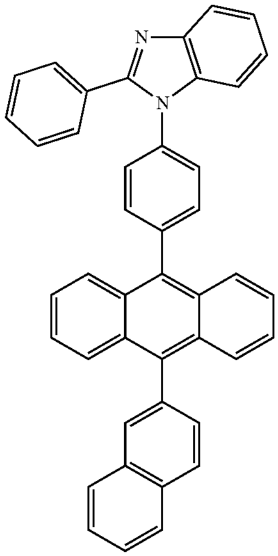

ET24

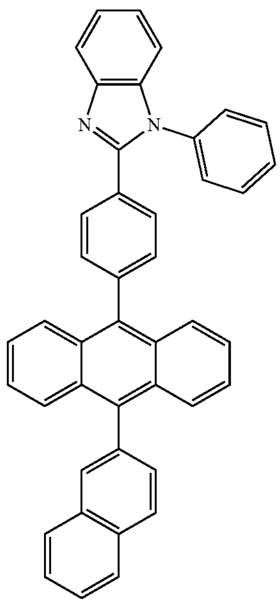

ET25

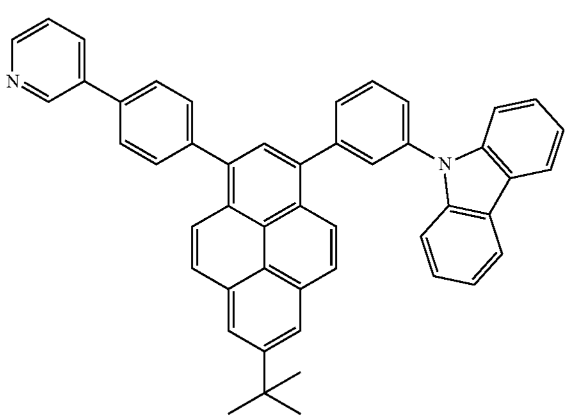

A thickness of the electron transport layer may be from about 100 Å to about 1,000 Å, for example, about 150 Å to about 500 Å. While not wishing to be bound by theory, it is understood that when the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (LiQ) or ET-D2:

ET-D1

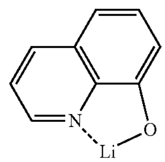

ET-D2

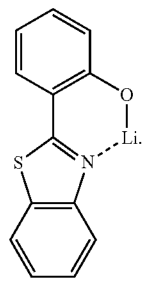

The electron transport region may include an electron injection layer that promotes flow of electrons from the second electrode 19 thereinto.

The electron injection layer may include LiF, NaCl, CsF, $Li_2O$, BaO, or any combination thereof.

A thickness of the electron injection layer may be from about 1 Å to about 100 Å, for example, about 3 Å to about 90 Å. While not wishing to be bound by theory, it is understood that when a thickness of the electron injection layer is within these ranges, satisfactory electron injection characteristics may be obtained without substantial increase in driving voltage.

The second electrode 19 is disposed on the organic layer 15. The second electrode 19 may be a cathode. A material for forming the second electrode 19 may be a metal, an alloy, an electrically conductive compound, or any combination thereof, which have a relatively low work function. In an exemplary device, lithium (Li), magnesium (Mg), aluminum (Al), aluminum-lithium (Al—Li), calcium (Ca), magnesium-indium (Mg—In), or magnesium-silver (Mg—Ag) may be formed as the material for forming the second electrode 19. To manufacture a top-emission type light-emitting device, a transmissive electrode formed using ITO or IZO may be used as the second electrode 19.

Hereinbefore, the organic light-emitting device according to an embodiment has been described in connection with the FIGURE.

Another aspect of the present disclosure provides a diagnostic composition including at least one organometallic compound represented by Formula 1.

The organometallic compound represented by Formula 1 provides high luminescence efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbon monovalent group having 1 to 60 carbon atoms, and examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$, (wherein $A_{101}$, is the $C_1$-$C_{60}$ alkyl group), and examples thereof include a methoxy group, an ethoxy group, and an isopropyloxy group.

The term "$C_2$-$C_{60}$ alkenyl group" as used herein refers to a hydrocarbon group having at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group having at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom selected from N, O, P, Si and S as a ring-forming atom and 1 to 10 carbon atoms, and non-limiting examples thereof include a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, and S as a ring-forming atom, 1 to 10 carbon atoms, and at least one carbon-carbon double bond in its ring. Non-limiting examples of the $C_1$-$C_{10}$ heterocycloalkenyl group are a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_7$-$C_{60}$ alkylaryl group" as used herein refers to a $C_6$-$C_{60}$ aryl group substituted with at least one $C_1$-$C_{60}$ alkyl group.

The term "$C_1$-$C_{60}$ heteroaryl group," as used herein, refers to a monovalent group having a cyclic aromatic system that has at least one heteroatom selected from N, O, P, Si, and S as a ring-forming atom, in addition to 1 to 60 carbon atoms. The term "$C_1$-$C_{60}$ heteroarylene group" as used herein refers to a divalent group having a cyclic aromatic system that has at least one heteroatom selected from N, O, P, Si, and S as a ring-forming atom, in addition to 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_2$-$C_{60}$ alkylheteroaryl group" as used herein refers to a $C_1$-$C_{60}$ heteroaryl group substituted with at least one $C_1$-$C_{60}$ alkyl group.

The term "$C_6$-$C_{60}$ aryloxy group" as used herein indicates —$OA_{102}$ (wherein $A_{102}$ is the $C_6$-$C_{60}$ aryl group), and the term $C_6$-$C_{60}$ arylthio group used herein indicates —$SA_{103}$ (wherein $A_{103}$ is the $C_6$-$C_{60}$ aryl group), and the term "$C_7$-$C_{60}$ arylalkyl group" as used herein indicates -$A_{104}A_{105}$ (wherein $A_{105}$ is the $C_6$-$C_{59}$ aryl group and $A_{104}$ is the $C_1$-$C_{53}$ alkylene group).

The term "$C_1$-$C_{60}$ heteroaryloxy group" as used herein refers to —$OA_{106}$ (wherein $A_{106}$ is the $C_2$-$C_{60}$ heteroaryl group), the term "$C_1$-$C_{60}$ heteroarylthio group" as used herein indicates —$SA_{107}$ (wherein $A_{107}$ is the $C_1$-$C_{60}$ heteroaryl group), and the term "$C_2$-$C_{60}$ heteroarylalkyl group" as used herein refers to -$A_{108}A_{109}$ ($A_{109}$ is a $C_1$-$C_{59}$ heteroaryl group, and $A_{108}$ is a $C_1$-$C_{59}$ alkylene group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Non-limiting examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom selected from N, O, P, Si, and S, other than carbon atoms, as a ring-forming atom, and no aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group.

The term "$C_1$-$C_{30}$ heterocyclic group" as used herein refers to a saturated or unsaturated cyclic group having, as a ring-forming atom, at least one heteroatom selected from N, O, Si, P, and S other than 1 to 30 carbon atoms. The $C_1$-$C_{30}$ heterocyclic group may be a monocyclic group or a polycyclic group.

A substituent(s) of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{60}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group may be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, —$P(Q_{28})(Q_{29})$, or any combination thereof;

—$N(Q_{31})(Q_{32})$, —$Si(Q_{33})(Q_{34})(Q_{35})$, —$Ge(Q_{33})(Q_{34})(Q_{35})$, —$B(Q_{36})(Q_{37})$, —$P(=O)(Q_{38})(Q_{39})$, —$P(Q_{38})(Q_{39})$, or any combination thereof; or any combination thereof.

In the present specification, $Q_1$ to $Q_9$, $Q_{11}$ to $Q_{19}$, $Q_{21}$ to $Q_{29}$, and $Q_{31}$ to $Q_{39}$ may each independently be hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_7$-$C_{60}$ arylalkyl group; a $C_1$-$C_{60}$ heteroaryl group; a $C_1$-$C_{60}$ heteroaryloxy group; a $C_1$-$C_{60}$ heteroarylthio group; a $C_7$-$C_{60}$ arylalkyl group; a $C_2$-$C_{60}$ heteroarylalkyl group; a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group; or a monovalent non-aromatic condensed heteropolycyclic group.

Hereinafter, a compound and an organic light-emitting device according to embodiments are described in detail with reference to Synthesis Example and Examples. However, the organic light-emitting device is not limited thereto. The wording "B was used instead of A" used in describing Synthesis Examples means that an amount of B used was identical to an amount of A used, in terms of a molar equivalent.

EXAMPLES

Synthesis Example 1 (Compound 2)

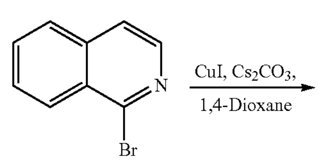

-continued

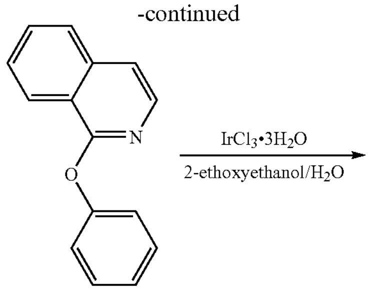

L2

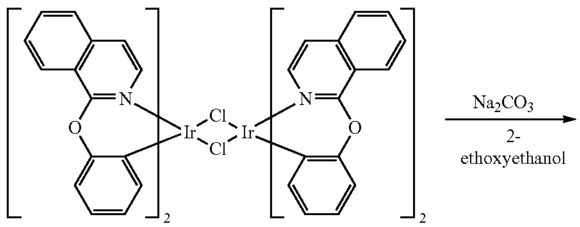

L2-dimer

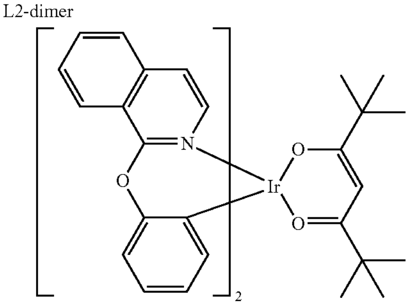

2

1) Synthesis of Intermediate L2

1-bromo-isoquinoline (6.58 grams (g), 31.64 millimoles, (mmol)), phenol (3.28 g, 34.80 mmol), CuI (0.603 g, 3.06 mmol) and $Cs_2CO_3$ (20.62 g, 63.28 mmol), and pyridine-2-carboxylic acid (0.78 g, 6.33 mmol) were mixed with 160 milliliters (mL) of 1,4-dioxane, and the mixed solution was stirred under reflux for 18 hours. Then, the reaction temperature was lowered to room temperature, a solid produced therein was separated by filtration. A solvent was removed from a filtrate obtained therefrom under reduced pressure, and the resulting residue was extracted by using methylene chloride (MC) to obtain the organic layer. Anhydrous magnesium sulfate ($MgSO_4$) was added to the organic layer to remove moisture, and the resulting solution was filtered. A solvent was removed from the filtrate obtained therefrom under reduced pressure, and the resulting residue was purified by using column chromatography under conditions of EA (ethyl acetate):Hexane=1:10, thereby obtaining 6.46 g (92%) of Intermediate L2.

MALDI-TOFMS (m/z): $C_{15}H_{11}NO$ ($M^+$) 222.

2) Synthesis of Intermediate L2-Dimer

Intermediate L2 (6.33 g, 28.62 mmol) and iridium chloride (4.49 g, 12.72 mmol) were mixed with 60 mL of ethoxyethanol and 20 mL of distilled water, and the mixed solution was stirred under reflux for 24 hours. Then, the reaction temperature was lowered to room temperature, a solid produced therein was separated by filtration, and the resulting filtrate was thoroughly washed using water/methanol/hexane in the stated order. The solid obtained was then dried in a vacuum oven, thereby obtaining Intermediate L2-dimer (3.69 g, 43%).

3) Synthesis of Compound 2

Intermediate L2-dimer (3.28 g, 2.45 mmol), 2,2,6,6-tetramethylheptane-3,5-dione (4.52 g, 24.5 mmol), and $Na_2CO_3$ (2.59 g, 24.5 mmol) were mixed with 50 mL of ethoxyethanol, and the mixed solution was heated at a temperature of 90° C. for 18 hours while being stirred. The mixture obtained was filtered, and the resulting solid was thoroughly washed using ethanol, and purified by using column chromatography under conditions of dichloromethane:n-hexane=1:1 (v/v), thereby obtaining Compound 2 (1.40 g, 35%). Compound 2 was identified by Mass Spectrum and HPLC.

HRMS(MALDI) calcd for $C_{41}H_{39}IrN_2O_4$: m/Z 816.2539. Found: 816.2540.

Synthesis Example 2 (Compound 3)

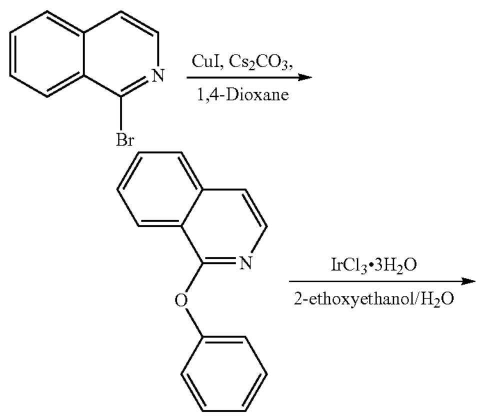

L2

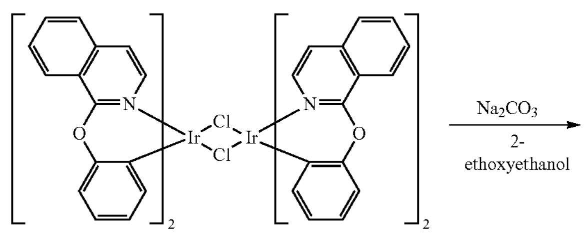

L2-dimer

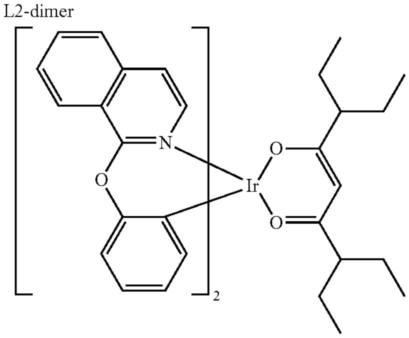

3

Compound 3 (1.6 g, 39%) was obtained in the same manner as in the synthesis of Compound 2 of Synthesis Example 1, except that 3,7-diethylnonane-4,6-dione (5.20 g, 24.5 mmol) was used instead of 2,2,6,6-tetramethylheptane-3,5-dione. Compound 3 was identified by Mass Spectrum and HPLC.

HRMS(MALDI) calcd for $C_{43}H_{43}IrN_2O_4$: m/Z 844.2852. Found: 844.2851.

Synthesis Example 3 (Compound 32)

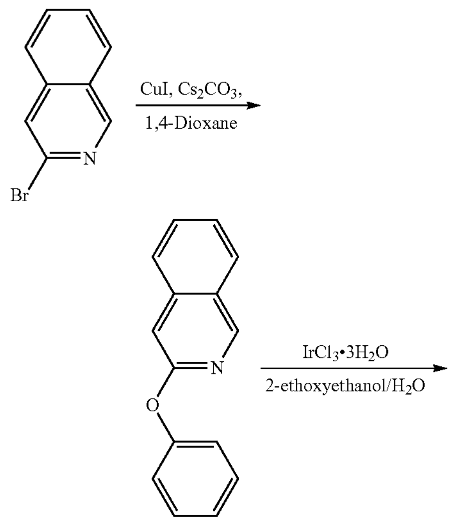

L32

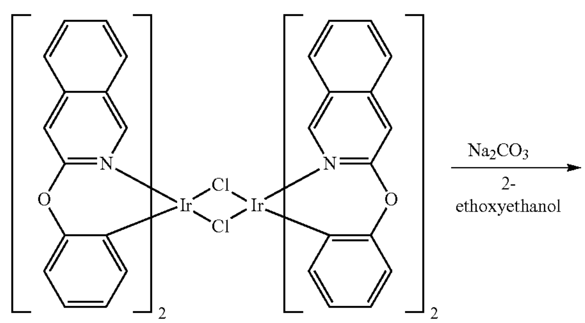

L32-dimer

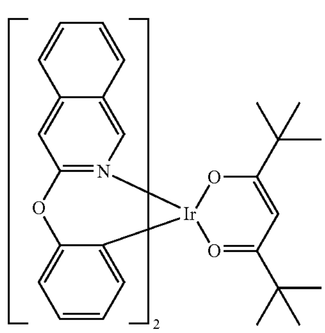

32

1) Synthesis of Intermediate L32

Intermediate L32 (6.4 g, 91%) was obtained in the same manner as in the synthesis of Intermediate L2 of Synthesis Example 1, except that 3-bromoisoquinoline (5.20 g, 24.5 mmol) was formed instead of 1-bromo-isoquinoline.

MALDI-TOFMS (m/z): $C_{15}H_{11}NO$ ($M^+$) 222.

2) Synthesis of Intermediate L32-Dimer

Intermediate L32-dimer (4.5 g, 53%) was obtained in the same manner as in the synthesis of Intermediate L2-dimer of Synthesis Example 1, except that Intermediate L32 (5.20 g, 24.5 mmol) was used instead of Intermediate L2.

3) Synthesis of Compound 32

Compound 32 (1.3 g, 46%) was obtained in the same manner as in the synthesis of Compound 2 of Synthesis Example 1, except that Intermediate L32-dimer (2.29 g, 1.72 mmol) was used instead of Intermediate L2-dimer. Compound 32 was identified by Mass Spectrum and HPLC.

HRMS(MALDI) calcd for $C_{41}H_{39}IrN_2O_4$: m/Z 816.2539. Found: 816.2540.

Synthesis Example 4 (Compound 33)

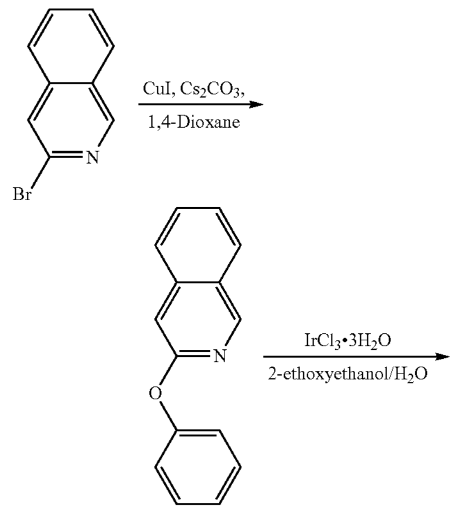

L32

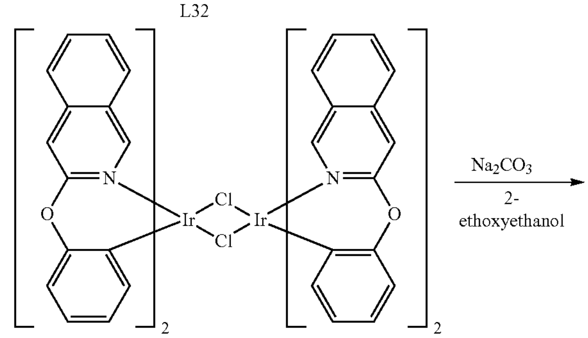

L32-dimer

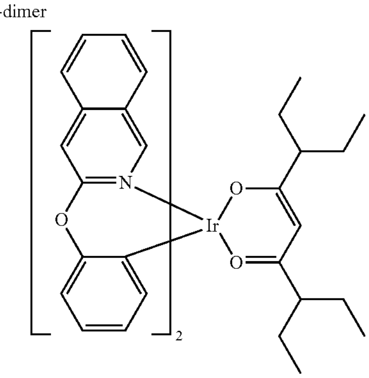

33

Compound 33 (1.1 g, 39%) was obtained in the same manner as in the synthesis of Compound 32 of Synthesis Example 3, except that 3,7-diethylnonane-4,6-dione (3.52 g, 16.6 mmol) was used instead of 2,2,6,6-tetramethylheptane-3,5-dione. Compound 33 was identified by Mass Spectrum and HPLC.

HRMS(MALDI) calcd for $C_{43}H_{43}IrN_2O_4$: m/Z 844.2852. Found: 844.2851.

Synthesis Example 5 (Compound 47)

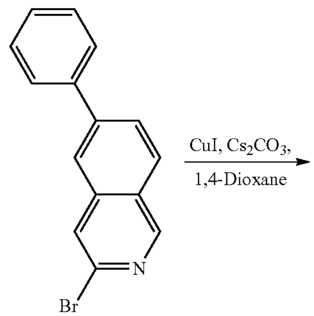

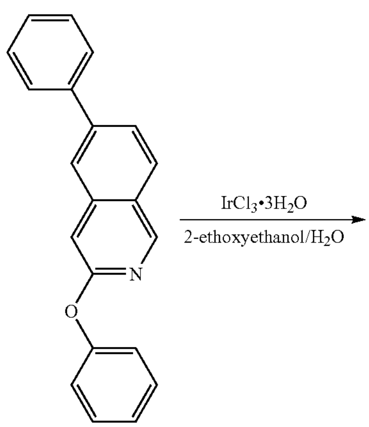

L47

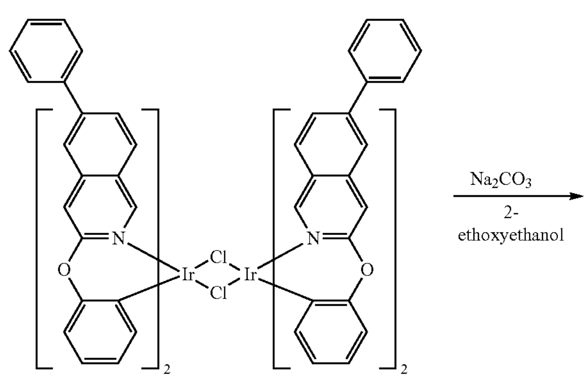

L47-dimer

-continued

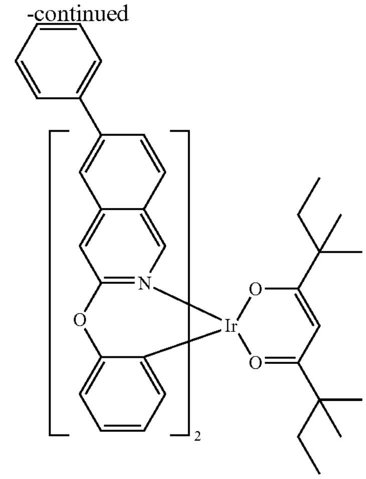

47

1) Synthesis of Intermediate L47

Intermediate L47 (3.8 g, 95%) was obtained in the same manner as in the synthesis of Intermediate L2 of Synthesis Example 1, except that 3-bromo-6-phenylisoquinoline (3.82 g, 13.5 mmol) was used instead of 1-bromo-isoquinoline.

MALDI-TOFMS (m/z): $C_{21}H_{15}NO$ ($M^+$) 298.

2) Synthesis of Intermediate L47-Dimer

Intermediate L47-dimer (2.2 g, 47%) was obtained in the same manner as in the synthesis of Intermediate L2-dimer of Synthesis Example 1, except that Intermediate L47 (3.8 g, 12.7 mmol) was used instead of Intermediate L2.

3) Synthesis of Compound 47

Compound 47 (1.3 g, 46%) was obtained in the same manner as in the synthesis of Compound 2 of Synthesis Example 1, except that Intermediate L47-dimer (2.2 g, 1.72 mmol) was used instead of Intermediate L2-dimer and 3,3,7,7-tetramethylnonane-4,6-dione was used instead of 2,2,6,6-tetramethylheptane-3,5-dione. Compound 47 was identified by Mass Spectrum and HPLC.

HRMS(MALDI) calcd for $C_{55}H_{51}IrN_2O_4$: m/Z 996.3478. Found: 996.3477.

Synthesis Example 6 (Compound 69)

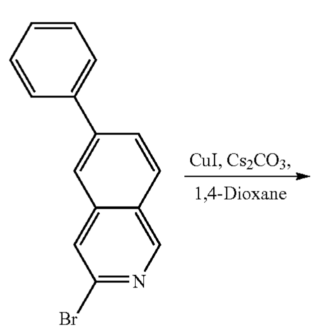

-continued

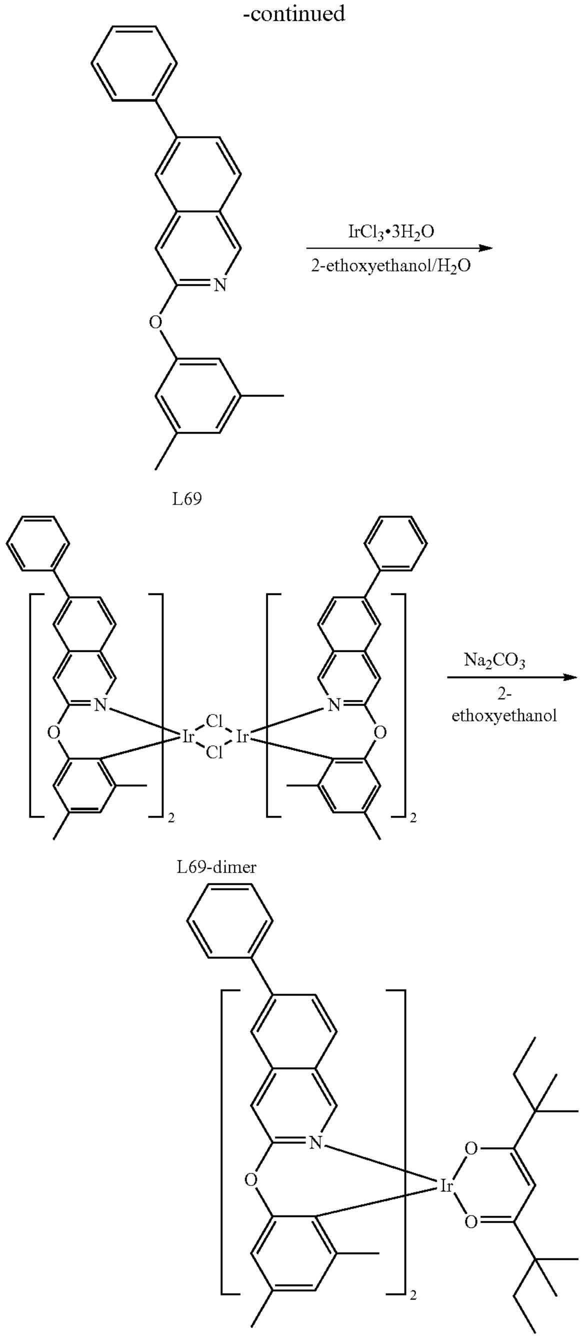

69

1) Synthesis of Intermediate L69

Intermediate L69 (3.2 g, 91%) was obtained in the same manner as in the synthesis of Intermediate L47 of Synthesis Example 5, except that 3,5-dimethylphenol (1.45 g, 11.83 mmol) was used instead of phenol.

MALDI-TOFMS (m/z): $C_{23}H_{19}NO$ ($M^+$) 326.

2) Synthesis of Intermediate L69-Dimer

Intermediate L69-dimer (1.9 g, 50%) was obtained in the same manner as in the synthesis of Intermediate L47-dimer of Synthesis Example 5, except that Intermediate L69 (3.2 g, 9.76 mmol) was used instead of Intermediate L47.

3) Synthesis of Compound 69

Compound 69 (0.98 g, 43%) was obtained in the same manner as in the synthesis of Compound 47 of Synthesis Example 5, except that Intermediate L69-dimer (1.9 g, 1.09 mmol) was used instead of Intermediate L47-dimer. Compound 69 was identified by Mass Spectrum and HPLC.

HRMS(MALDI) calcd for $C_{59}H_{59}IrN_2O_4$: m/Z 1052.4104. Found: 1052.4102.

Synthesis Example 7 (Compound 239)

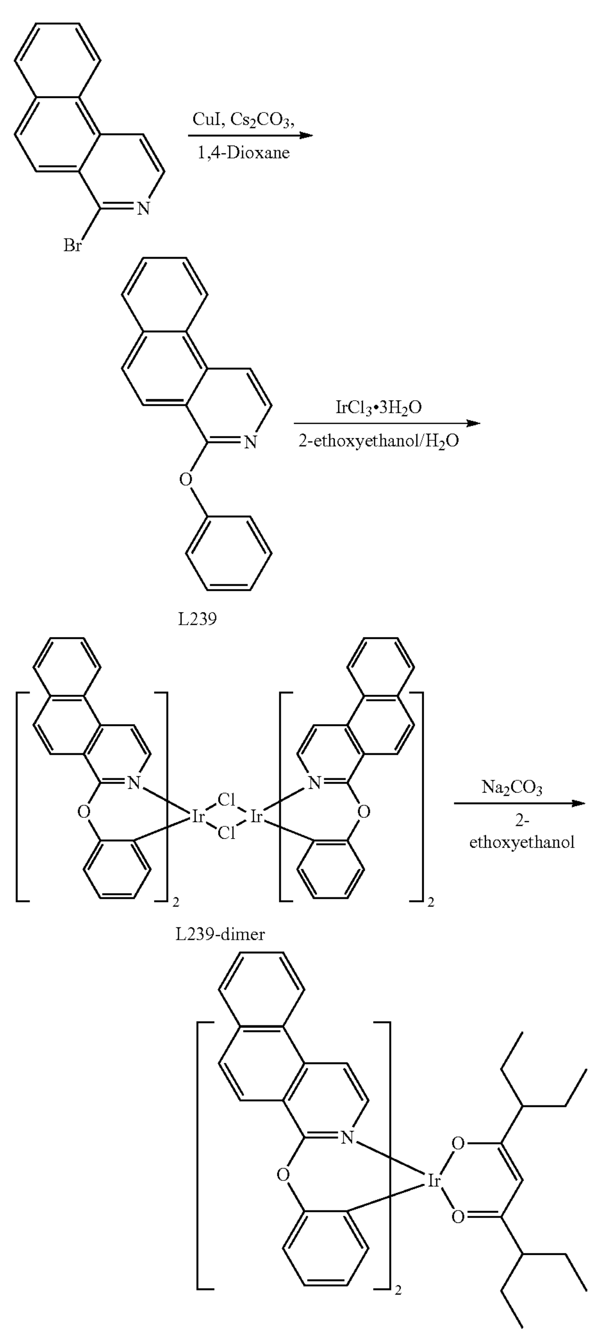

239

1) Synthesis of Intermediate L239

Intermediate L239 (4.4 g, 84%) was obtained in the same manner as in the synthesis of Intermediate L2 of Synthesis Example 1, except that 4-bromobenzo[f]isoquinoline (5.0 g, 19.35 mmol) was used instead of 1-bromo-isoquinoline.

2) Synthesis of Intermediate L239-Dimer

Intermediate L239-dimer (1.8 g, 45%) was obtained in the same manner as in the synthesis of Intermediate L2-dimer of Synthesis Example 1, except that Intermediate L239 (3.2 g, 11.71 mmol) was used instead of Intermediate L2.

3) Synthesis of Compound 239

Compound 239 (0.54 g, 27%) was obtained in the same manner as in the synthesis of Compound 2 of Synthesis Example 1, except that Intermediate L239-dimer (1.6 g, 1.06 mmol) was used instead of Intermediate L2-dimer. Compound 239 was identified by Mass Spectrum and HPLC.

HRMS(MALDI) calcd for $C_{51}H_{47}IrN_2O_4$: m/z 944.3165. Found: 944.3161.

Example 1

A glass substrate, on which ITO was deposited to as an anode, was cut to a size of 50 mm×50 mm×0.5 mm, sonicated with isopropyl alcohol and pure water each for 5 minutes, and then cleaned by exposure to ultraviolet rays and ozone for 30 minutes. Then, the glass substrate was provided to a vacuum deposition apparatus.

2-TNATA was vacuum-deposited on the anode to form a hole injection layer having a thickness of 600 Å, and 4,4'-bis[N-(1-naphthyl)-N-phenylamino]biphenyl (NPB) was vacuum-deposited on the hole injection layer to form a hole transport layer having a thickness of 1,350 Å.

Then, CBP (host) and Compound 2 (dopant) were co-deposited on the hole transport layer at a weight ratio of 98:2 to form an emission layer having a thickness of 400 Å.

Afterwards, BCP was vacuum-deposited on the emission layer to form a hole blocking layer having a thickness of 50 Å, $Alq_3$ was vacuum-deposited on the hole blocking layer to form an electron transport layer having a thickness of 350 Å, LiF was vacuum-deposited on the electron transport layer to form an electron injection layer having a thickness of 10 Å, and Al was deposited on the electron injection layer to form a cathode, thereby completing the manufacture of an organic light-emitting device:

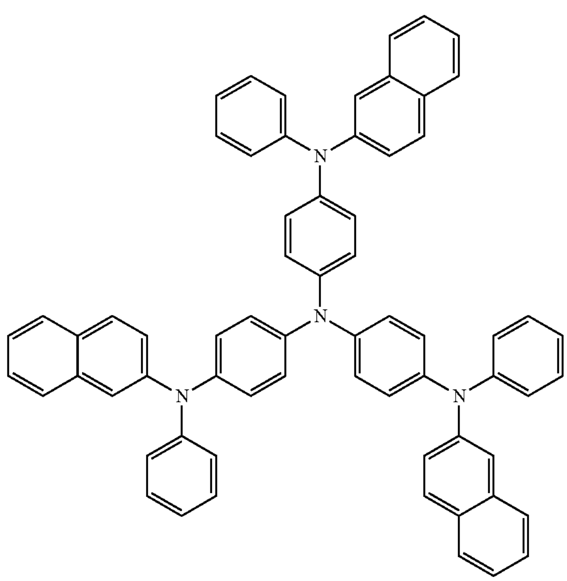

2-TNATA

-continued

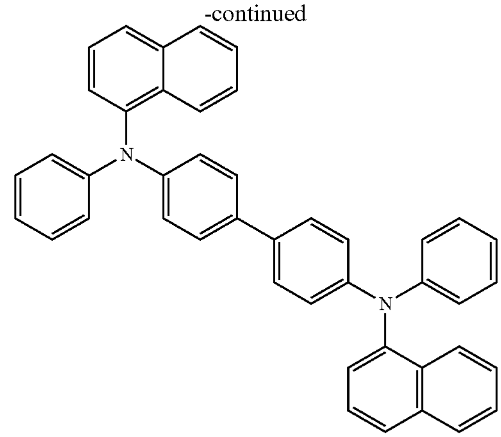

NPB

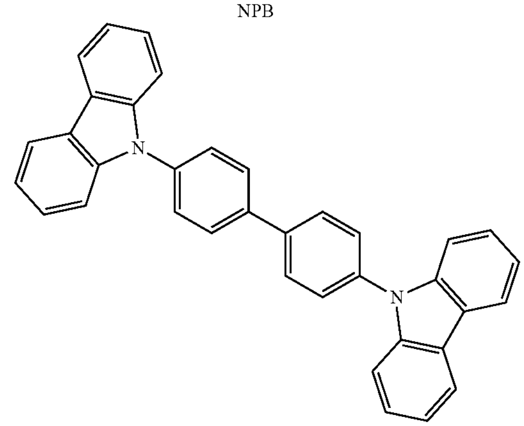

CBP

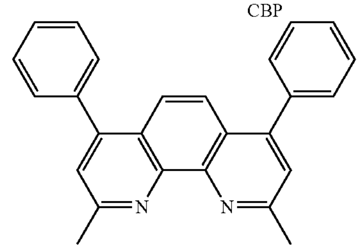

BCP

Examples 2 to 6 and Comparative Examples A, E, and G

Organic light-emitting devices were manufactured in the same manner as in Example 1, except that Compounds shown in Table 2 were each used instead of Compound 2 as a dopant in forming an emission layer.

Evaluation Example 1: Evaluation of Characteristics of Organic Light-Emitting Device The driving voltage, maximum value of external quantum efficiency (Max EQE), roll-off ratio, half-width, and maximum emission wavelength of a main peak in an EL spectrum, and lifespan ($LT_{97}$) of the organic light-emitting devices manufactured according to Examples 1 to 6 and Comparative Examples A, E, and G were evaluated, and results thereof are shown in Table 2. A current-voltage meter (Keithley 2400) and a luminance meter (Minolta Cs-1000 Å) were used as evaluation devices, and the lifespan ($LT_{97}$) (at 3,500 nit) indicates an amount of time that lapsed when luminance was 97% of initial luminance (100%). The roll-off ratio was calculated by using Equation 20:

$$\text{Roll-off ratio}=\{1-(\text{efficiency (at 3,500 nit)}/\text{maximum emission efficiency})\}\times 100\% \quad \text{Equation 20}$$

TABLE 2

| | Dopant in emission layer | Driving voltage (V) | Max EQE (%) | Roll-Off ratio (%) | $LT_{97}$ (hr) (at 3,500 nit) |
|---|---|---|---|---|---|
| Example 1 | 2 | 4.7 | 23.2 | 10 | 205 |
| Example 2 | 69 | 3.2 | 31.9 | 3 | 557 |
| Example 3 | 33 | 4.5 | 27.8 | 8 | 745 |
| Example 4 | 32 | 4.3 | 27.9 | 7 | 472 |
| Example 5 | 47 | 3.6 | 29.3 | 10 | 580 |
| Example 6 | 239 | 4.0 | 30.2 | 5 | 480 |
| Comparative Example A | A | 8.8 | 5.5 | 39 | 0.2 |
| Comparative Example E | E | 6.4 | 16.4 | 25 | 52 |
| Comparative Example G | G | 5.8 | 22.3 | 13 | 175 |

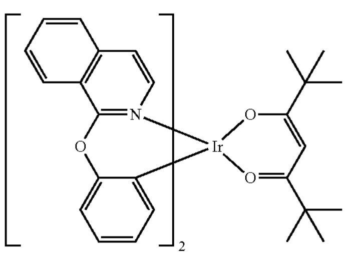

2

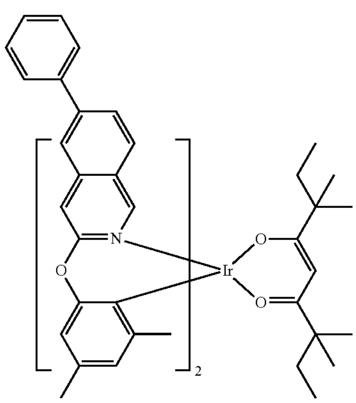

69

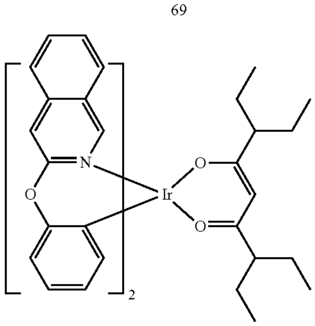

33

TABLE 2-continued

| | Dopant in emission layer | Driving voltage (V) | Max EQE (%) | Roll-Off ratio (%) | $LT_{97}$ (hr) (at 3,500 nit) |
|---|---|---|---|---|---|

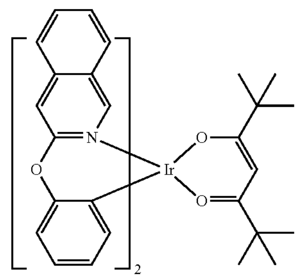

32

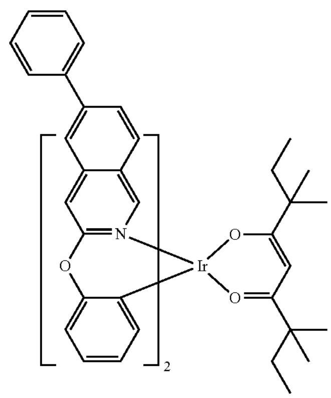

47

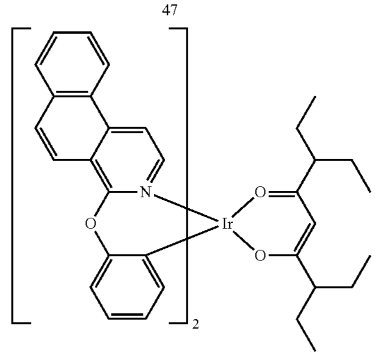

239

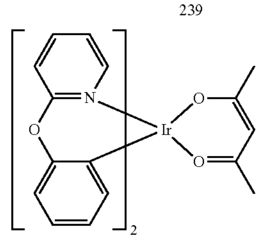

A

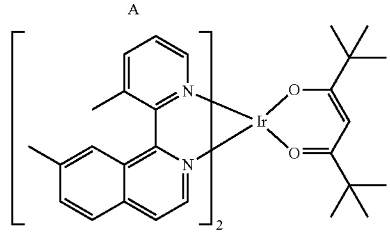

E

TABLE 2-continued

| Dopant in emission layer | Driving voltage (V) | Max EQE (%) | Roll-Off ratio (%) | $LT_{97}$ (hr) (at 3,500 nit) |
|---|---|---|---|---|
| 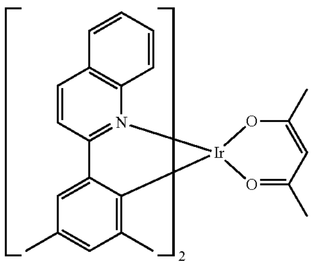 G | | | | |

From Table 2, it was confirmed that the organic light-emitting devices of Examples 1 to 6 had improved driving voltage, improved external quantum efficiency, improved roll-off ratio, and improved lifespan characteristics, as compared with those of the organic light-emitting devices of Comparative Examples A, E, and G.

According to the one or more embodiments, the organometallic compound has improved electric characteristics. In an exemplary embodiment, an organic light-emitting device including the organometallic compound may have improved driving voltage, improved external quantum efficiency, improved roll-off ratio, and improved lifespan characteristics. In addition, the organometallic compound may have improved phosphorescence characteristics, and in this regard, a diagnostic composition including the organometallic compound may have high diagnostic efficiency.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the FIGURES, it will be understood by those of ordinary skill in the art that various changes in form and details may be made therein without departing from the spirit and scope of the present disclosure as defined by the following claims.

What is claimed is:

1. An organometallic compound represented by Formula 1:

$$M(L_1)_{n1}(L_2)_{n2} \quad \text{Formula 1}$$

wherein, in Formula 1,

M is iridium (Ir), osmium (Os), titanium (Ti), hafnium (Hf), europium (Eu), rhodium (Rh), or ruthenium (Ru), $L_1$ is a ligand represented by Formula 2, n1 is 1 or 2, and when n1 is 2, the two $L_1$ groups are identical to or different from each other, $L_2$ is a group represented by one of Formulae 3-1(61) to 3-1(66), 3-1(301) and 3-1(305) to 3-1(307), and 3-1 (309),

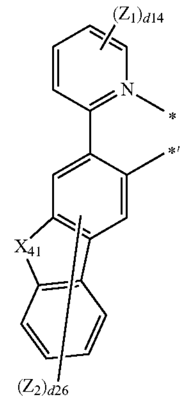

3-1(61)

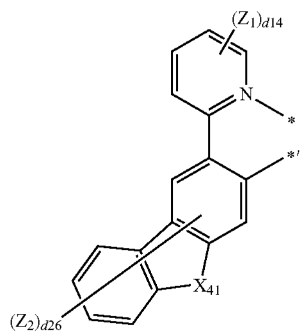

3-1(62)

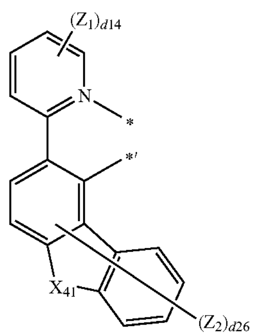

3-1(63)

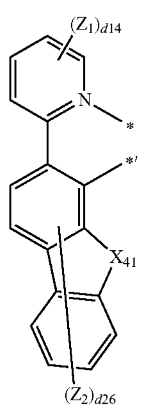

3-1(64)

-continued 3-1(65)

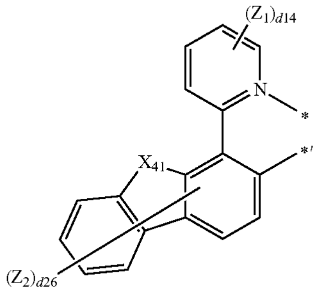

3-1(301)

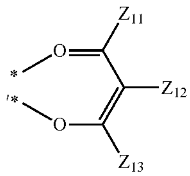

3-1(305)

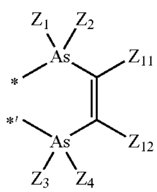

3-1(306)

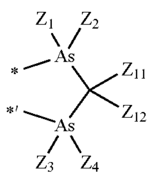

3-1(307)

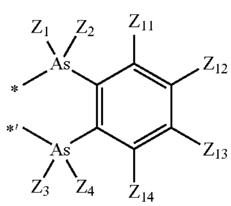

3-1(308)

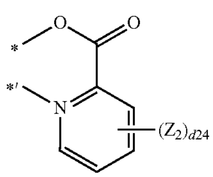

3-1(309)

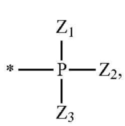

wherein, in Formulae 3-1(61) to 3-1(66), 3-1(301) and 3-1(305) to 3-1(307), and 3-1(309), $X_{41}$ is O, S, $N(Z_{21})$, $C(Z_{21})(Z_{22})$, or $Si(Z_{21})(Z_{22})$, $Z_1$ to $Z_4$, and $Z_{11}$ to $Z_{14}$ are each the same as defined in connection with $R_{21}$, d14 is an integer from 0 to 4, d26 is an integer from 0 to 6,

* and *' each indicate a binding site to M in Formula 1, and in Formula 1, n2 is 1 or 2, and when n2 is 2, the two $L_2$ groups are identical to or different from each other, and $L_1$ and $L_2$ are different from each other, Formula 2

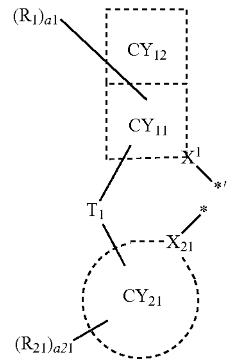

wherein, in Formula 2, $X_1$ is N and $X_{21}$ is C, ring $CY_{11}$ and ring $CY_{12}$ are condensed with each other, $T_1$ is *—O—*', wherein * and *' each indicate a binding site to a neighboring atom, a group represented by

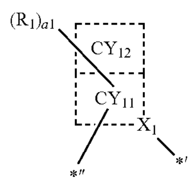

in Formula 2 is a group represented by one of Formulae CY1-30 to CY1-33, CY1-35 to CY1-37, CY1-39 to CY1-42, CY1-44 to CY1-48, CY1-50 to CY1-52, CY1-54 to CY1-58 and CY1-60 to CY1-69:

CY1-30

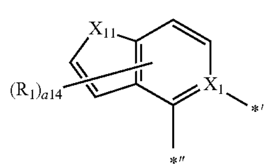

CY1-31

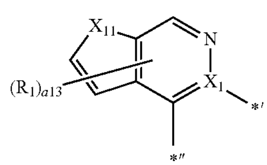

CY1-32

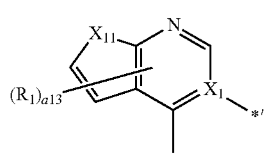

-continued
CY1-33
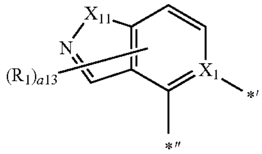
CY1-35
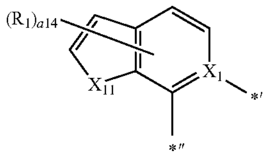
CY1-36
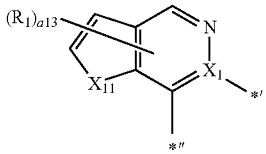
CY1-37
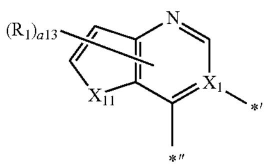
CY1-39
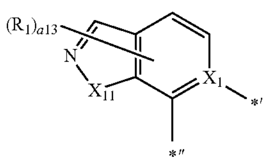
CY1-40
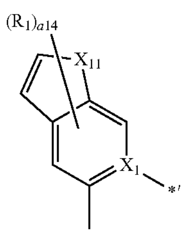
CY1-41
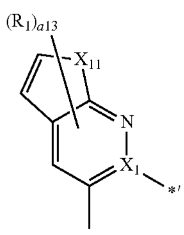
-continued
CY1-42
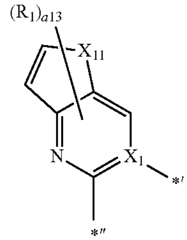
CY1-44
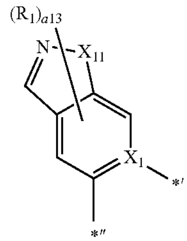
CY1-45
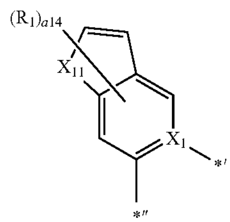
CY1-46
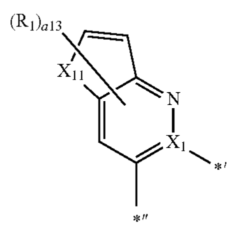
CY1-47
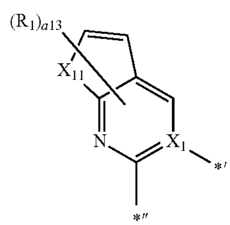
CY1-48
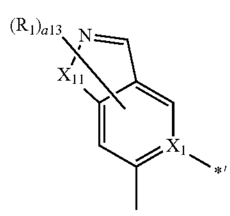

-continued
CY1-50
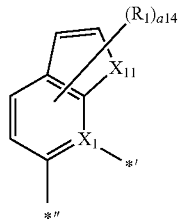
CY1-51
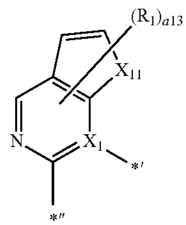
CY1-52
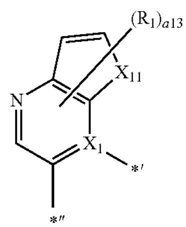
CY1-54
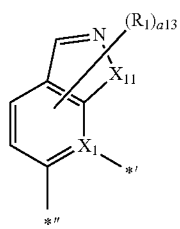
CY1-55
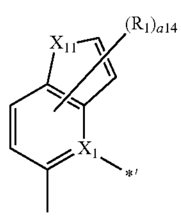
CY1-56
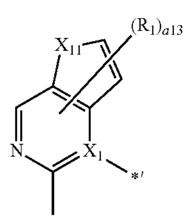
-continued
CY1-57
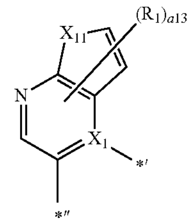
CY1-58
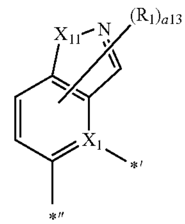
CY1-60
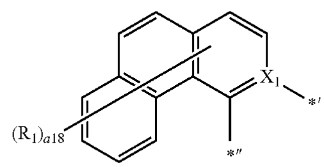
CY1-61
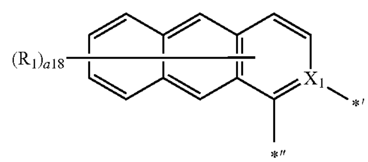
CY1-62
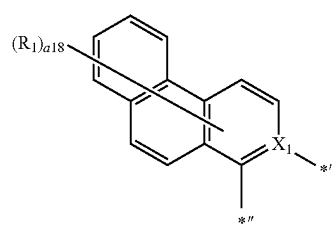
CY1-63
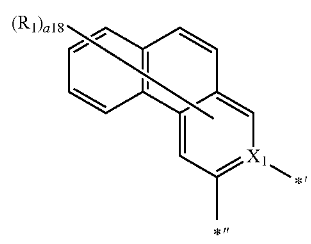
CY1-64
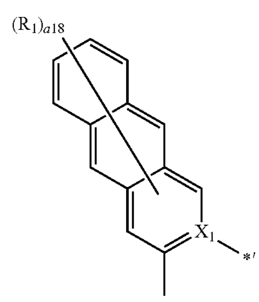

-continued

CY1-65

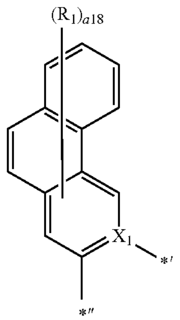

CY1-66

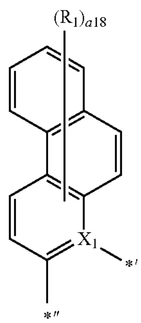

CY1-67

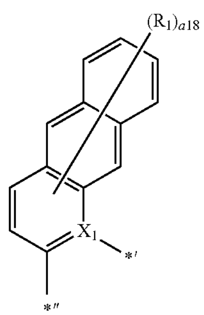

CY1-68

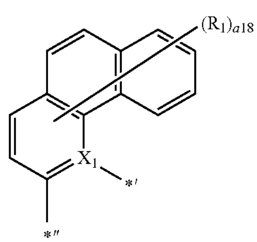

CY1-69

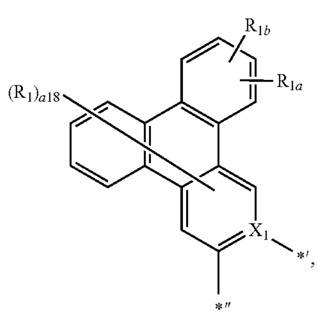

wherein, in Formulae CY1-30 to CY1-33, CY1-35 to CY1-37, CY1-39 to CY1-42, CY1-44 to CY1-48, CY1-50 to CY1-52, CY1-54 to CY1-58 and CY1-60 to CY1-69, $X_{11}$ is O, S, Se, $N(R_{19})$, $C(R_{19a})(R_{19b})$, or $Si(R_{19a})(R_{19b})$, $R_{19}$, $R_{19a}$, $R_{19b}$, $R_{1a}$ and $R_{1b}$ are each the same as defined in connection with $R_1$, a18 is an integer from 0 to 8, a14 is an integer from 0 to 4, a13 is an integer from 0 to 3,

*" indicates a binding site to Tin Formula 2, and

*' indicates a binding site to M in Formula 1, a group represented by

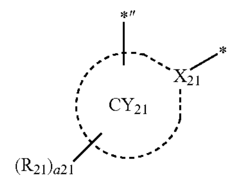

in Formula 2 is a group represented by one of Formulae CY21-1 to CY21-25:

CY21-1

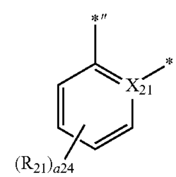

CY21-2

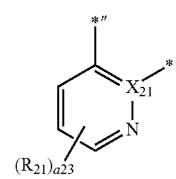

CY21-3

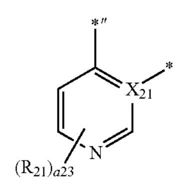

CY21-4

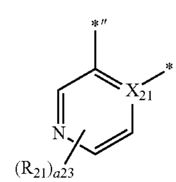

CY21-5

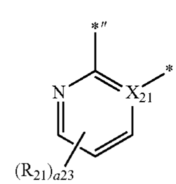

CY21-6
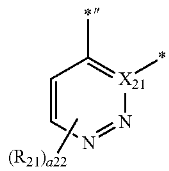
CY21-7
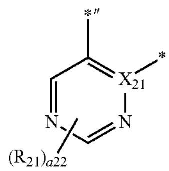
CY21-8
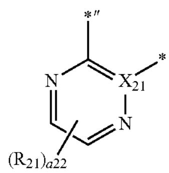
CY21-9
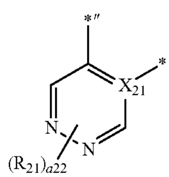
CY21-10
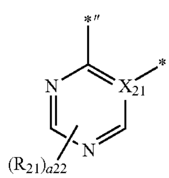
CY21-11
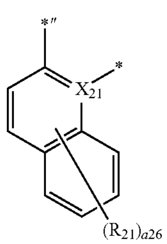
CY21-12
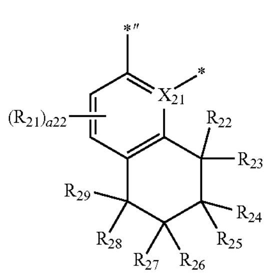
CY21-13
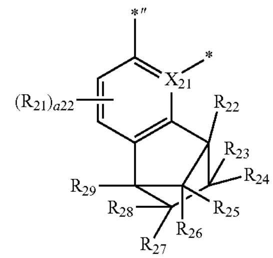
CY21-14
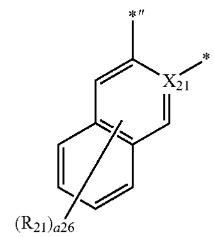
CY21-15
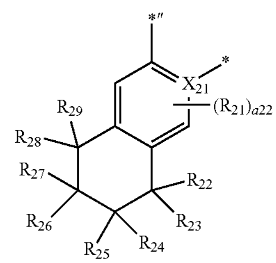
CY21-16
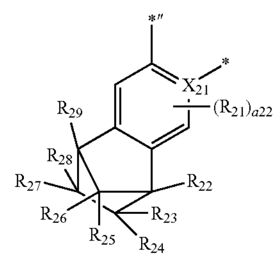
CY21-17
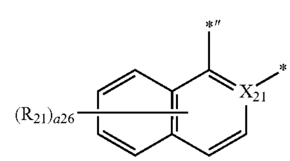
CY21-18
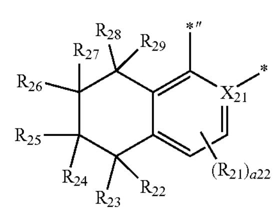
CY21-19
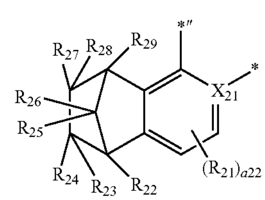

-continued

CY21-20

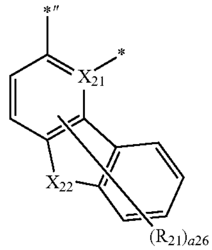

CY21-21

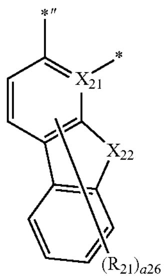

CY21-22

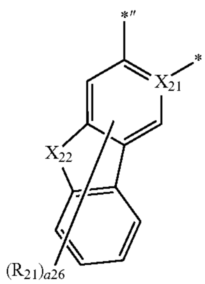

CY21-23

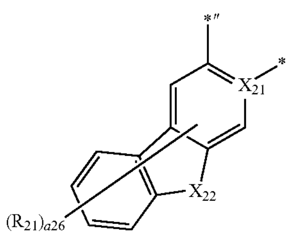

CY21-24

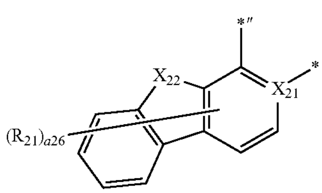

CY21-25

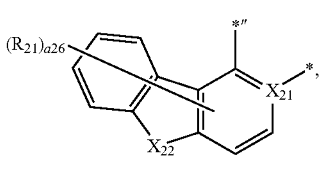

wherein, in Formulae CY21-1 to CY21-25, $X_{22}$ is $C(R_{22})(R_{23})$, $N(R_{22})$, O, S, or $Si(R_{22})(R_{23})$, $R_{22}$ to $R_{29}$ are each the same as defined in connection with $R_{21}$, a26 is an integer from 0 to 6, a24 is an integer from 0 to 4, a23 is an integer from 0 to 3, a22 is an integer from 0 to 2,

*" indicates a binding site to $T_1$ in Formula 2, and

*' indicates a binding site to M in Formula 1, $R_1$ to $R_3$ and $R_{21}$ are each independently hydrogen, deuterium, —F, —Cl, —Br, —I, —$SF_5$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, provided that when $CY_{21}$ is a benzene group, then at least one of $R_{21}$ is not —F, —Cl, —Br, or —I, a1 and a21 are each independently an integer from 0 to 20, two or more of a plurality of groups $R_1$ are optionally linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of a plurality of groups $R_{21}$ are optionally linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of $R_1$ to $R_3$ and $R_{21}$ are optionally linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $R_{10a}$ is the same as defined in connection with $R_{21}$,

* and *' each indicate a binding site to M in Formula 1, and a substituent(s) of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group is each independently:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{19})$, —$P(Q_{28})(Q_{29})$, or any combination thereof;

—$N(Q_{31})(Q_{32})$, —$Si(Q_{33})(Q_{34})(Q_{35})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$; or any combination thereof, and $Q_1$ to $Q_9$, $Q_{11}$ to $Q_{19}$, $Q_{21}$ to $Q_{29}$, and $Q_{31}$ to $Q_{39}$ are each independently hydrogen; deuterium; —F; —Cl; —Br; —I; a hydroxyl group; a cyano group; a nitro group; an amino group; a guanidino group; an amidino group; a guanidino group; a hydrazine group; a hydrazone group; a carboxylic acid group or a salt thereof a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_7$-$C_{60}$ arylalkyl group; a $C_1$-$C_{60}$ heteroaryl group; a $C_1$-$C_{60}$ heteroaryloxy group; a $C_1$-$C_{60}$ heteroarylthio group; a $C_2$-$C_{60}$ heteroarylalkyl group; a monovalent non-aromatic condensed polycyclic group; or a monovalent non-aromatic condensed heteropolycyclic group.

2. The organometallic compound of claim 1, wherein M is Ir or Os, and the sum of n1 and n2 is 3 or 4.

3. The organometallic compound of claim 1, wherein $R_1$ to $R_3$ and $R_{21}$ are each independently:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, $C_1$-$C_{20}$ alkyl group, or a $C_1$-$C_{20}$ alkoxy group;

a $C_1$-$C_{20}$ alkyl group and a $C_1$-$C_{20}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{20}$ alkoxy group, a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl) adamantanyl group, a ($C_1$-$C_{20}$ alkyl) norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a pyridinyl group, a pyrimidinyl group, or any combination thereof;

a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterium-containing $C_2$-$C_{20}$ alkyl group, a $C_1$-$C_{20}$ alkoxy group, a cyclopentyl group, a cyclohexyl group, a cycloheptyl group, a cyclooctyl group, an adamantyl group, a norbornyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl) adamantanyl group, a ($C_1$-$C_{20}$ alkyl) norbornanyl group, a ($C_1$-$C_{20}$ alkyl)norbornenyl group, a ($C_1$-$C_{20}$ alkyl)cyclopentenyl group, a ($C_1$-$C_{20}$ alkyl) cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a phenyl group, a ($C_1$-$C_{20}$ alkyl) phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or any combination thereof; or $—N(Q_1)(Q_2)$, $—Si(Q_3)(Q_4)(Q_5)$, $—Ge(Q_3)(Q_4)(Q_5)$, $—B(Q_6)(Q_7)$, $—P(=O)(Q_8)(Q_9)$, or $—P(Q_8)(Q_9)$, and $Q_1$ to $Q_9$ are each independently:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$; or an n-propyl group, an iso-propyl group, an n-butyl group, a sec-butyl group, an isobutyl group, a tert-butyl group, an n-pentyl group, a tert-pentyl group, a neo-pentyl group, an iso-pentyl group, a sec-pentyl group, a 3-pentyl group, a sec-iso-pentyl group, a phenyl group, a biphenyl group or a naphthyl group, each unsubstituted or substituted with deuterium, a $C_1$-$C_{10}$ alkyl group, a phenyl group, or any combination thereof.

4. The organometallic compound of claim 1, wherein a group represented by

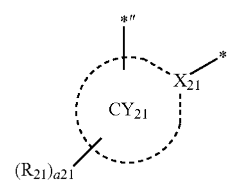

in Formula 2 is a group represented by one of Formulae CY21(1) to CY21(56) and Formula CY21-20 to CY21-25:

CY21(1)

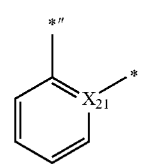

CY21(2)

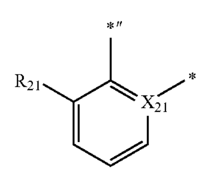

CY21(3)

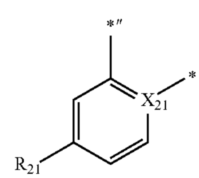

CY21(4)

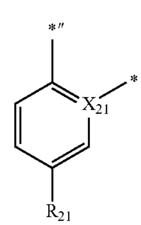

-continued
CY21(5)
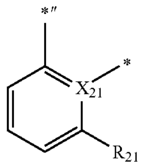
CY21(6)
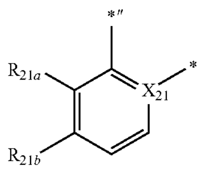
CY21(7)
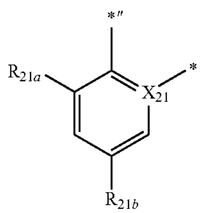
CY21(8)
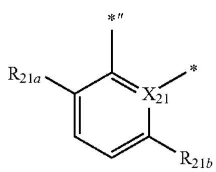
CY21(9)
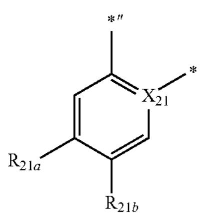
CY21(10)
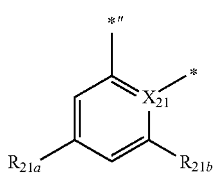
CY21(11)
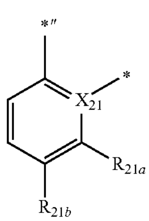
CY21(12)
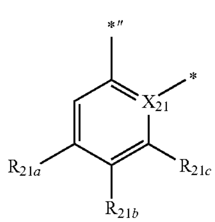
-continued
CY21(13)
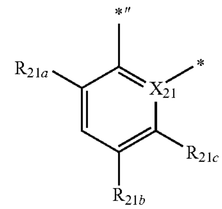
CY21(14)
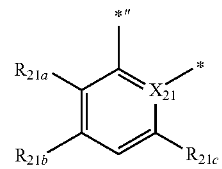
CY21(5)
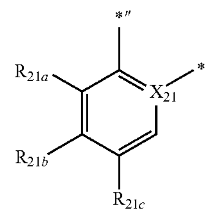
CY21(16)
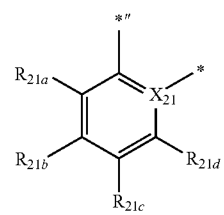
CY21(17)
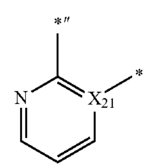
CY21(18)
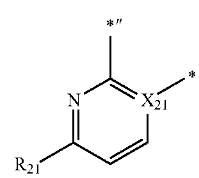
CY21(19)
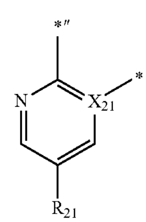
CY21(20)
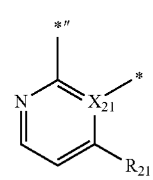

-continued
CY21(21)
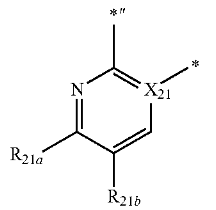
CY21(22)
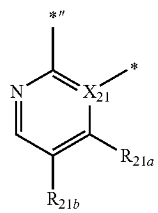
CY21(23)
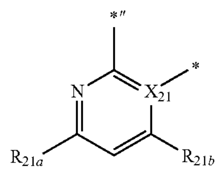
CY21(24)
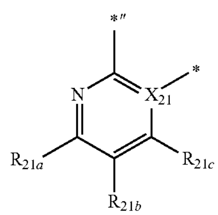
CY21(25)
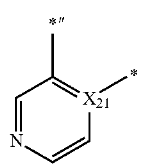
CY21(26)
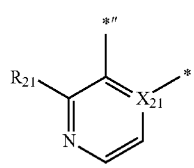
CY21(27)
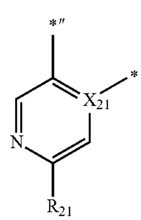
CY21(28)
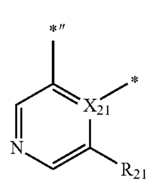
-continued
CY21(29)
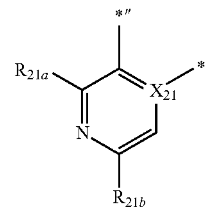
CY21(30)
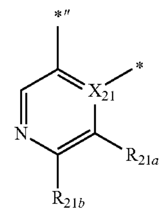
CY21(31)
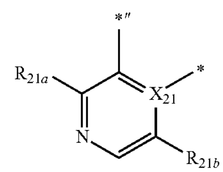
CY21(32)
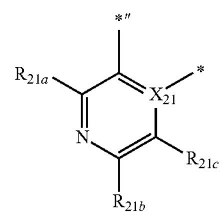
CY21(33)
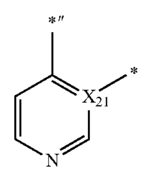
CY21(34)
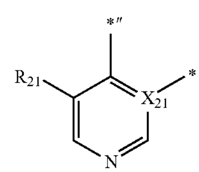
CY21(35)
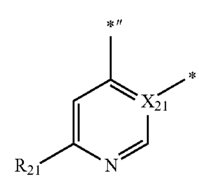
CY21(36)
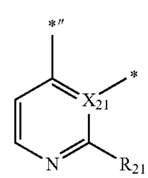

CY21(37)
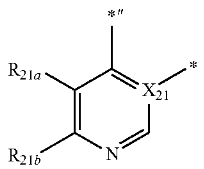
CY21(38)
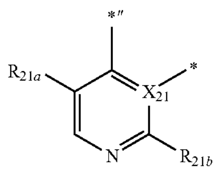
CY21(39)
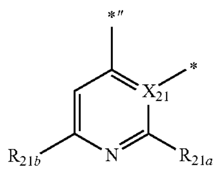
CY21(40)
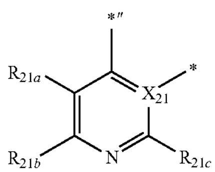
CY21(41)
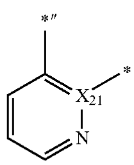
CY21(42)
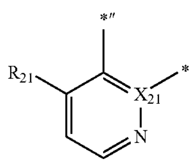
CY21(43)
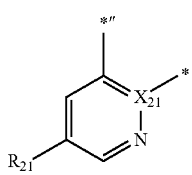
CY21(44)
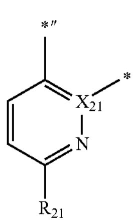
CY21(45)
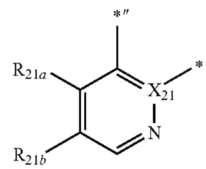
CY21(46)
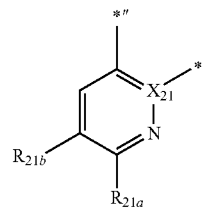
CY21(47)
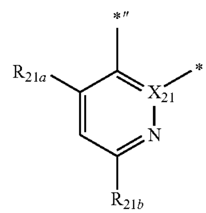
CY21(48)
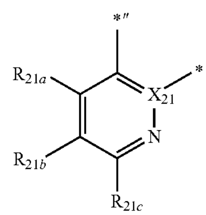
CY21(49)
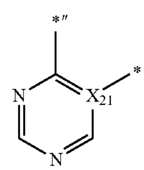
CY21(50)
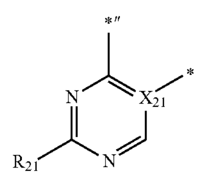
CY21(51)
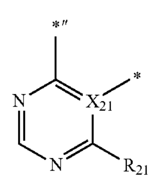
CY21(52)
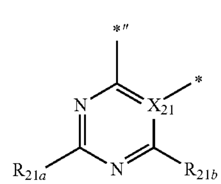

-continued

CY21(53)

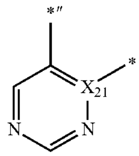

CY21(54)

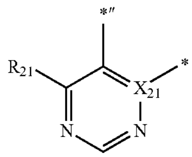

CY21(55)

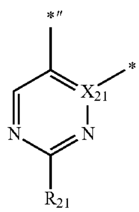

CY21(56)

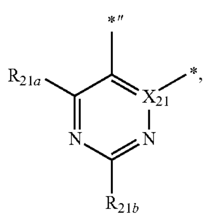

wherein, in Formulae CY21(1) to CY21(56), $X_{21}$ and $R_{21}$ are each the same as defined in claim 1

$R_{21a}$ to $R_{21a}$ are each the same as defined in connection with $R_{21}$ in claim 1, wherein each of $R_{21}$ and $R_{21a}$ to $R_{21a}$ is not hydrogen,

*" indicates a binding site to $T_1$ in Formula 2, and

*' indicates a binding site to M in Formula 1.

5. The organometallic compound of claim 1, wherein $L_2$ in Formula 1 is a group represented by Formula 3-1-1:

3-1-1

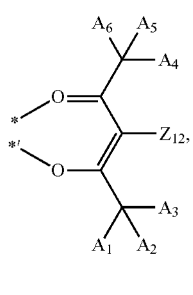

wherein, in Formula 3-1-1, $Z_{12}$ is the same as defined in connection with $R_{21}$ in claim 1, $A_2$ and $A_5$ are each independently hydrogen, deuterium, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, or a substituted or unsubstituted monovalent non-aromatic condensed heteropolycyclic group, $A_1$, $A_3$, $A_4$, and $A_6$ are each independently a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, or a substituted or unsubstituted monovalent non-aromatic condensed heteropolycyclic group, two or more of $A_1$ to $A_6$ are optionally be linked to form a $C_5$-$C_{30}$ carbocyclic group unsubstituted or substituted with at least one $R_{1a}$ or a $C_1$-$C_{30}$ heterocyclic group unsubstituted or substituted with at least one $R_{1a}$, $R_{1a}$ is the same as defined in connection with $Z_{12}$, a substituent(s) of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group is:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, —$P(Q_{28})(Q_{29})$, or any combination thereof;

—$N(Q_{31})(Q_{32})$, —$Si(Q_{33})(Q_{34})(Q_{35})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$; or any combination thereof, and $Q_{11}$ to $Q_{19}$, $Q_{21}$ to $Q_{29}$, and $Q_{31}$ to $Q_{39}$ are each independently hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_7$-$C_{60}$ arylalkyl group; a $C_1$-$C_{60}$ heteroaryl group; a $C_1$-$C_{60}$ heteroaryloxy group; a $C_1$-$C_{60}$ heteroarylthio group; a $C_2$-$C_{60}$ heteroarylalkyl group; a monovalent non-aromatic condensed polycyclic group; or a monovalent non-aromatic condensed heteropolycyclic group.

6. The organometallic compound of claim 1, wherein the organometallic compound is one of Compounds 72 to 191 and 237 to 366:

31

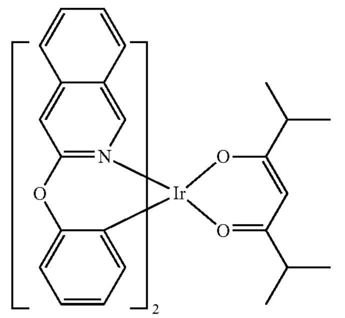

32

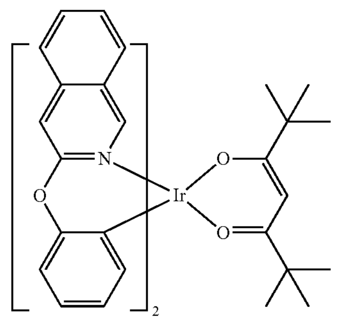

33

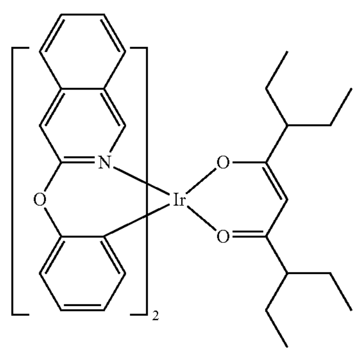

34

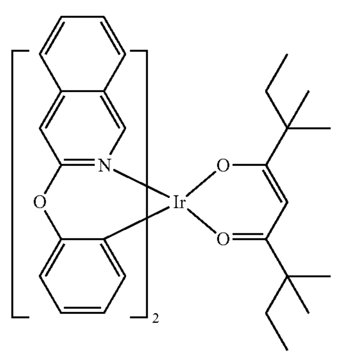

-continued
35
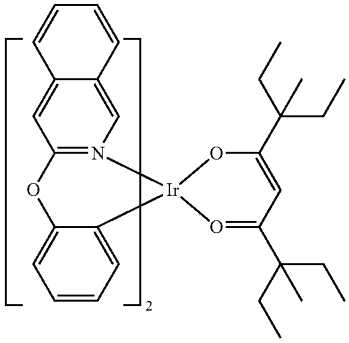
41
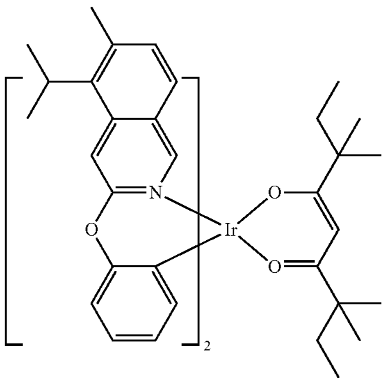
42
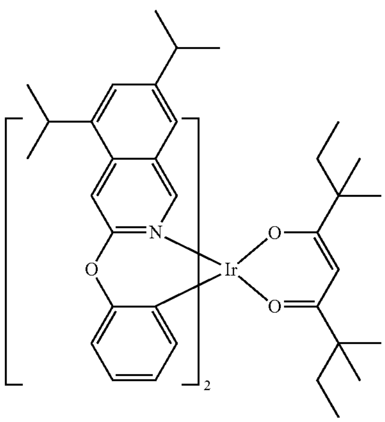
43
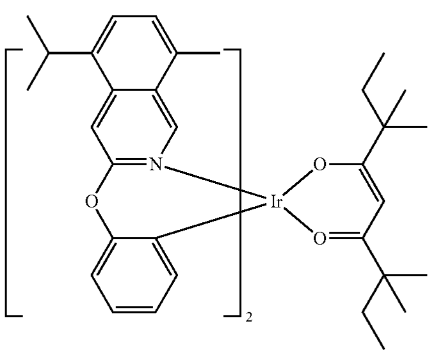
-continued
44
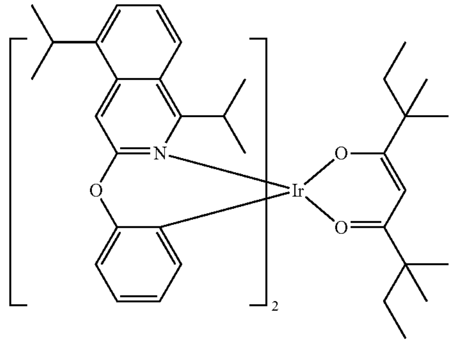
45
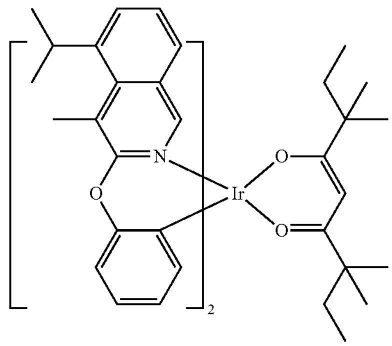
46
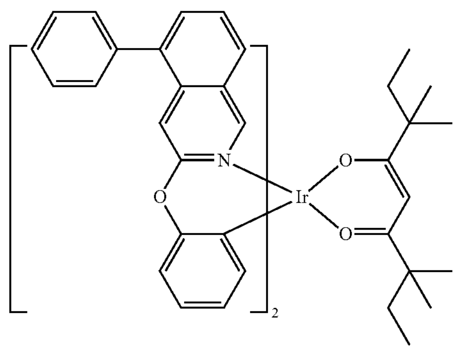
47
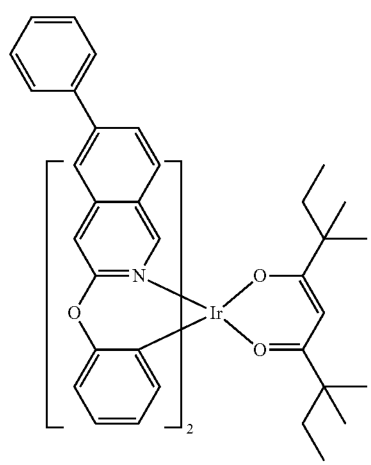

-continued
48
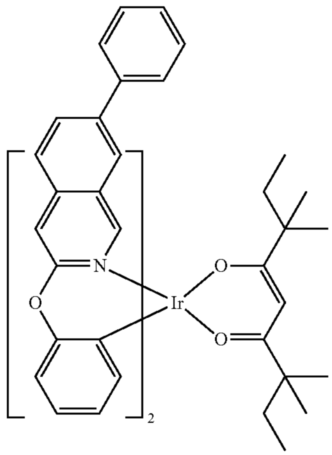
49
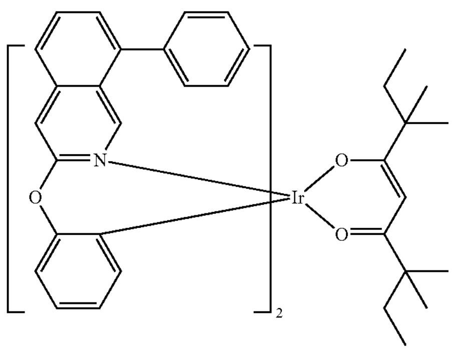
50
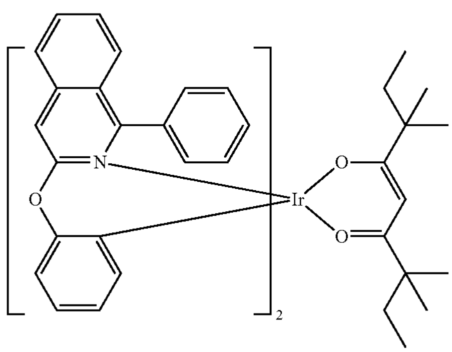
56
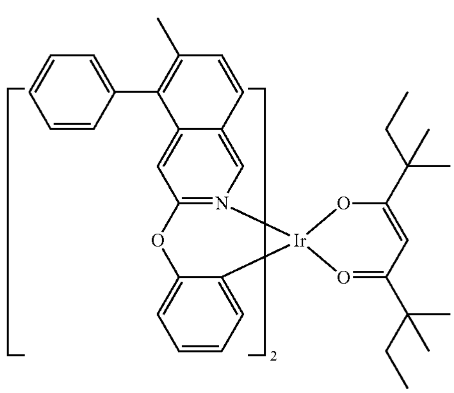
-continued
57
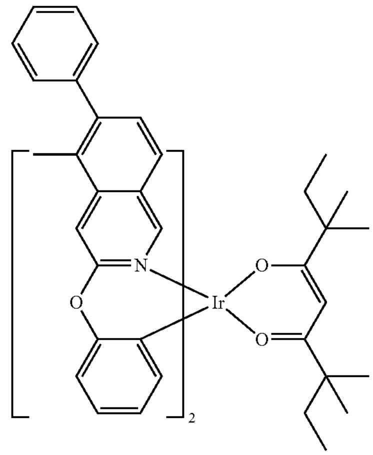
58
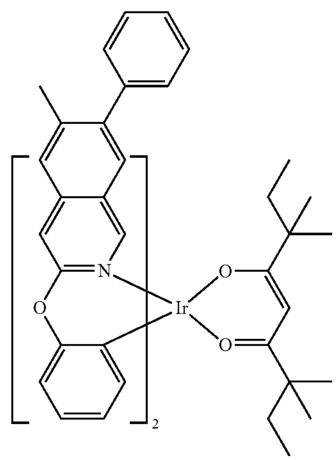
59
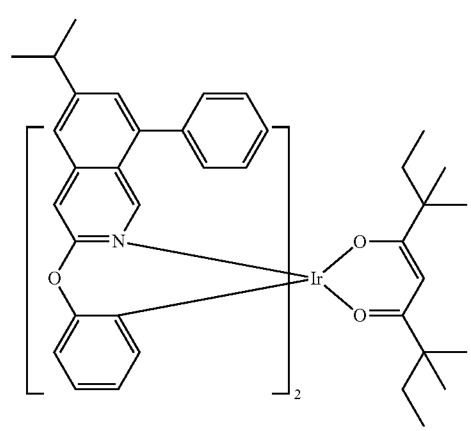

-continued
60
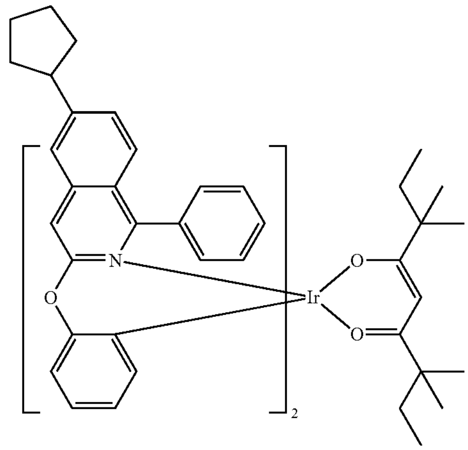
66
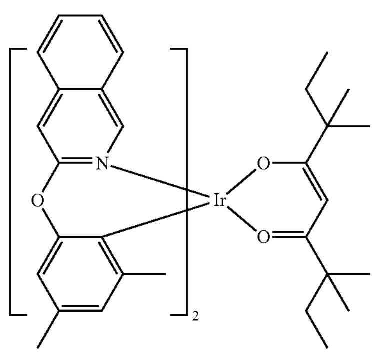
67
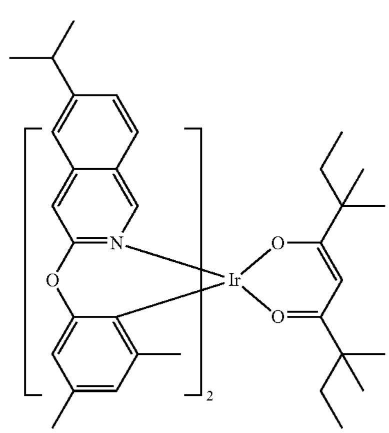
-continued
68
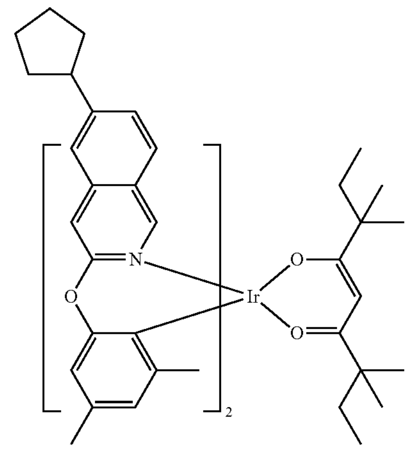
69
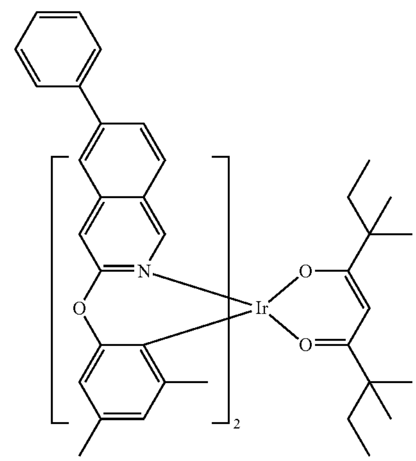
70
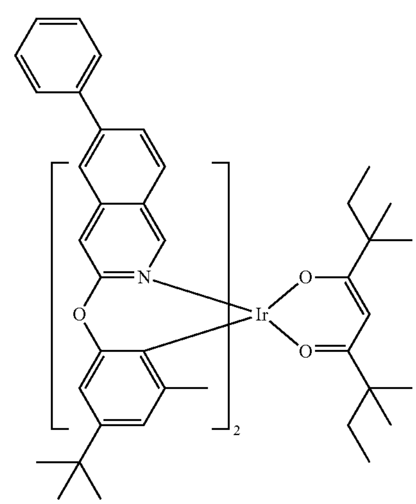

71
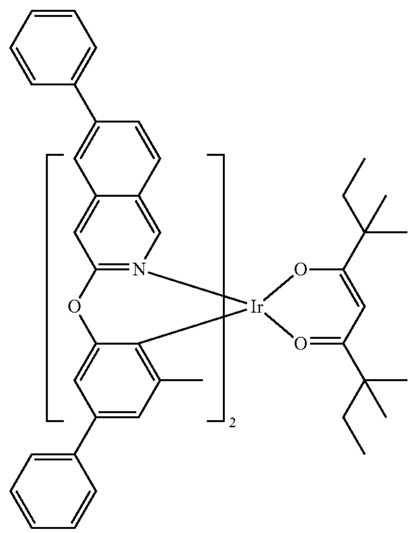
72
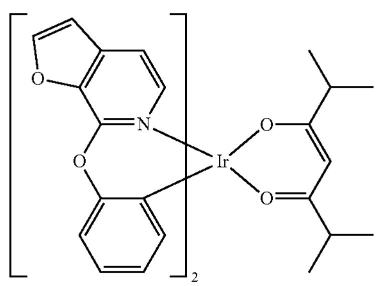
73
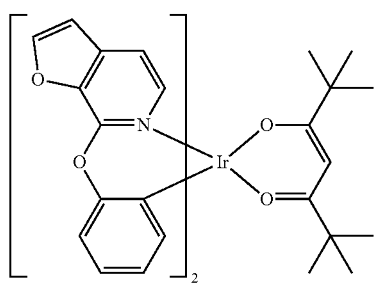
74
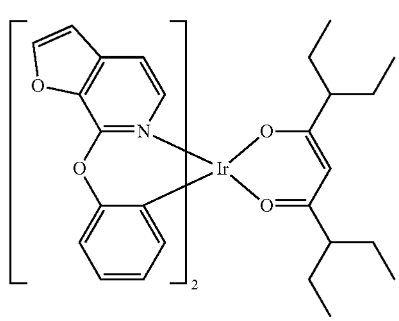
76
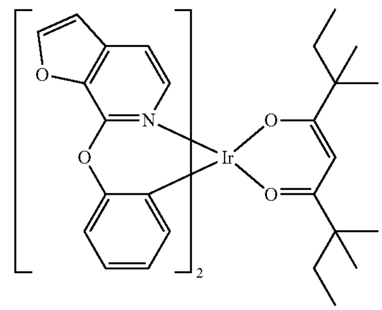
76
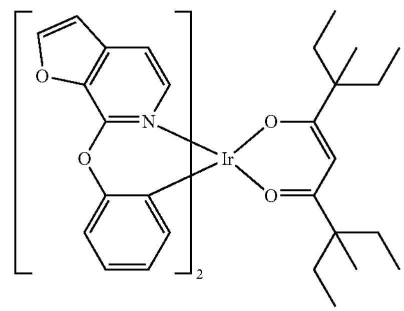
77
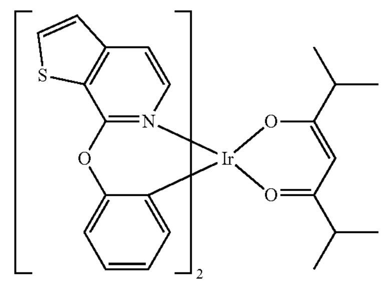
78
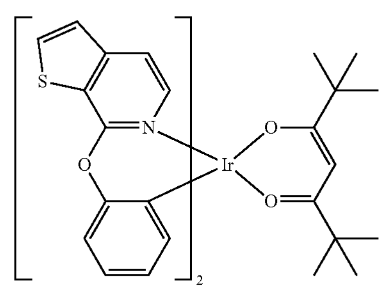
79
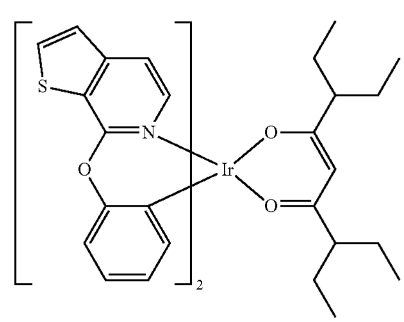

-continued
80
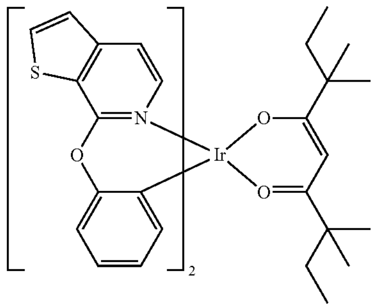
81
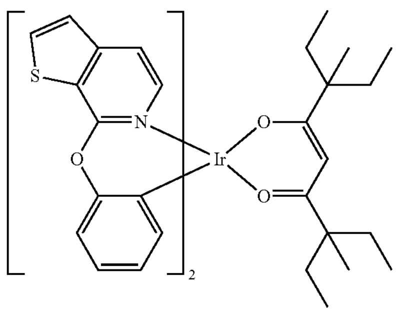
82
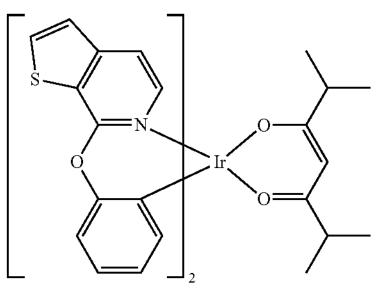
83
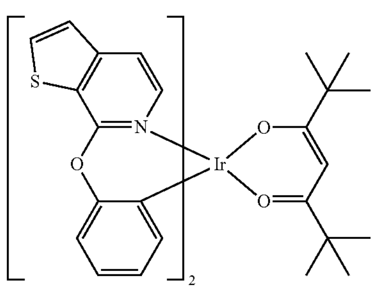
84
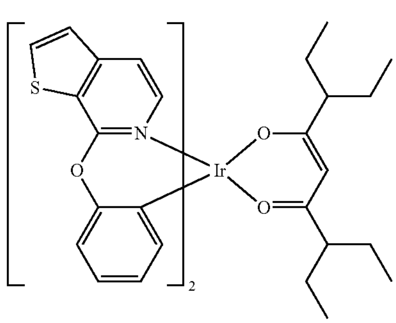
-continued
85
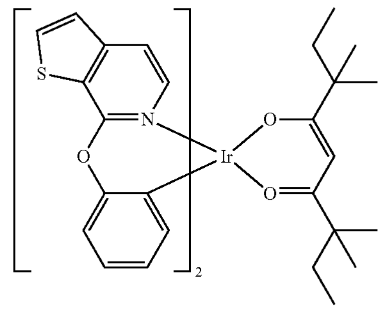
86
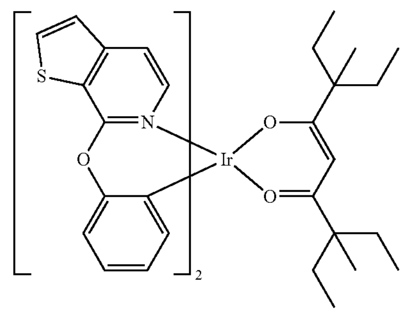
87
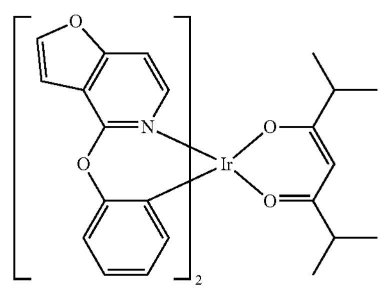
88
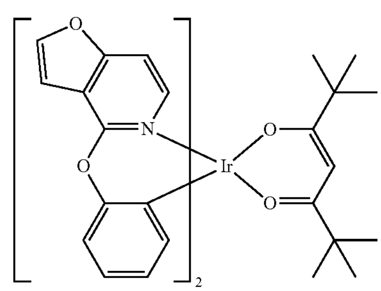
89
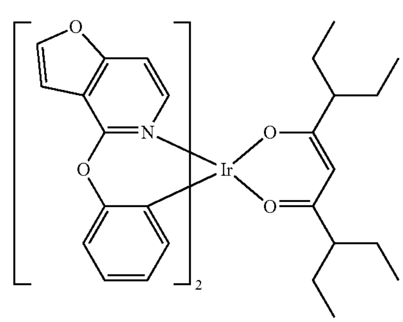

-continued
90
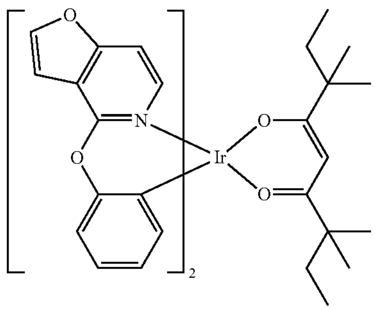
91
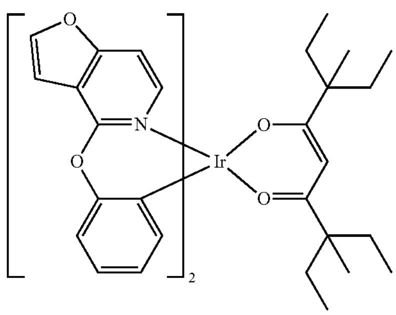
92
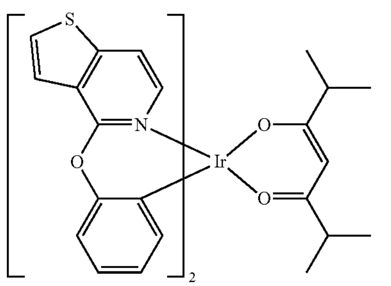
93
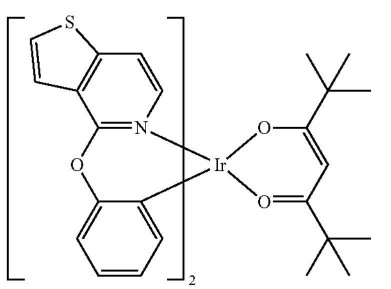
94
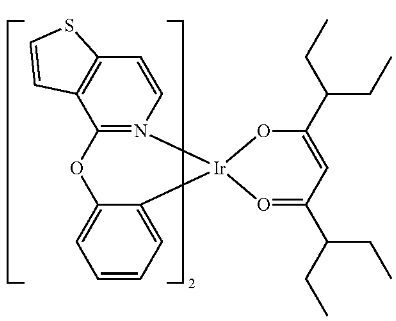
-continued
95
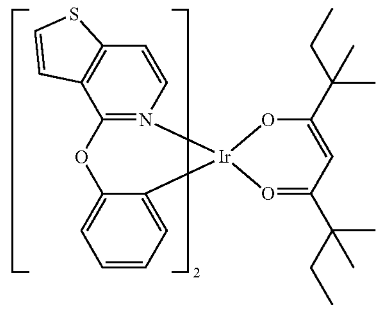
96
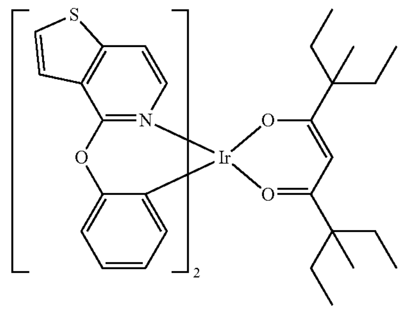
97
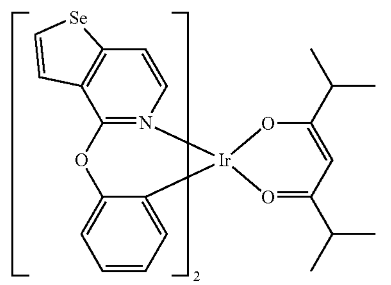
98
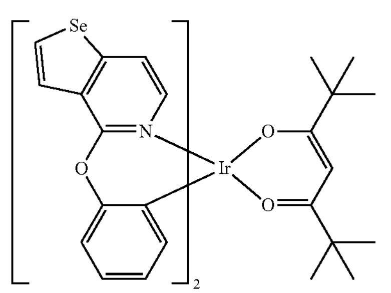
99
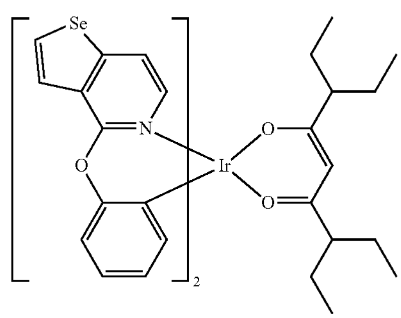

100
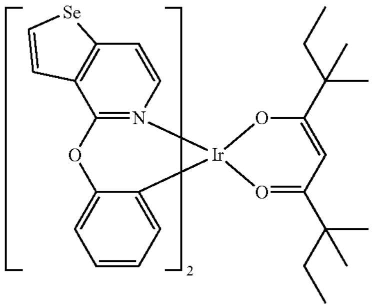
101
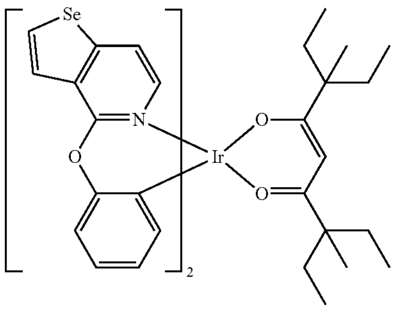
102
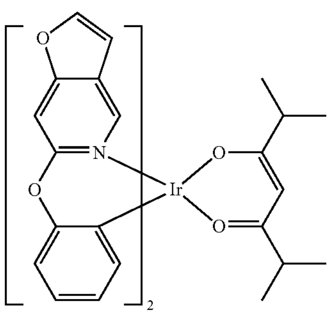
103
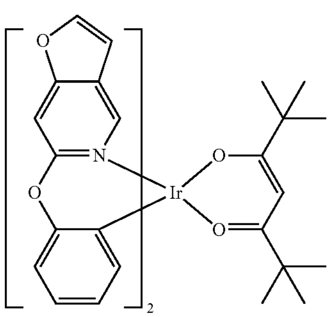
104
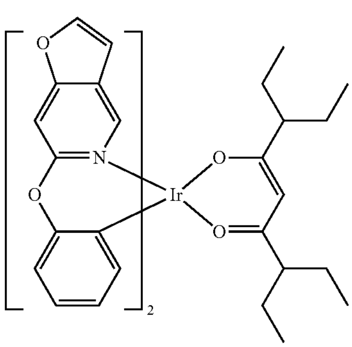
105
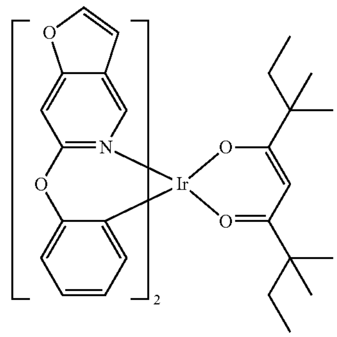
106
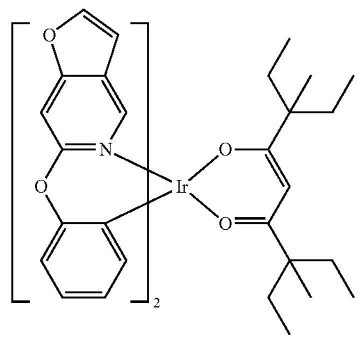
107
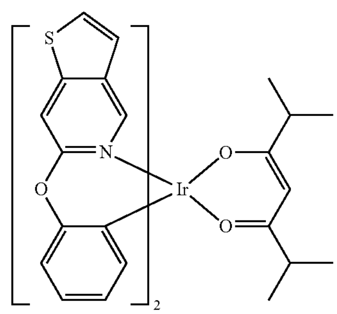
108
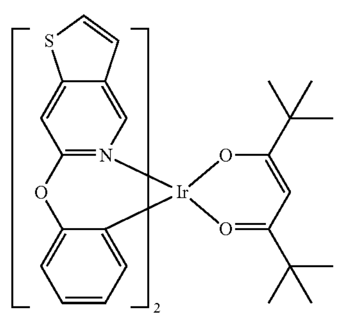
109
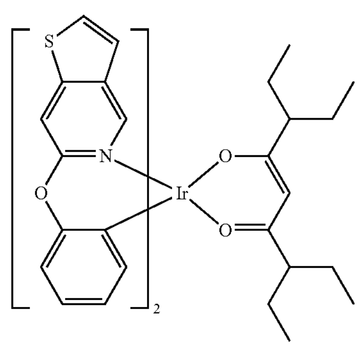

-continued
110
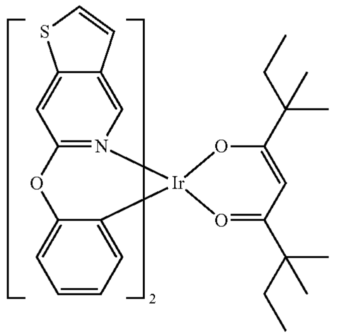
111
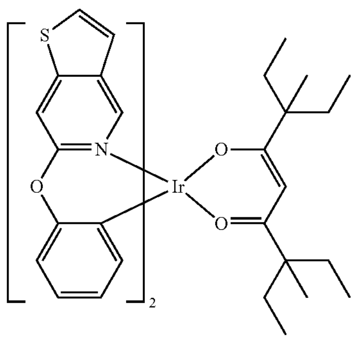
112
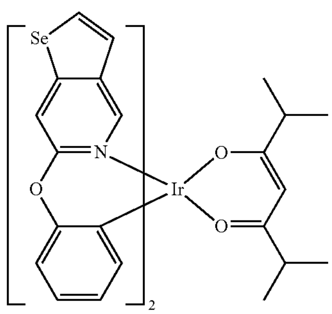
113
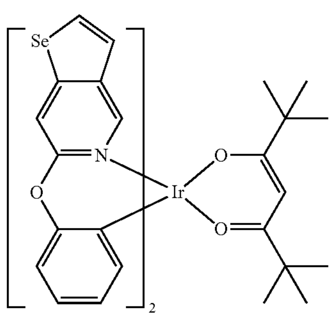
114
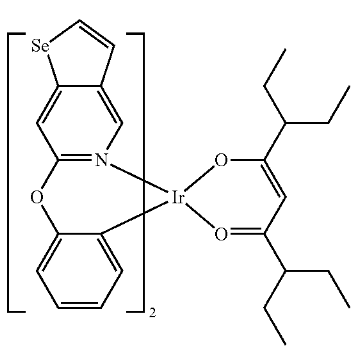
-continued
115
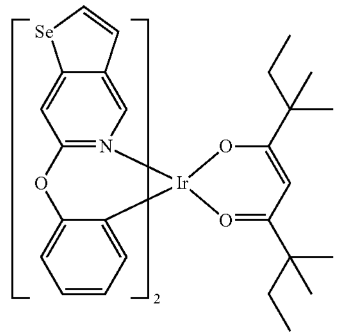
116
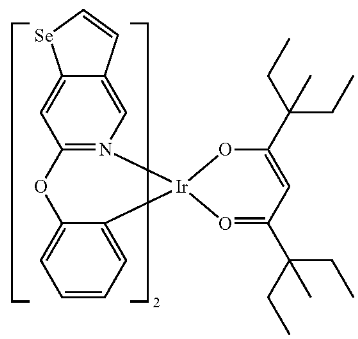
117
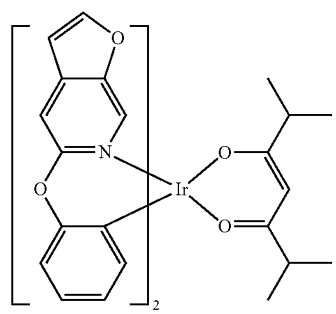
118
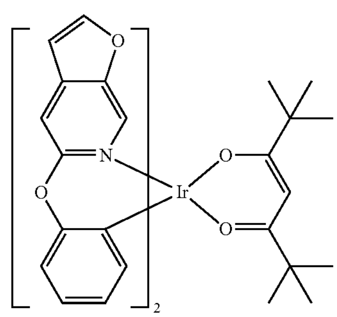
119
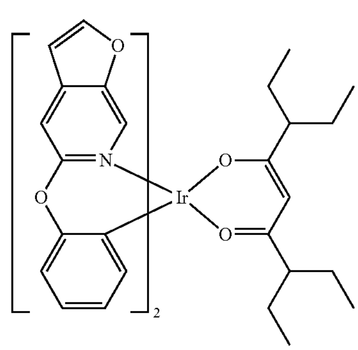

-continued
120
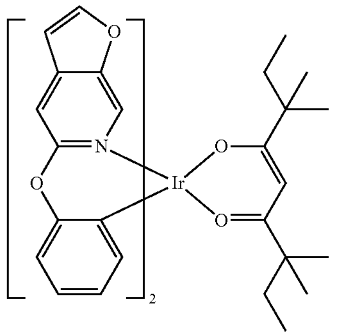
121
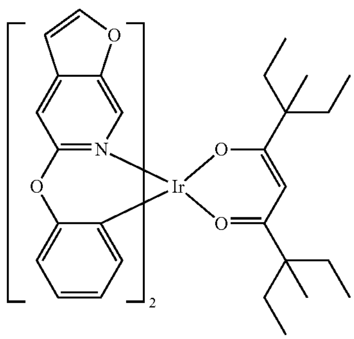
122
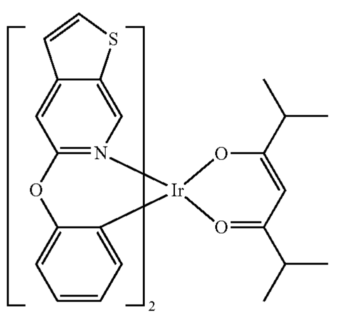
123
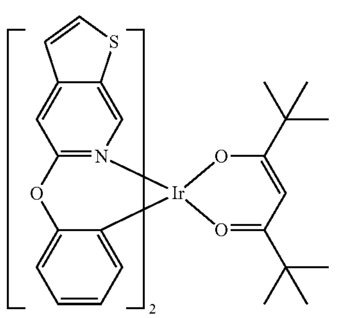
124
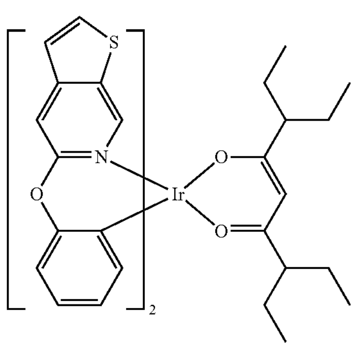
-continued
125
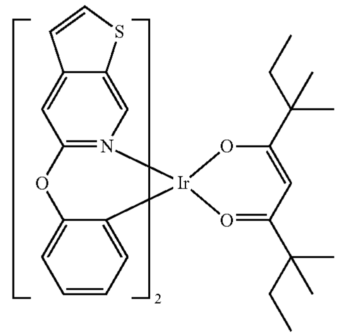
126
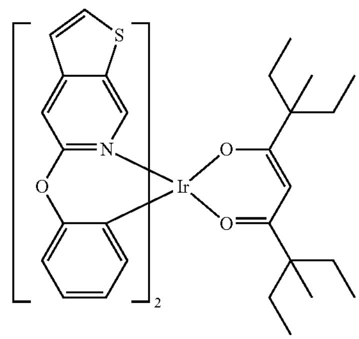
127
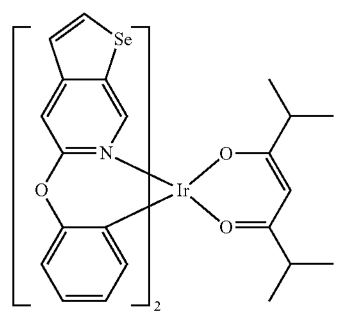
128
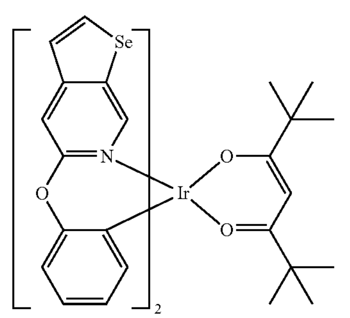
129
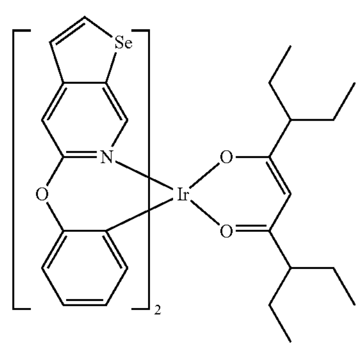

-continued
130
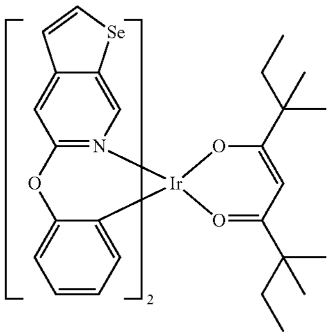
131
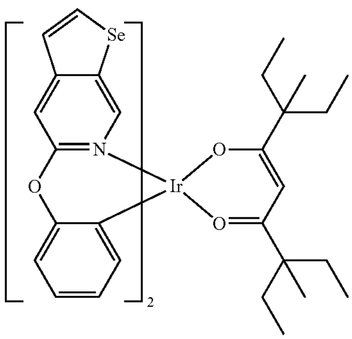
132
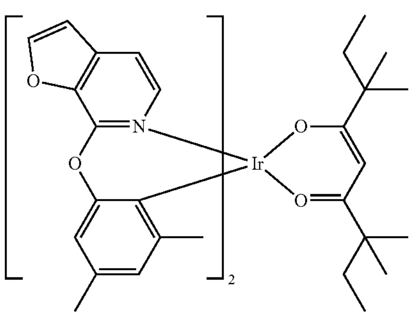
133
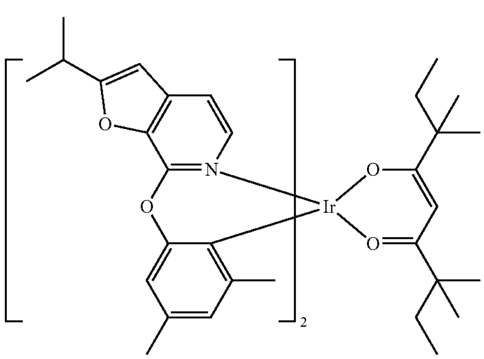
-continued
134
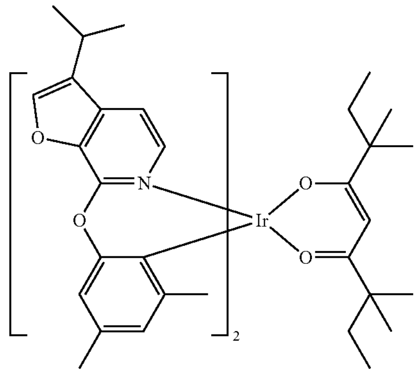
135
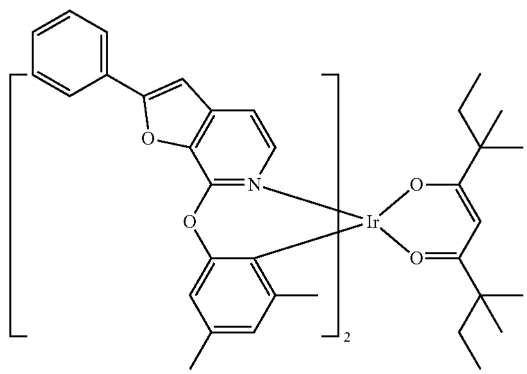
136
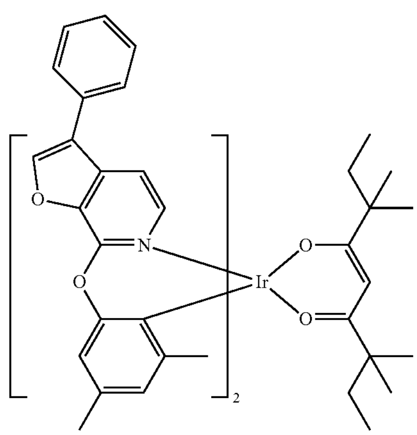
137
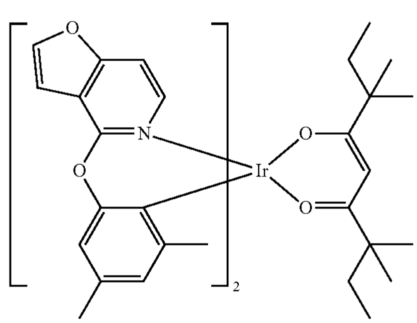

138
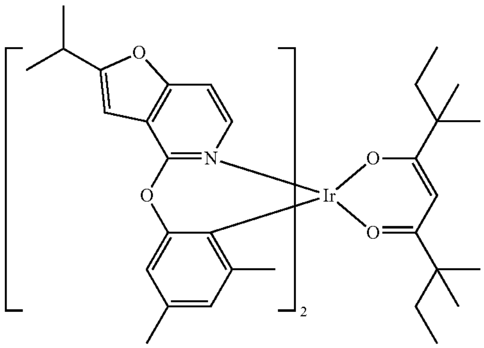
139
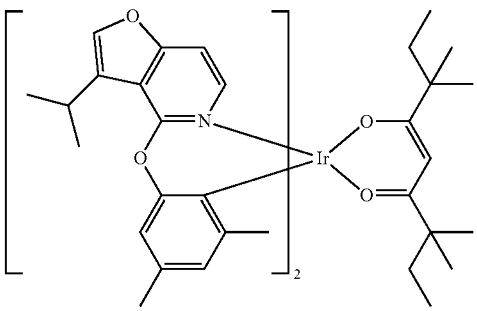
140
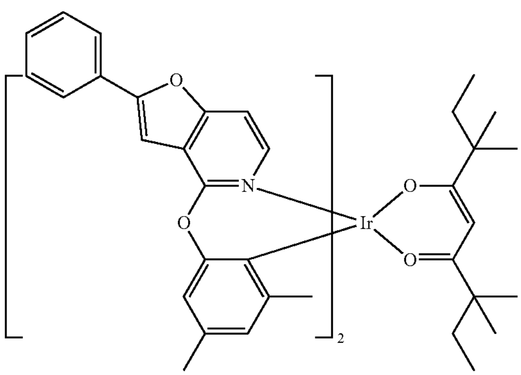
141
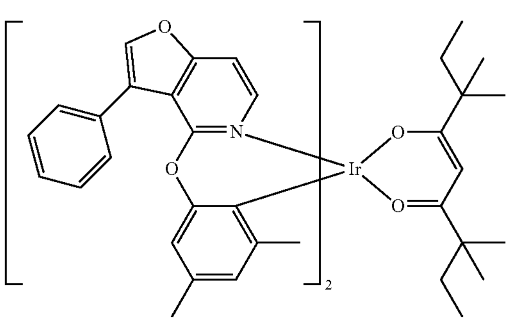
142
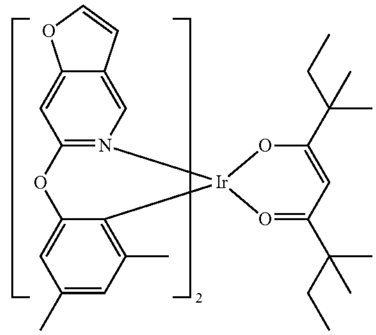
143
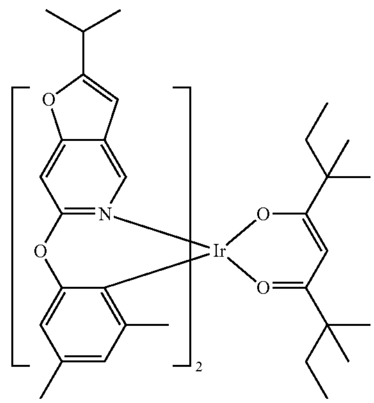
144
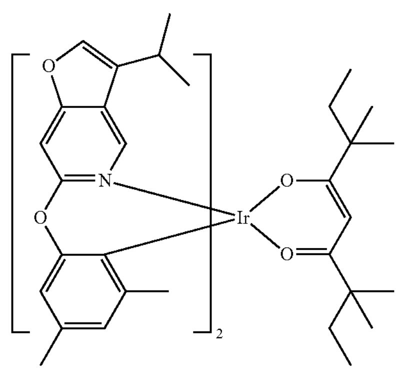
145
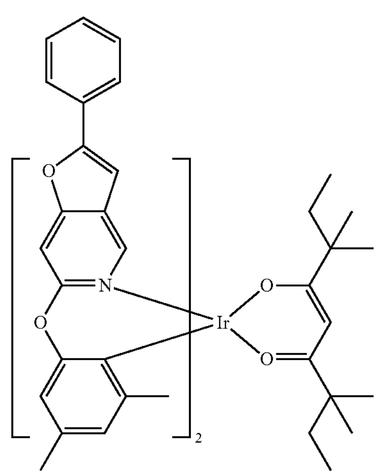

146
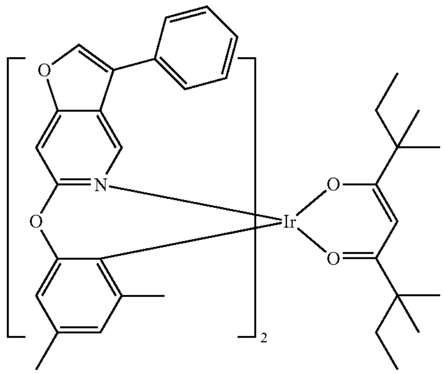
147
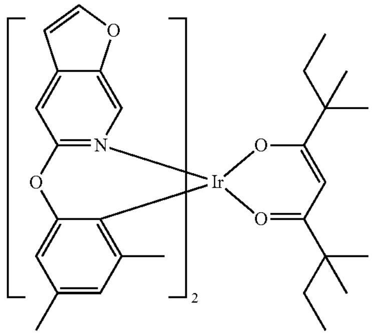
148
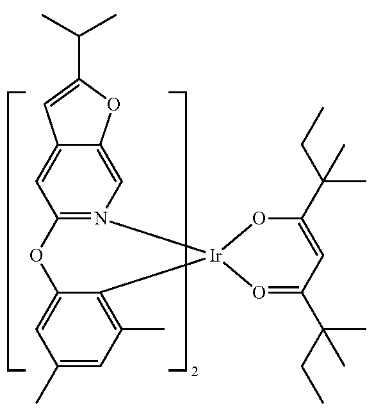
149
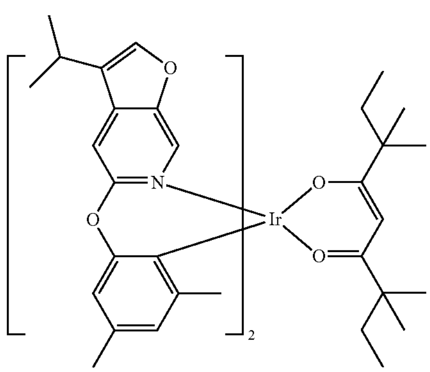
150
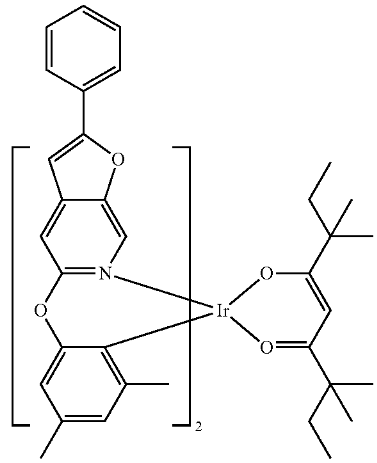
151
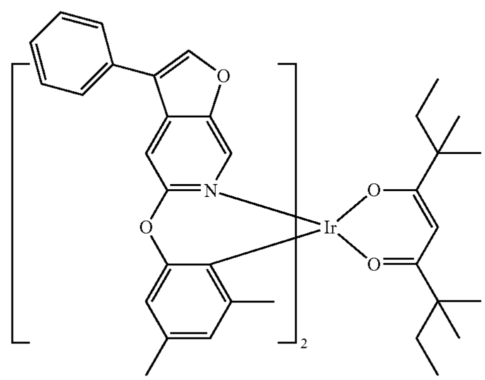
152
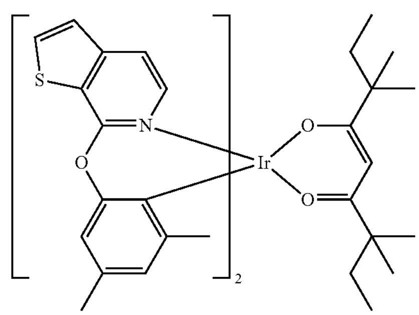
153
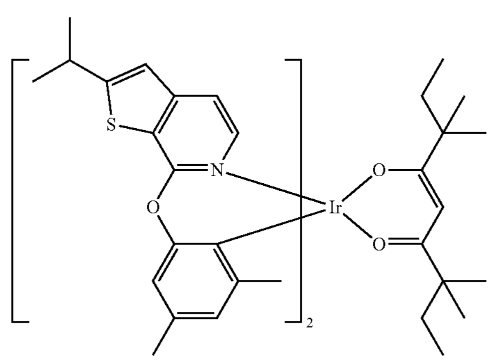

-continued
154
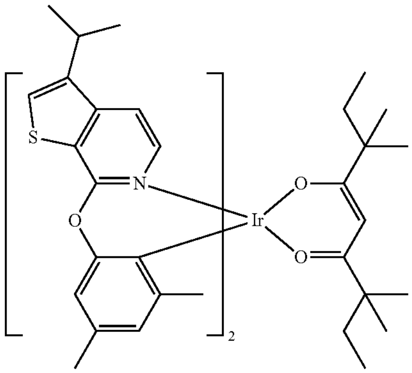
155
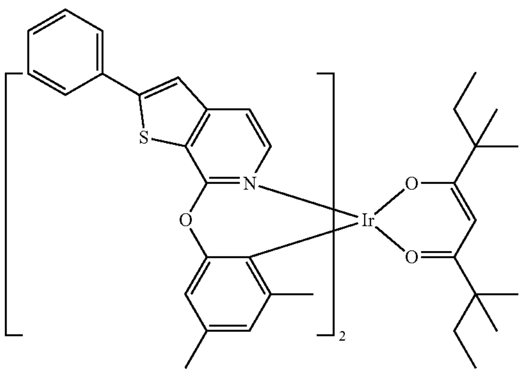
156
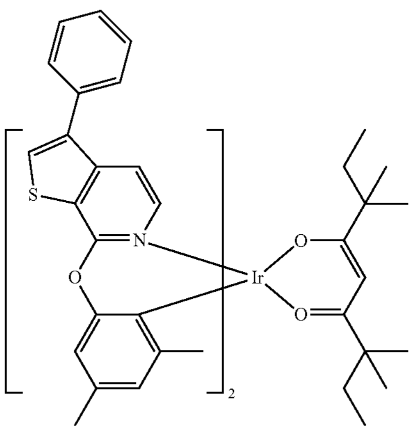
157
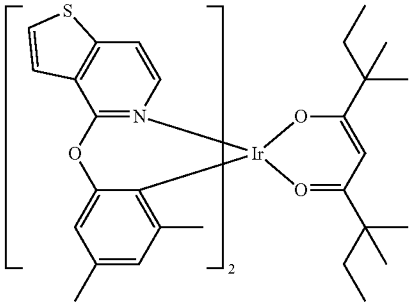
-continued
158
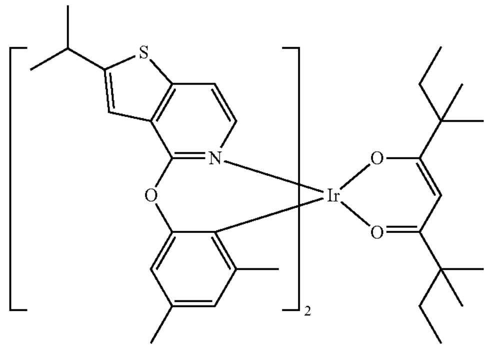
159
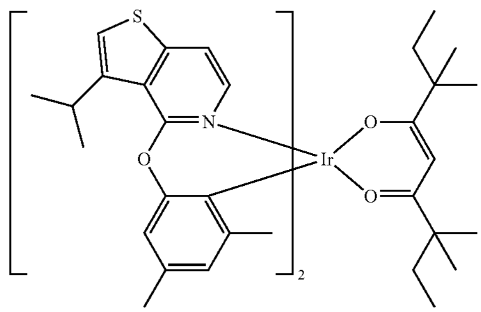
160
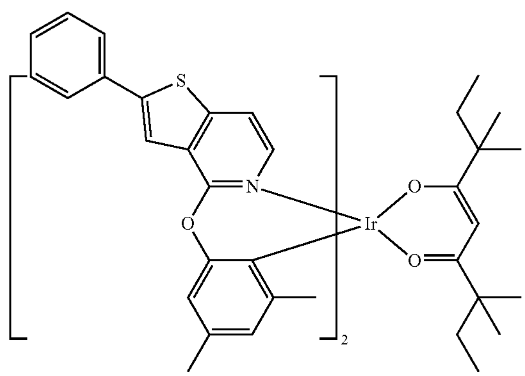
161
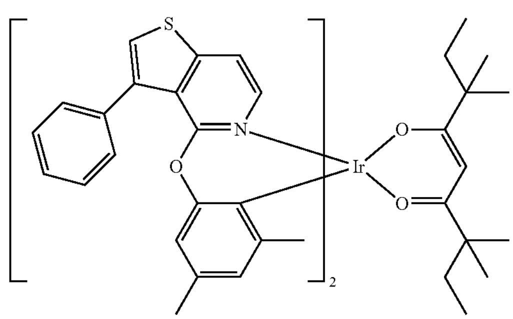

-continued
162
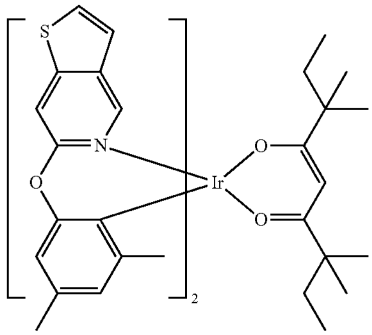
163
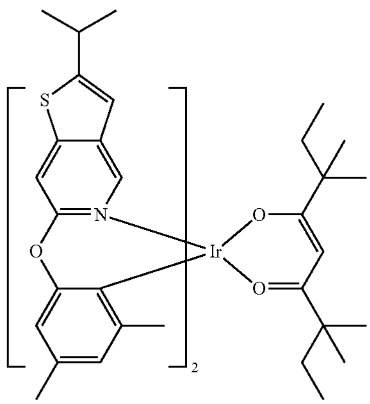
164
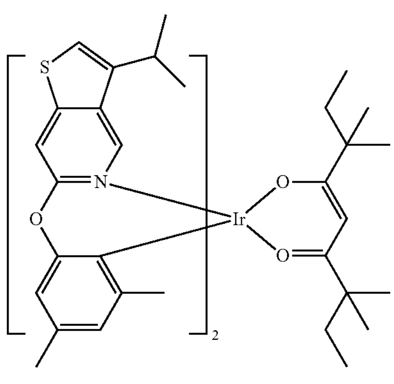
165
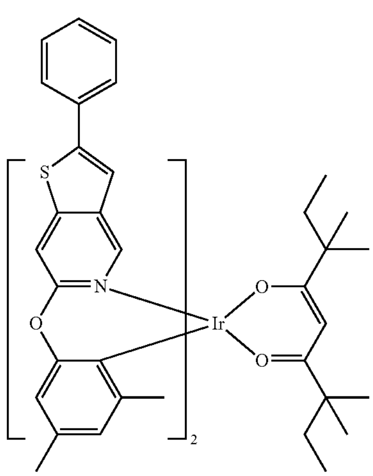
-continued
166
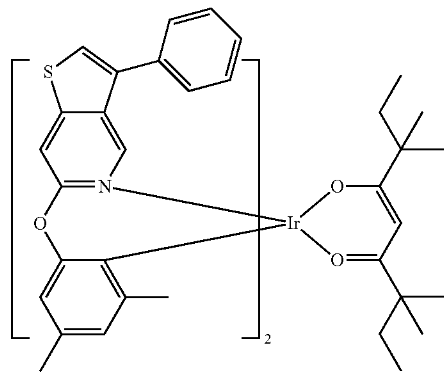
167
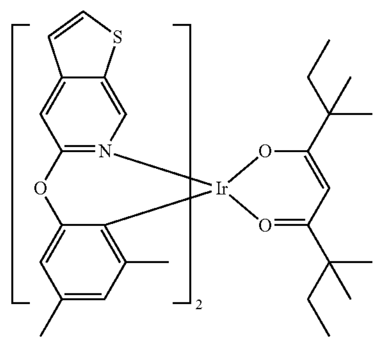
168
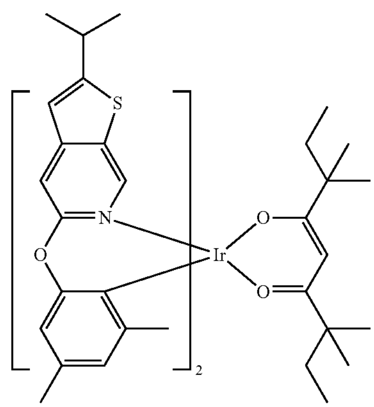
169
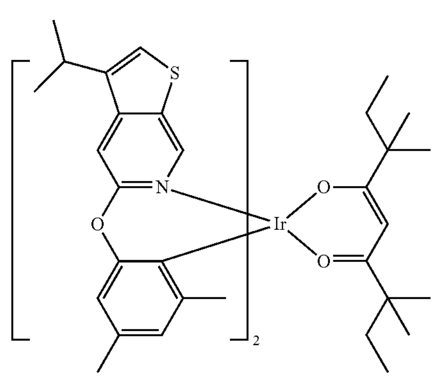

170
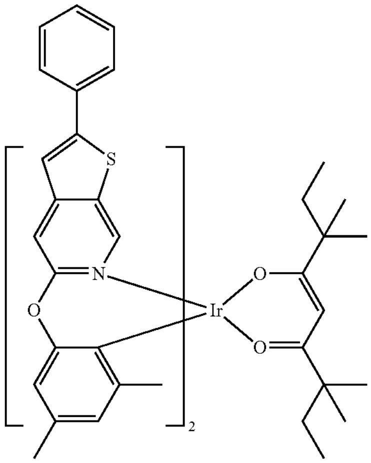
171
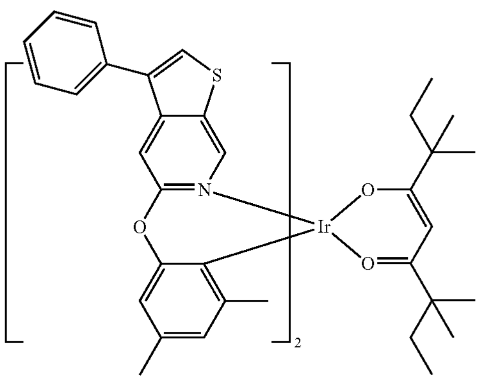
172
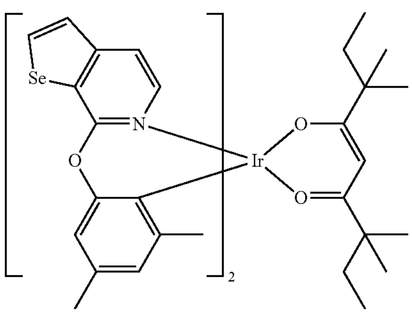
173
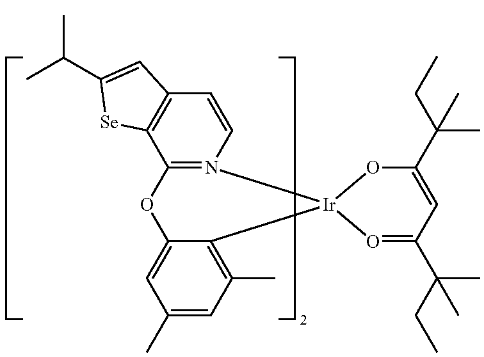
174
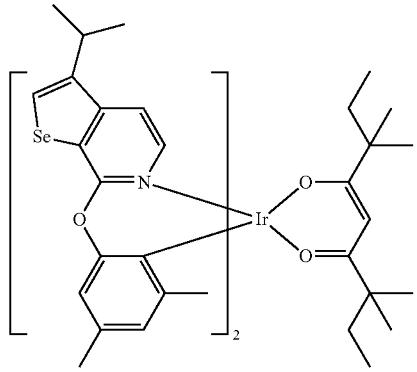
175
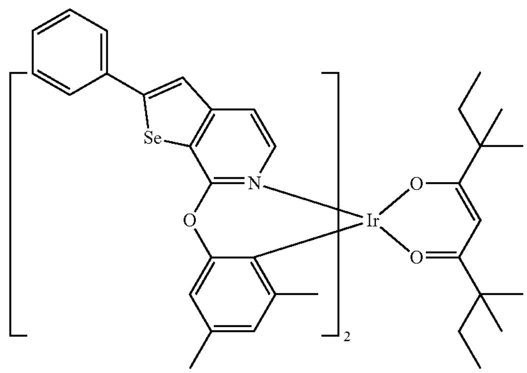
176
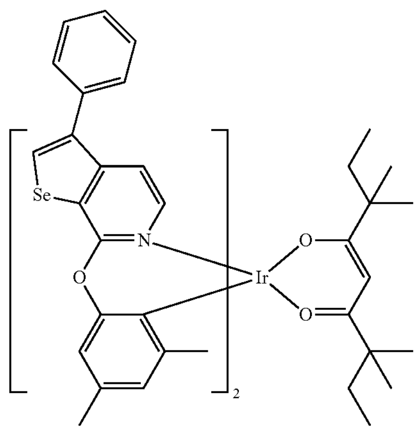
177
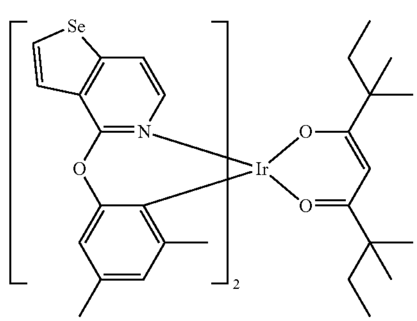

178
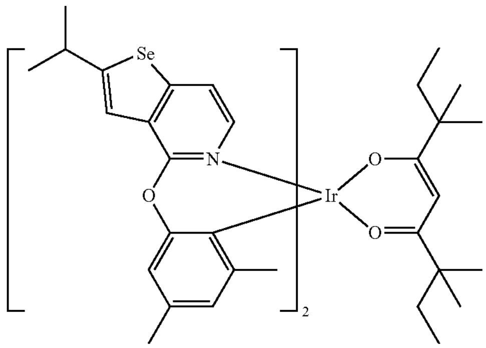
179
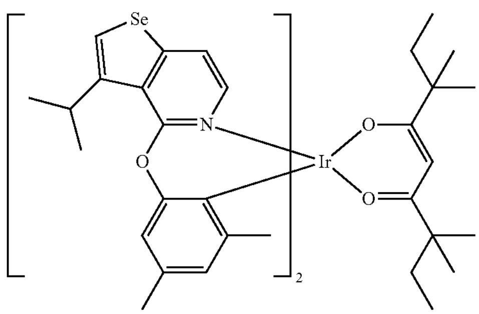
180
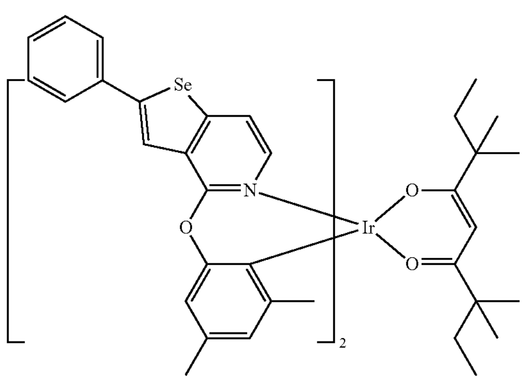
181
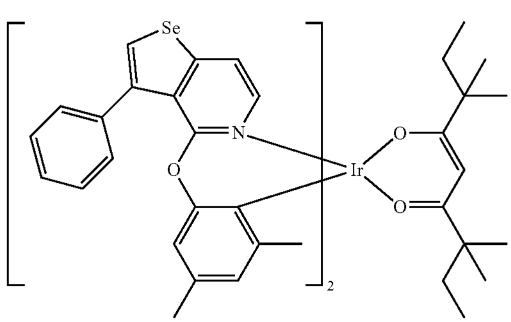
182
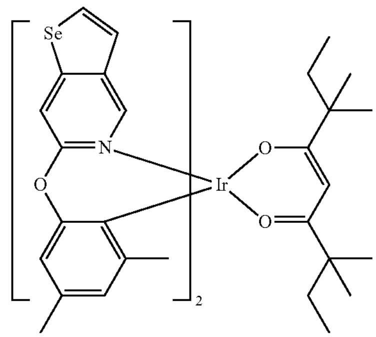
183
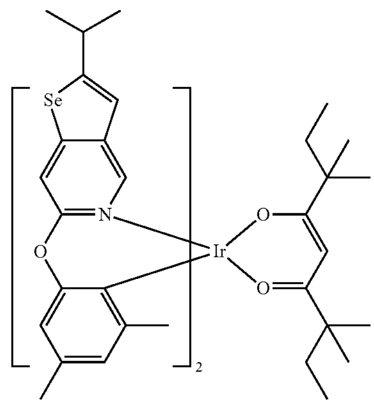
184
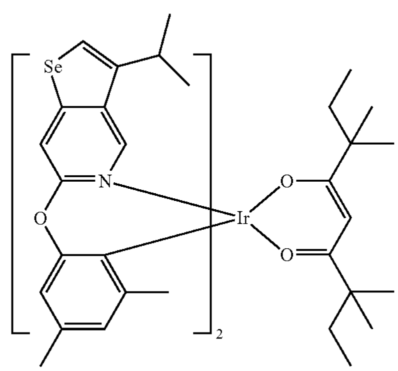
185
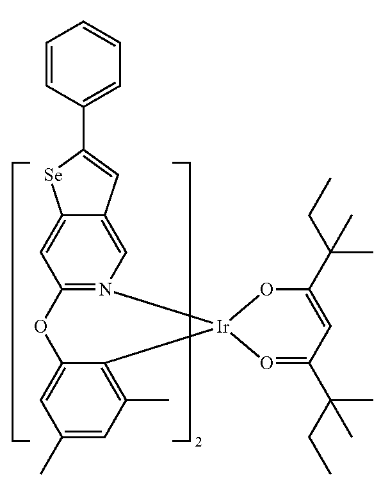

-continued
186
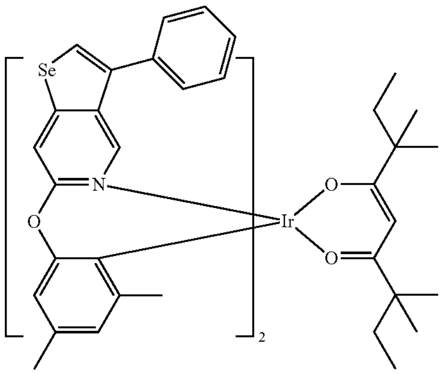
187
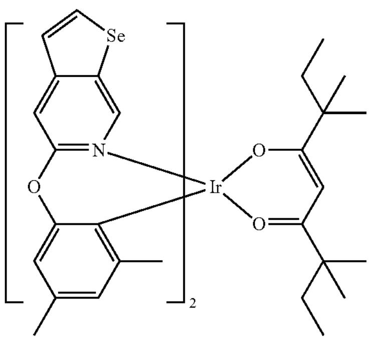
188
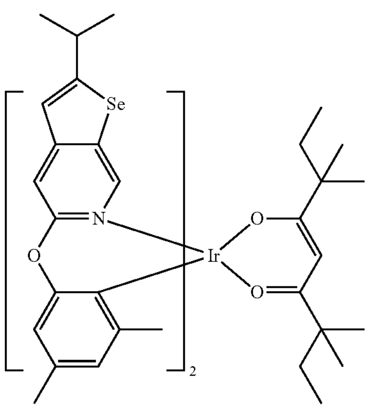
189
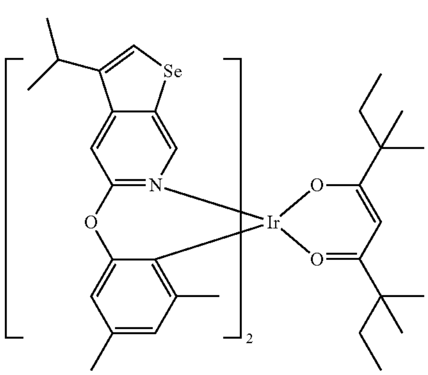
-continued
190
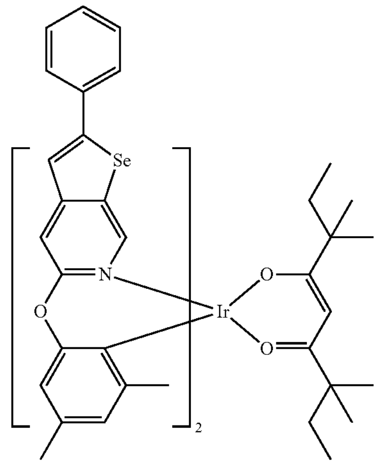
191
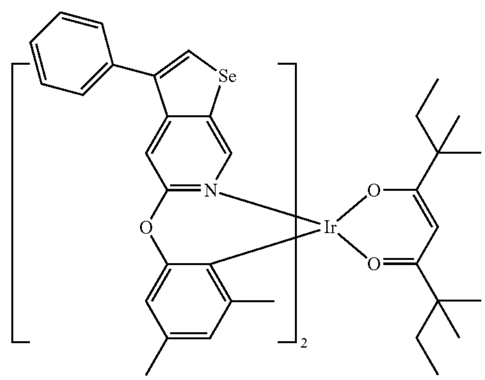
192
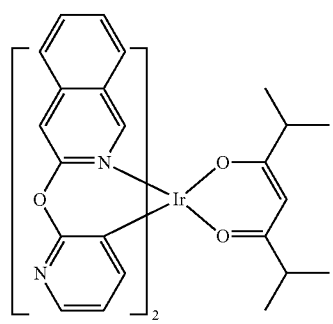
193
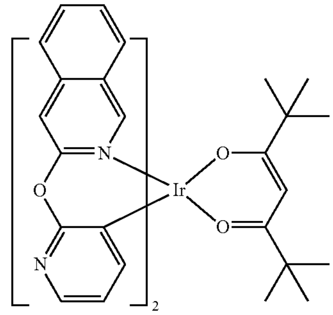

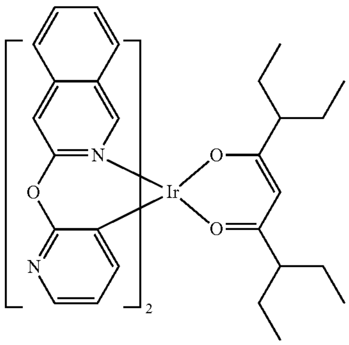
194
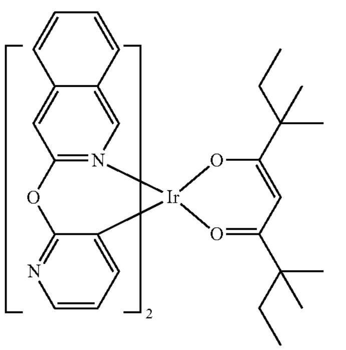
195
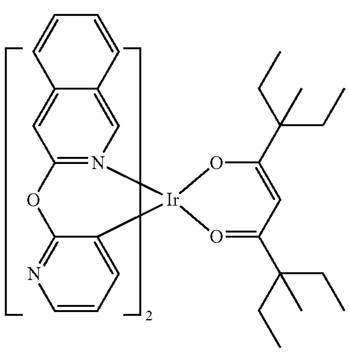
196
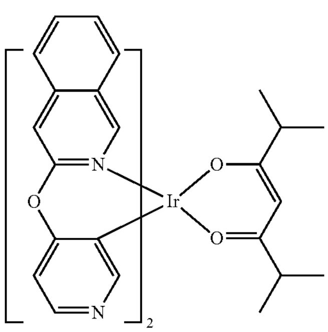
202
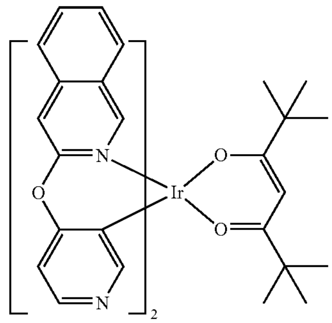
203
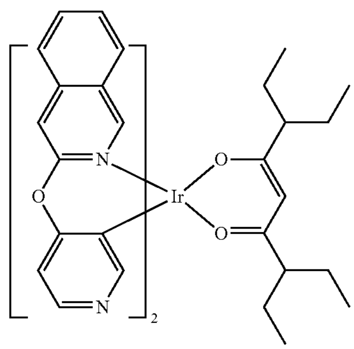
204
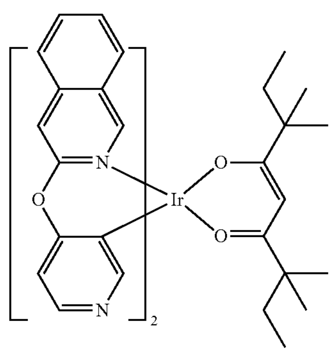
205
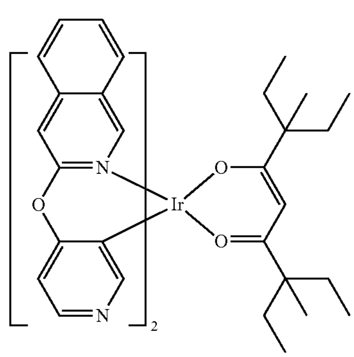
206

-continued
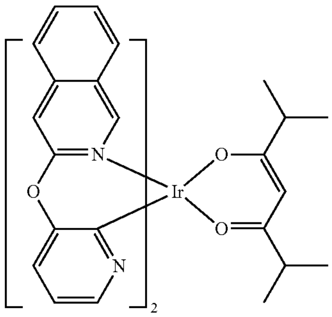
207
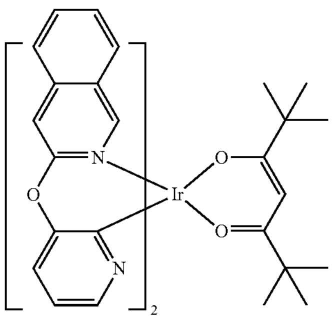
208
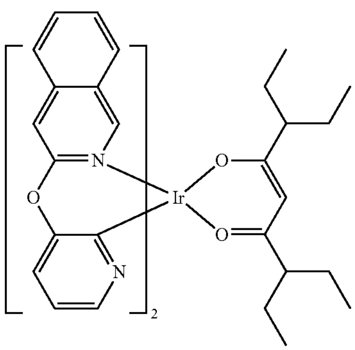
209
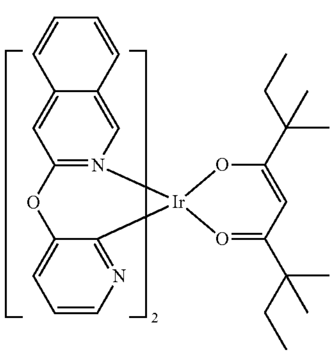
210
-continued
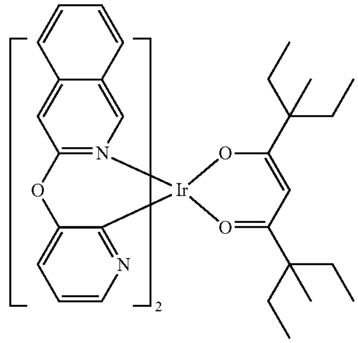
211
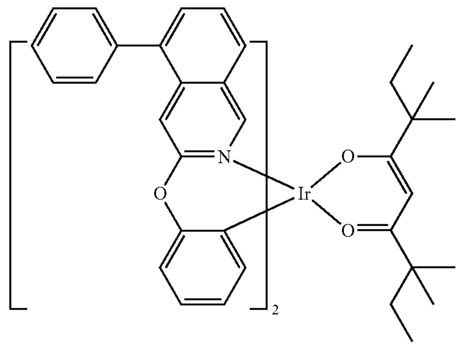
212
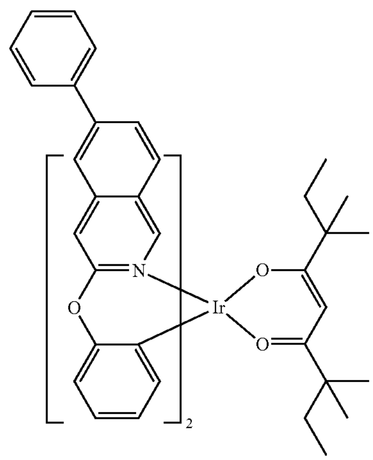
213
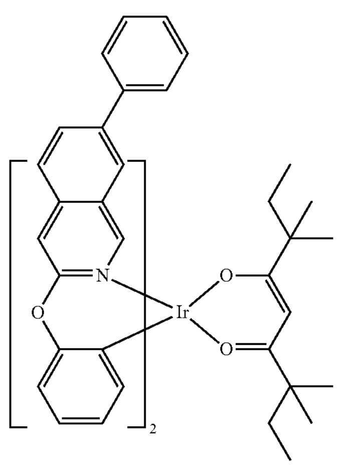
214

-continued
215
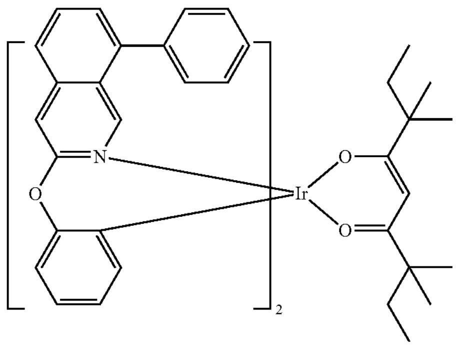
216
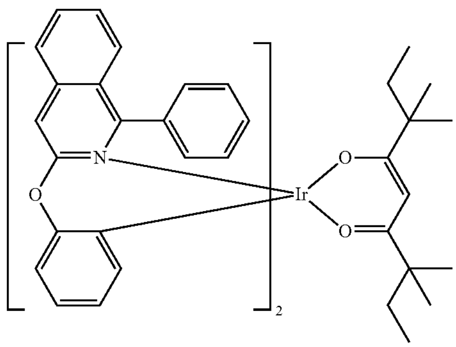
222
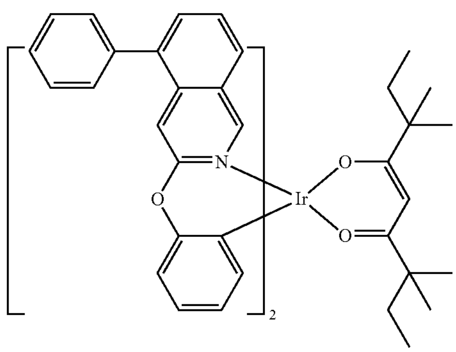
223
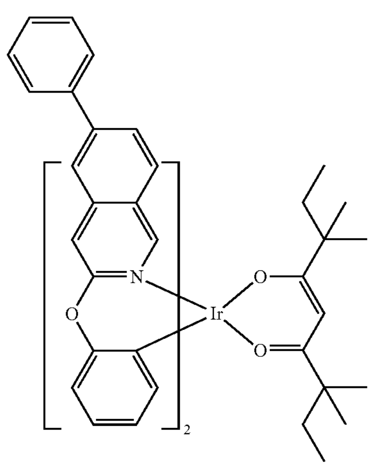
-continued
224
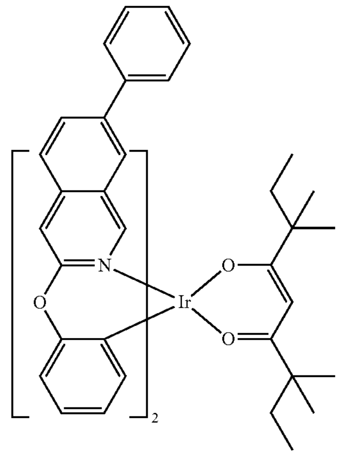
225
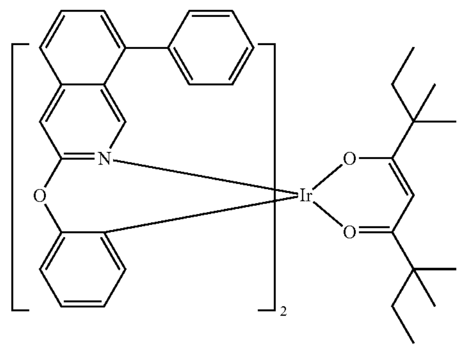
226
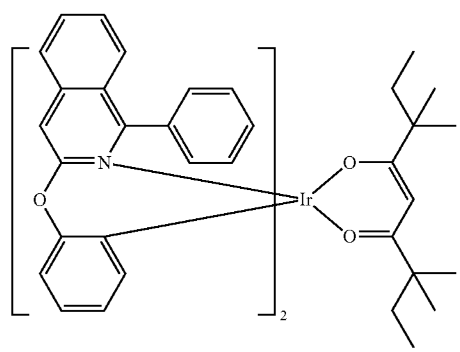
232
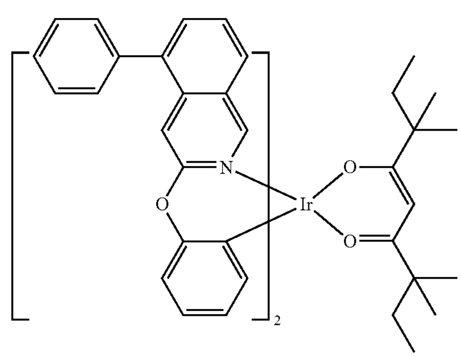

-continued
233
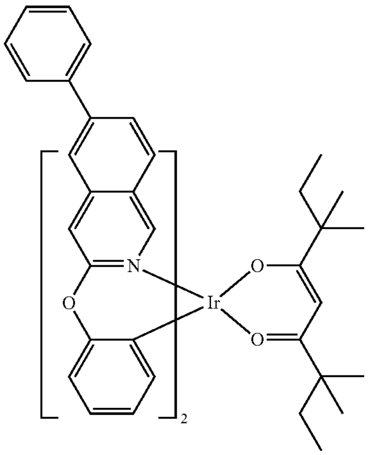
234
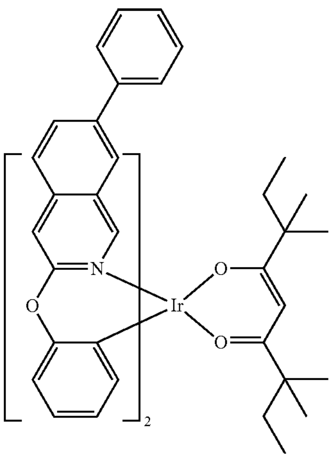
235
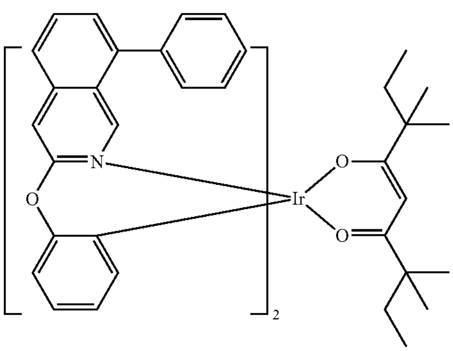
236
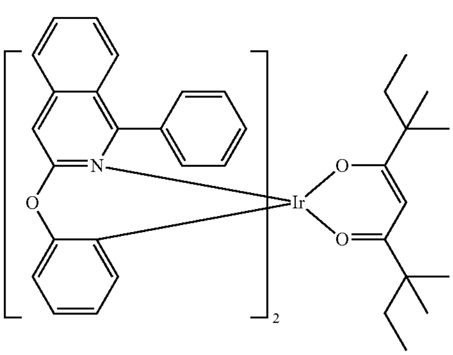
-continued
237
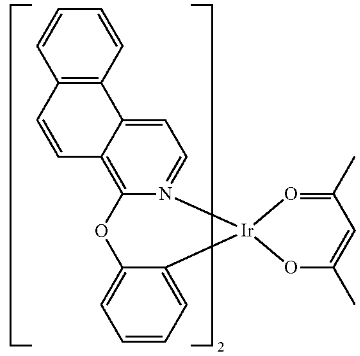
238
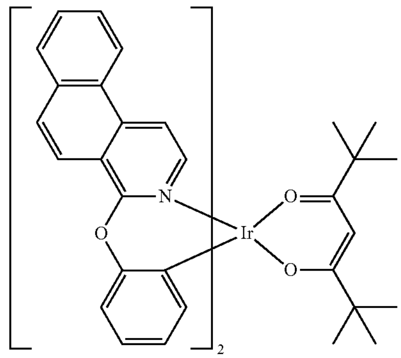
239
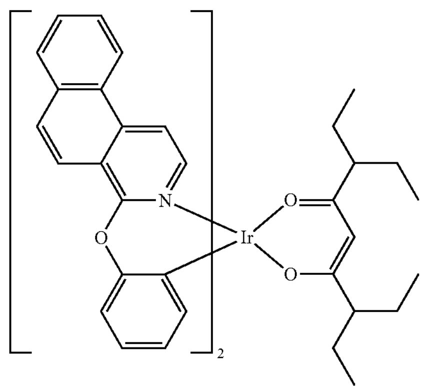
240
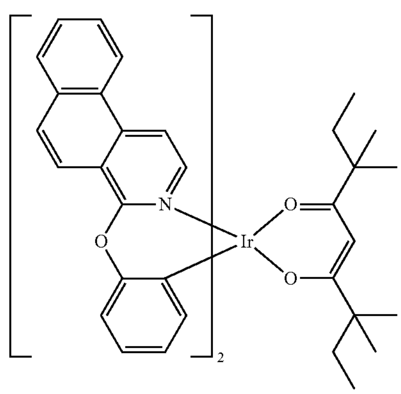

-continued
241
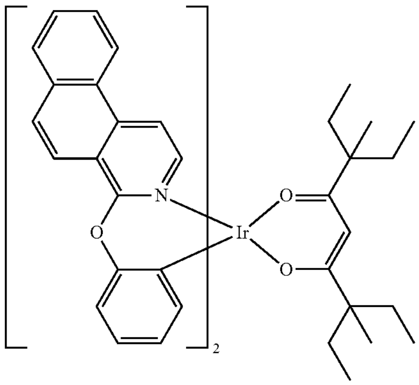
242
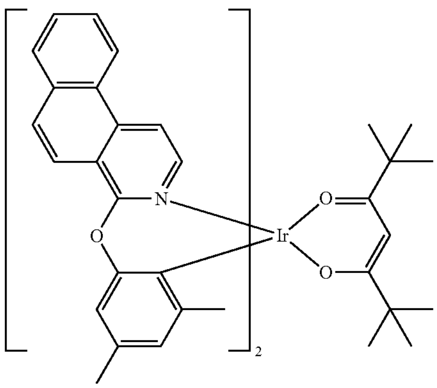
243
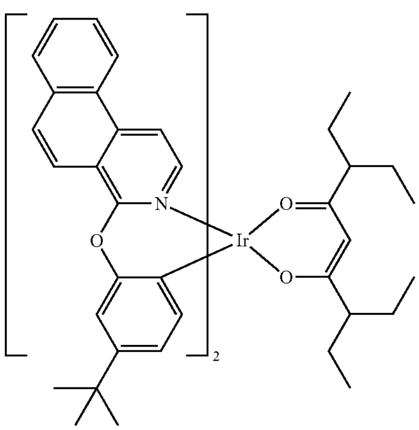
244
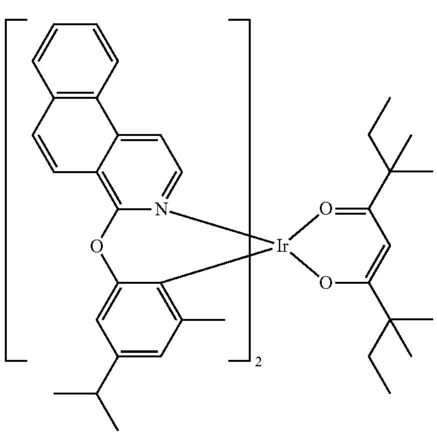
-continued
245
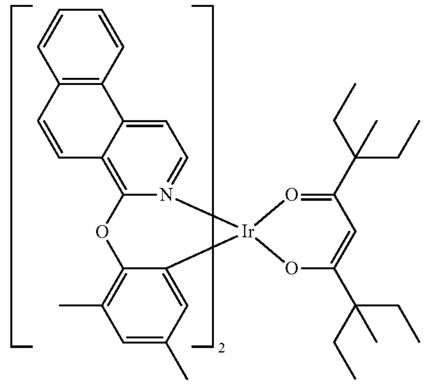
246
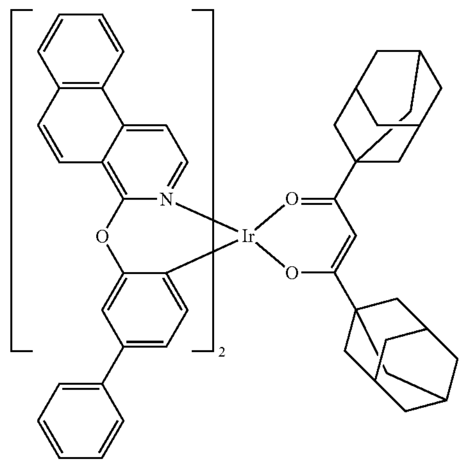
247
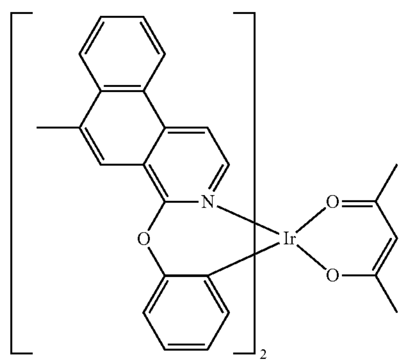
248
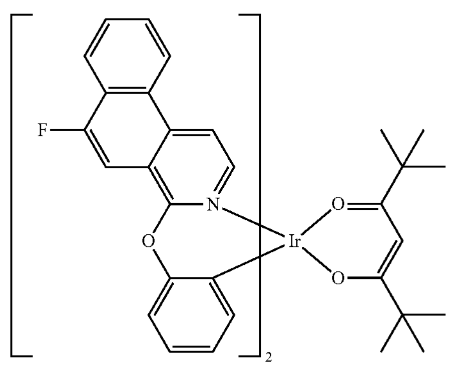

-continued
249
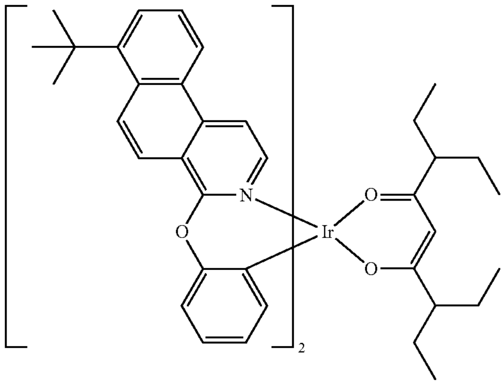
250
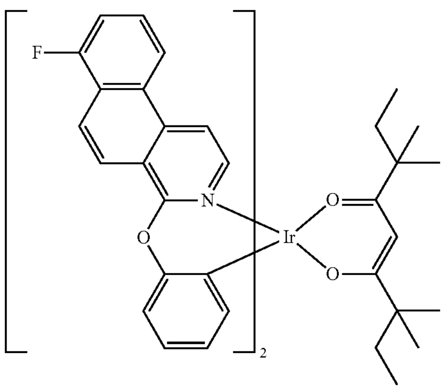
251
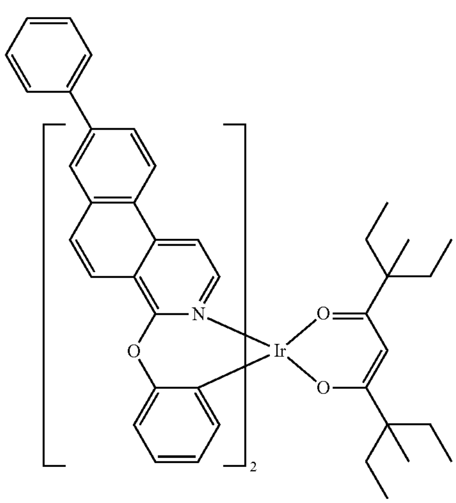
-continued
252
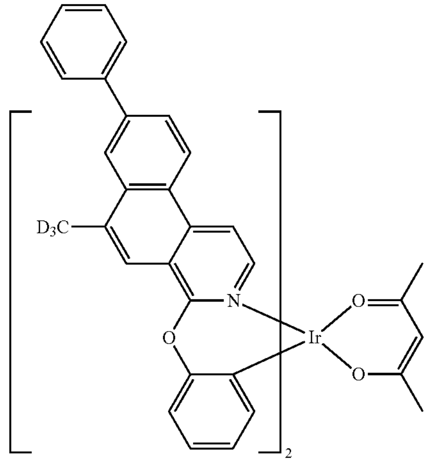
253
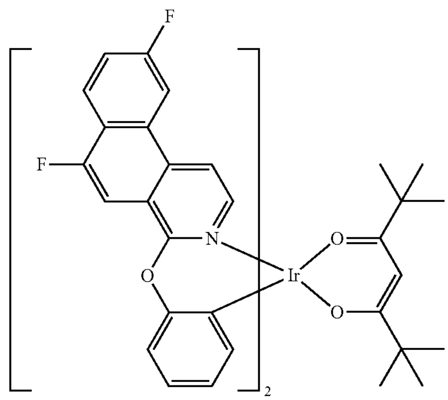
254
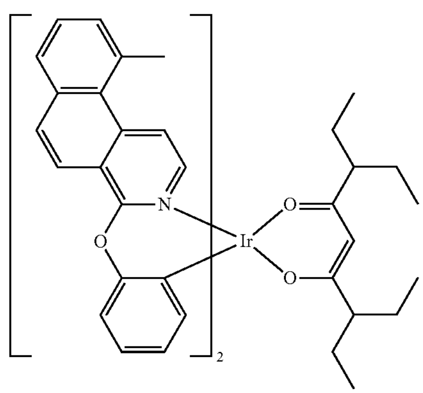

255
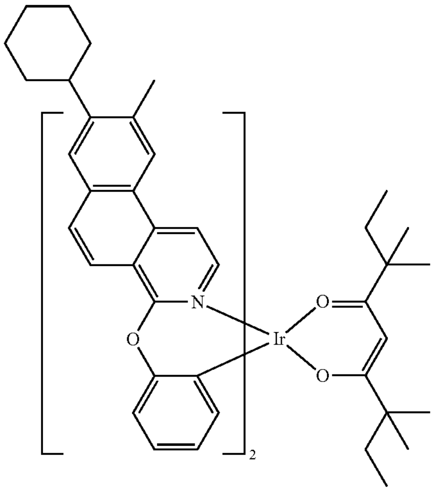
256
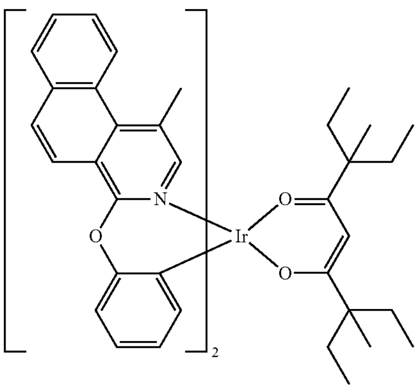
257
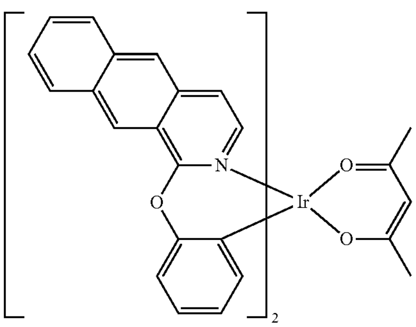
258
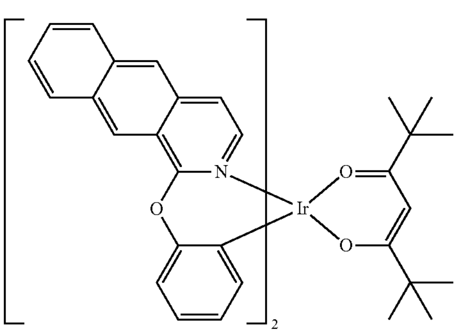
259
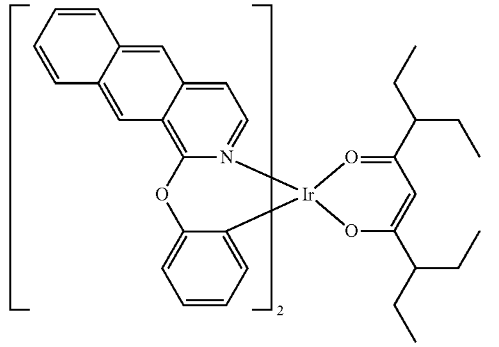
260
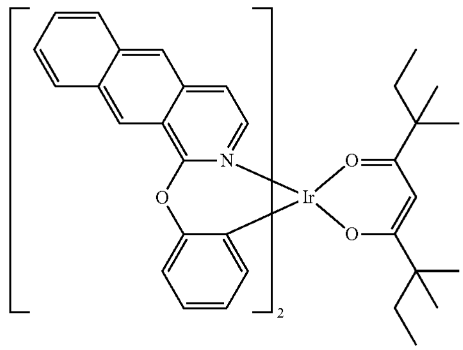
261
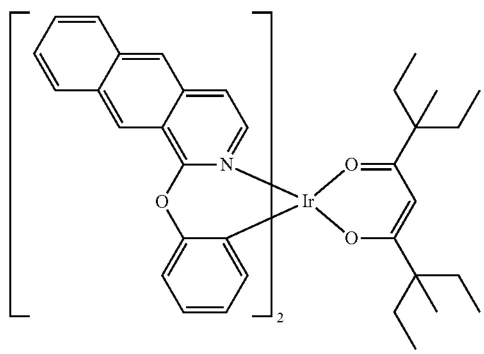
262
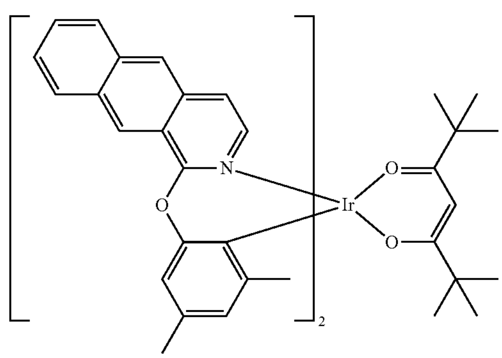

-continued
263
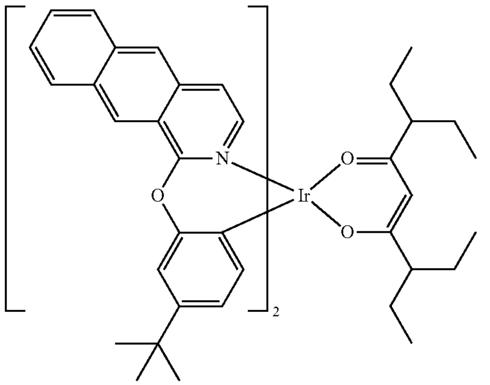
264
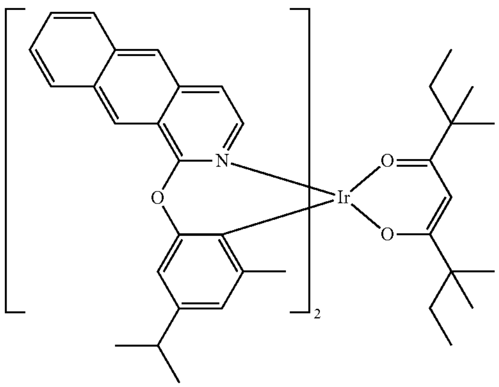
265
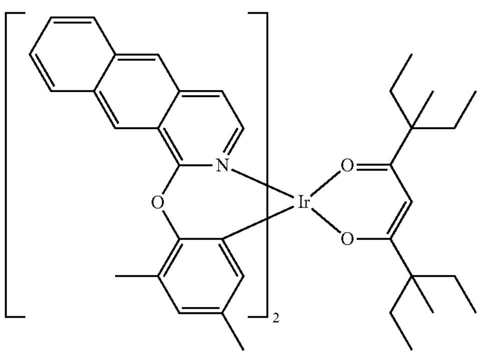
266
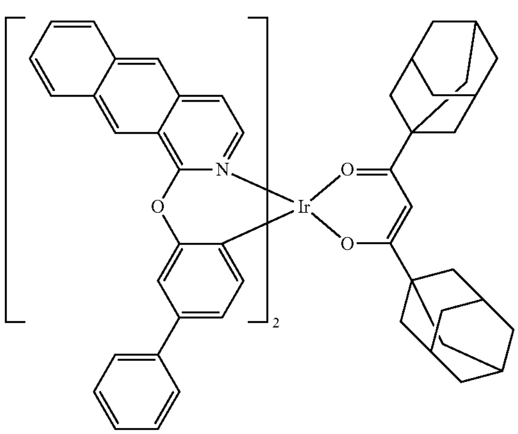
-continued
267
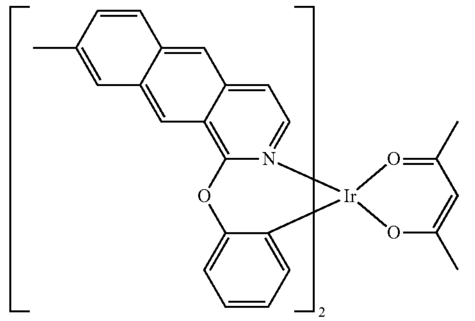
268
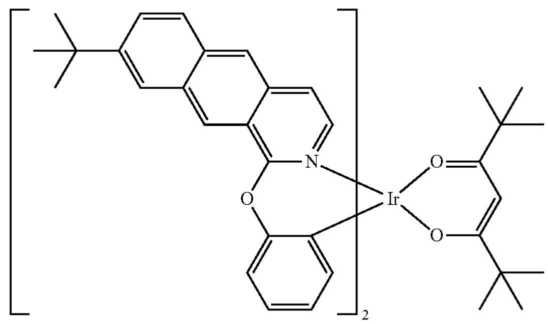
269
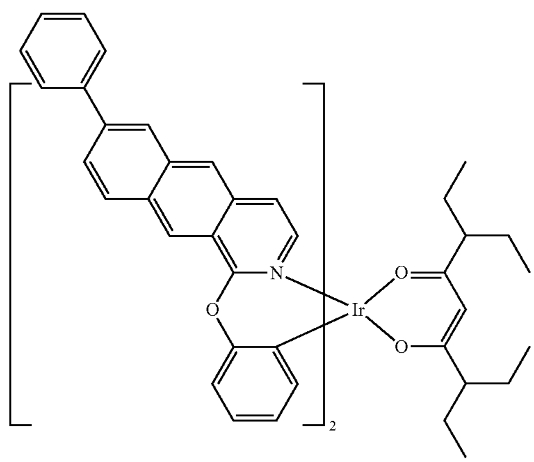
270
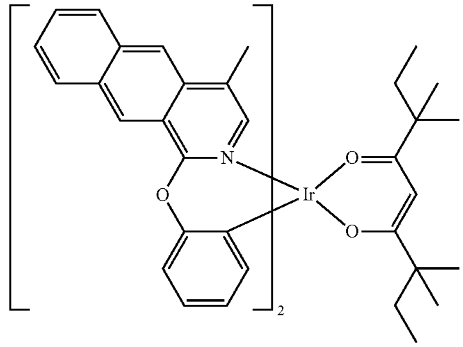

-continued
271
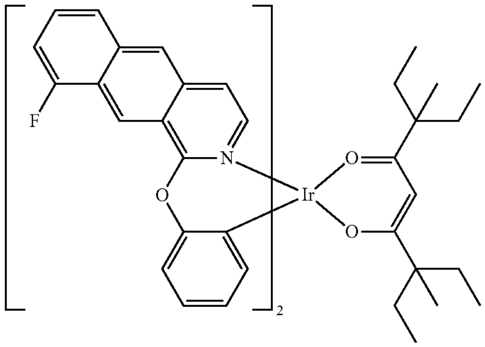
272
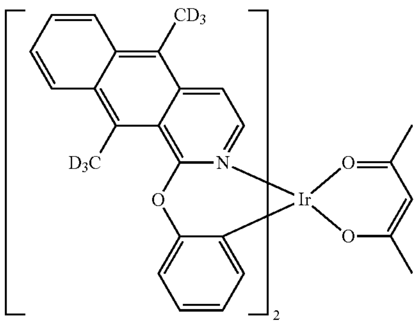
273
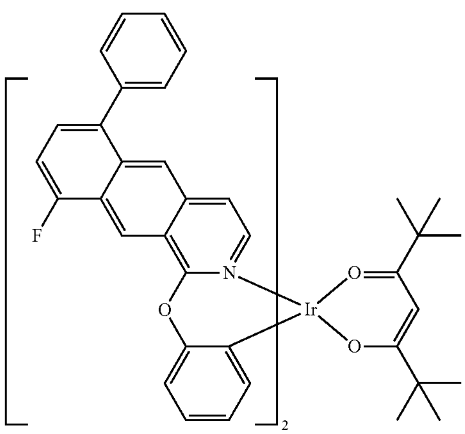
274
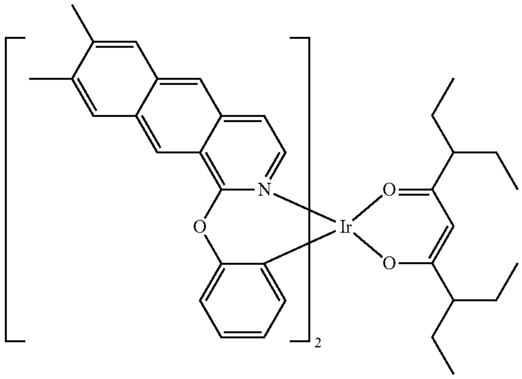
-continued
275
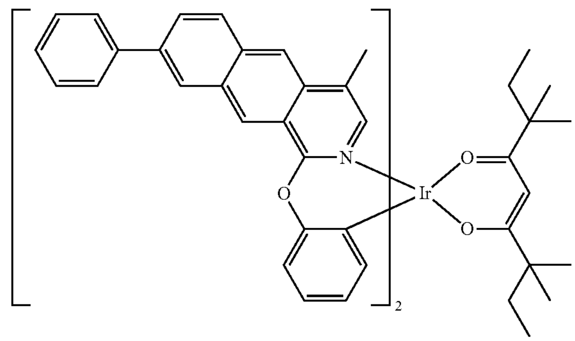
276
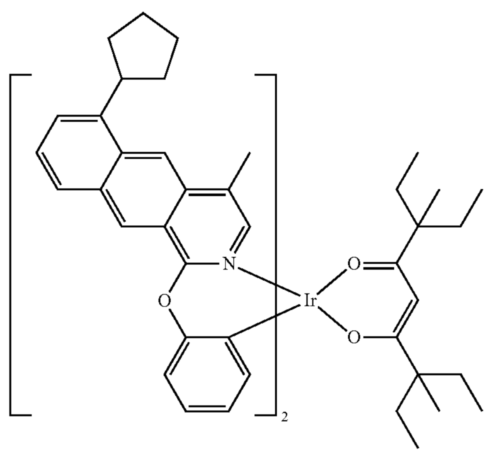
277
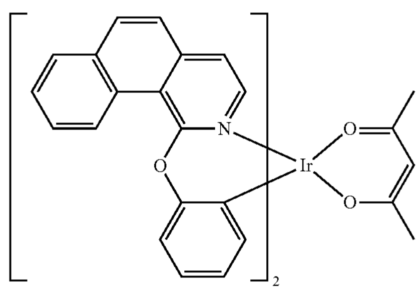
278
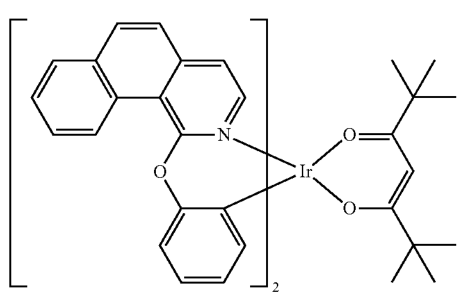

-continued
279
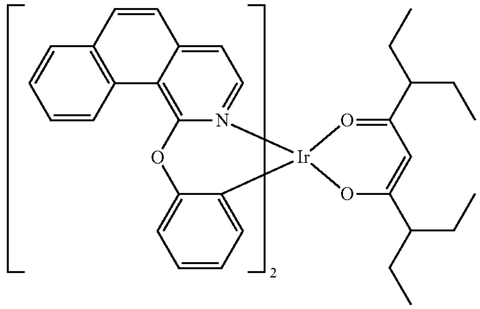
280
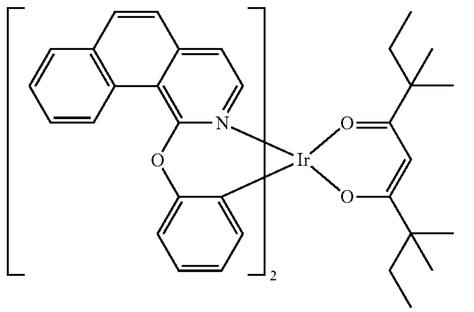
281
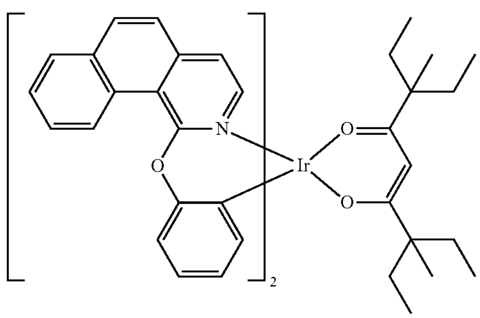
282
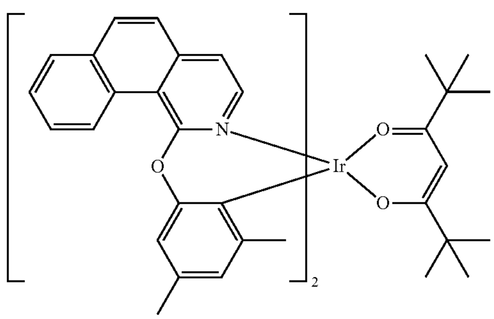
283
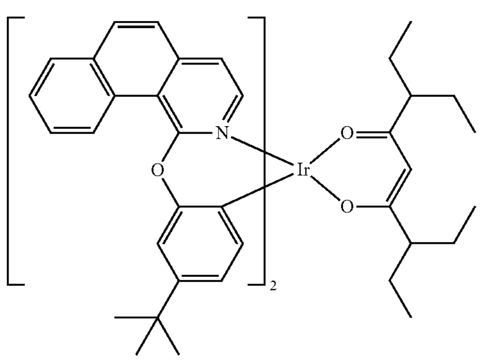
-continued
284
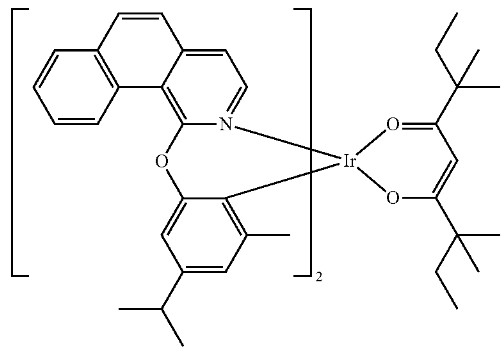
285
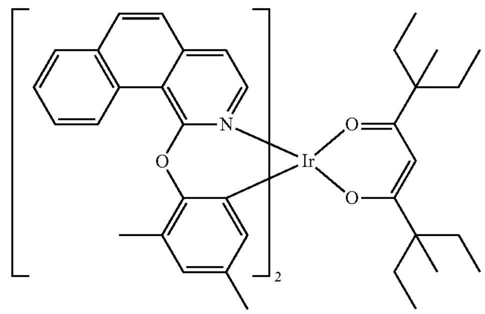
286
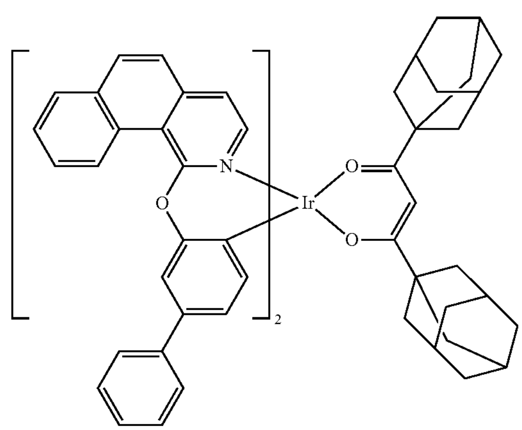
287
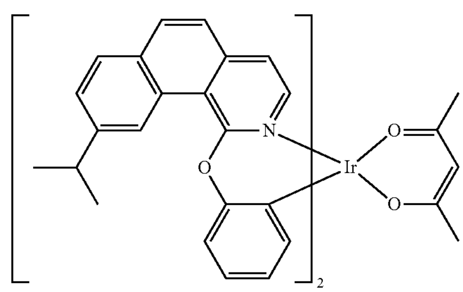

-continued
288
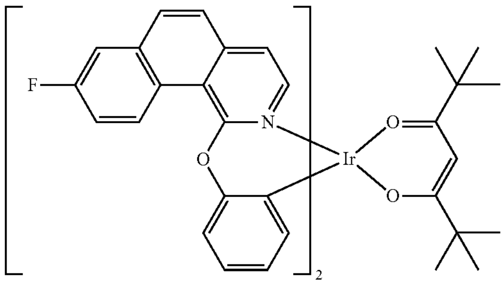
289
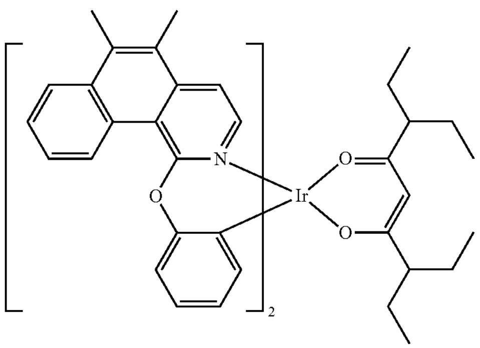
290
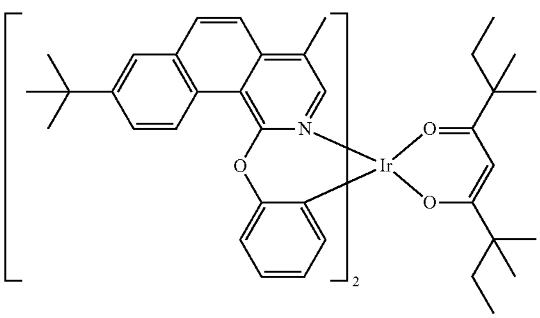
291
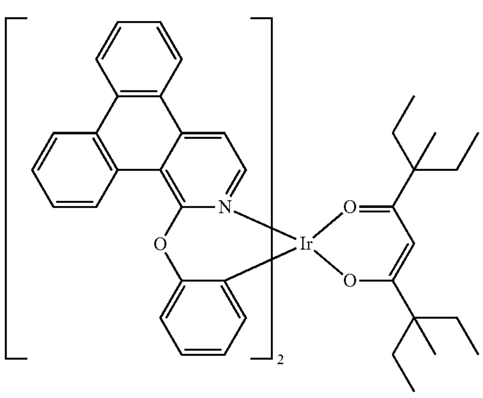
-continued
292
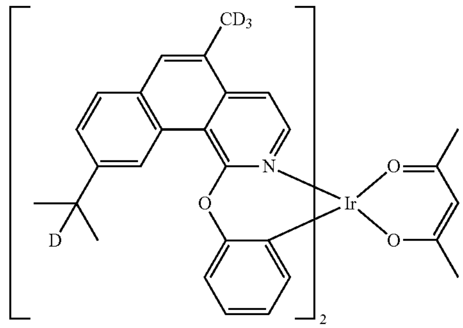
293
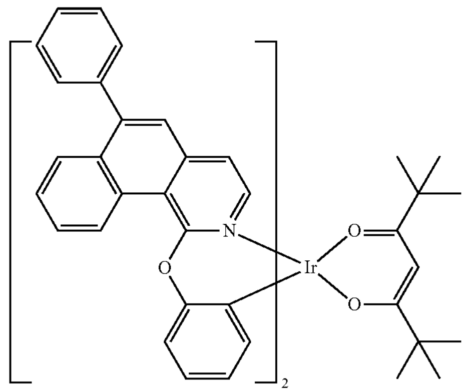
294
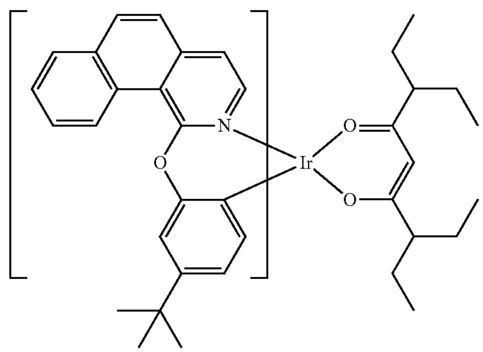
295
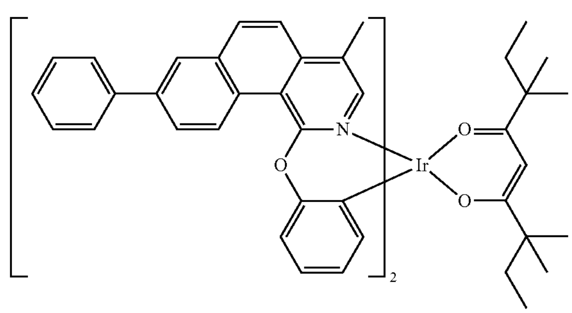

-continued
296
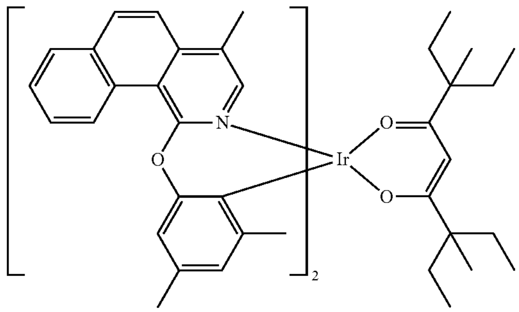
297
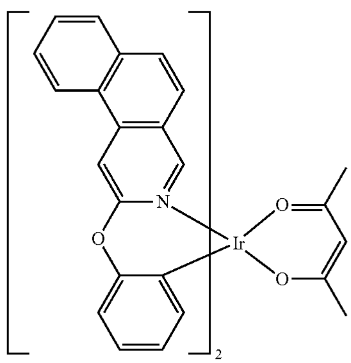
298
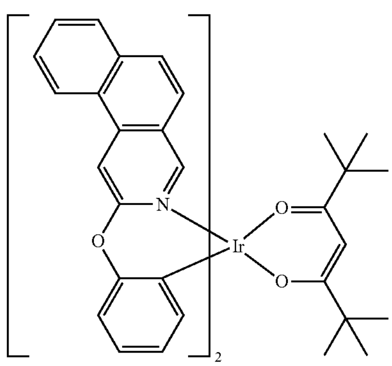
299
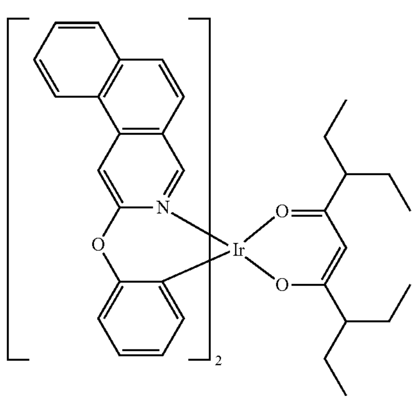
-continued
300
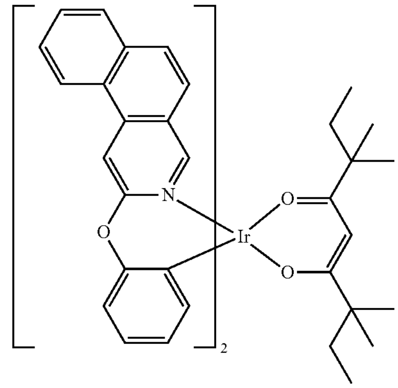
301
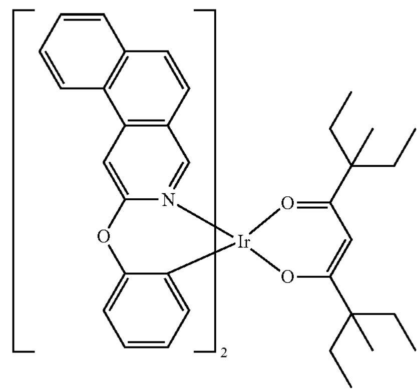
302
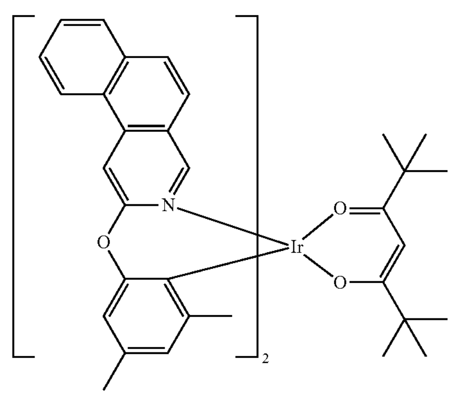
303
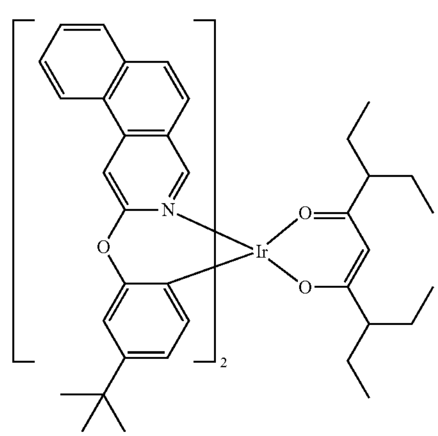

-continued
304
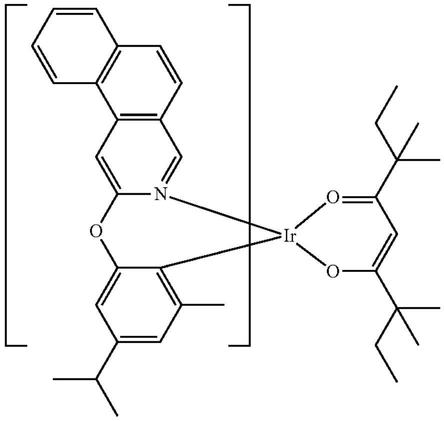
305
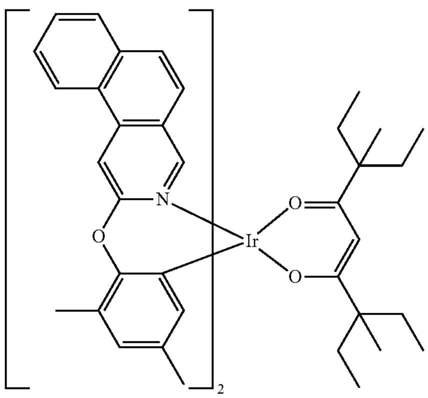
306
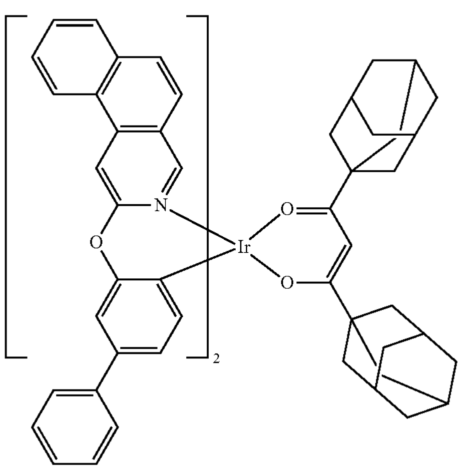
307
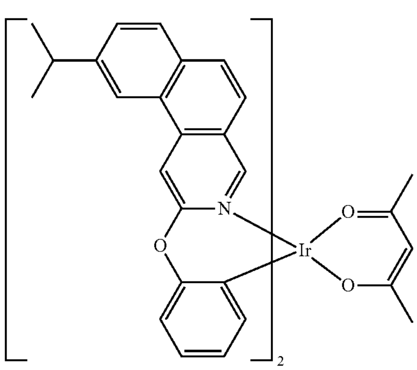
-continued
308
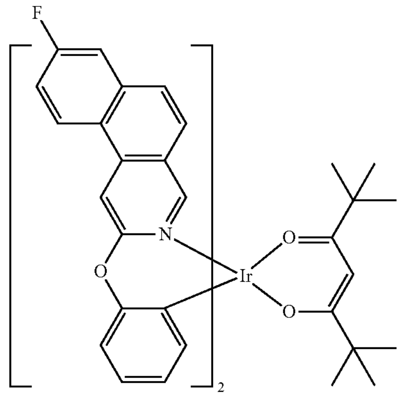
309
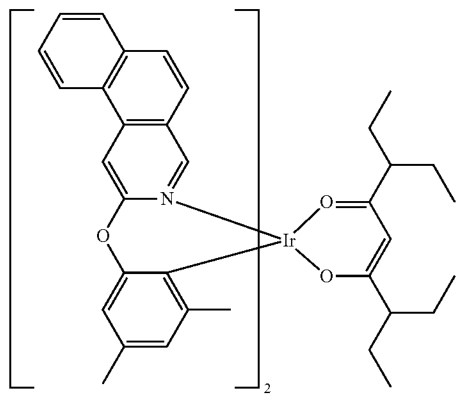
310
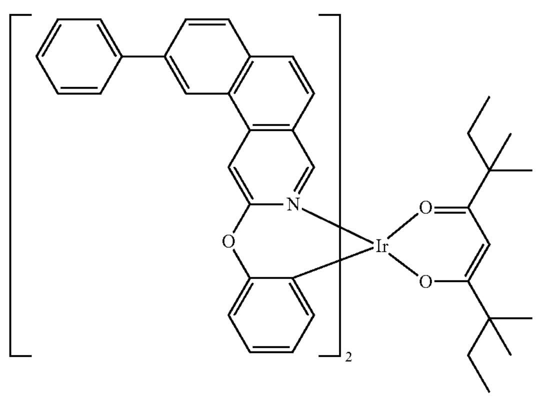
311
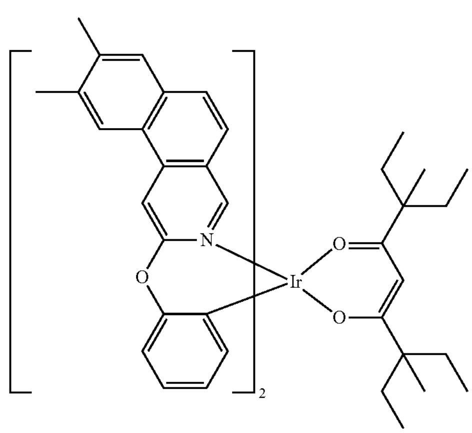

312
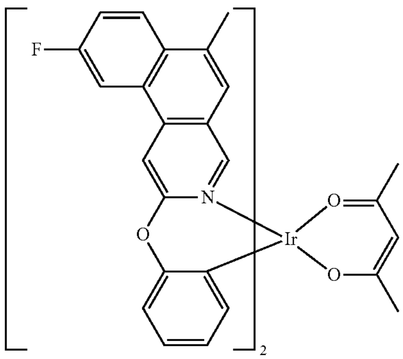
313
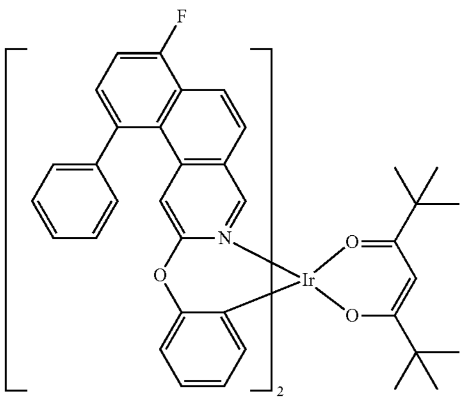
314
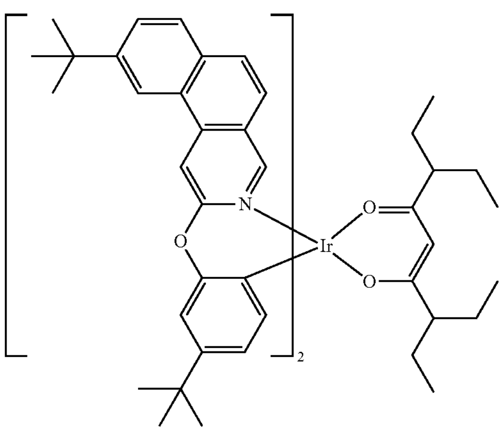
315
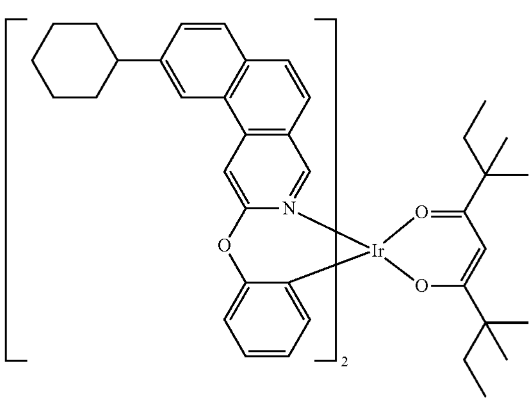
316
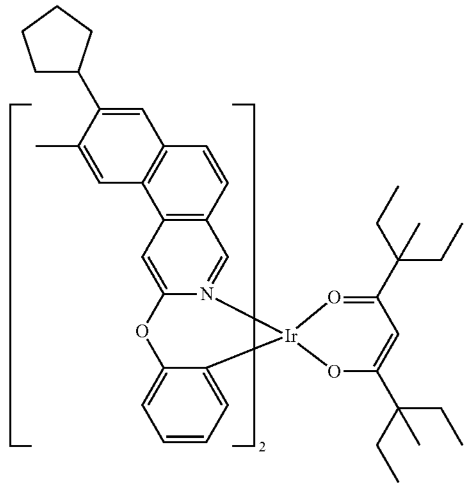
317
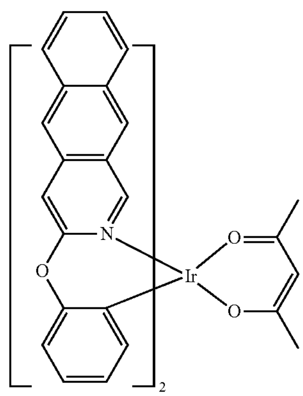
318
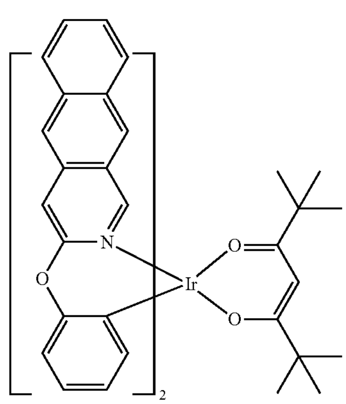

-continued
319
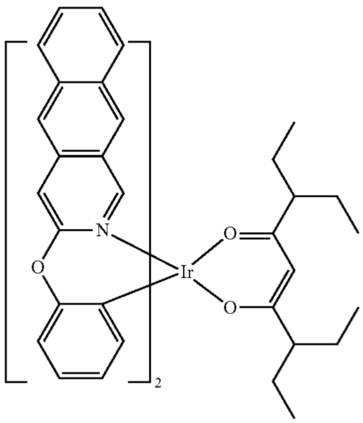
320
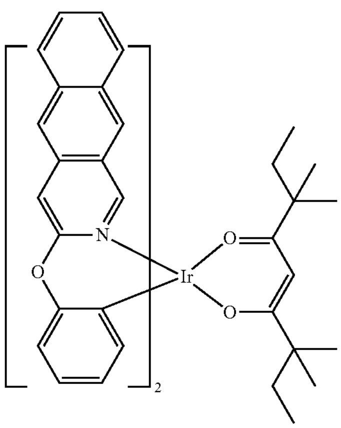
321
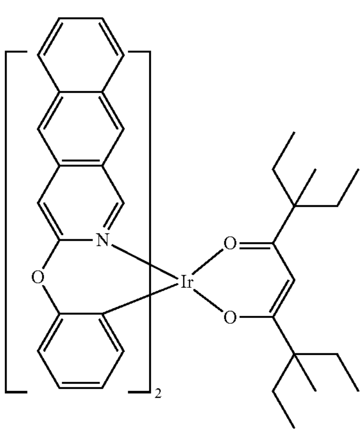
-continued
322
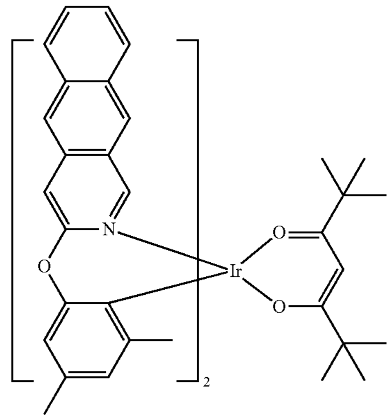
323
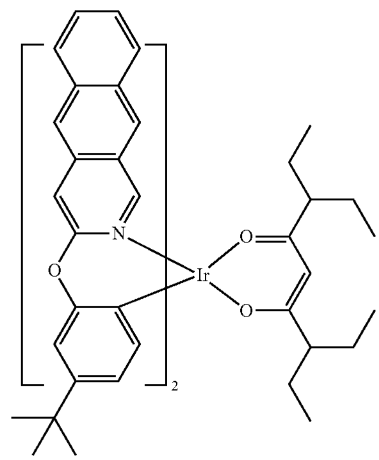
324
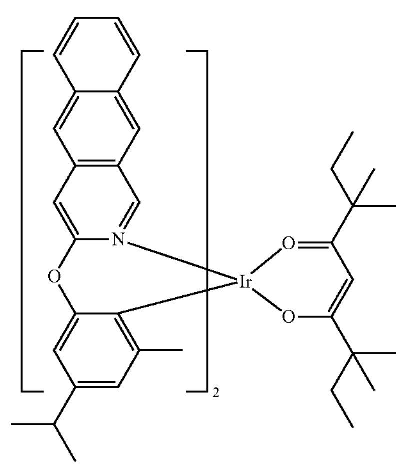

-continued
325
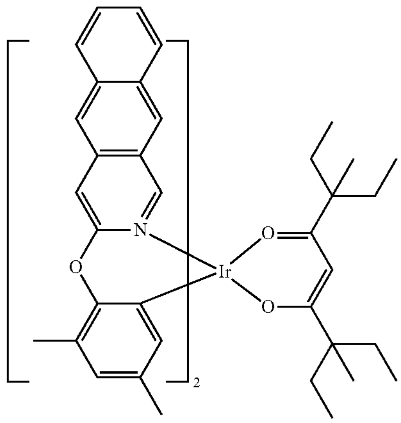
326
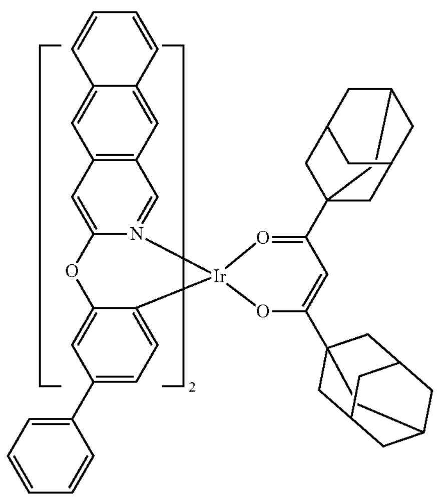
327
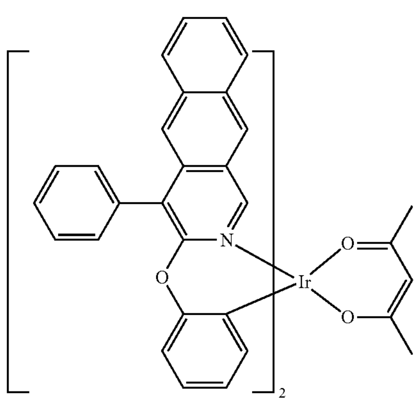
-continued
328
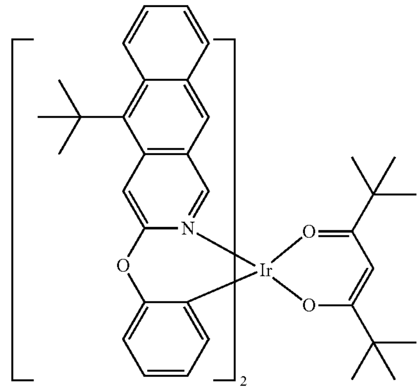
329
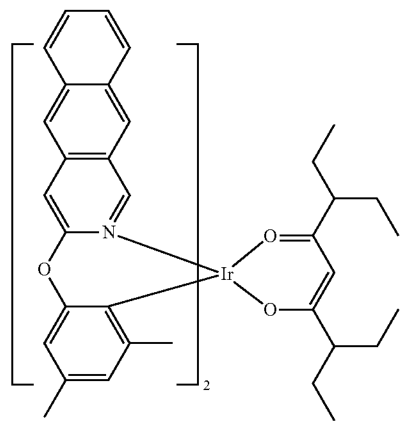
330
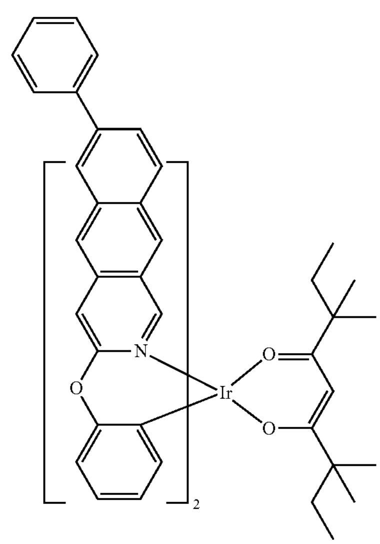

-continued
331
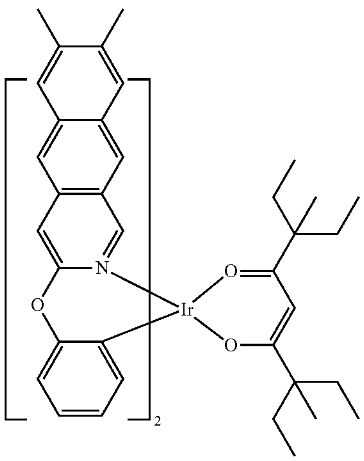
332
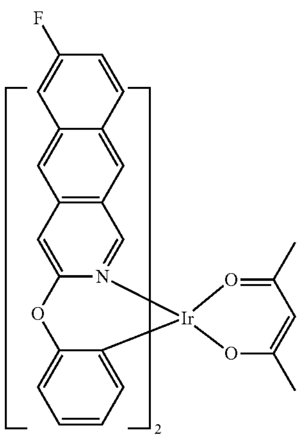
333
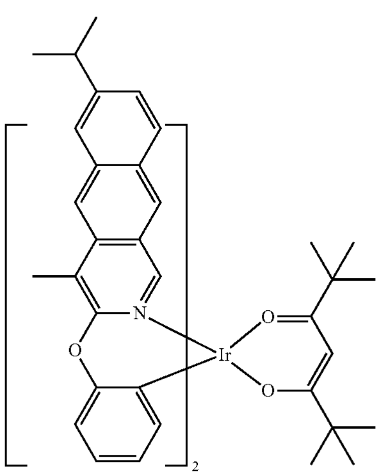
-continued
334
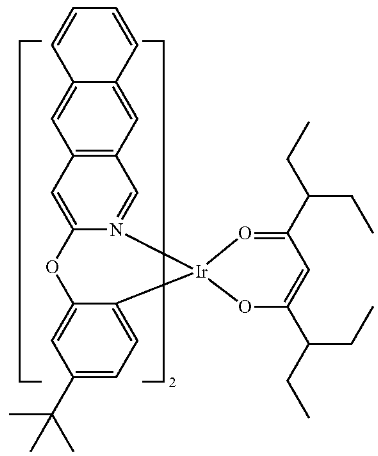
335
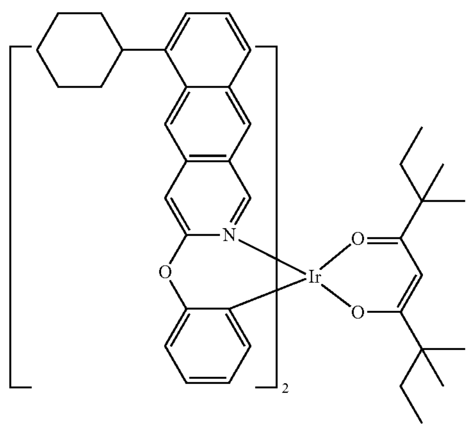
336
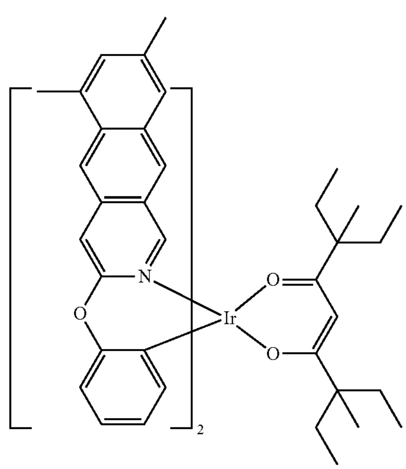

337
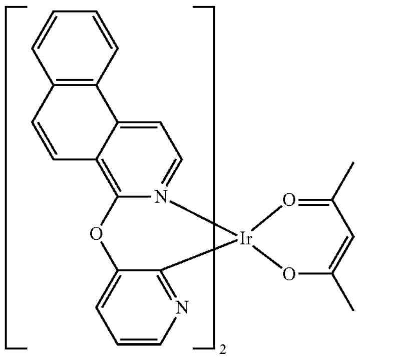
338
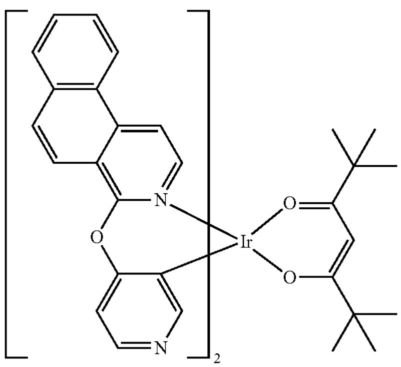
339
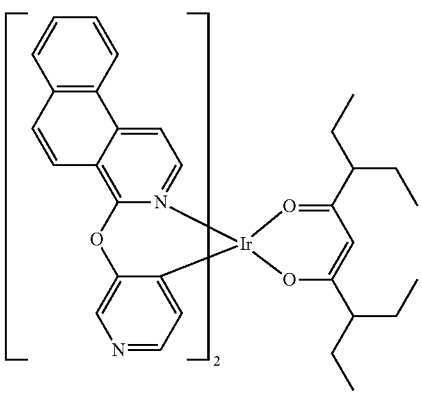
340
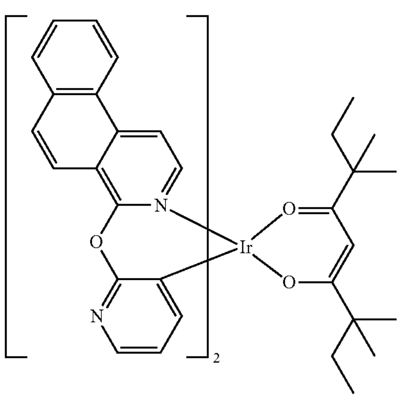
341
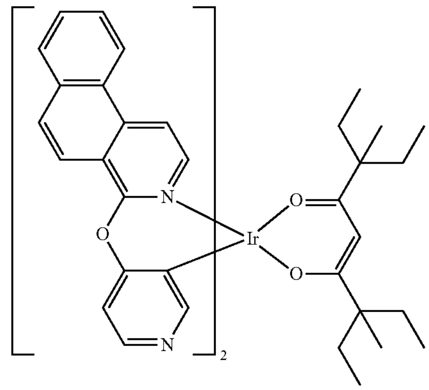
342
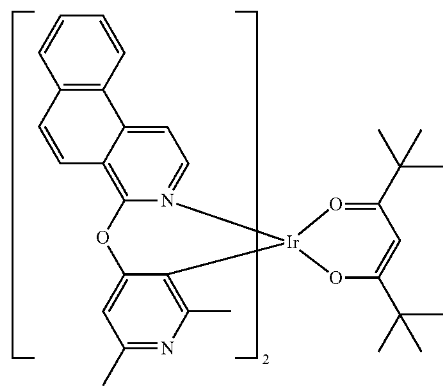
343
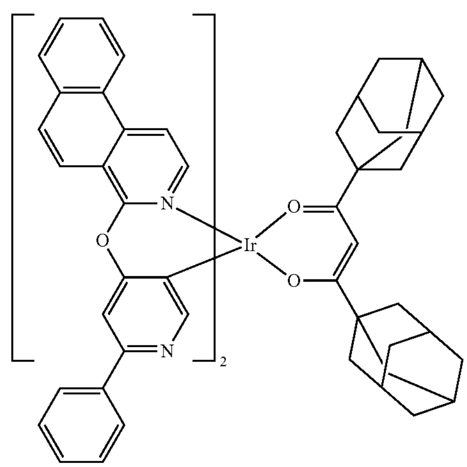
344
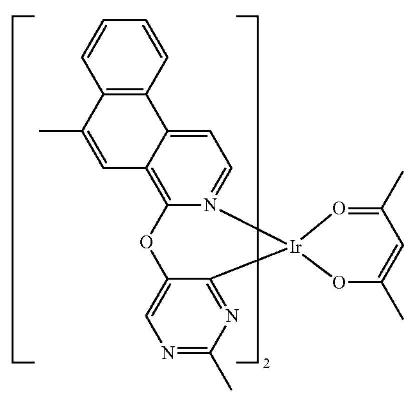

-continued
345
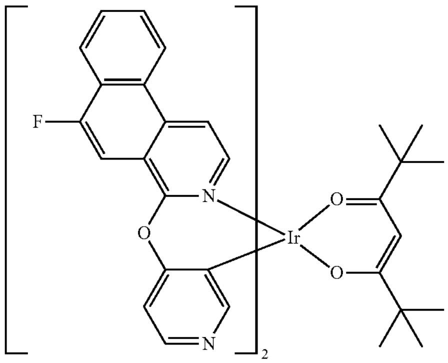
346
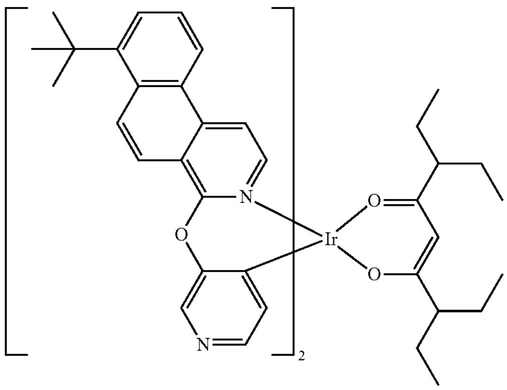
347
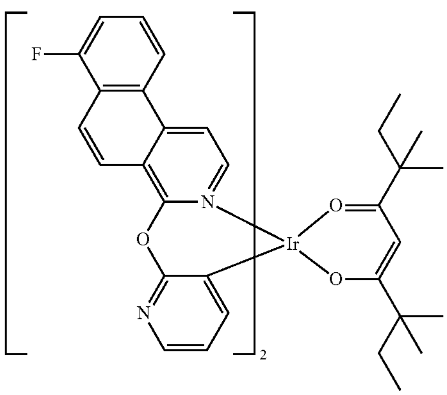
-continued
348
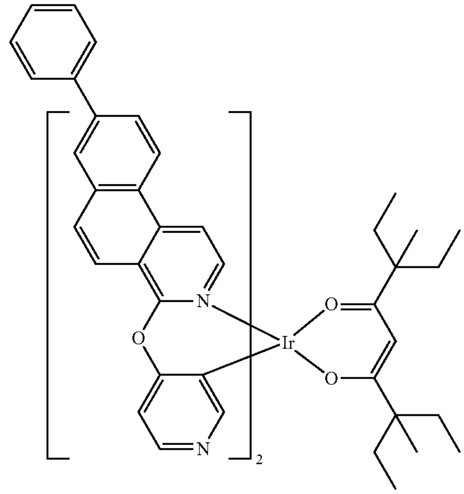
349
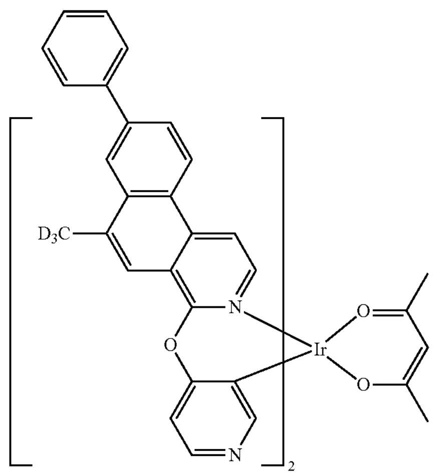
350
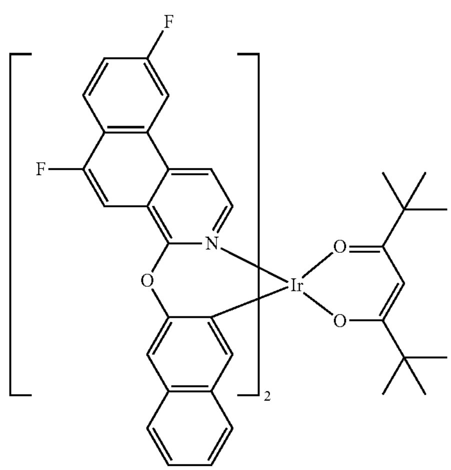

-continued
351
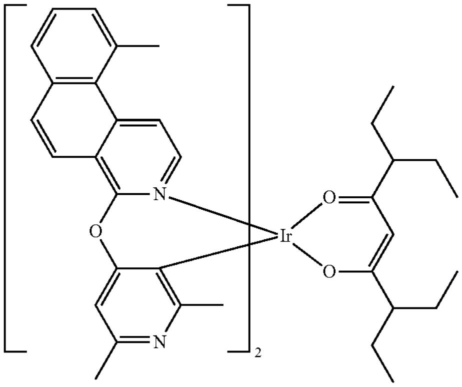
352
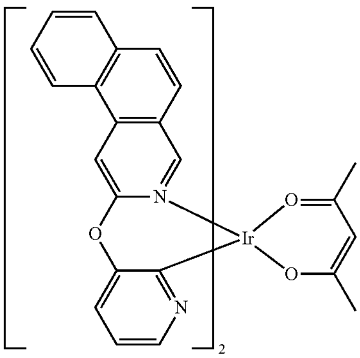
353
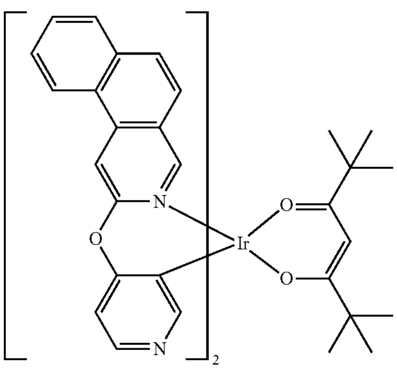
354
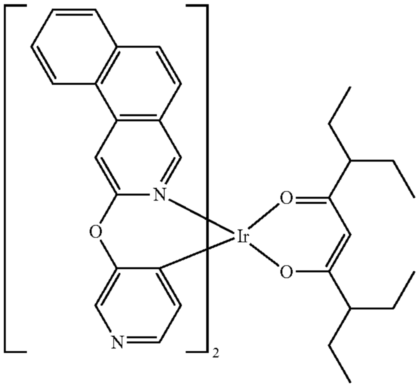
-continued
355
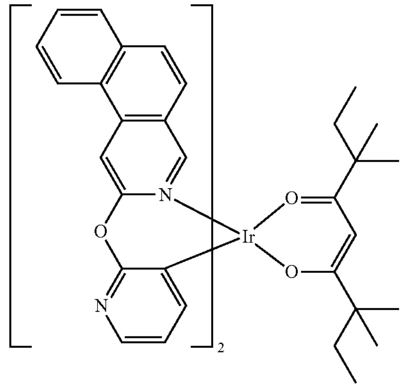
356
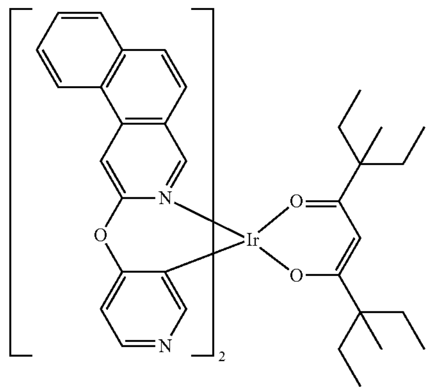
357
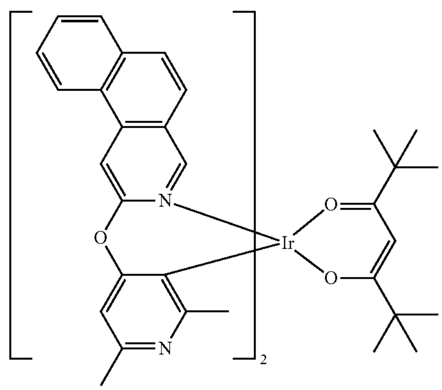
358
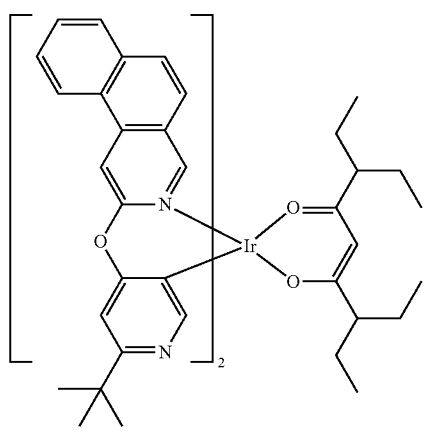

-continued
359
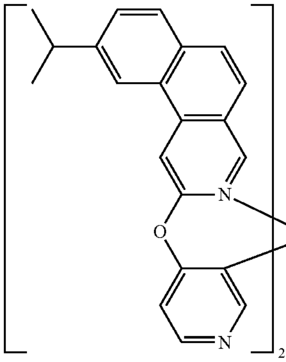
360
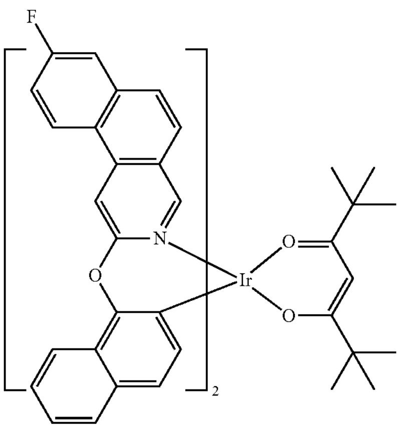
361
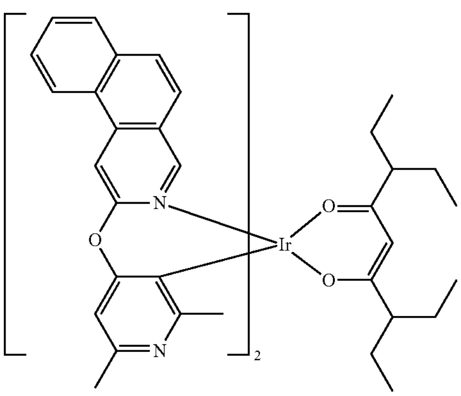
362
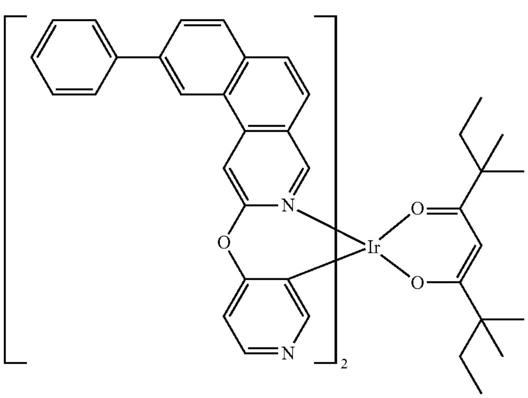
-continued
363
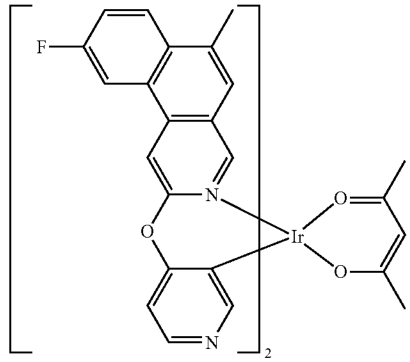
364
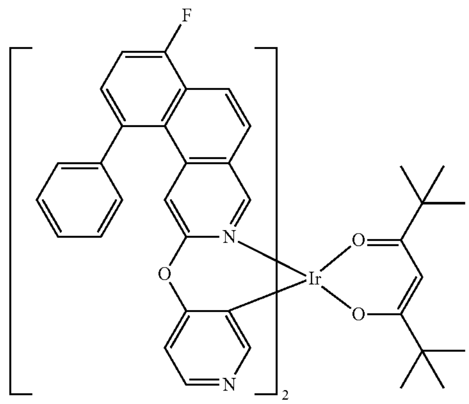
365
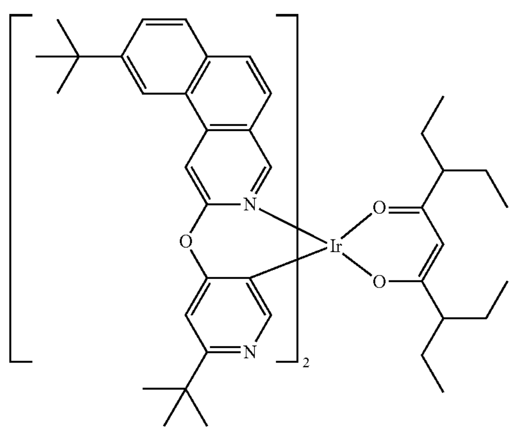
366
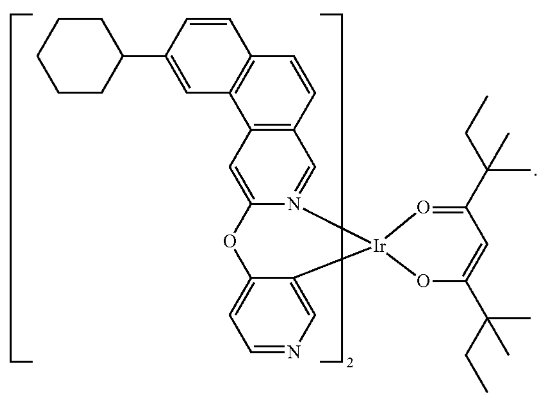

7. An organic light-emitting device comprising:

a first electrode;

a second electrode; and an organic layer disposed between the first electrode and the second electrode and comprising an emission layer, wherein the organic layer comprises at least one organometallic compound of claim 1.

8. The organic light-emitting device of claim 7, wherein the first electrode is an anode, the second electrode is a cathode, the organic layer further comprises a hole transport region disposed between the first electrode and the emission layer and an electron transport region disposed between the emission layer and the second electrode, the hole transport region comprises a hole injection layer, a hole transport layer, an electron blocking layer, a buffer layer, or any combination thereof, and the electron transport region comprises a hole blocking layer, an electron transport layer, an electron injection layer, or any combination thereof.

9. The organic light-emitting device of claim 7, wherein the emission layer comprises the organometallic compound.

10. The organic light-emitting device of claim 9, wherein the emission layer further comprises a host, and an amount of the host in the emission layer is larger than an amount of the organometallic compound in the emission layer.

11. A diagnostic composition comprising at least one organometallic compound of claim 1.

* * * * *